US012769207B2

(12) United States Patent
Hatakeyama et al.

(10) Patent No.: US 12,769,207 B2
(45) Date of Patent: *Oct. 20, 2026

(54) POSITIVE RESIST MATERIAL AND PATTERNING PROCESS

(71) Applicant: SHIN-ETSU CHEMICAL CO., LTD., Tokyo (JP)

(72) Inventors: Jun Hatakeyama, Joetsu (JP); Naoki Ishibashi, Joetsu (JP); Masayoshi Sagehashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 866 days.

This patent is subject to a terminal disclaimer.

(21) Appl. No.: 17/859,634

(22) Filed: Jul. 7, 2022

(65) Prior Publication Data

US 2023/0107121 A1 Apr. 6, 2023

(30) Foreign Application Priority Data

Jul. 29, 2021 (JP) ................................ 2021-124156

(51) Int. Cl.

| | |
|---|---|
| ***C08F 220/40*** | (2006.01) |
| ***C08F 212/14*** | (2006.01) |
| ***C08F 220/18*** | (2006.01) |
| ***C08F 220/22*** | (2006.01) |
| ***C08F 220/24*** | (2006.01) |
| ***C08F 220/38*** | (2006.01) |
| ***G03F 7/004*** | (2006.01) |
| ***G03F 7/039*** | (2006.01) |
| ***G03F 7/30*** | (2006.01) |

(52) U.S. Cl.

CPC .......... *G03F 7/0392* (2013.01); *C08F 212/24* (2020.02); *C08F 220/1804* (2020.02); *C08F 220/1805* (2020.02); *C08F 220/1806* (2020.02); *C08F 220/22* (2013.01); *C08F 220/24* (2013.01); *C08F 220/38* (2013.01); *C08F 220/40* (2013.01); *G03F 7/0045* (2013.01); *G03F 7/039* (2013.01); *G03F 7/0397* (2013.01)

(58) Field of Classification Search

CPC .. G03F 7/039; G03F 7/0045; C08F 220/1804; C08F 220/1806; C08F 220/1805; C08F 212/24; C08F 220/22; C08F 220/24; C08F 220/38; C08F 220/40

See application file for complete search history.

(56) References Cited

U.S. PATENT DOCUMENTS 5,585,220 A 12/1996 Breyta et al.
6,448,420 B1 9/2002 Kinsho et al.
12,013,639 B2 * 6/2024 Hatakeyama ......... G03F 7/2006
2007/0231708 A1 10/2007 Matsumaru et al.
2007/0231738 A1 10/2007 Kaneko et al.
2008/0085469 A1 4/2008 Ohsawa et al.
2008/0090172 A1 4/2008 Hatakeyama et al.

(Continued)

FOREIGN PATENT DOCUMENTS

CN 111670176 A 9/2020
JP H03-241355 A 10/1991

(Continued)

OTHER PUBLICATIONS

May 2, 2023 Office Action issued in Taiwanese Patent Application No. 111127913.

(Continued)

*Primary Examiner* — John S. Chu

(74) *Attorney, Agent, or Firm* — Oliff PLC

(57) ABSTRACT

A positive resist material contains an acid generator, and a base polymer containing a repeating unit having two carboxyl groups whose hydrogen atoms are substituted with two tertiary carbon atoms each bonded to a double bond or triple bond. The repeating unit having two carboxyl groups whose hydrogen atoms are substituted with two tertiary carbon atoms each bonded to a double bond or triple bond is represented by a repeating unit-a in the following formula (1). Thus, the present invention provides: a positive resist material having higher sensitivity than conventional positive resist materials and smaller dimensional variation; and a patterning process.

(1)

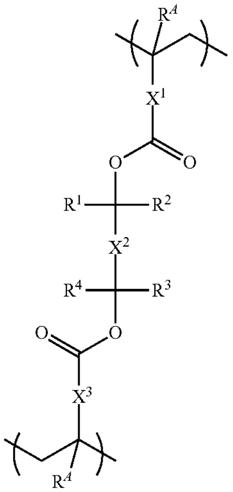

(a)

13 Claims, No Drawings

(56) References Cited

U.S. PATENT DOCUMENTS

| | | | | |
|---|---|---|---|---|
| 2008/0153030 | A1 | 6/2008 | Kobayashi et al. | |
| 2008/0241736 | A1 | 10/2008 | Kobayashi et al. | |
| 2008/0318160 | A1 | 12/2008 | Ohsawa et al. | |
| 2009/0246694 | A1 | 10/2009 | Ohsawa et al. | |
| 2010/0035185 | A1 | 2/2010 | Hagiwara et al. | |
| 2010/0209827 | A1 | 8/2010 | Ohashi et al. | |
| 2012/0045724 | A1 | 2/2012 | Ohsawa et al. | |
| 2012/0100486 | A1 | 4/2012 | Sagehashi et al. | |
| 2014/0199629 | A1 | 7/2014 | Ohashi et al. | |
| 2017/0031243 | A1 | 2/2017 | Hatakeyama et al. | |
| 2018/0335696 | A1 | 11/2018 | Hatakeyama et al. | |
| 2019/0094690 | A1* | 3/2019 | Hatakeyama | C09D 125/08 |
| 2020/0369595 | A1 | 11/2020 | Lim et al. | |
| 2020/0392065 | A1* | 12/2020 | Kakuta | C07C 69/54 |
| 2021/0116808 | A1 | 4/2021 | Hatakeyama et al. | |

FOREIGN PATENT DOCUMENTS

| | | | | |
|---|---|---|---|---|
| JP | H09-179302 | A | | 7/1997 |
| JP | H11109631 | A | * | 4/1999 |
| JP | H11-190904 | A | | 7/1999 |
| JP | 2000-214587 | A | | 8/2000 |
| JP | 2000-327633 | A | | 11/2000 |
| JP | 2006-045311 | A | | 2/2006 |
| JP | 3790649 | B2 | | 6/2006 |
| JP | 2006-178317 | A | | 7/2006 |
| JP | 2007-145797 | A | | 6/2007 |
| JP | 2007-297590 | A | | 11/2007 |
| JP | 2008-106045 | A | | 5/2008 |
| JP | 2008-111103 | A | | 5/2008 |
| JP | 2008-122932 | A | | 5/2008 |
| JP | 2008-158339 | A | | 7/2008 |
| JP | 2008-239918 | A | | 10/2008 |
| JP | 2009-007327 | A | | 1/2009 |
| JP | 2009-258695 | A | | 11/2009 |
| JP | 2010-215608 | A | | 9/2010 |
| JP | 2012-041320 | A | | 3/2012 |
| JP | 2012-106986 | A | | 6/2012 |
| JP | 2012-153644 | A | | 8/2012 |
| JP | 2014-133723 | A | | 7/2014 |
| JP | 2017-026980 | A | | 2/2017 |
| JP | 2018-197853 | A | | 12/2018 |
| KR | 10-2102540 | B1 | | 4/2020 |
| TW | I306991 | B | | 3/2009 |
| TW | 202122922 | A | | 6/2021 |
| WO | 2019/171957 | A1 | | 9/2019 |

OTHER PUBLICATIONS

Jan. 29, 2024 Office Action issued in Korean Patent Application No. 10-2022-0091763.

Kishikawa et al. "Assessment of trade-off between resist resolution and sensitivity for optimization of hyper-NA immersion lithography." Optical Microlithography XX, edited by Donis G. Flagello, Proc. of SPIE vol. 6520, 65203L, (2007), 0277-786X/07/$18 • doi: 10.1117/12.711420.

Mar. 11, 2025 Office Action issued in Japanese Patent Application No. 2022-100335.

* cited by examiner

POSITIVE RESIST MATERIAL AND PATTERNING PROCESS

TECHNICAL FIELD

The present invention relates to a positive resist material and a patterning process.

BACKGROUND ART

As LSIs advance toward higher integration and higher processing speed, miniaturization of pattern rule is progressing rapidly. Especially, the expansion of logic and memory markets owing to widespread use of smart phones leads this miniaturization. The utilizations of artificial intelligence (AI) and 5G for high-speed communications require high-performance semiconductors, accelerating the progress of miniaturization. As cutting-edge technology for miniaturization, mass-productions of 7-nm node devices by double patterning involving ArF immersion lithography and 5-nm node devices by extreme ultraviolet ray (EUV) lithography have been in progress. EUV lithography is also a candidate for the next-generation 3-nm node and the following-generation 2-nm node.

As the miniaturization progresses, image blurs due to acid diffusion become a problem. To ensure resolution for fine patterns with dimensional sizes of 45 nm and smaller, there is a proposal that it is important to not only improve dissolution contrast as previously reported, but also control acid diffusion (Non Patent Document 1). Nevertheless, since chemically amplified resist materials enhance the sensitivity and contrast through acid diffusion, an attempt to minimize acid diffusion by reducing the temperature and/or time of post-exposure bake (PEB) results in significant reductions of sensitivity and contrast.

A triangular tradeoff relationship among sensitivity, resolution, and edge roughness has been pointed out. Specifically, resolution improvement requires suppression of acid diffusion, whereas shortening acid diffusion distance lowers sensitivity.

The addition of an acid generator capable of generating a bulky acid is effective in suppressing acid diffusion. Hence, it has been proposed to incorporate in a polymer a repeating unit derived from an onium salt having a polymerizable unsaturated bond. In this case, the polymer also functions as an acid generator (polymer-bound acid generator). Patent Document 1 proposes a sulfonium and iodonium salt having a polymerizable unsaturated bond that generates a particular sulfonic acid. Patent Document 2 proposes a sulfonium salt having a sulfonate acid moiety directly bonded to the main chain.

Chemically amplified resists have contributed to not only the merit of high sensitivity but also enhancement of resist contrast. Particularly, a high-contrast resist is necessary to form a fine two-dimensional pattern. Regarding a positive-type resist, the contrast is improved by enhancing the alkali dissolution rate through deprotection reaction, during heating (PEB), of an acid catalyst that is generated by light exposure. A resist composition with a crosslinking acetal has been proposed in which one acid labile group is substituted as an acid labile group to undergo deprotection reaction within a polyhydroxystyrene polymer (Patent Document 3). This is a high-contrast resist whose alkali dissolution rate is increased not only by changing the polarity through common deprotection reaction but also by decreasing the molecular weight.

When a carboxyl group having higher acidity than a phenol group is substituted with an acid labile group, the alkali dissolution rate after deprotection is further increased. For this reason, a copolymer containing methacrylic acid with a substituted acid labile group has been used in place of polyhydroxystyrene with a substituted acid labile group (Patent Document 4). To further enhance dissolution contrast, resist materials based on polymers having tertiary ester as an acid labile group for crosslinking between the polymers have been proposed (Patent Documents 5, 6). Further, a hybrid polymer-based resist with acetal crosslinkage and tertiary ester crosslinkage is also proposed (Patent Document 7).

CITATION LIST

Patent Literature

Patent Document 1: JP 2006-045311 A

Patent Document 2: JP 2006-178317 A

Patent Document 3: JP H11-190904 A

Patent Document 4: JP H09-179302 A

Patent Document 5: JP H03-241355 A

Patent Document 6: JP H11-109631 A

Patent Document 7: JP 2000-214587 A

Non Patent Literature

Non Patent Document 1: SPIE, Vol. 6520, 65203L-1 (2007)

SUMMARY OF INVENTION

Technical Problem

The present invention has been made in view of the above circumstances. An object of the present invention is to provide a positive resist material having higher sensitivity than conventional positive resist materials and smaller dimensional variation; and a patterning process.

Solution to Problem

To achieve the object, the present invention provides a positive resist material comprising:

an acid generator; and a base polymer comprising a repeating unit comprising two carboxyl groups whose hydrogen atoms are substituted with two tertiary carbon atoms each bonded to a double bond or triple bond, wherein the repeating unit comprising two carboxyl groups whose hydrogen atoms are substituted with two tertiary carbon atoms each bonded to a double bond or triple bond is a repeating unit-a in the following formula (1), (1)

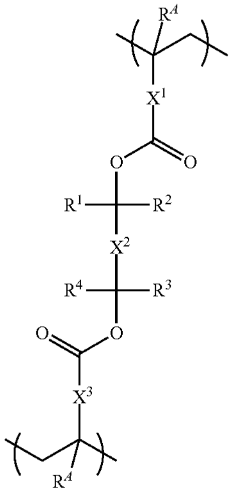

(a)

wherein $R^A$'s are identical to or different from each other and each represent a hydrogen atom or a methyl group; $X^1$ and $X^3$ each represent a single bond, a phenylene group, or a linking group having 1 to 12 carbon atoms containing at least one selected from the group consisting of an ester bond, an ether bond, and a lactone ring, or represents the following formula (1'); $R^1$ to $R^4$ each represent a linear, branched, or cyclic alkyl group having 1 to 8 carbon atoms, and $R^1$ and $R^2$, or $R^3$ and $R^4$, are optionally bonded to each other to form a ring; and $X^2$ represents a vinylene group or an ethynylene group, (1')

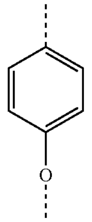

wherein an oxygen atom in the formula (1') is not bonded to a carbon atom of a carboxyl group in the formula (1); and each broken line represents a bonding arm.

Such a positive resist material has higher sensitivity than conventional positive resist materials and smaller dimensional variation.

In the present invention, the acid generator is preferably a sulfonium salt or iodonium salt of a sulfonic acid containing an iodine atom-substituted aromatic ring.

Such a positive resist material can control acid diffusion.

In this case, the sulfonium salt or iodonium salt of a sulfonic acid containing an iodine atom-substituted aromatic ring is preferably shown by the following formula (2-1) or (2-2), (2-1)

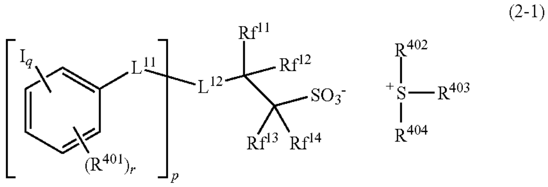

(2-2)

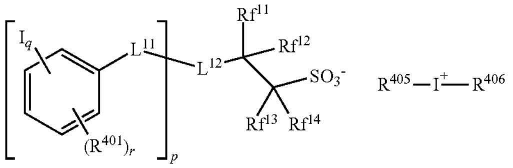

wherein "p" represents an integer satisfying $1 \leq p \leq 3$;

"q" and "r" represent integers satisfying $1 \leq q \leq 5$, $0 \leq r \leq 3$, and $1 \leq q+r \leq 5$;

$L^{11}$ represents a single bond, or a linear, branched, or cyclic saturated hydrocarbylene group having 1 to 6 carbon atoms and optionally containing an ether bond or an ester bond;

$L^{12}$ represents a single bond or a divalent linking group having 1 to 20 carbon atoms when "p" is 1, or represents a trivalent or tetravalent linking group having 1 to 20 carbon atoms when "p" is 2 or 3, the linking groups optionally containing an oxygen atom, a sulfur atom, a nitrogen atom, a chlorine atom, a bromine atom, or an iodine atom;

$R^{401}$ represents a hydroxy group, a carboxyl group, a fluorine atom, a chlorine atom, a bromine atom, an amino group, $-NR^{401A}-C(=O)-R^{401B}$, or $-NR^{401A}-C(=O)-O-R^{401B}$, or a saturated hydrocarbyl group having 1 to 20 carbon atoms, a saturated hydrocarbyloxy group having 1 to 20 carbon atoms, a saturated hydrocarbyloxycarbonyl group having 2 to 10 carbon atoms, a saturated hydrocarbylcarbonyloxy group having 2 to 20 carbon atoms, a saturated hydrocarbylsulfonyloxy group having 1 to 20 carbon atoms, or an aromatic hydrocarbon group having 6 to 20 carbon atoms each of which optionally contains an ether bond;

$R^{401A}$ represents a hydrogen atom or a saturated hydrocarbyl group having 1 to 6 carbon atoms, and optionally contains a halogen atom, a hydroxy group, an alkoxy group having 1 to 6 carbon atoms, a saturated hydrocarbylcarbonyl group having 2 to 6 carbon atoms, or a saturated hydrocarbylcarbonyloxy group having 2 to 6 carbon atoms;

$R^{401B}$ represents an aliphatic hydrocarbyl group having 1 to 16 carbon atoms or an aryl group having 6 to 12 carbon atoms, and optionally contains a halogen atom, a hydroxy group, a saturated hydrocarbyloxy group having 1 to 6 carbon atoms, a saturated hydrocarbylcarbonyl group having 2 to 6 carbon atoms, or a saturated hydrocarbylcarbonyloxy group having 2 to 6 carbon atoms;

the aliphatic hydrocarbyl group is saturated or unsaturated, and linear, branched, or cyclic, and the saturated hydrocarbyl group, saturated hydrocarbyloxy group, saturated hydrocarbyloxycarbonyl group, saturated hydrocarbylcarbonyl groups, saturated hydrocarbylcarbonyloxy groups, and saturated hydrocarbylsulfonyloxy group are linear, branched, or cyclic;

when "p" and/or "r" are 2 or more, $R^{401}$'s are identical to or different from one another;

$Rf^{11}$ to $Rf^{14}$ each independently represent a hydrogen atom, a fluorine atom, or a trifluoromethyl group, at least one of $Rf^{11}$ to $Rf^{14}$ is a fluorine atom, or a trifluoromethyl group, and $Rf^{11}$ and $Rf^{12}$ optionally bond with each other to form a carbonyl group;

$R^{402}$, $R^{403}$, $R^{404}$, $R^{405}$, and $R^{406}$ each independently represent a hydrocarbyl group having 1 to 20 carbon atoms optionally containing a fluorine atom, a chlorine atom, a bromine atom, an iodine atom, or a heteroatom, the hydrocarbyl group is saturated or unsaturated, and linear, branched, or cyclic, and the groups as $R^{402}$, $R^{403}$, $R^{404}$, $R^{405}$, and $R^{406}$ have some or all of hydrogen atoms optionally substituted with a hydroxy group, a carboxyl group, a halogen atom, a cyano group, a nitro group, a mercapto group, a sultone group, a sulfone group, or a sulfonium salt-containing group, and have some of carbon atoms optionally substituted with an ether bond, an ester bond, a carbonyl group, an amide bond, a carbonate group, or a sulfonic acid ester bond, and $R^{402}$ and $R^{403}$ are optionally bonded to each other to form a ring together with a sulfur atom bonded thereto.

The positive resist material containing such an acid generator can further control acid diffusion.

More preferably, in the present invention, the base polymer further comprises at least one selected from the group consisting of a repeating unit containing a carboxyl group whose hydrogen atom is substituted with a first acid labile group different from the two tertiary carbon atoms each bonded to a double bond or triple bond, and a repeating unit containing a phenolic hydroxy group whose hydrogen atom is substituted with a second acid labile group.

Such a positive resist material can further enhance the effects of the present invention.

Preferably, in this case, the repeating unit having the substituted first acid labile group is a repeating unit shown by the following formula (b1), and the repeating unit having the substituted second acid labile group is a repeating unit shown by the following formula (b2), (b1)

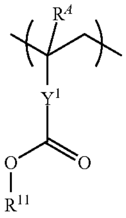

(b2)

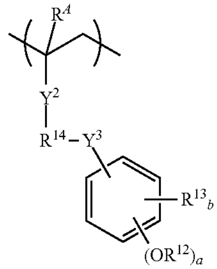

wherein each $R^A$ independently represents a hydrogen atom or a methyl group; $Y^1$ represents a single bond, a phenylene group, a naphthylene group, or a linking group having 1 to 14 carbon atoms containing at least one selected from the group consisting of an ester bond, an ether bond, and a lactone ring; $Y^2$ represents a single bond, an ester bond, or an amide bond; $Y^3$ represents a single bond, an ether bond, or an ester bond; $R^{11}$ represents the first acid labile group that is different from the two tertiary carbon atoms each bonded to a double bond or triple bond; $R^{12}$ represents the second acid labile group; $R^{13}$ represents a fluorine atom, a trifluoromethyl group, a cyano group, or a saturated hydrocarbyl group having 1 to 6 carbon atoms; $R^{14}$ represents a single bond or an alkanediyl group having 1 to 6 carbon atoms, and some of the carbon atoms are optionally substituted with an ether bond or an ester bond; and "a" represents 1 or 2, and "b" represents an integer of 0 to 4, with $1 \le a+b \le 5$.

The positive resist material containing such repeating units can further enhance the effects of the present invention.

Moreover, in the present invention, the base polymer preferably further comprises a repeating unit comprising an adhesive group selected from the group consisting of a hydroxy group, a carboxyl group, a lactone ring, a carbonate group, a thiocarbonate group, a carbonyl group, a cyclic acetal group, an ether bond, an ester bond, a sulfonic acid ester bond, a cyano group, an amide bond, —O—C(═O)—S—, and —O—C(═O)—NH—.

Such a positive resist material can enhance the adhesiveness.

Preferably, the present inventive positive resist material further comprises one or more selected from the group consisting of an organic solvent, a quencher, and a surfactant.

To the inventive positive resist material, such components can be added.

In addition, the present invention provides a patterning process comprising steps of:

forming a resist film on a substrate by using the above-described positive resist material;

exposing the resist film to a high-energy beam; and developing the exposed resist film by using a developer.

Such a patterning process is suitable for patterning a positive resist material having higher sensitivity than conventional positive resist materials and smaller dimensional variation.

In this event, the high-energy beam is preferably an i-line beam, a KrF excimer laser beam, an ArF excimer laser beam, an electron beam, or an extreme ultraviolet ray having a wavelength of 3 to 15 nm.

Such a patterning process is suitable for fine patterning.

Advantageous Effects of Invention

The inventive positive resist material has high sensitivity, high resolution, favorable pattern profile, edge roughness, and dimensional variation after exposure, as well as high effect of suppressing acid diffusion because it is possible to increase the efficiency of acid generator decomposition. Because of these excellent properties, the inventive positive resist material is quite highly practical and very useful as a material for forming fine patterns particularly for manufacturing very LSI circuits or for photomask in EB drawing, or as a material for forming patterns for EB or EUV exposure. The inventive positive resist material is applicable to not only lithography in forming, for example, semiconductor circuits, but also formations of mask circuit patterns, micromachines, and thin-film magnetic head circuits.

DESCRIPTION OF EMBODIMENTS

As noted above, there have been demands for the development of a positive resist material and a patterning process which result in higher sensitivity and smaller dimensional variation than conventional positive resist materials.

In the repeating unit incorporated in the base polymer of the inventive positive resist material, tertiary carbon atoms attached to a triple bond or double bond have appropriate carbocation stability because of electron-attracting effect by the two ester groups. Incidentally, when one of tertiary ester bonds is cleaved, the electron-attracting group is lost, so that the deprotection reaction of the other tertiary ester group progresses very fast. To put it differently, if one is deprotected, the other deprotection reaction simultaneously proceeds rapidly. It appears as if the two acid labile groups are deprotected simultaneously. Since these acid labile groups are intermolecularly linked, the molecular weight is decreased by the deprotection reaction, so that the dissolution contrast is also enhanced.

Meanwhile, the acid diffusion rate is mainly governed by the progress of the first deprotection reaction. The activation energies of a 2-phenyl-2-propanol ester compound and a tertiary ester compound having a double bond or triple bond are so low that the both rates of deprotection reaction and acid diffusion are fast and it is difficult to control these. As to the acid labile groups of the present invention, the first deprotection reaction rate and acid diffusion rate of one of the ester groups are not so fast, enabling the acid diffusion control. Hence, the largest contrast can be obtained with minimum acid diffusion.

The present inventors have earnestly studied to obtain a positive resist material having high resolution and small edge roughness and dimensional variation as recently demanded. Consequently, the inventors have found the following. It is important to reduce the acid diffusion distance as short as possible. In this event, the sensitivity is decreased, and simultaneously the dissolution contrast is decreased. These bring about a problem of lowered resolution of two-dimensional pattern, such as hole pattern. Nevertheless, the inventors have also found that when a polymer containing a repeating unit having two carboxyl groups whose hydrogen atoms are substituted by two tertiary carbon atoms each bonded to a double bond or triple bond is used as a base polymer, it is possible to enhance the dissolution contrast and suppress the acid diffusion distance to the minimum simultaneously. Particularly, it has been found that this polymer is quite effectively used as a base polymer of a chemically amplified positive resist material.

Specifically, the present invention is a positive resist material comprising:

an acid generator; and a base polymer comprising a repeating unit comprising two carboxyl groups whose hydrogen atoms are substituted with two tertiary carbon atoms each bonded to a double bond or triple bond, wherein the repeating unit comprising two carboxyl groups whose hydrogen atoms are substituted with two tertiary carbon atoms each bonded to a double bond or triple bond is a repeating unit-a in the following formula (1), (1)

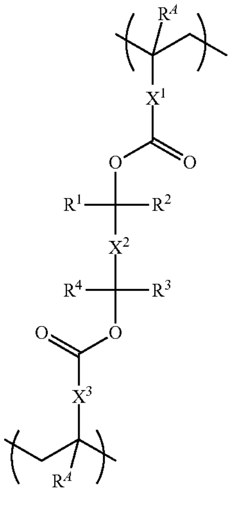

(a)

wherein $R^A$'s are identical to or different from each other and each represent a hydrogen atom or a methyl group; $X^1$ and $X^3$ each represent a single bond, a phenylene group, or a linking group having 1 to 12 carbon atoms containing at least one selected from the group consisting of an ester bond, an ether bond, and a lactone ring, or represents the following formula (1'); $R^1$ to $R^4$ each represent a linear, branched, or cyclic alkyl group having 1 to 8 carbon atoms, and $R^1$ and $R^2$, or $R^3$ and $R^4$, are optionally bonded to each other to form a ring; and $X^2$ represents a vinylene group or an ethynylene group, (1')

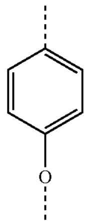

wherein an oxygen atom in the formula (1') is not bonded to a carbon atom of a carboxyl group in the formula (1); and each broken line represents a bonding arm.

Hereinafter, the present invention will be described in detail, but the present invention is not limited thereto.

[Positive Resist Material]

The inventive positive resist material contains an acid generator, and a base polymer containing a repeating unit having two carboxyl groups whose hydrogen atoms are substituted with two tertiary carbon atoms each bonded to a double bond or triple bond (hereinafter also referred to as repeating unit-a). The repeating unit having two carboxyl groups whose hydrogen atoms are substituted with two tertiary carbon atoms each bonded to a double bond or triple bond exhibits high dissolution contrast. Thus, when a base polymer containing the repeating unit-a is used, a resist film having high dissolution contrast is obtained. Incidentally, a tertiary hydrocarbyl group means a group obtained by removing a hydrogen atom from a tertiary carbon atom of a hydrocarbon.

[Base Polymer]

The base polymer contained in the inventive positive resist material may contain other repeating unit(s) than the repeating unit-a. Hereinafter, such repeating units will be described in detail.

[Repeating Unit-a]

The repeating unit-a is shown by the following formula (a).

(1)

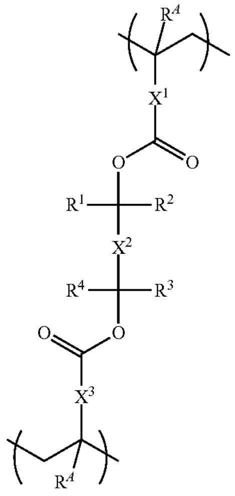

(a)

In the formula, $R^A$'s are identical to or different from each other and each represent a hydrogen atom or a methyl group. $X^1$ and $X^3$ each represent a single bond, a phenylene group, or a linking group having 1 to 12 carbon atoms containing at least one selected from the group consisting of an ester bond, an ether bond, and a lactone ring, or represents the following formula (1'). $R^1$ to $R^4$ each represent a linear, branched, or cyclic alkyl group having 1 to 8 carbon atoms, and $R^1$ and $R^2$, or $R^3$ and $R^4$, are optionally bonded to each other to form a ring. $X^2$ represents a vinylene group or an ethynylene group.

(1')

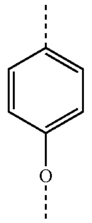

In the formula, an oxygen atom is not bonded to a carbon atom of a carboxyl group in the formula (1). Each broken line represents a bonding arm.

In the formula (a), $R^A$ is a hydrogen atom or a methyl group. $X^1$ and $X^3$ are each a single bond, a phenylene group, or a linking group having 1 to 12 carbon atoms containing at least one selected from the group consisting of an ester bond, an ether bond, and a lactone ring, but exclude the formula (1') in a certain orientation.

Each of $R^1$ to $R^4$ is a linear, branched, or cyclic alkyl group having 1 to 8 carbon atoms. $R^1$ and $R^2$, or $R^3$ and $R^4$, may bond with each other to form a ring. $X^2$ is a vinylene group or an ethynylene group.

Specific examples of $R^1$ to $R^4$ include alkyl groups, such as a methyl group, an ethyl group, a propyl group, an isopropyl group, an n-butyl group, an isobutyl group, a sec-butyl group, a tert-butyl group, an n-pentyl group, a neopentyl group, and an n-hexyl group.

Examples of a monomer to give the repeating unit-a include ones shown below, but are not limited thereto.

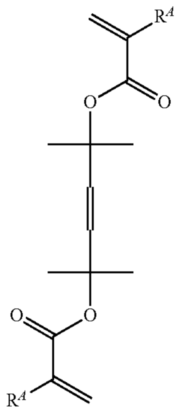
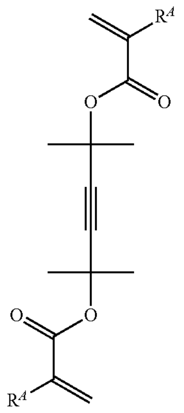
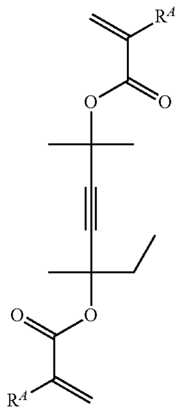

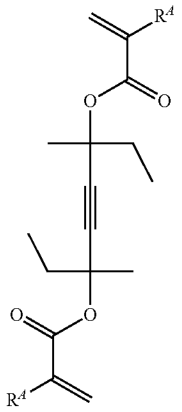
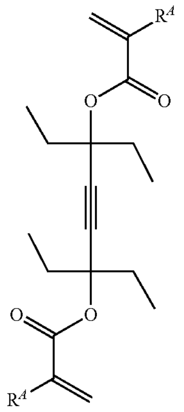
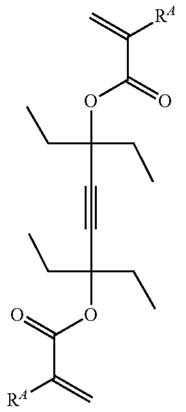

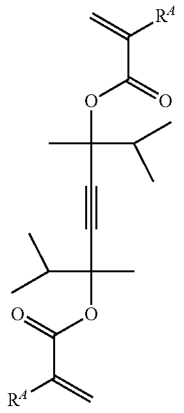
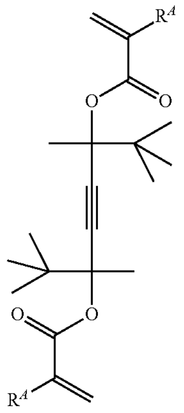

-continued
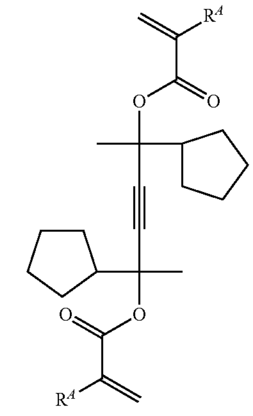
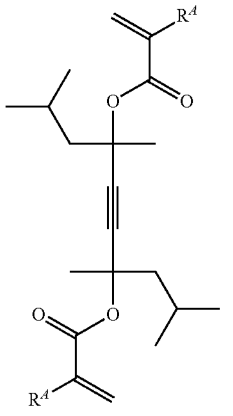
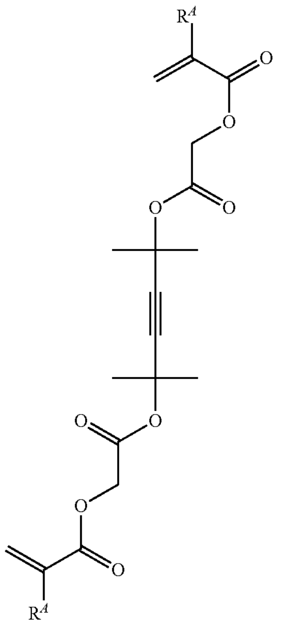
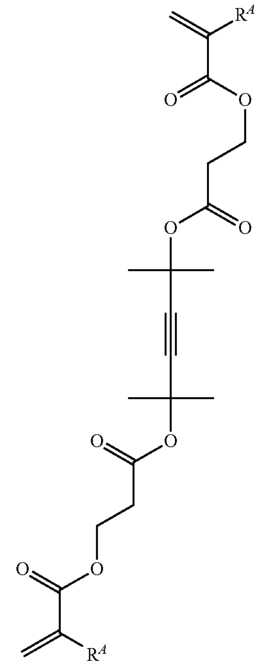
-continued
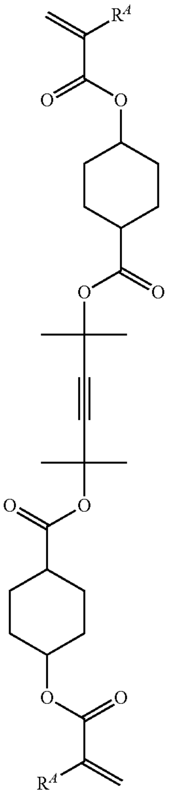
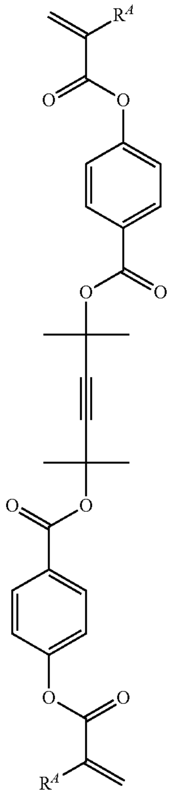
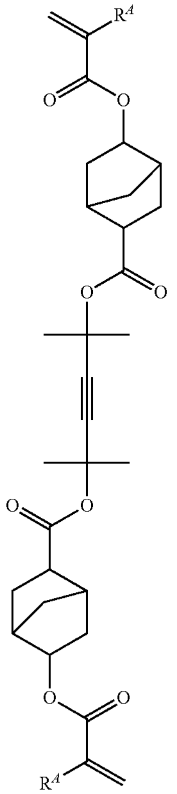
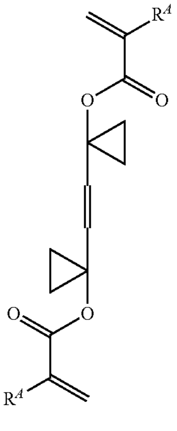
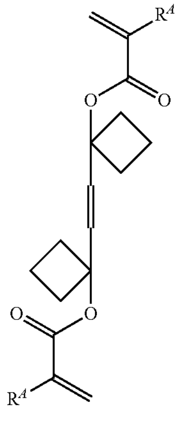
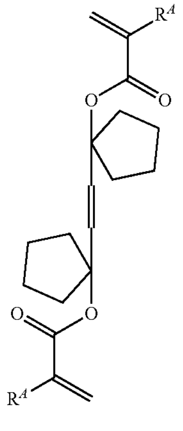

-continued

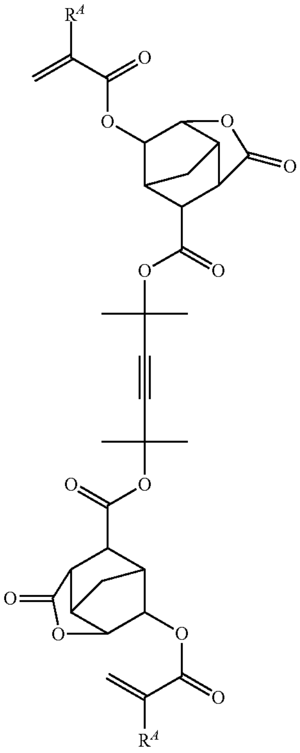

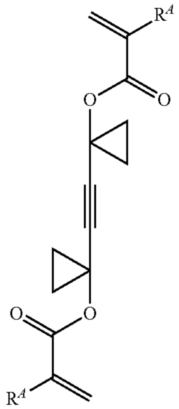

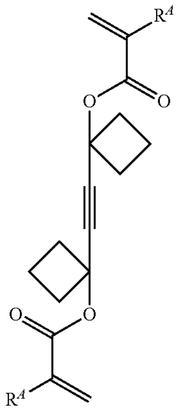

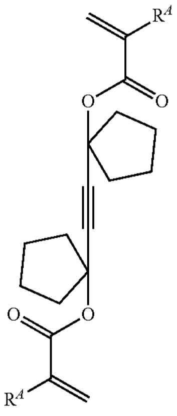

-continued

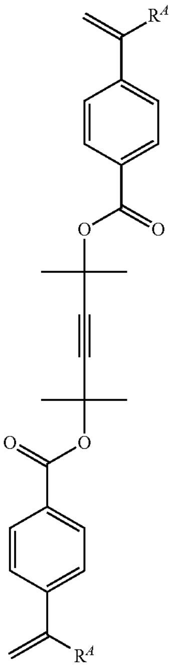

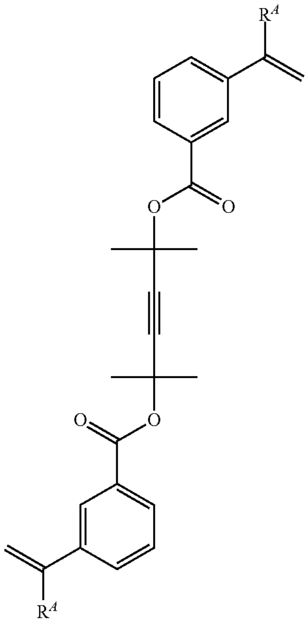

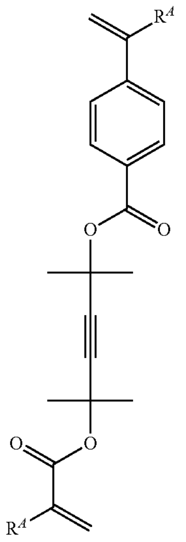

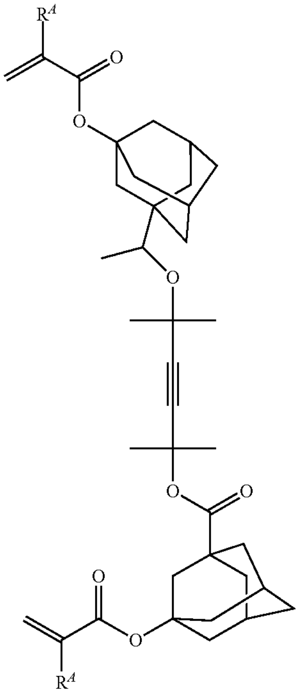

$R^A$ is as defined above.

[Repeating Units-b1, -b2]

In the present invention, the repeating unit-a having acid labile groups as shown by the formula (a) is essential. The base polymer can further contain at least one selected from the group consisting of a repeating unit-b1 containing a carboxyl group whose hydrogen atom is substituted with a first acid labile group different from the two tertiary carbon atoms each bonded to a double bond or triple bond, and a repeating unit-b2 containing a phenolic hydroxy group whose hydrogen atom is substituted with a second acid labile group. Preferably, the repeating unit-b1 having the substituted first acid labile group is a repeating unit shown by the following formula (b1), and the repeating unit-b2 having the substituted second acid labile group is a repeating unit shown by the following formula (b2).

(b1)

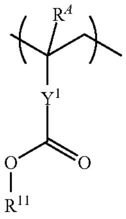

(b2)

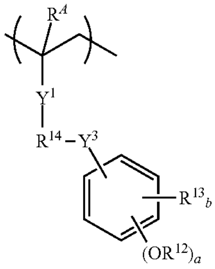

In the formulae, each $R^A$ independently represents a hydrogen atom or a methyl group. $Y^1$ represents a single bond, a phenylene group, a naphthylene group, or a linking group having 1 to 14 carbon atoms containing at least one selected from the group consisting of an ester bond, an ether bond, and a lactone ring. $Y^2$ represents a single bond, an ester bond, or an amide bond. $Y^3$ represents a single bond, an ether bond, or an ester bond. $R^{11}$ represents the first acid labile group that is different from the two tertiary carbon atoms each bonded to a double bond or triple bond. $R^{12}$ represents the second acid labile group. $R^{13}$ represents a fluorine atom, a trifluoromethyl group, a cyano group, or a saturated hydrocarbyl group having 1 to 6 carbon atoms. $R^{14}$ represents a single bond or an alkanediyl group having 1 to 6 carbon atoms, and some of the carbon atoms are optionally substituted with an ether bond or an ester bond. "a" represents 1 or 2, and "b" represents an integer of 0 to 4, with $1 \leq a+b \leq 5$.

In the formula (b1) and (b2), $R^A$'s are each independently a hydrogen atom or a methyl group. $Y^1$ is a single bond, a phenylene group, a naphthylene group, or a linking group having 1 to 14 carbon atoms and containing at least one selected from the group consisting of an ester bond, an ether bond, and a lactone ring. $Y^2$ is a single bond, an ester bond, or an amide bond. $Y^3$ is a single bond, an ether bond, or an ester bond. $R^{11}$ is a first acid labile group different from the two tertiary carbon atoms each bonded to a double bond or triple bond. $R^{12}$ is a second acid labile group. $R^{13}$ is a fluorine atom, a trifluoromethyl group, a cyano group, or a saturated hydrocarbyl group having 1 to 6 carbon atoms. $R^{14}$ is a single bond or an alkanediyl group having 1 to 6 carbon atoms some of which are optionally substituted with an ether bond or an ester bond. "a" is 1 or 2, and "b" is an integer of 0 to 4, but $1 \leq a+b \leq 5$ is satisfied.

Examples of a monomer to give the repeating unit-b1 include ones shown below, but are not limited thereto. Note that, in the following formulae, $R^A$ and $R^{11}$ are as defined above.

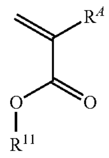
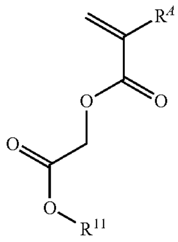
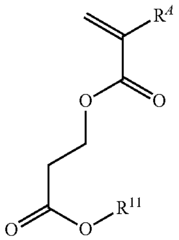
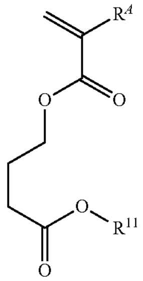
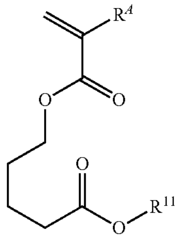
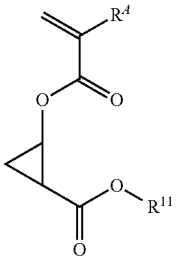
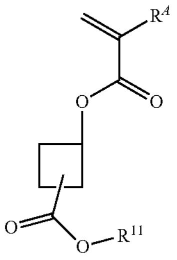
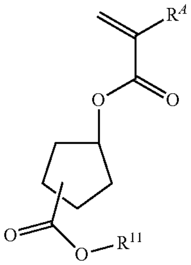
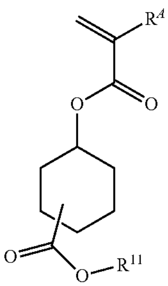
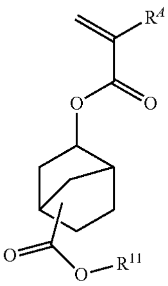
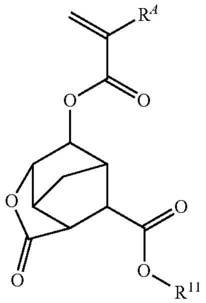
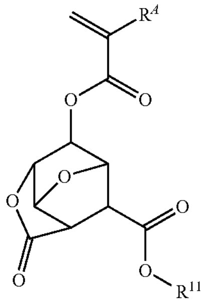
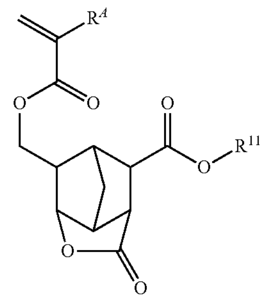

-continued
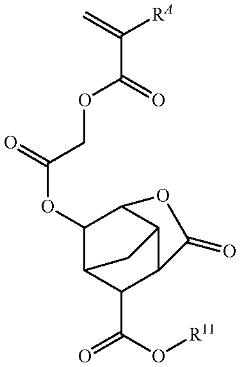
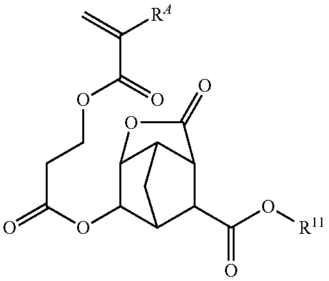
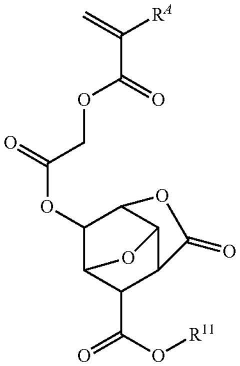
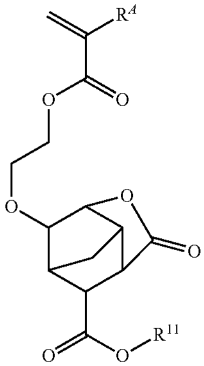
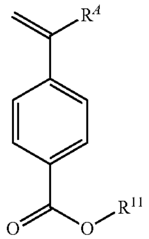
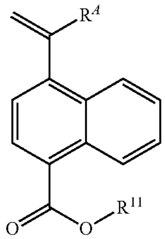
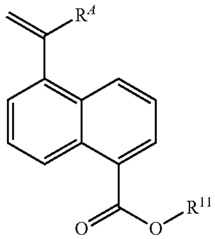
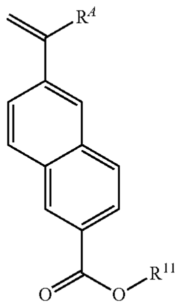
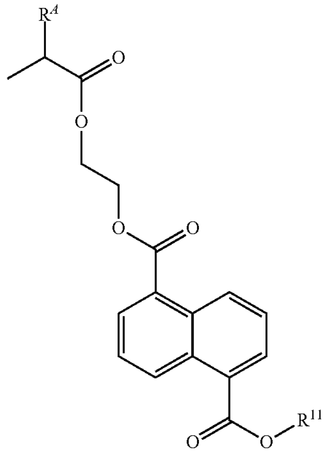
-continued
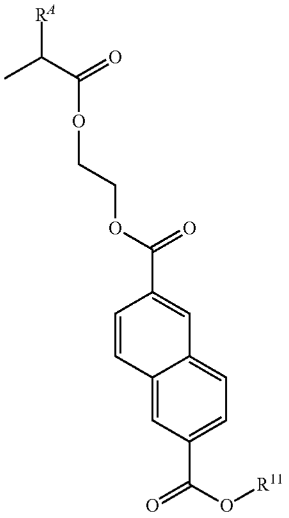
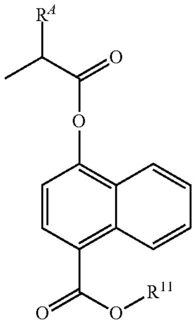
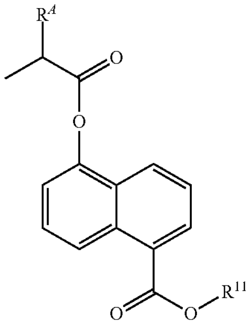
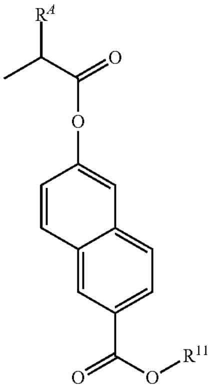
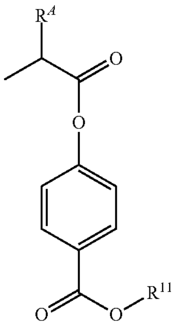
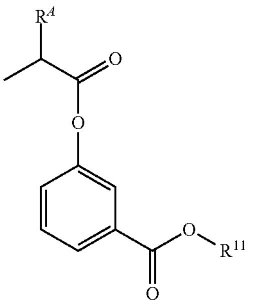
Examples of a monomer to give the repeating unit-b2 include ones shown below, but are not limited thereto. Note that, in the following formulae, $R^A$ and $R^{12}$ are as defined above.
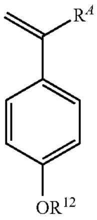
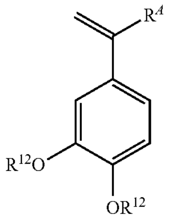
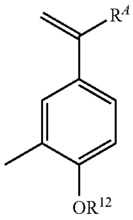

-continued

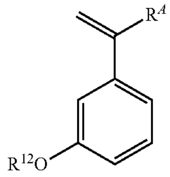

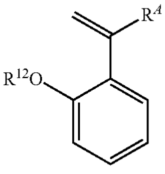

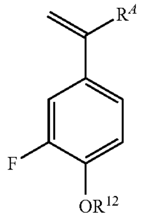

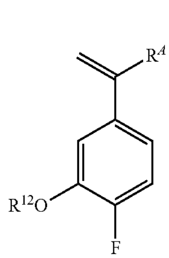

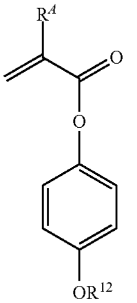

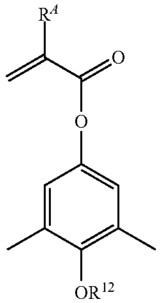

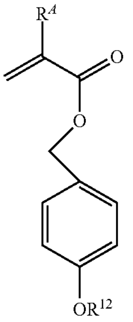

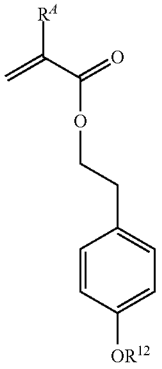

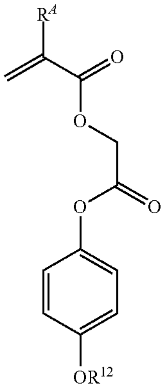

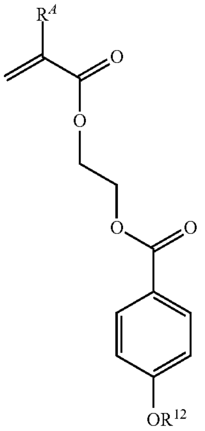

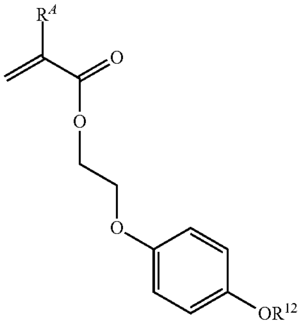

Various acid labile groups shown by $R^{11}$ or $R^{12}$ can be selected. Examples thereof include ones shown by the following formulae (AL-1) to (AL-3).

(AL-1)

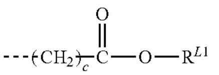

-continued (AL-2)

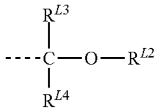

(AL-3)

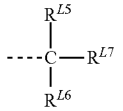

In the formula (AL-1), "c" represents an integer of 0 to 6. $R^{L1}$ represents: a tertiary hydrocarbyl group having 4 to 61 carbon atoms, preferably 4 to 15 carbon atoms; a trihydrocarbylsilyl group in which hydrocarbyl groups are each a saturated hydrocarbyl group having 1 to 6 carbon atoms; a saturated hydrocarbyl group having 4 to 20 carbon atoms containing a carbonyl group, an ether bond, or an ester bond; or a group shown by the formula (AL-3).

The tertiary hydrocarbyl group shown by $R^{L1}$ may be saturated or unsaturated, and may be branched or cyclic. Specific examples thereof include a tert-butyl group, a tert-pentyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, etc. Examples of the trihydrocarbylsilyl group include a trimethylsilyl group, a triethylsilyl group, a dimethyl-tert-butylsilyl group, etc. The saturated hydrocarbyl group containing a carbonyl group, an ether bond, or an ester bond may be linear, branched, or cyclic, and is preferably cyclic. Specific examples thereof include a 3-oxocyclohexyl group, a 4-methyl-2-oxooxan-4-yl group, a 5-methyl-2-oxooxolan-5-yl group, a 2-tetrahydropyranyl group, a 2-tetrahydrofuranyl group, etc.

Examples of the acid labile group shown by the formula (AL-1) include a tert-butoxycarbonyl group, a tert-butoxycarbonylmethyl group, a tert-pentyloxycarbonyl group, a tert-pentyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, a 2-tetrahydrofuranyloxycarbonylmethyl group, etc.

Other Examples of the acid labile group shown by the formula (AL-1) include groups shown by the following formulae (AL-1)-1 to (AL-1)-10.

(AL-1)-1

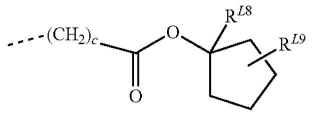

(AL-1)-2

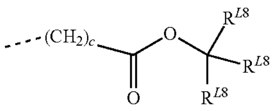

(AL-1)-3

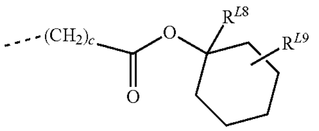

-continued (AL-1)-4

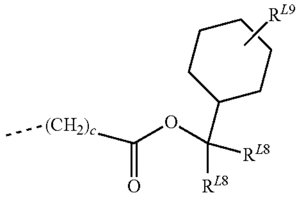

(AL-1)-5

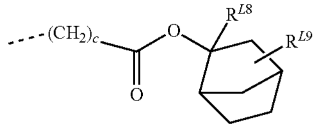

(AL-1)-6

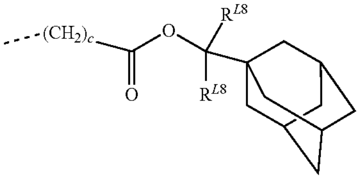

(AL-1)-7

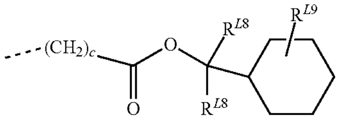

(AL-1)-8

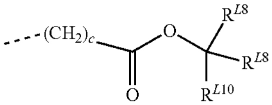

(AL-1)-9

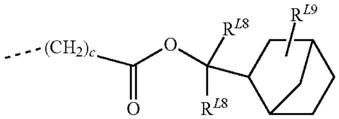

(AL-1)-10

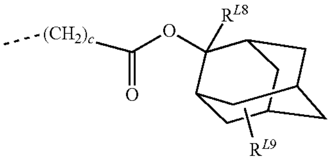

In the formulae, each broken line represents a bonding arm.

In the formulae (AL-1)-1 to (AL-1)-10, "c" is as defined above. Each $R^{L8}$ independently represents a saturated hydrocarbyl group having 1 to 10 carbon atoms or an aryl group having 6 to 20 carbon atoms. $R^{L9}$ represents a hydrogen atom or a saturated hydrocarbyl group having 1 to 10 carbon atoms. $R^{L10}$ represents a saturated hydrocarbyl group having 2 to 10 carbon atoms or an aryl group having 6 to 20 carbon atoms. The saturated hydrocarbyl groups may be linear, branched, or cyclic.

In the formula (AL-2), $R^{L3}$ and $R^{L4}$ each independently represent a hydrogen atom or a saturated hydrocarbyl group having 1 to 18 carbon atoms, preferably 1 to 10 carbon atoms. The saturated hydrocarbyl group may be linear, branched, or cyclic. Specific examples thereof include a methyl group, an ethyl group, a propyl group, an isopropyl group, an n-butyl group, a sec-butyl group, a tert-butyl group, a cyclopentyl group, a cyclohexyl group, a 2-ethylhexyl group, an n-octyl group, etc.

In the formula (AL-2), $R^{L2}$ represents a hydrocarbyl group having 1 to 18 carbon atoms, preferably 1 to 10 carbon atoms, and optionally contains a heteroatom. The hydrocarbyl group may be saturated or unsaturated, and may be linear, branched, or cyclic. Examples of the hydrocarbyl group include saturated hydrocarbyl groups each having 1 to 18 carbon atoms, etc., and some of hydrogen atoms thereof may be substituted with a hydroxy group, an alkoxy group, an oxo group, an amino group, an alkylamino group, or the like. Examples of such substituted saturated hydrocarbyl groups include ones shown below, etc.

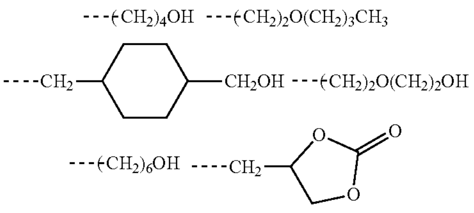

In the formulae, each broken line represents a bonding arm.

$R^{L2}$ and $R^{L3}$, $R^{L2}$ and $R^{L4}$, or $R^{L3}$ and $R^{L4}$, optionally bond with each other to form a ring together with a carbon atom bonded therewith, or together with the carbon atom and an oxygen atom. In this case, $R^{L2}$ and $R^{L3}$, $R^{L2}$ and $R^{L4}$, or $R^{L3}$ and $R^{L4}$, involved in the ring formation each independently represent an alkanediyl group having 1 to 18 carbon atoms, preferably 1 to 10 carbon atoms. The number of carbon atoms in the ring obtained by bonding these is preferably 3 to 10, more preferably 4 to 10.

Examples of the linear and branched acid labile groups shown by the formula (AL-2) include ones shown by the following formulae (AL-2)-1 to (AL-2)-69, but are not limited thereto. Note that, in the following formulae, each broken line represents a bonding arm.

$----CH_2-O-CH_3$ (AL-2)-1

$----CH_2-O-CH_2-CH_3$ (AL-2)-2

$----CH_2-O-(CH_2)_2-CH_3$ (AL-2)-3

$----CH_2-O-(CH_2)_3-CH_3$ (AL-2)-4

(AL-2)-5

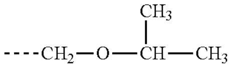

(AL-2)-6

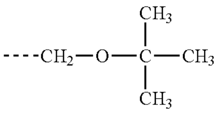

(AL-2)-7

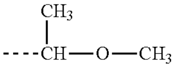

(AL-2)-8

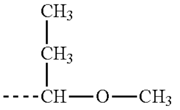

(AL-2)-9

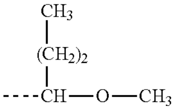

-continued
(AL-2)-10
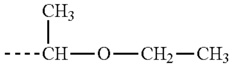
(AL-2)-11
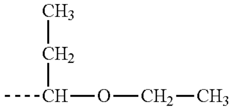
(AL-2)-12
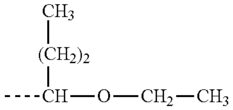
(AL-2)-13
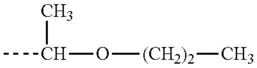
(AL-2)-14
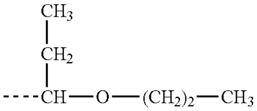
(AL-2)-15
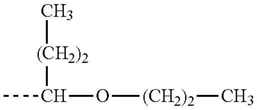
(AL-2)-16
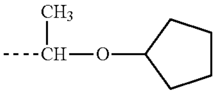
(AL-2)-17
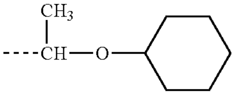
(AL-2)-18
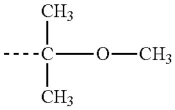
(AL-2)-19
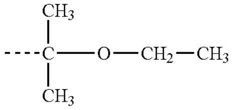
(AL-2)-20
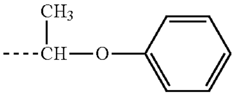
(AL-2)-21
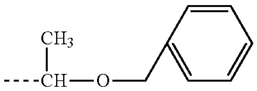
(AL-2)-22
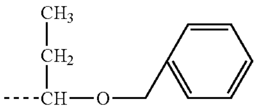
(AL-2)-23
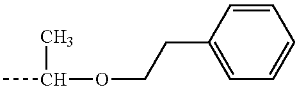
-continued
(AL-2)-24
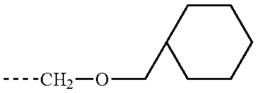
(AL-2)-25
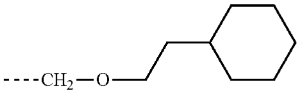
(AL-2)-26
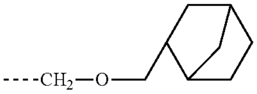
(AL-2)-27
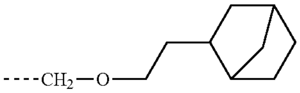
(AL-2)-28
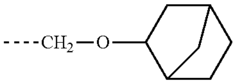
(AL-2)-29
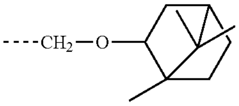
(AL-2)-30
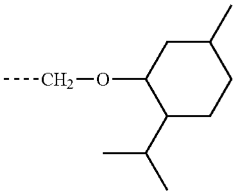
(AL-2)-31
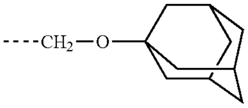
(AL-2)-32
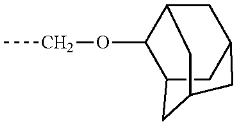
(AL-2)-33
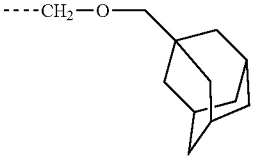
(AL-2)-34
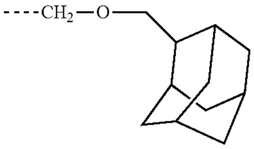

-continued
(AL-2)-35
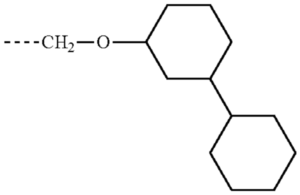
(AL-2)-36
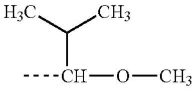
(AL-2)-37
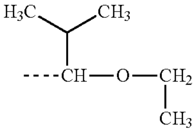
(AL-2)-38
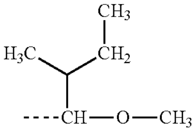
(AL-2)-39
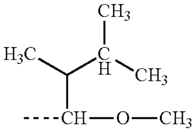
(AL-2)-40
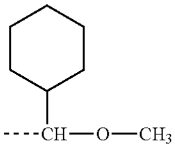
(AL-2)-41
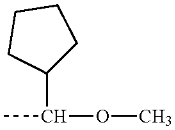
(AL-2)-42
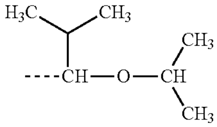
(AL-2)-43
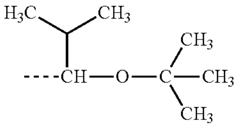
(AL-2)-44
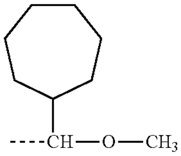
-continued
(AL-2)-45
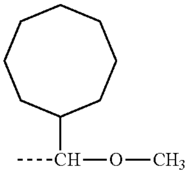
(AL-2)-46
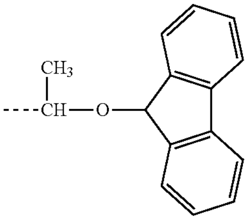
(AL-2)-47
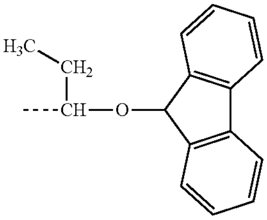
(AL-2)-48
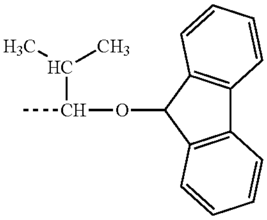
(AL-2)-49
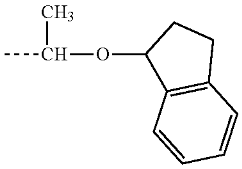
(AL-2)-50
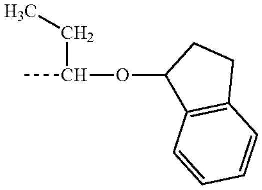
(AL-2)-51
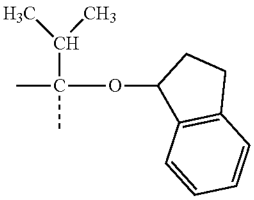

-continued
(AL-2)-52
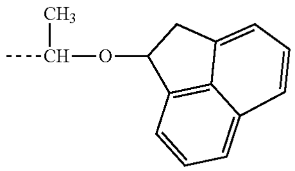
(AL-2)-53
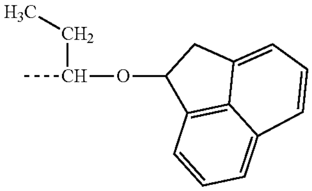
(AL-2)-54
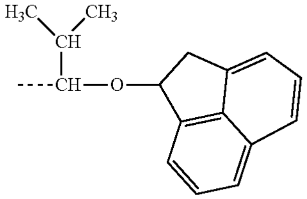
(AL-2)-55
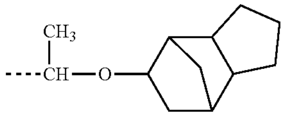
(AL-2)-56
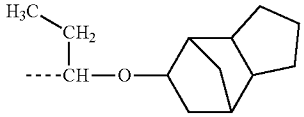
(AL-2)-57
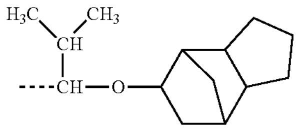
(AL-2)-58
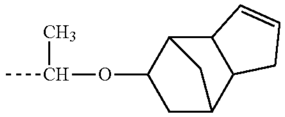
(AL-2)-59
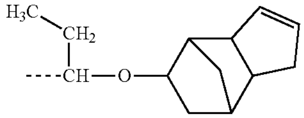
(AL-2)-60
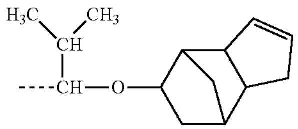
(AL-2)-61
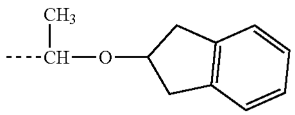
-continued
(AL-2)-62
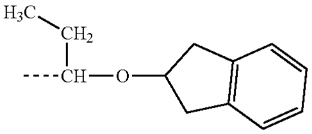
(AL-2)-63
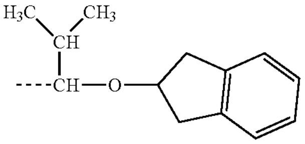
(AL-2)-64
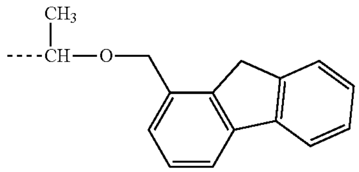
(AL-2)-65
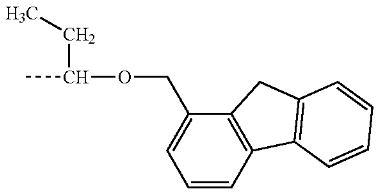
(AL-2)-66
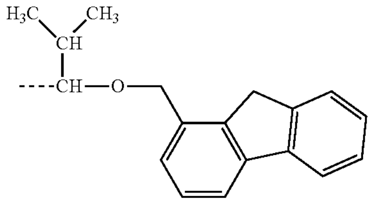
(AL-2)-67
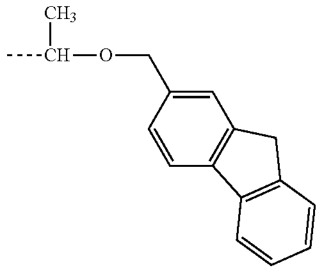
(AL-2)-68
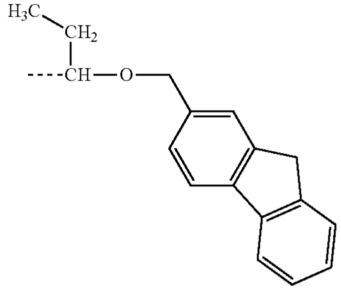

-continued (AL-2)-69

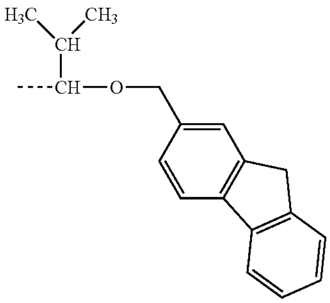

Examples of the cyclic acid labile group shown by the formula (AL-2) include a tetrahydrofuran-2-yl group, a 2-methyltetrahydrofuran-2-yl group, a tetrahydropyran-2-yl group, a 2-methyltetrahydropyran-2-yl group, etc.

In addition, the examples of the acid labile groups include groups shown by the following formula (AL-2a) or (AL-2b). The acid labile group may crosslink the base polymer intermolecularly or intramolecularly.

(AL-2a)

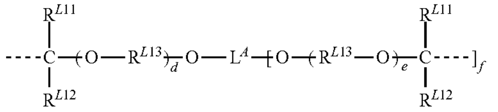

(AL-2b)

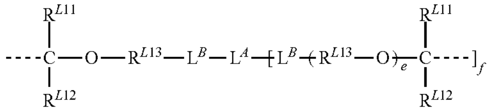

In the formulae, each broken line represents a bonding arm.

In the formulae (AL-2a) and (AL-2b), $R^{L11}$ and $R^{L12}$ each independently represent a hydrogen atom or a saturated hydrocarbyl group having 1 to 8 carbon atoms. The saturated hydrocarbyl group may be linear, branched, or cyclic. Alternatively, $R^{L11}$ and $R^{L12}$ may bond with each other to form a ring together with a carbon atom bonded therewith. In this case, $R^{L13}$ and $R^{L12}$ each independently represent an alkanediyl group having 1 to 8 carbon atoms. Each $R^{L13}$ independently represents a saturated hydrocarbylene group having 1 to 10 carbon atoms. The saturated hydrocarbylene group may be linear, branched, or cyclic. "d" and "e" each independently represent an integer of 0 to 10, preferably an integer of 0 to 5. "f" represents an integer of 1 to 7, preferably an integer of 1 to 3.

In the formulae (AL-2a) or (AL-2b), $L^A$ represents an aliphatic saturated hydrocarbon group having a valency of (f+1) with 1 to 50 carbon atoms, an alicyclic saturated hydrocarbon group having a valency of (f+1) with 3 to 50 carbon atoms, an aromatic hydrocarbon group having a valency of (f+1) with 6 to 50 carbon atoms, or a heterocyclic group having a valency of (f+1) with 3 to 50 carbon atoms. Some of the carbon atoms of these groups may be substituted with a heteroatom-containing group, and some hydrogen atoms bonded to the carbon atoms of these groups may be substituted with a hydroxy group, a carboxyl group, an acyl group, or a fluorine atom. $L^A$ is preferably an arylene group having 6 to 30 carbon atoms, a saturated hydrocarbon group, such as a saturated hydrocarbylene group, a trivalent saturated hydrocarbon group, and a tetravalent saturated hydrocarbon group each of which have 1 to 20 carbon atoms, or the like. The saturated hydrocarbon groups may be linear, branched, or cyclic. $L^B$ represents —C(=O)—O—, —NH—C(=O)—O—, or —NH—C(=O)—NH—.

Examples of the crosslinking acetal groups shown by the formulae (AL-2a) and (AL-2b) include groups shown by the following formulae (AL-2)-70 to (AL-2)-77, etc.

(AL-2)-70

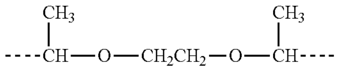

(AL-2)-71

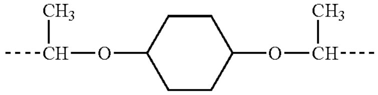

(AL-2)-72

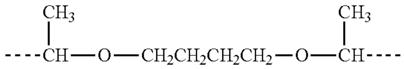

(AL-2)-73

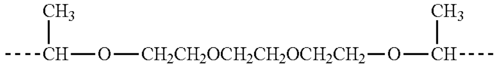

(AL-2)-74

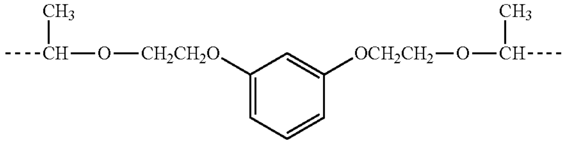

-continued (AL-2)-75

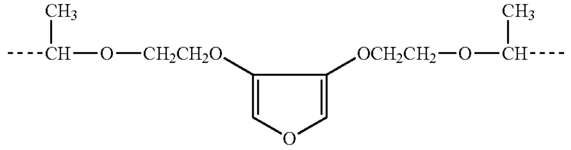

(AL-2)-76

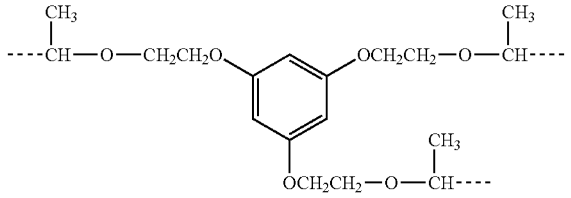

(AL-2)-77

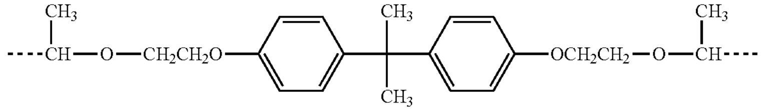

In the formulae, each broken line represents a bonding arm.

In the formula (AL-3), $R^{L5}$, $R^{L6}$, and $R^{L7}$ each independently represent a hydrocarbyl group having 1 to 20 carbon atoms, and optionally contain a heteroatom, such as an oxygen atom, a sulfur atom, a nitrogen atom, and a fluorine atom. The hydrocarbyl group may be saturated or unsaturated, and may be linear, branched, or cyclic. Specific examples thereof include alkyl groups having 1 to 20 carbon atoms, cyclic saturated hydrocarbyl groups having 3 to 20 carbon atoms, alkenyl groups having 2 to 20 carbon atoms, cyclic unsaturated hydrocarbyl groups having 3 to 20 carbon atoms, aryl groups having 6 to 10 carbon atoms, etc. Alternatively, $R^{L5}$ and $R^{L6}$, $R^{L5}$ and $R^{L7}$, or $R^{L6}$ and $R^{L7}$, may bond with each other to form an alicyclic group having 3 to 20 carbon atoms, together with a carbon atom bonded therewith.

Examples of the group shown by the formula (AL-3) include a tert-butyl group, a 1,1-diethylpropyl group, a 1-ethylnorbornyl group, a 1-methylcyclopentyl group, a 1-isopropylcyclopentyl group, a 1-ethylcyclopentyl group, a 1-methylcyclohexyl group, a 2-(2-methyl)adamantyl group, a 2-(2-ethyl)adamantyl group, a tert-pentyl group, etc.

The examples of the group shown by the formula (AL-3) also include groups shown by the following formulae (AL-3)-1 to (AL-3)-19.

(AL-3)-1

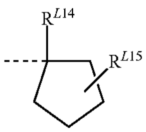

(AL-3)-2

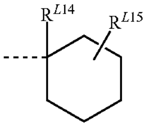

(AL-3)-3

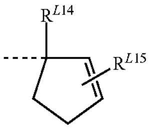

-continued (AL-3)-4

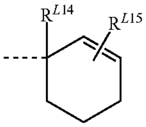

(AL-3)-5

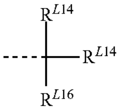

(AL-3)-6

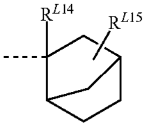

(AL-3)-7

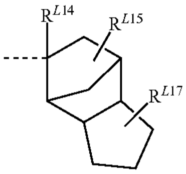

(AL-3)-8

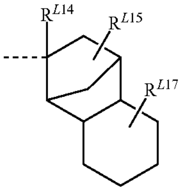

(AL-3)-9

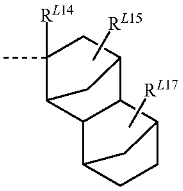

-continued (AL-3)-10

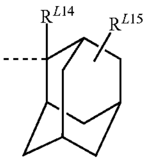

(AL-3)-11

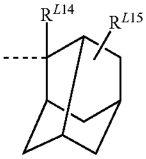

(AL-3)-12

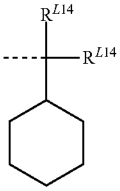

(AL-3)-13

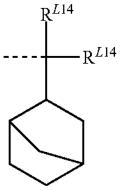

(AL-3)-14

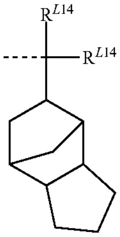

(AL-3)-15

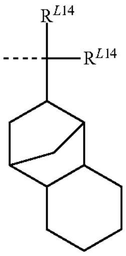

(AL-3)-16

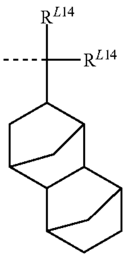

-continued (AL-3)-17

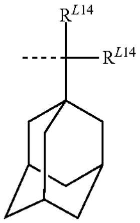

(AL-3)-18

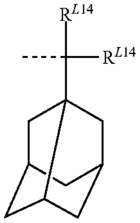

(AL-3)-19

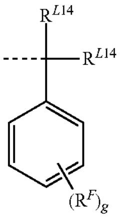

In the formulae, each broken line represents a bonding arm.

In the formulae (AL-3)-1 to (AL-3)-19, each $R^{L14}$ independently represents a saturated hydrocarbyl group having 1 to 8 carbon atoms, an unsaturated hydrocarbyl group having 2 to 8 carbon atoms, or an aryl group having 6 to 20 carbon atoms. $R^{L15}$ and $R^{L17}$ each independently represent a hydrogen atom or a saturated hydrocarbyl group having 1 to 20 carbon atoms. $R^{L16}$ represents an aryl group having 6 to 20 carbon atoms. The saturated hydrocarbyl groups may be linear, branched, or cyclic. The aryl groups are preferably a phenyl group or the like. RF represents a fluorine atom or a trifluoromethyl group. "g" represents an integer of 1 to 5.

Examples of the acid labile group further include groups shown by the following formula (AL-3)-20 or (AL-3)-21. The acid labile group may crosslink the polymer intramolecularly or intermolecularly.

(AL-3)-20

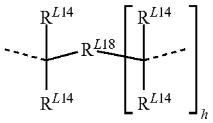

(AL-3)-21

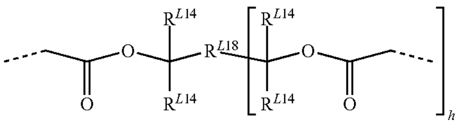

In the formulae, each broken line represents a bonding arm.

In the formulae (AL-3)-20 and (AL-3)-21, $R^{L14}$ is as defined above. $R^{L18}$ represents a saturated hydrocarbylene group having a valency of (h+1) with 1 to 20 carbon atoms, or an arylene group having a valency of (h+1) with 6 to 20 carbon atoms, and optionally contains a heteroatom, such as an oxygen atom, a sulfur atom, and a nitrogen atom. The saturated hydrocarbylene group may be linear, branched, or cyclic. "h" represents an integer of 1 to 3.

Examples of a monomer to give the repeating unit containing the acid labile group shown by the formula (AL-3) include (meth)acrylate having an exo-form structure shown by the following formula (AL-3)-22.

(AL-3)-22

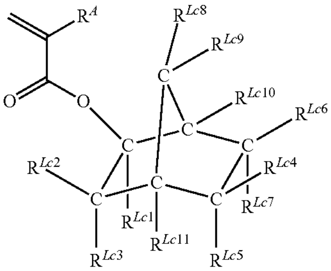

In the formula (AL-3)-22, $R^A$ is as defined above. $R^{Lc1}$ represents a saturated hydrocarbyl group having 1 to 8 carbon atoms, or an aryl group having 6 to 20 carbon atoms and optionally containing a substituent. The saturated hydrocarbyl group may be linear, branched, or cyclic. $R^{Lc2}$ to $R^{Lc11}$ each independently represent a hydrogen atom, or a hydrocarbyl group having 1 to 15 carbon atoms and optionally containing a heteroatom. Examples of the heteroatom include oxygen atom etc. Examples of the hydrocarbyl group include alkyl groups having 1 to 15 carbon atoms, aryl groups having 6 to 15 carbon atoms, etc. $R^{Lc2}$ and $R^{Lc3}$, $R^{Lc4}$ and $R^{Lc6}$, $R^{Lc4}$ and $R^{Lc7}$, $R^{Lc5}$ and $R^{Lc7}$, $R^{Lc5}$ and $R^{Lc11}$, $R^{Lc6}$ and $R^{Lc10}$, $R^{Lc8}$ and $R^{Lc9}$, or $R^{Lc9}$ and $R^{Lc10}$, may bond with each other to form a ring together with a carbon atom bonded therewith. In this case, a group involved in the bonding is a hydrocarbylene group having 1 to 15 carbon atoms and optionally containing a heteroatom. Alternatively, $R^{Lc2}$ and $R^{Lc11}$, $R^{Lc8}$ and $R^{Lc11}$, or $R^{Lc4}$ and $R^{Lc6}$, all pairs of which are attached to carbon atoms next to each other, may directly bond with each other to form a double bond. Note that the formula also represents an enantiomer.

Examples of the monomer shown by the formula (AL-3)-22 to give the repeating unit include ones disclosed in JP 2000-327633A, etc. Specific examples thereof include ones shown below, but are not limited thereto. Note that, in the following formulae, $R^A$ is as defined above.

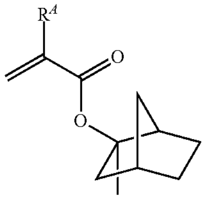
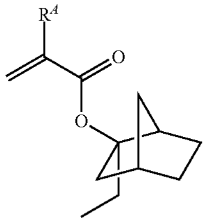
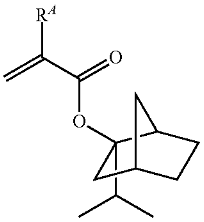
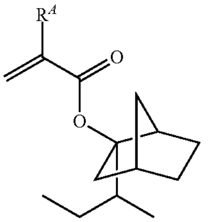

-continued

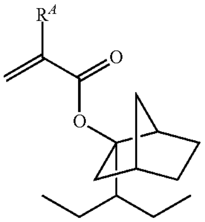
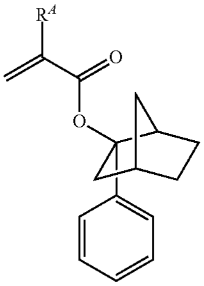
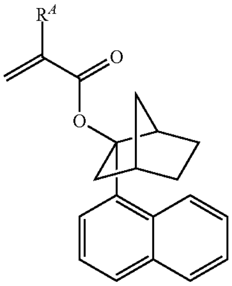
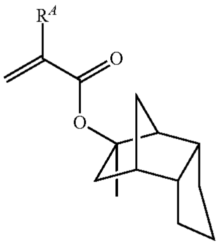
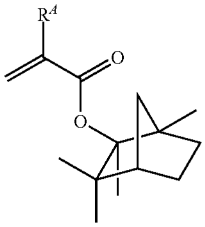
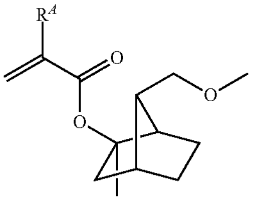
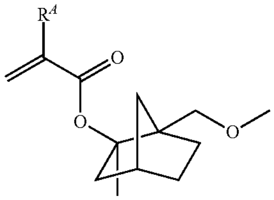
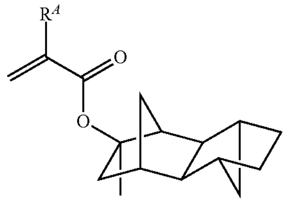
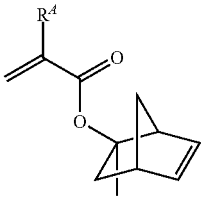
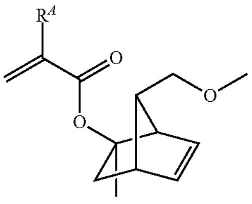
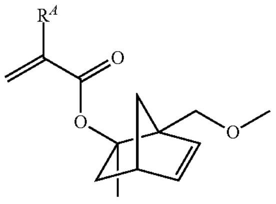
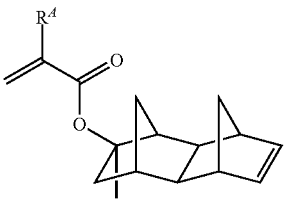

-continued

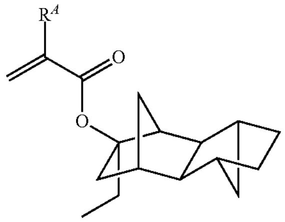
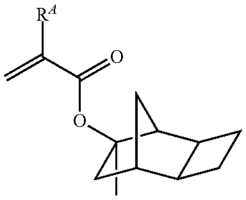
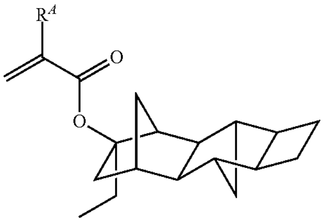

Other examples of the monomer to give the repeating unit containing the acid labile group shown by the formula (AL-3) include (meth)acrylate containing a furandiyl group, a tetrahydrofurandiyl group, or an oxanorbornanediyl group as shown by the following formula (AL-3)-23.

(AL-3)323

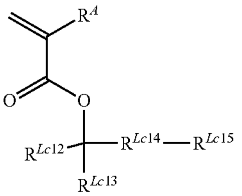

In the formula (AL-3)-23, $R^A$ is as defined above. $R^{Lc12}$ and $R^{Lc13}$ each independently represent a hydrocarbyl group having 1 to 10 carbon atoms. $R^{Lc12}$ and $R^{Lc13}$ may bond with each other to form an alicyclic group together with a carbon atom bonded therewith. $R^{Lc14}$ represents a furandiyl group, a tetrahydrofurandiyl group, or an oxanorbornanediyl group. $R^{Lc15}$ represents a hydrogen atom, or a hydrocarbyl group having 1 to 10 carbon atoms and optionally containing a heteroatom. The hydrocarbyl groups may be linear, branched, or cyclic. Specific examples thereof include a saturated hydrocarbyl group having 1 to 10 carbon atoms, etc.

Examples of the monomer shown by the formula (AL-3)-23 to give the repeating unit include, but are not limited to, ones shown below. Note that, in the following formulae, $R^A$ is as defined above, Ac represents an acetyl group, and Me represents a methyl group.

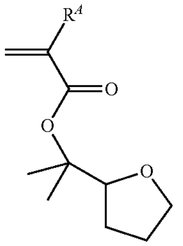
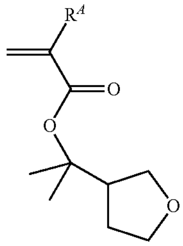
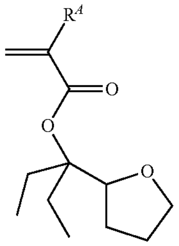

-continued

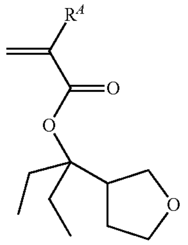
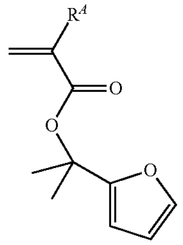
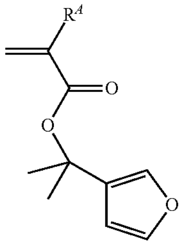
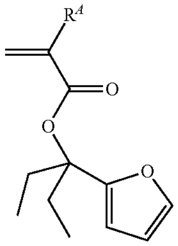
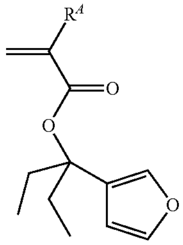
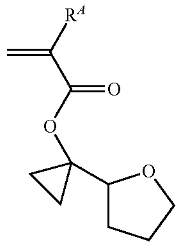
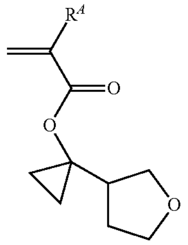
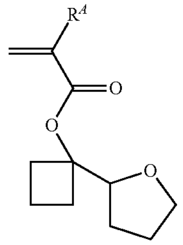
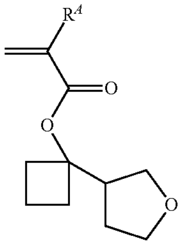
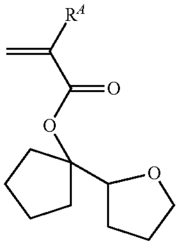
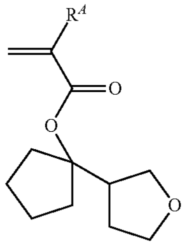
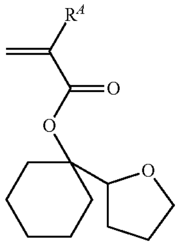
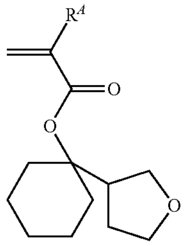
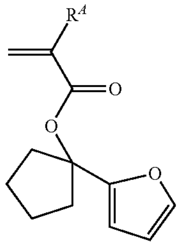
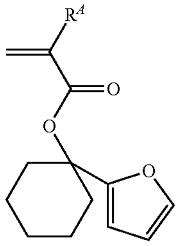
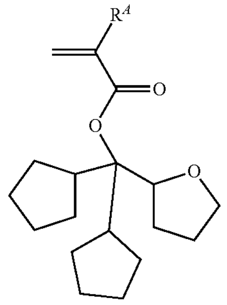
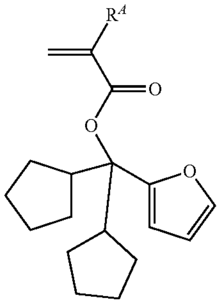

-continued
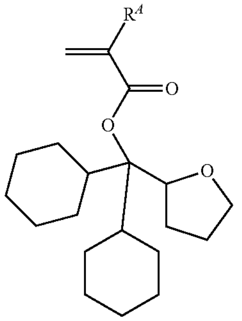
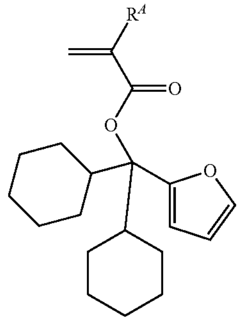
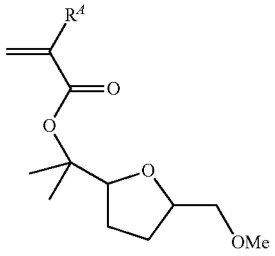
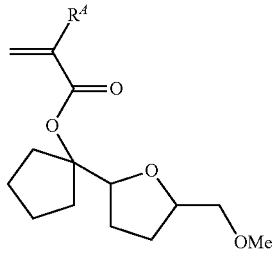
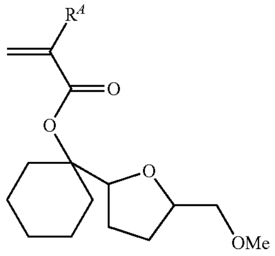
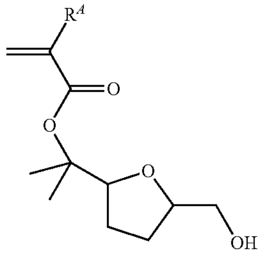
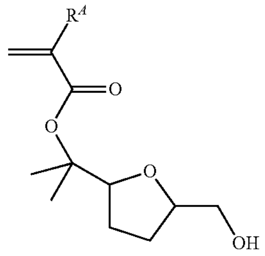
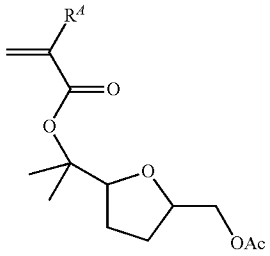
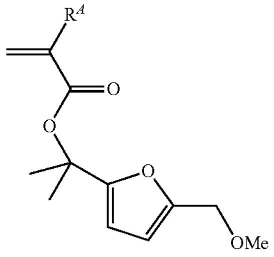
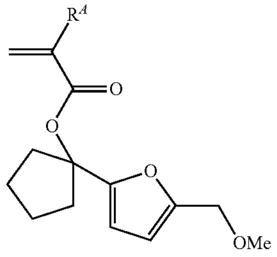
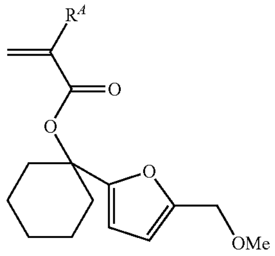
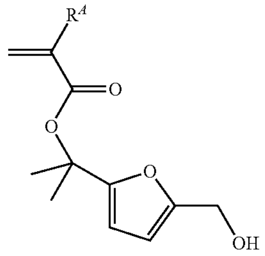
-continued
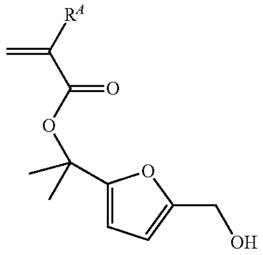
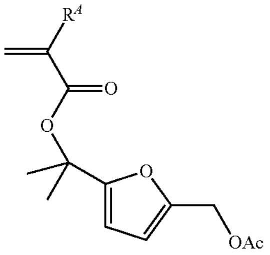
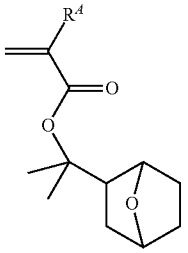
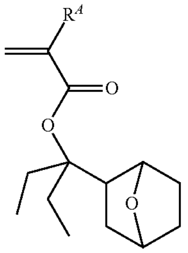
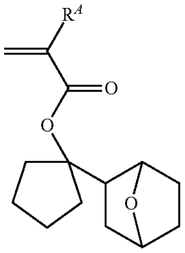
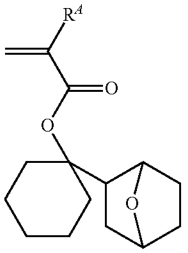
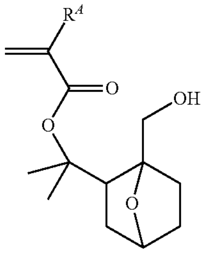
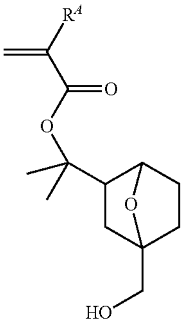
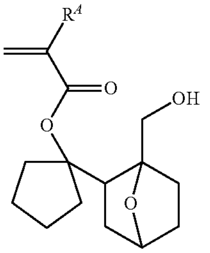
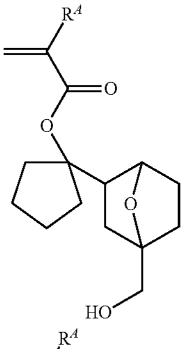
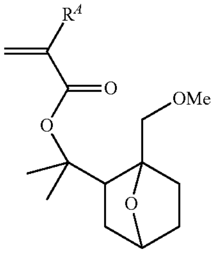
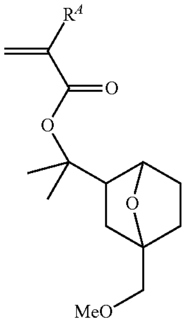
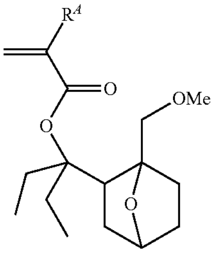

-continued

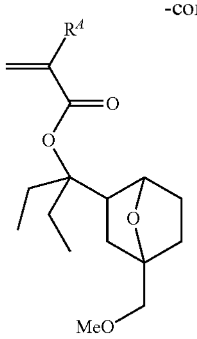
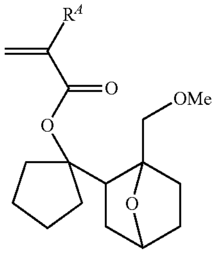
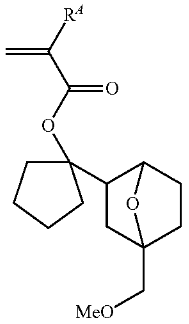
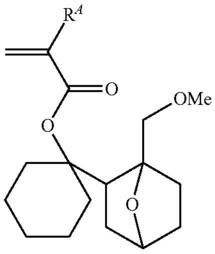
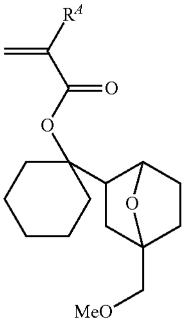
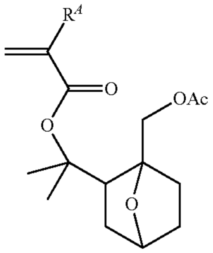
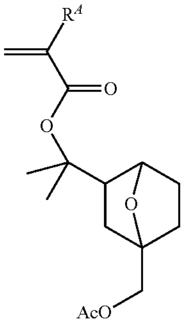
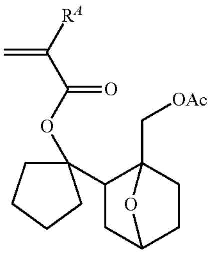
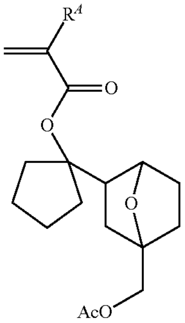

[Repeating Unit-c]

The base polymer may further contain a repeating unit-c containing an adhesive group selected from the group consisting of a hydroxy group, a carboxyl group, a lactone ring, a carbonate group, a thiocarbonate group, a carbonyl group, a cyclic acetal group, an ether bond, an ester bond, a sulfonic acid ester bond, a cyano group, an amide bond, —O—C(═O)—S—, and —O—C(═O)—NH—.

Examples of a monomer to give the repeating unit-c include ones shown below, but are not limited thereto. Note that, in the following formulae, $R^A$ is as defined above.

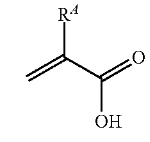
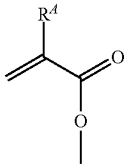
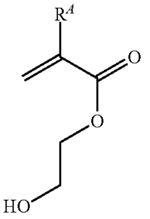
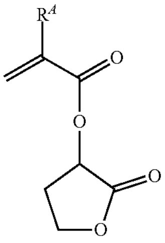
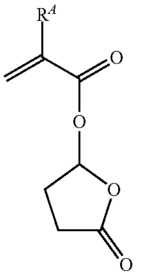
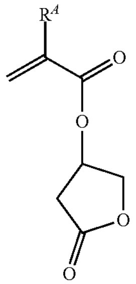
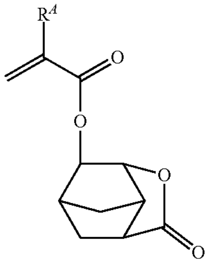
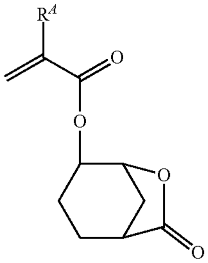
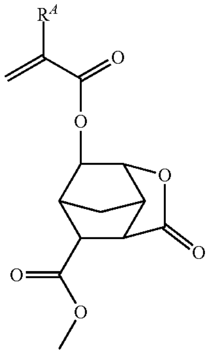
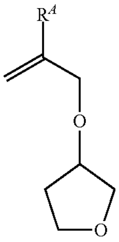
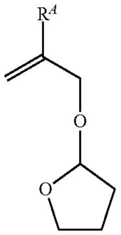
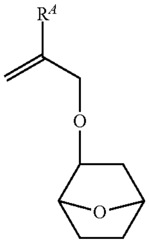
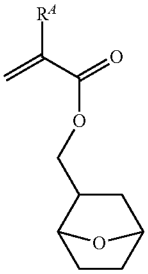

-continued
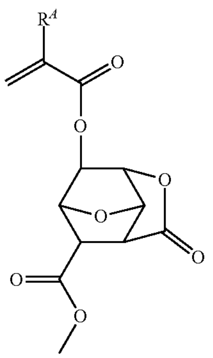
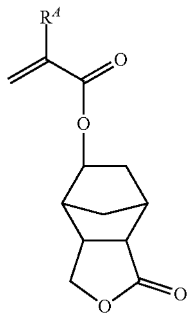
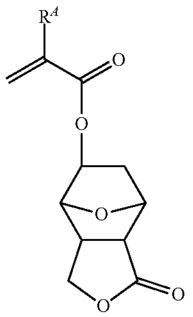
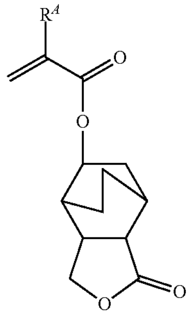
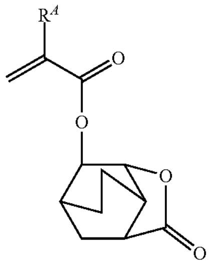
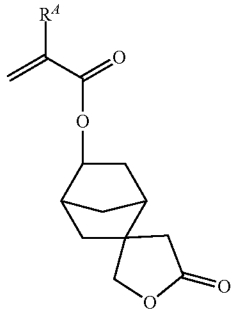
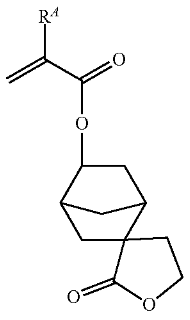
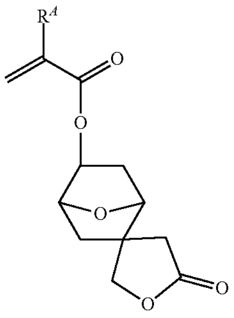
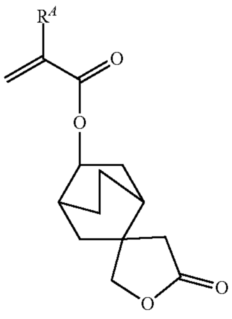
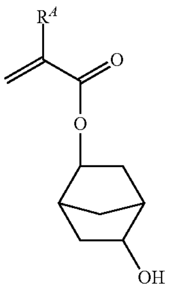
-continued
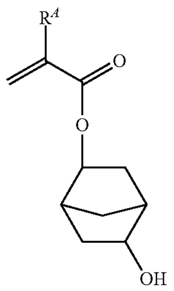
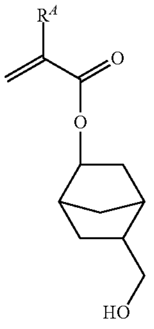
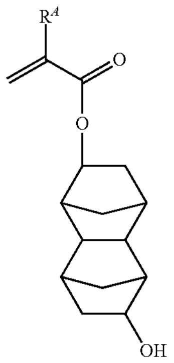
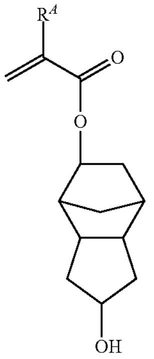
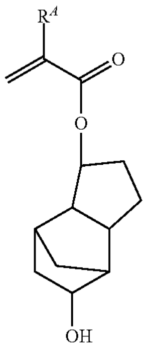
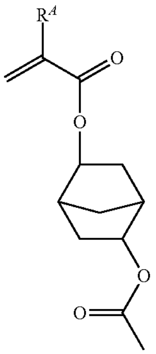
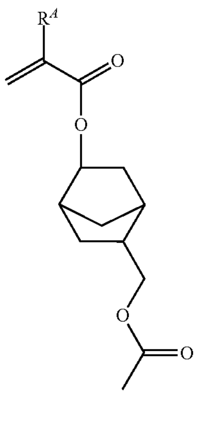
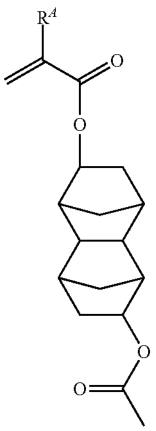

-continued
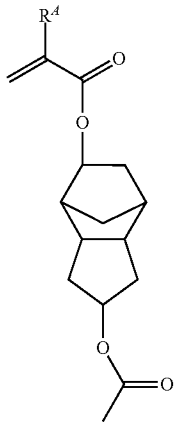
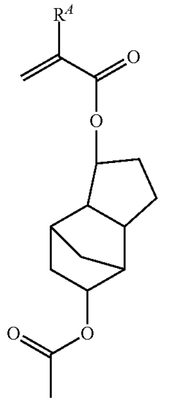
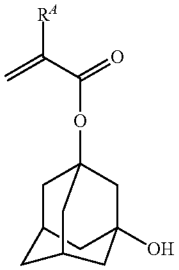
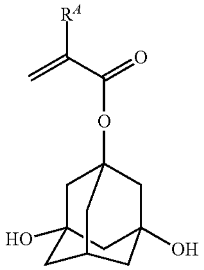
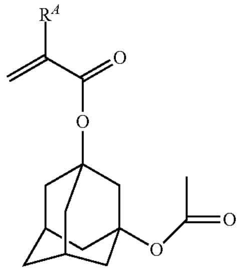
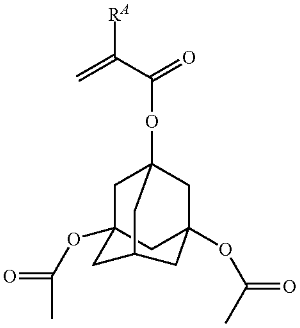
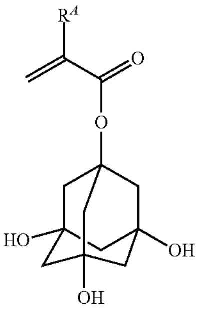
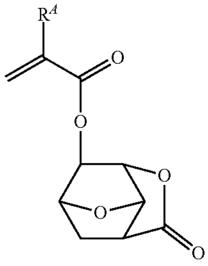
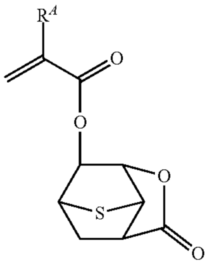
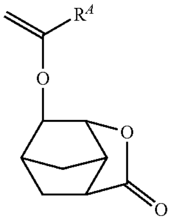
-continued
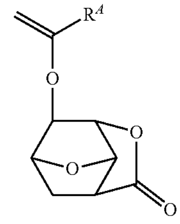
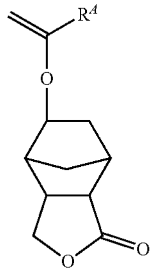
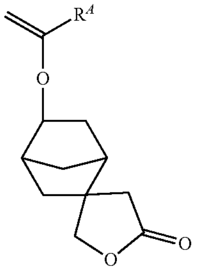
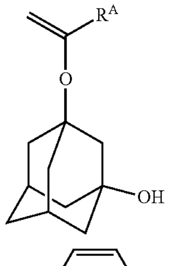
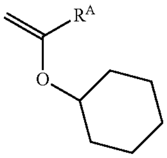
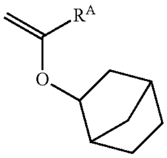
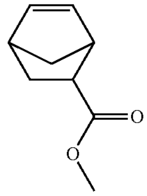
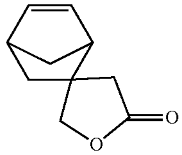
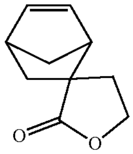
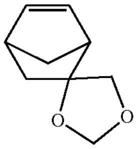
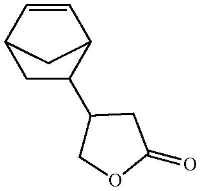
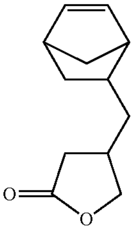
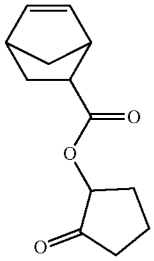
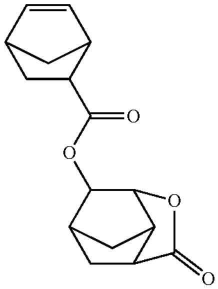
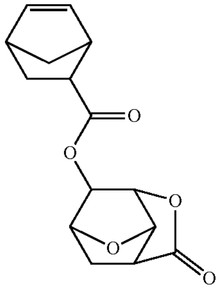

-continued
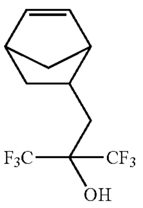
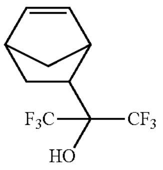
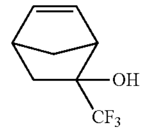
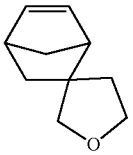
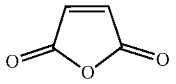
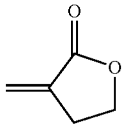
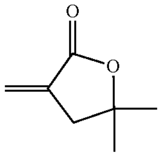
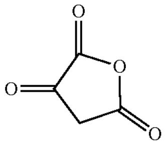
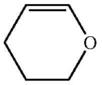
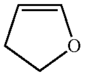
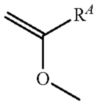
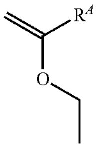
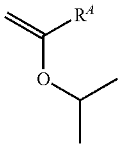
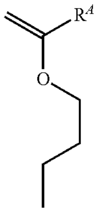
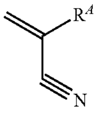
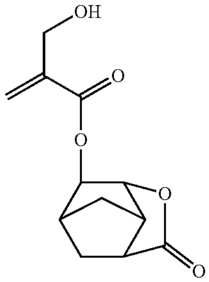
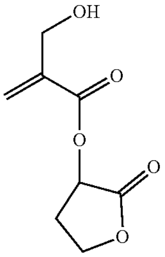
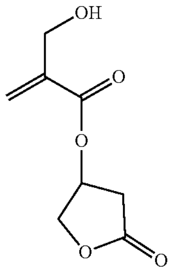
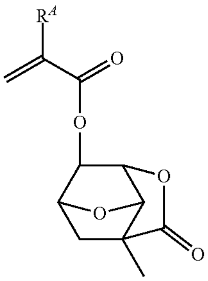
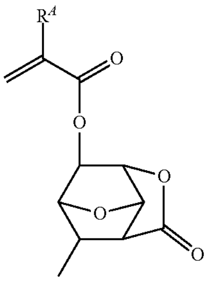
-continued
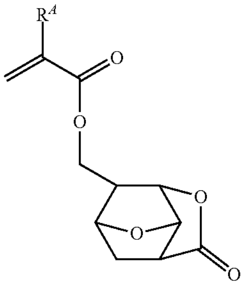
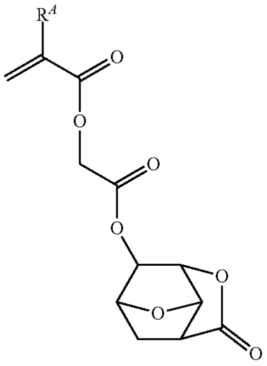
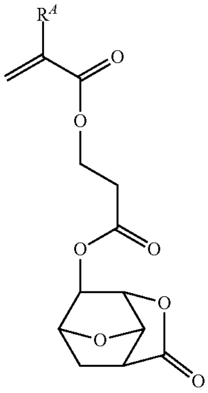
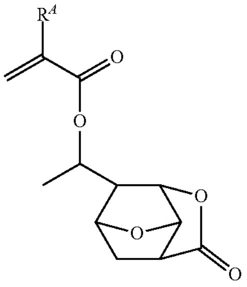
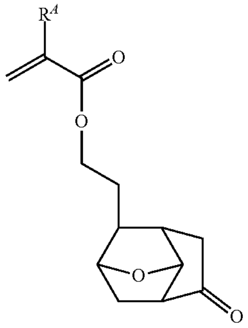
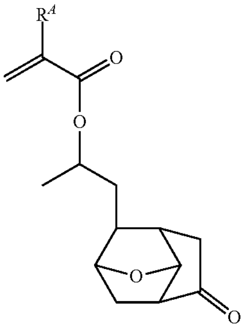
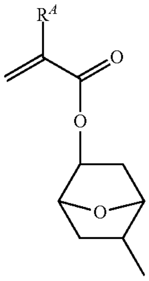
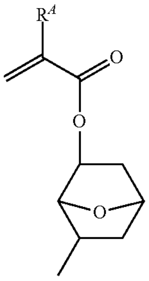
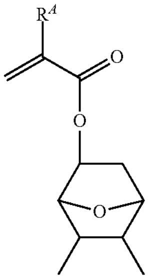
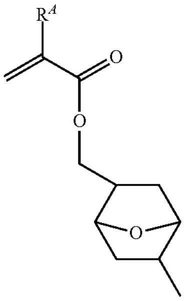

-continued
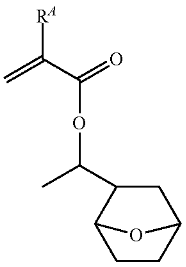
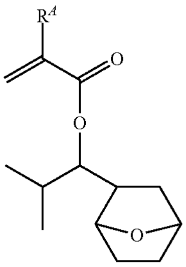
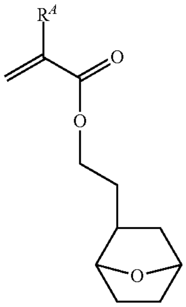
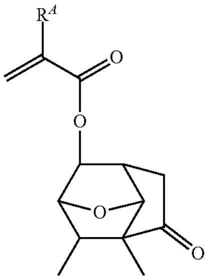
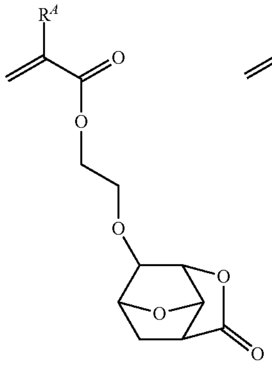
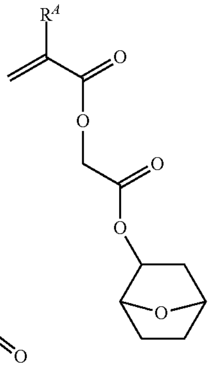
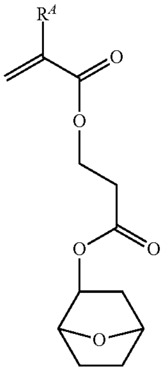
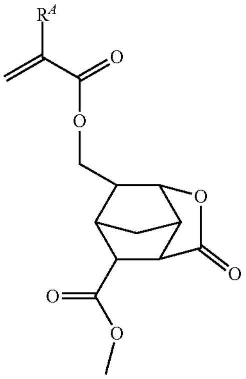
-continued
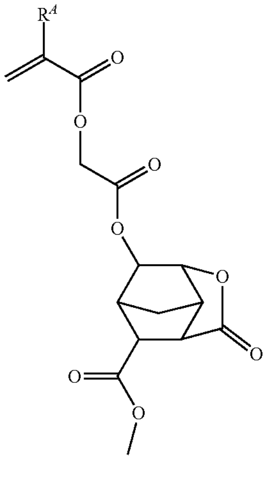
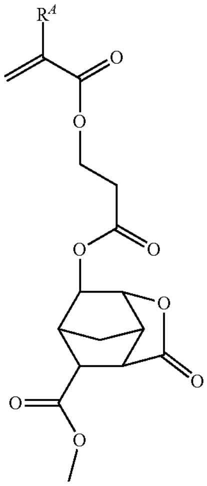
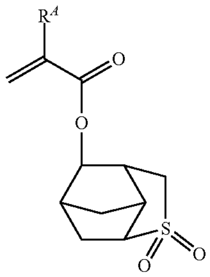
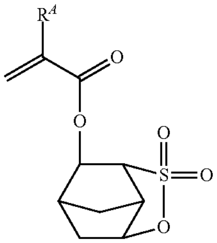
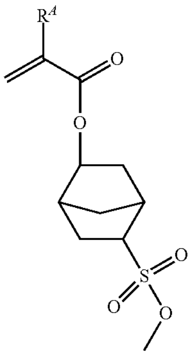
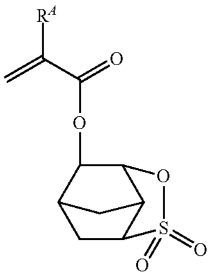
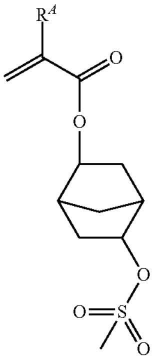
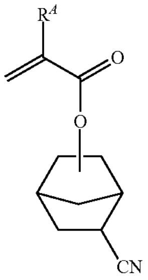

-continued
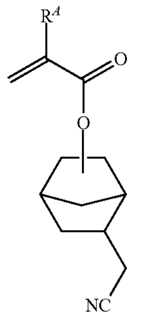
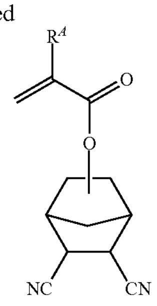
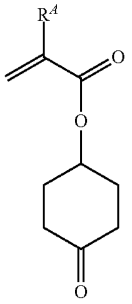
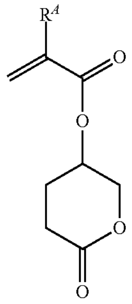
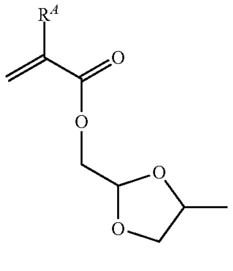
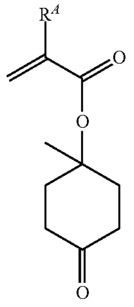
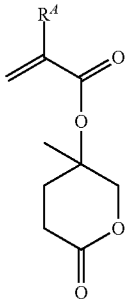
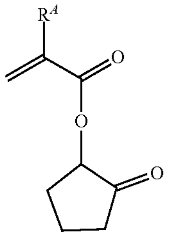
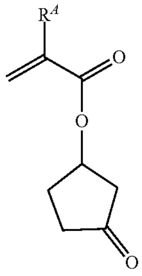
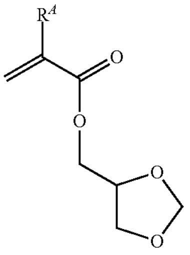
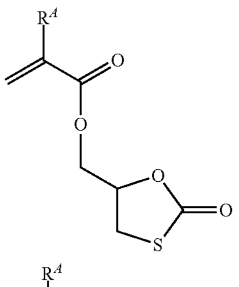
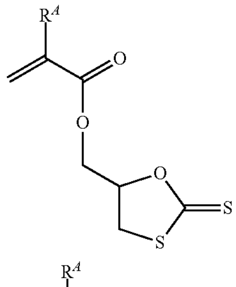
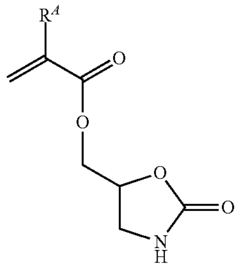
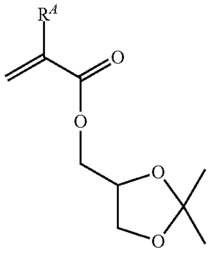
-continued
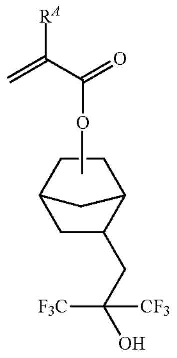
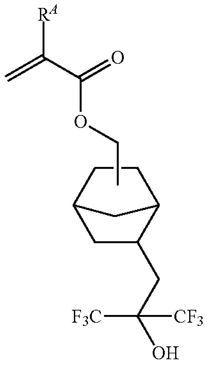
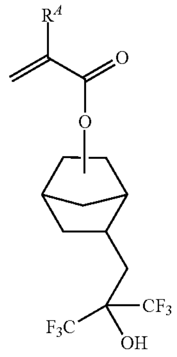
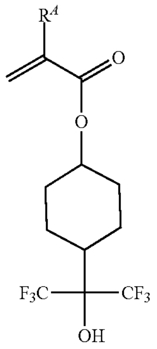
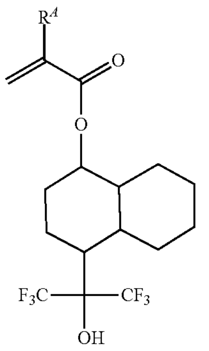
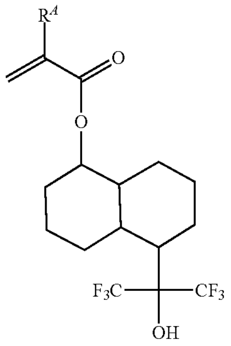
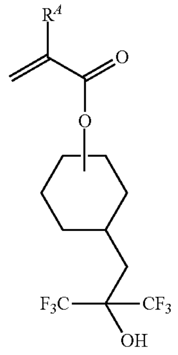
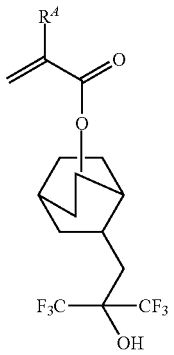

-continued
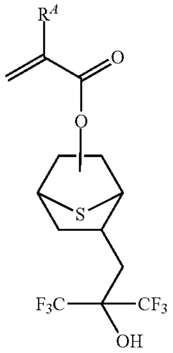
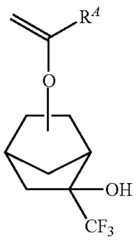
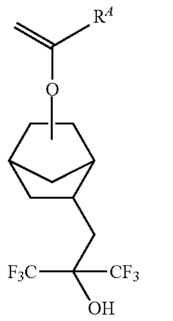
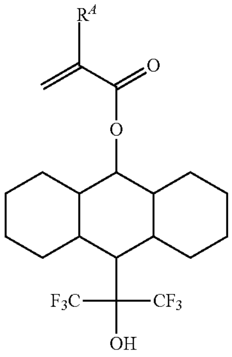
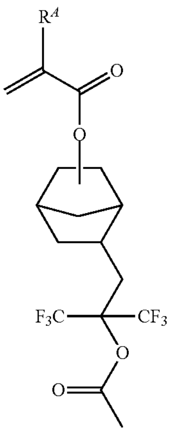
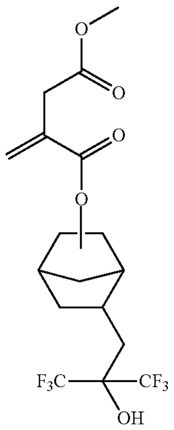
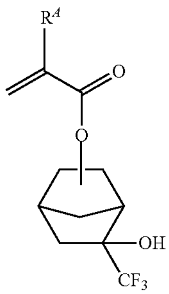
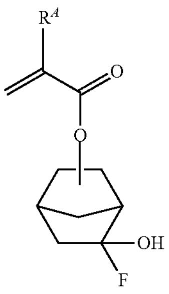
-continued
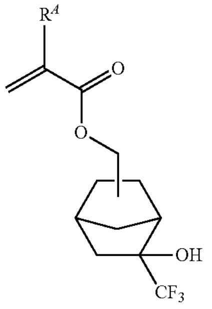
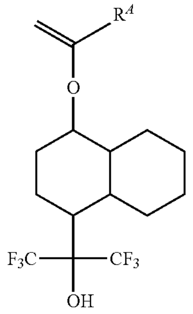
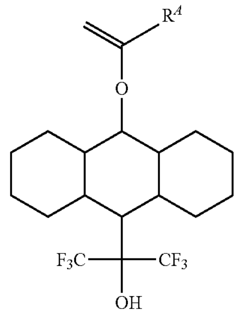
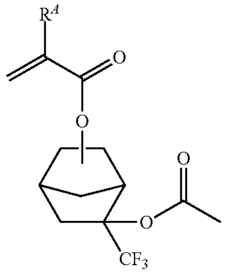
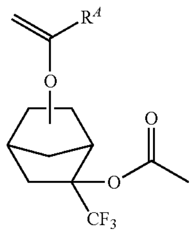
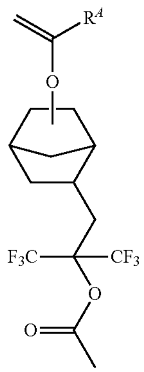
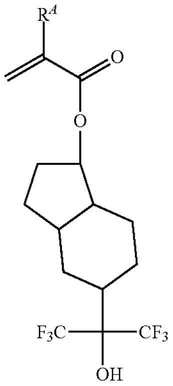
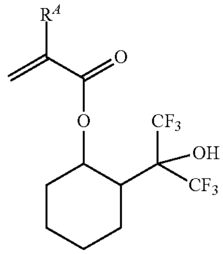
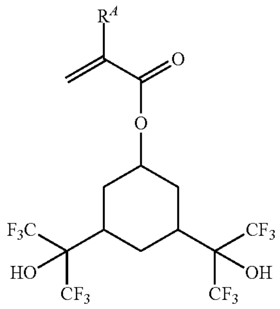
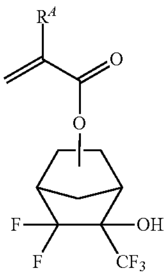

-continued
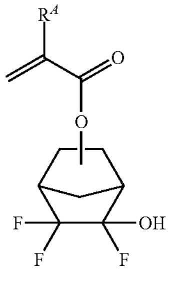
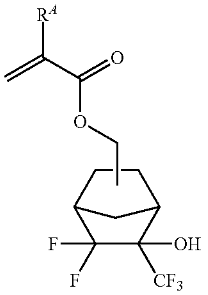
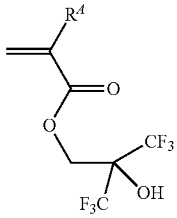
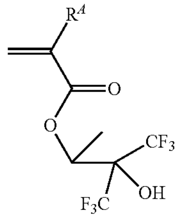
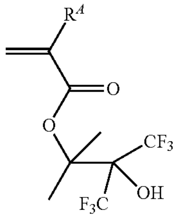
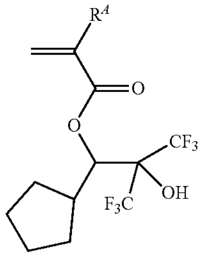
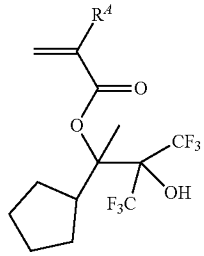
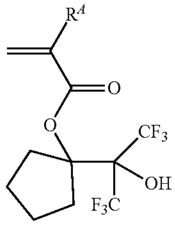
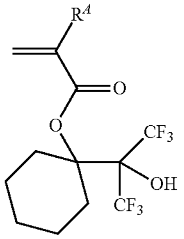
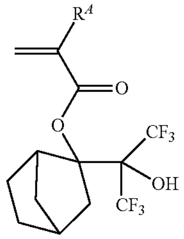
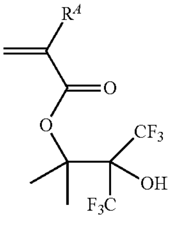
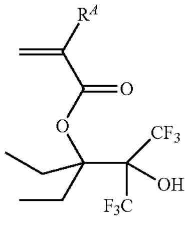
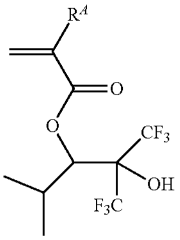
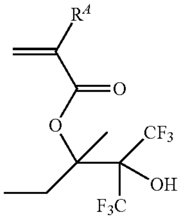
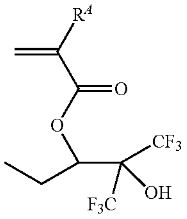
-continued
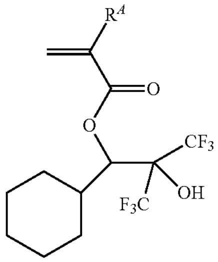
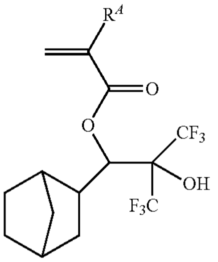
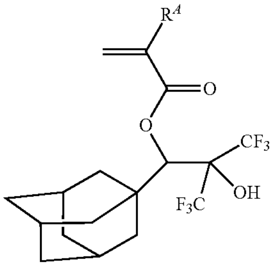
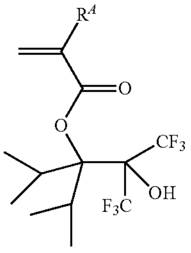
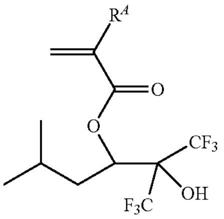
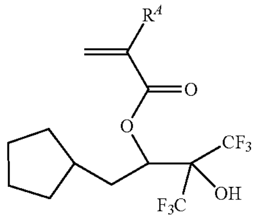
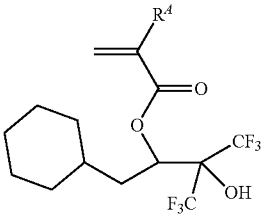
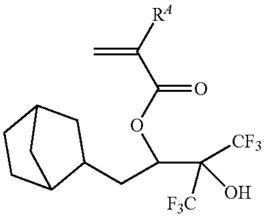
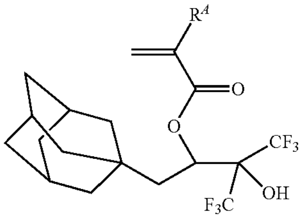
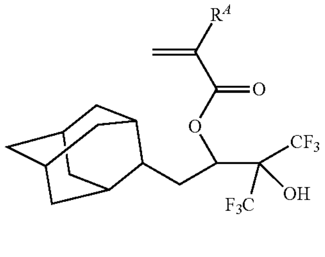
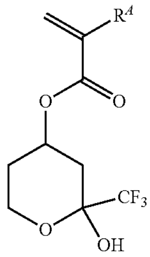
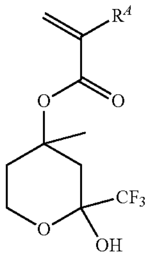
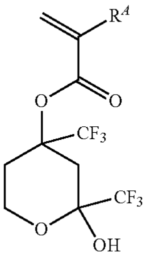
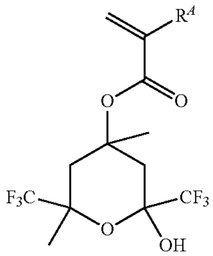

-continued
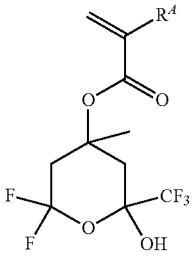
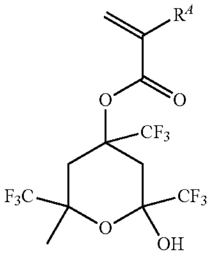
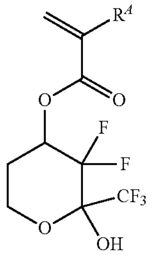
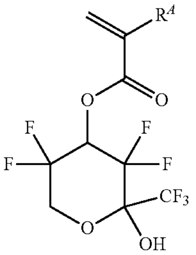
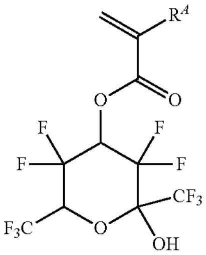
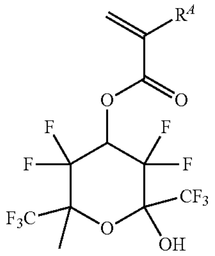
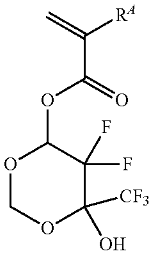
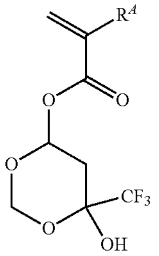
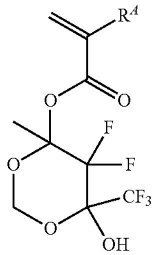
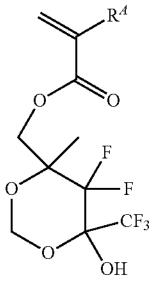
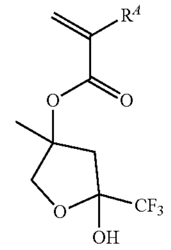
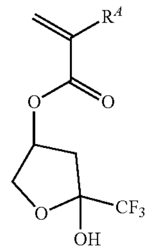
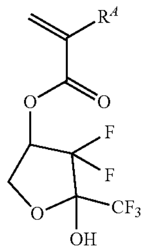
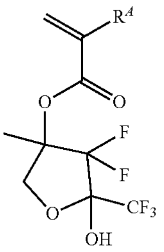
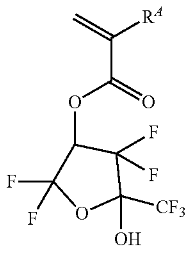
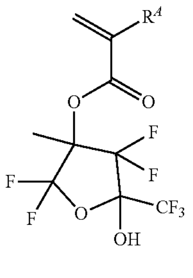
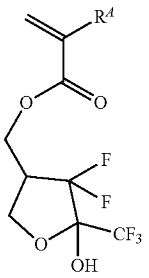
-continued
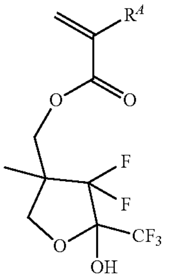
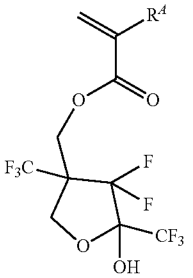
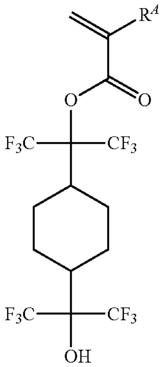
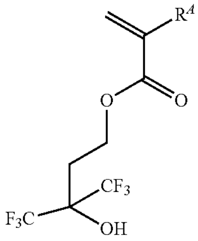
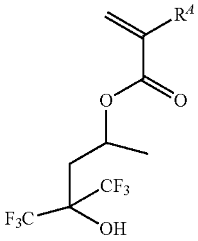
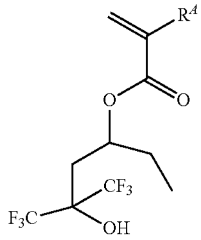
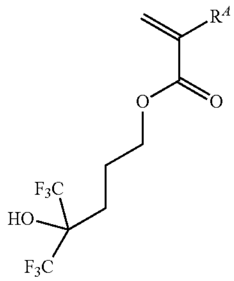
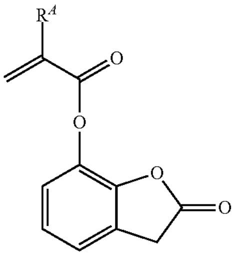
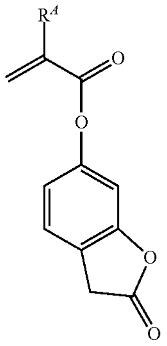
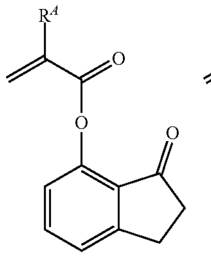
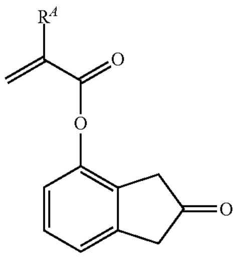

-continued
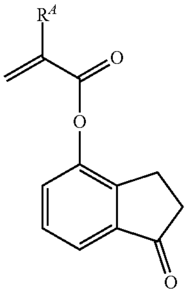
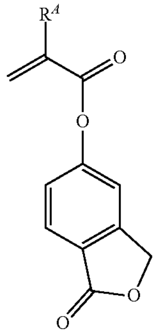
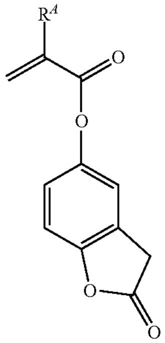
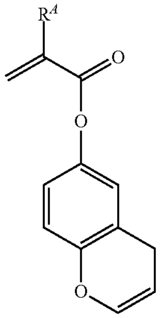
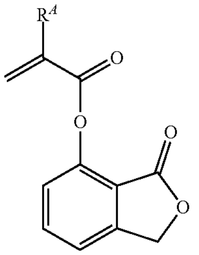
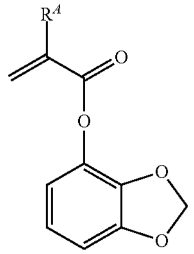
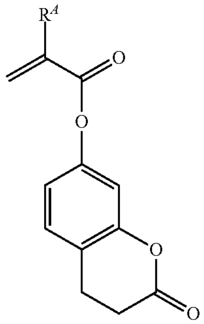
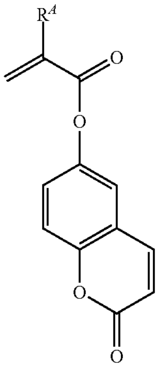
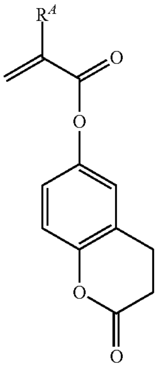
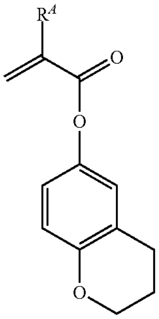
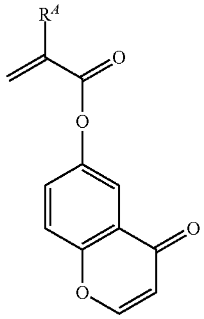
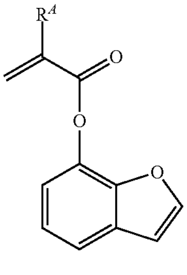
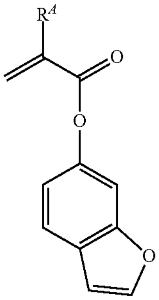
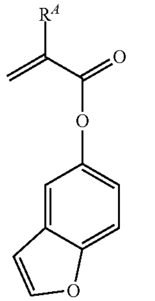
-continued
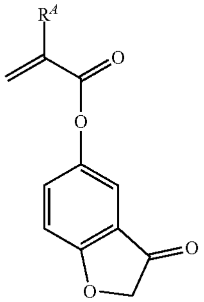
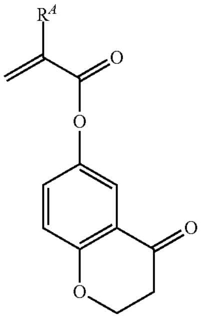
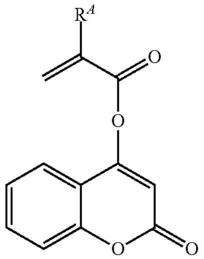
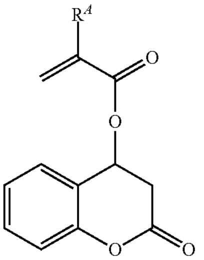
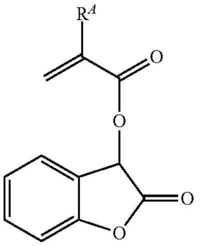
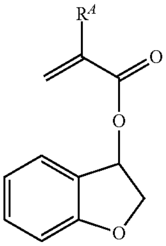
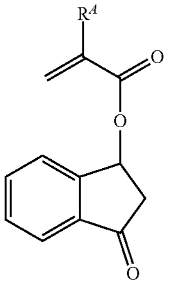
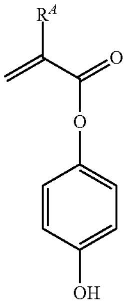
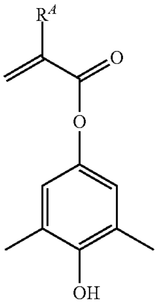
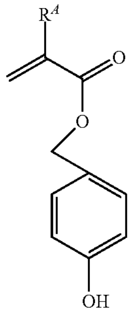
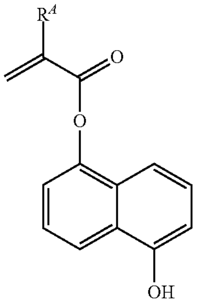
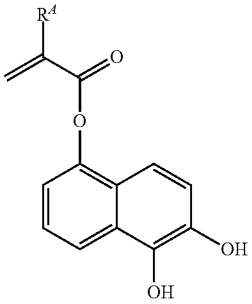

-continued
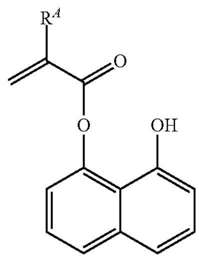
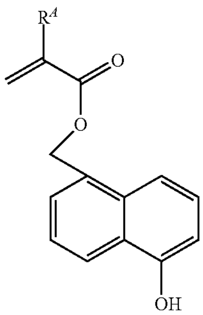
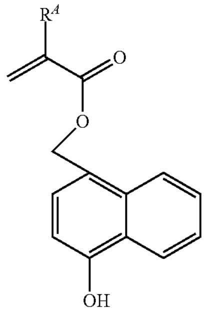
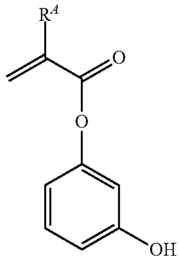
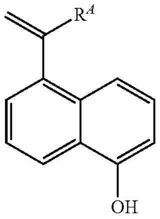
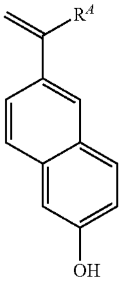
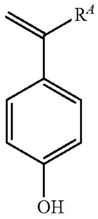
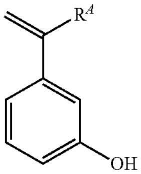
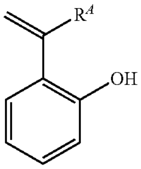
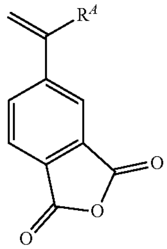
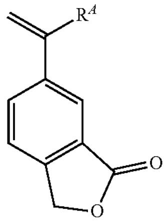
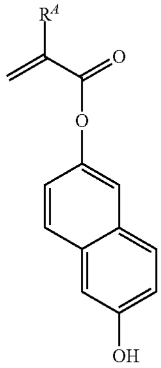
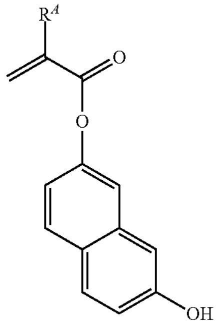
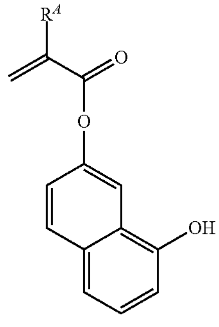
-continued
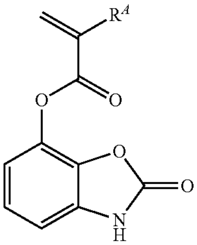
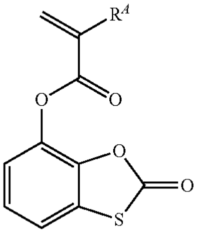
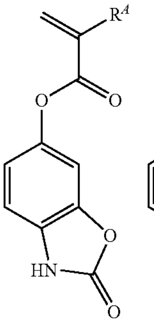
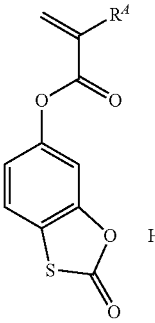
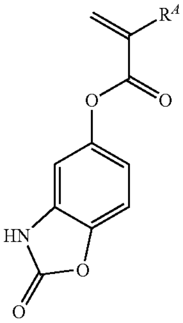
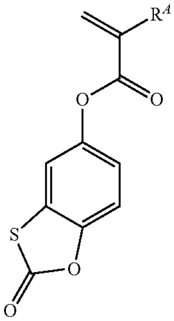
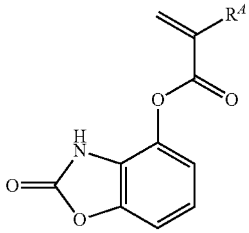
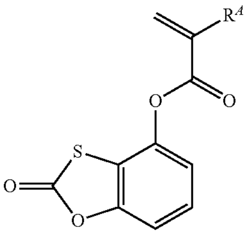
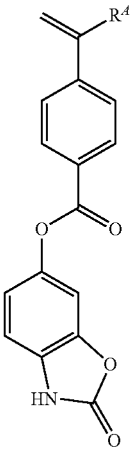
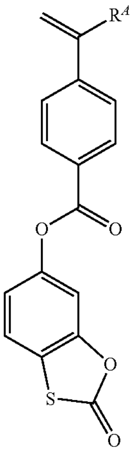

-continued

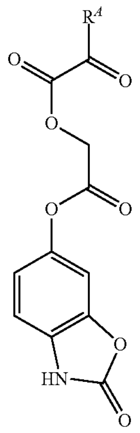
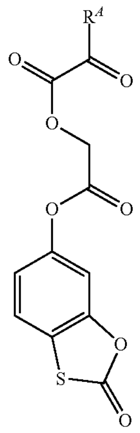
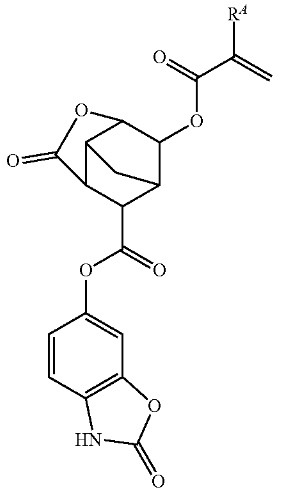

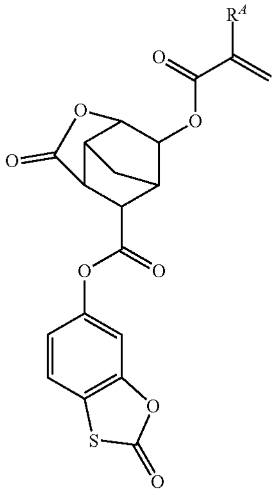
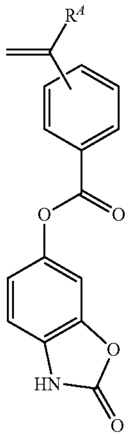
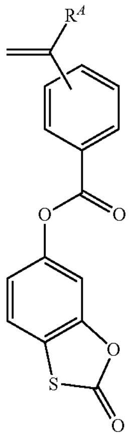

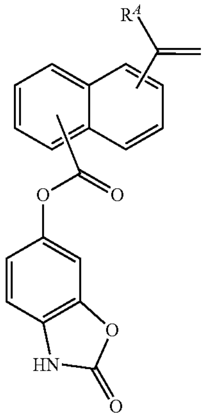
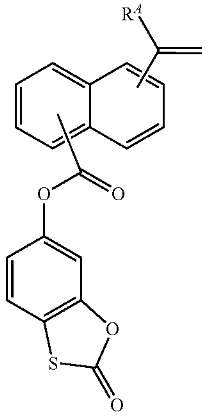
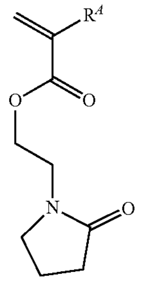

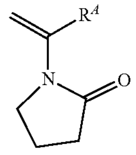
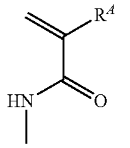
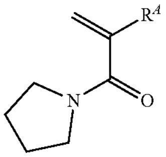

[Repeating Unit-d]

The base polymer may contain a repeating unit-d different from the above-described repeating units. Nevertheless, the repeating unit does not contain acid generator. Examples of the repeating unit-d include ones derived from styrene, acenaphthylene, indene, coumarin, coumarone, etc.

In the base polymer, the content ratios of the repeating unit-a, -b1, -b2, -c, and -d are preferably $0<a<1.0$, $0\leq b1\leq 0.9$, $0\leq b2\leq 0.9$, $0\leq c\leq 0.9$, and $0\leq d\leq 0.9$; more preferably $0.005\leq a\leq 0.8$, $0\leq b1\leq 0.8$, $0\leq b2\leq 0.8$, $0.1\leq b1+b2\leq 0.8$, $0\leq c\leq 0.8$, and $0\leq d\leq 0.4$; further preferably $0.01\leq a\leq 0.7$, $0\leq b1\leq 0.7$, $0\leq b2\leq 0.7$, $0.2\leq b1+b2\leq 0.7$, $0\leq c\leq 0.7$, and $0\leq d\leq 0.3$, given that $a+b1+b2+c+d=1.0$.

The base polymer may be synthesized, for example, by subjecting the monomers to give the repeating units described above to heat polymerization in an organic solvent to which a radical polymerization initiator has been added.

Examples of the organic solvent used in the polymerization include toluene, benzene, tetrahydrofuran (THF), diethyl ether, dioxane, etc. Examples of the polymerization initiator include 2,2'-azobisisobutyronitrile (AIBN), 2,2'-azobis(2,4-dimethylvaleronitrile), dimethyl-2,2-azobis(2-methylpropionate), benzoyl peroxide, lauroyl peroxide, etc. The temperature during the polymerization is preferably 50 to 80° C. The reaction time is preferably 2 to 100 hours, more preferably 5 to 20 hours.

In the case where the monomer containing a hydroxy group is copolymerized, the process may include: substituting the hydroxy group with an acetal group susceptible to deprotection with acid, such as an ethoxyethoxy group, prior to the polymerization; and the deprotection performing with weak acid and water after the polymerization. Alternatively, the process may include: substituting the hydroxy group with an acetyl group, a formyl group, a pivaloyl group, or the like; and performing alkaline hydrolysis after the polymerization.

In a case where hydroxystyrene or hydroxyvinylnaphthalene is copolymerized, at first, acetoxystyrene or acetoxyvinylnaphthalene may be used in place of hydroxystyrene or hydroxyvinylnaphthalene; after the polymerization, the acetoxy group may be deprotected by the alkaline hydrolysis as described above to convert the acetoxystyrene or acetoxyvinylnaphthalene to hydroxystyrene or hydroxyvinylnaphthalene.

In the alkaline hydrolysis, a base is usable, such as ammonia water or triethylamine. The reaction temperature is preferably −20 to 100° C., more preferably 0 to 60° C. The reaction time is preferably 0.2 to 100 hours, more preferably 0.5 to 20 hours.

The base polymer has a polystyrene-based weight-average molecular weight (Mw) of preferably 1,000 to 500,000, more preferably 2,000 to 30,000, which is determined by gel permeation chromatography (GPC) using THF as a solvent. When the Mw is 1,000 or more, the resist material does not have poor heat resistance. When the Mw is 500,000 or less, the alkali solubility is not decreased, and a footing phenomenon after pattern formation is prevented.

Further, the finer the pattern rule, the stronger the influences of Mw and molecular weight distribution (Mw/Mn). Hence, in order to obtain a resist material suitably used for finer pattern dimension, the base polymer preferably has a narrow dispersity Mw/Mn of 1.0 to 2.0, particularly preferably 1.0 to 1.5. When the base polymer has a molecular weight distribution (Mw/Mn) within these ranges, there is no low-molecular-weight or high-molecular-weight polymer. This can eliminate possibilities that foreign matters are observed on the pattern after the exposure, and that the pattern profile is degraded.

The base polymer may contain two or more kinds of polymers that differ in composition ratio, Mw, and Mw/Mn. Alternatively, a polymer containing the repeating unit-a may be blended with a polymer not containing the repeating unit-a but containing the repeating units-b1 and -b2.

[Acid Generator]

The inventive positive resist material further contains an acid generator that generates a strong acid (hereinafter also referred to as additive-type acid generator). Here, the term strong acid means a compound that has sufficient acidity to cause deprotection reaction of the acid labile groups of the base polymer. Examples of the acid generator include compounds that generate acids in response to actinic light or radiation (photo-acid generator). The photo-acid generator is not particularly limited, as long as the compound generates an acid upon high-energy beam irradiation. Preferably, the photo-acid generator generates a sulfonic acid, imide acid, or methide acid. Suitable photo-acid generators are sulfonium salt, iodonium salt, sulfonyldiazomethane, N-sulfonyloxyimide, oxime sulfonate type acid generators, etc. Specific examples of the photo-acid generator include ones disclosed in paragraphs [0122] to [0142] of JP 2008-111103A.

Moreover, a sulfonium salt shown by the following formula (1-1) and an iodonium salt shown by the following formula (1-2) can be used suitably as photo-acid generators.

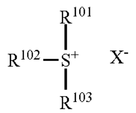

(1-1)

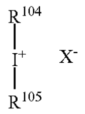

(1-2)

In the formulae (1-1) and (1-2), $R^{101}$ to $R^{105}$ each independently represent a hydrocarbyl group having 1 to 25 carbon atoms and optionally containing a fluorine atom, a chlorine atom, a bromine atom, an iodine atom, or a heteroatom.

The hydrocarbyl group represented by $R^{101}$ to $R^{105}$ may be saturated or unsaturated, and may be linear, branched, or cyclic. Specific examples thereof include alkyl groups having 1 to 20 carbon atoms, such as a methyl group, an ethyl group, an n-propyl group, an isopropyl group, an n-butyl group, an isobutyl group, a sec-butyl group, a tert-butyl group, an n-pentyl group, an n-hexyl group, an n-octyl group, an n-nonyl group, an n-decyl group, an undecyl group, a dodecyl group, a tridecyl group, a tetradecyl group, a pentadecyl group, a heptadecyl group, an octadecyl group, an nonadecyl group, and an eicosyl group; cyclic saturated hydrocarbyl groups having 3 to 20 carbon atoms, such as a cyclopropyl group, a cyclopentyl group, a cyclohexyl group, a cyclopropylmethyl group, a 4-methylcyclohexyl group, a cyclohexylmethyl group, a norbornyl group, and adamantyl group; alkenyl groups having 2 to 20 carbon atoms, such as a vinyl group, a propenyl group, a butenyl group, and a hexenyl group; cyclic unsaturated aliphatic hydrocarbyl groups having 3 to 20 carbon atoms, such as a cyclohexenyl group and a norbornenyl group; alkynyl groups having 2 to 20 carbon atoms, such as an ethynyl group, a propynyl group, and a butynyl group; aryl groups having 6 to 20 carbon atoms, such as a phenyl group, a methylphenyl group, an ethylphenyl group, an n-propylphenyl group, an isopropylphenyl group, an n-butylphenyl group, an isobutylphenyl group, a sec-butylphenyl group, a tert-butylphenyl group, a naphthyl group, a methylnaphthyl group, an ethylnaphthyl group, an n-propylnaphthyl group, an isopropylnaphthyl group, an n-butylnaphthyl group, an isobutylnaphthyl group, a sec-butylnaphthyl group, and a tert-butylnaphthyl group; aralkyl groups having 7 to 20 carbon atoms, such as a benzyl group and a phenethyl group; etc. Additionally, these groups may have some of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbyl group may contain a hydroxy group, a cyano group, a carbonyl group, an ether bond, an ester bond, a sulfonic acid ester bond, a carbonate group, a lactone ring, a sultone ring, a carboxylic anhydride, a haloalkyl group, etc.

Alternatively, $R^{101}$ and $R^{102}$ may bond with each other to form a ring together with a sulfur atom bonded therewith. In this event, the ring preferably has any of structures shown below.

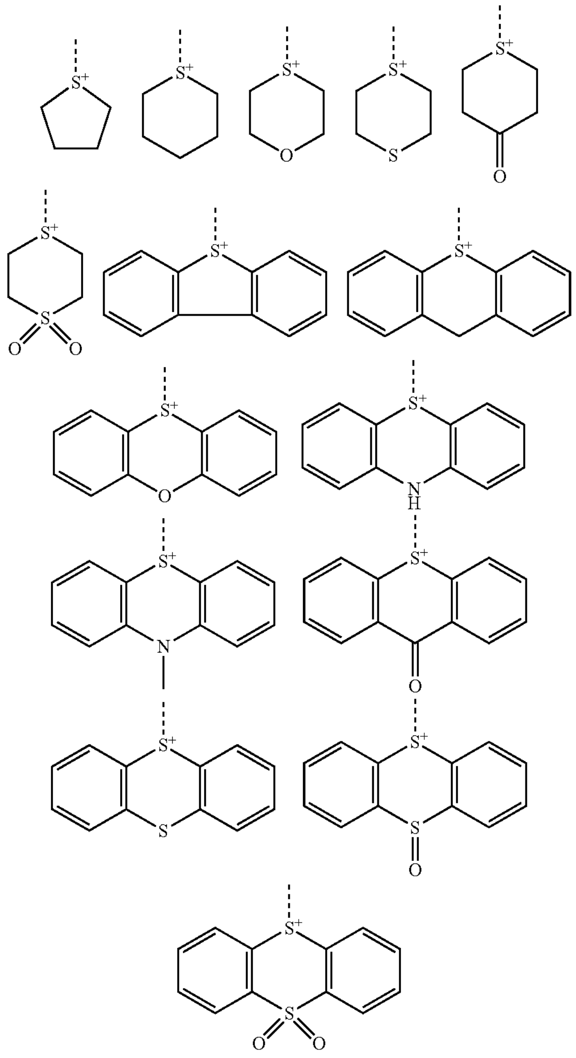

In the formulae, each broken line represents a bonding arm to $R^{103}$.

Examples of a cation of the sulfonium salt shown by the formula (1-1) include ones shown below, but are not limited thereto.

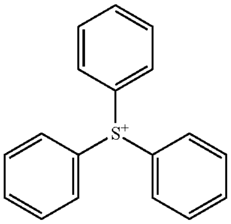
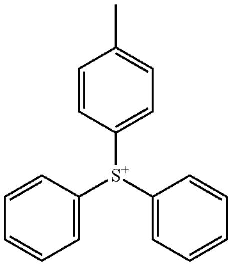
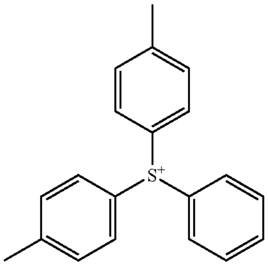
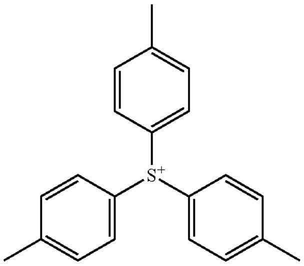
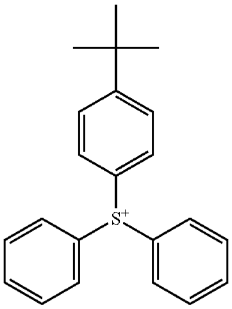
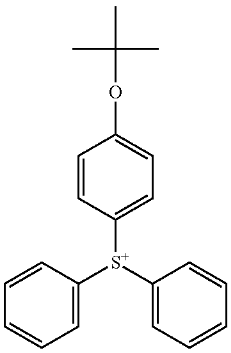
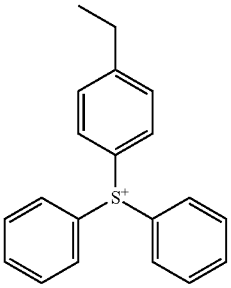
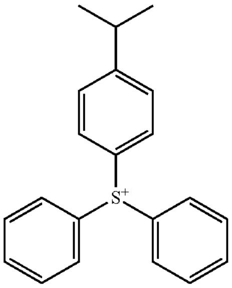
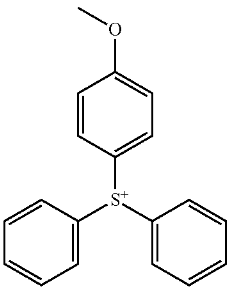
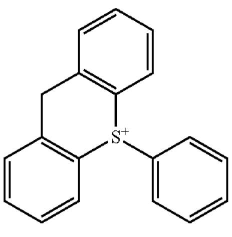
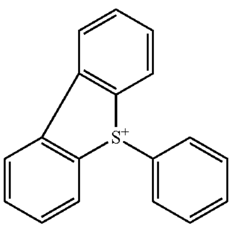
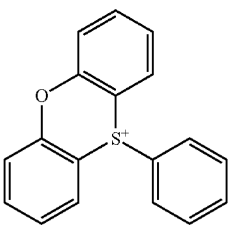
-continued
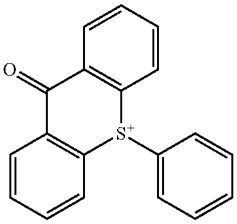
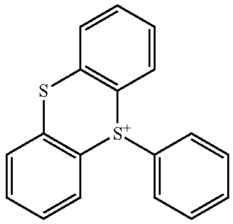
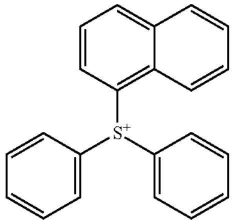
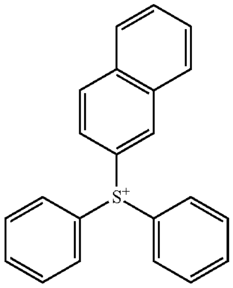
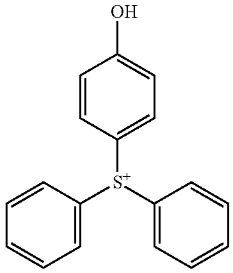
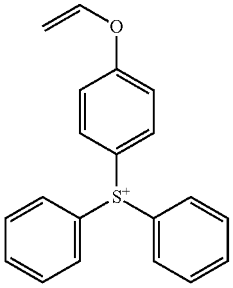
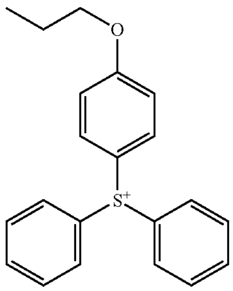
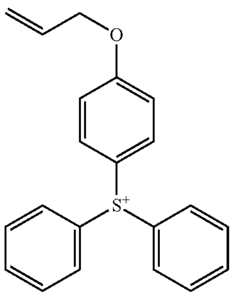
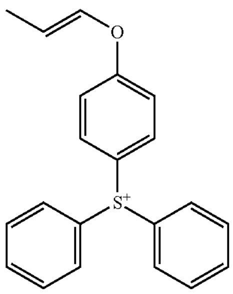
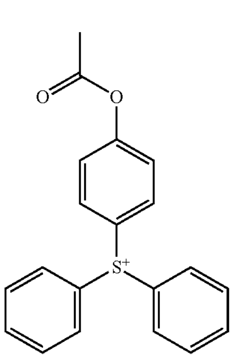

-continued
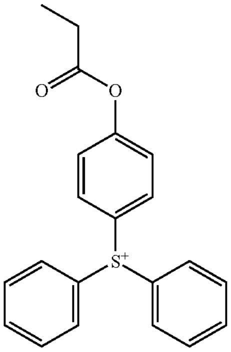
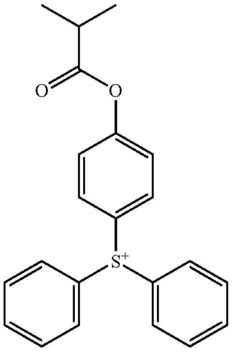
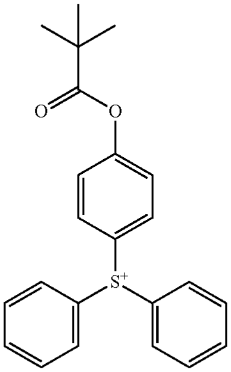
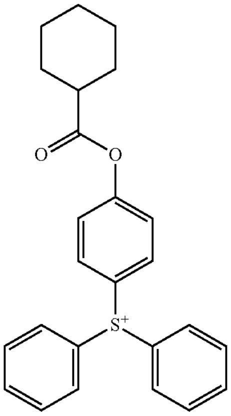
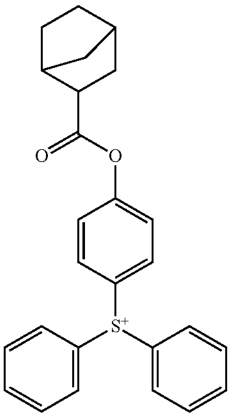
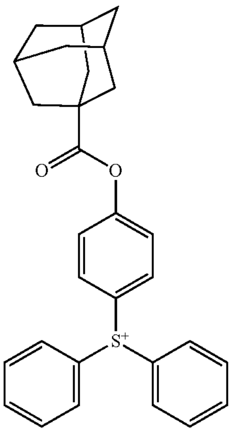
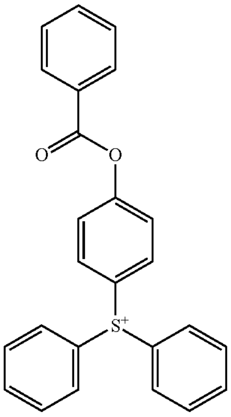
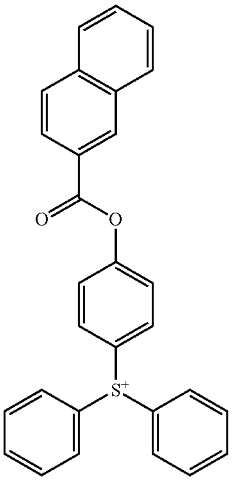
-continued
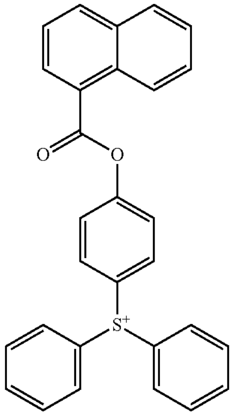
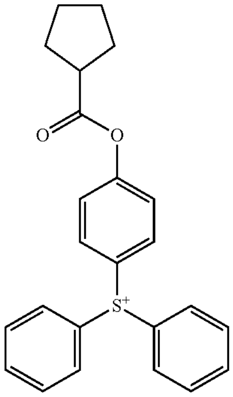
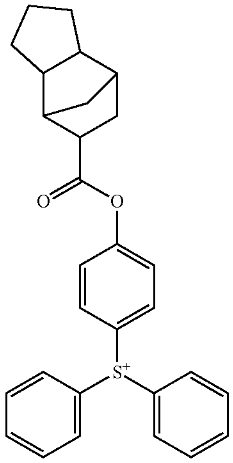
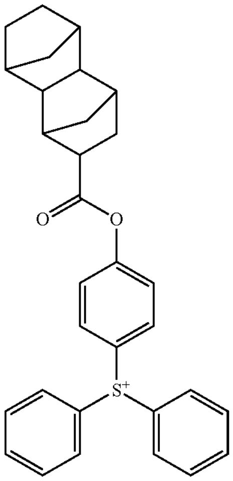
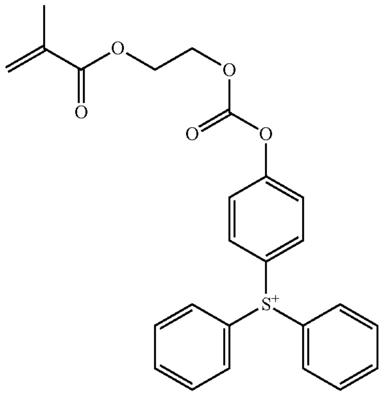
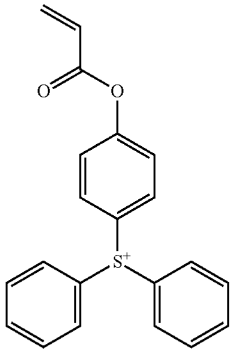
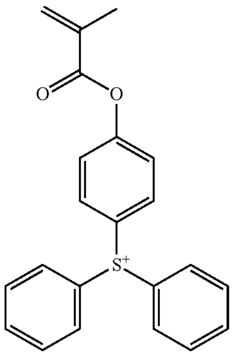

-continued
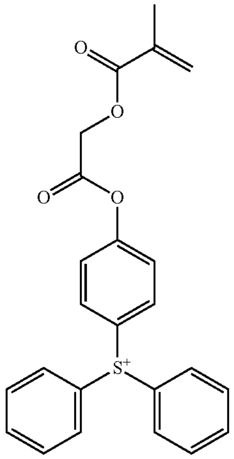
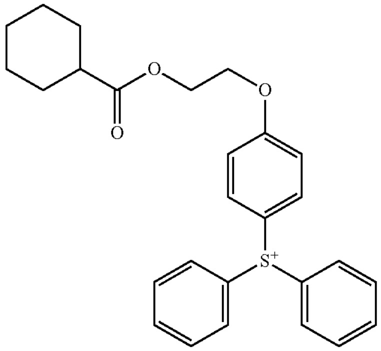
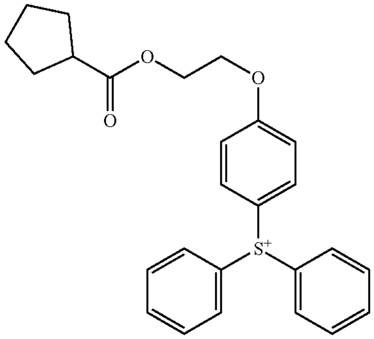
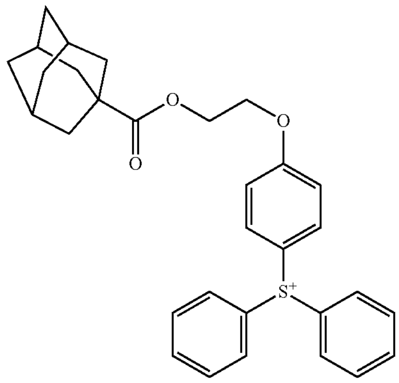
-continued
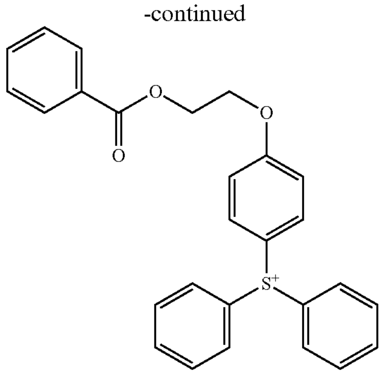
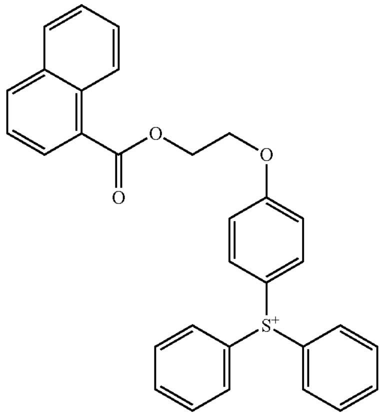
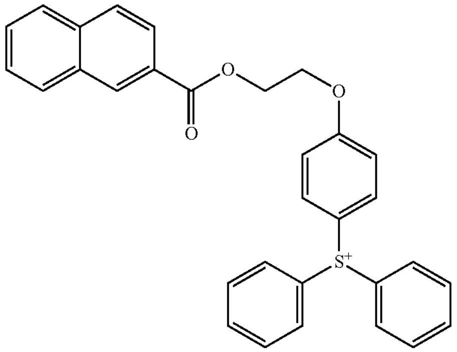
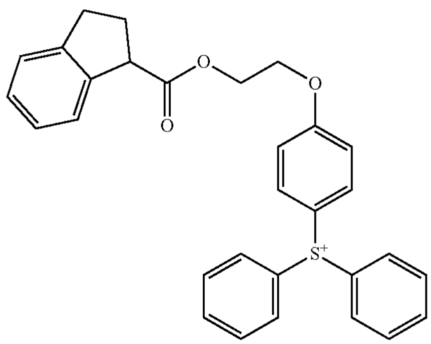

-continued
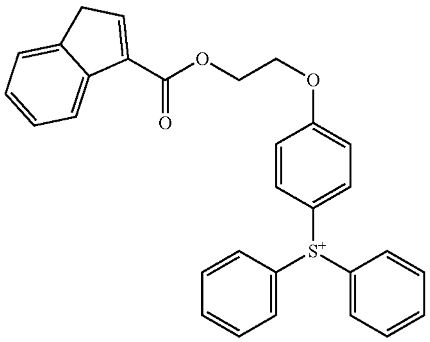
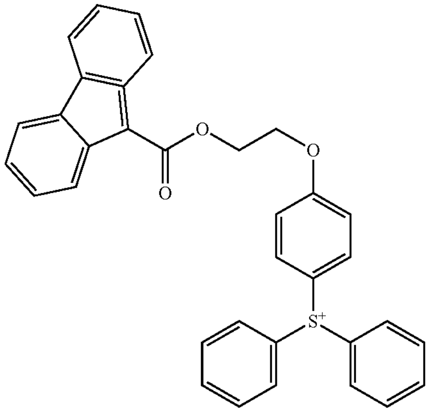
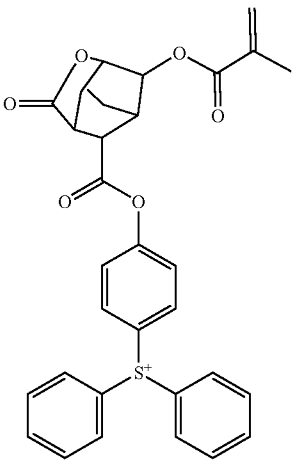
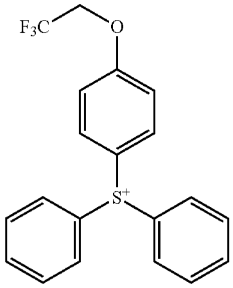
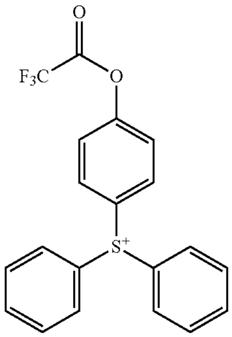
-continued
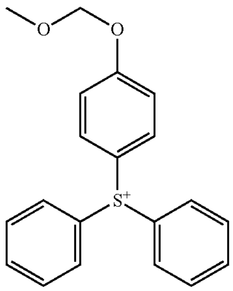
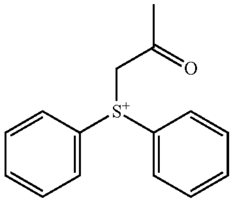
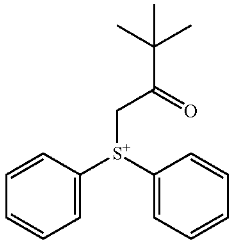
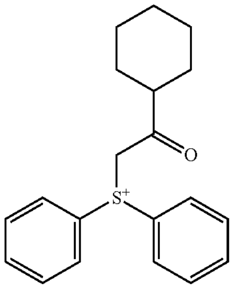
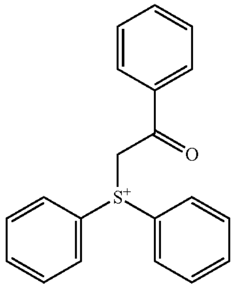
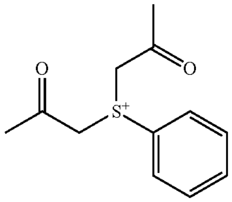
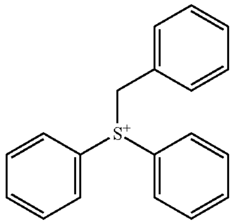
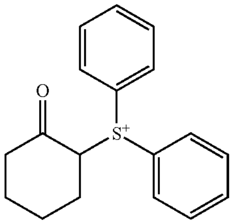
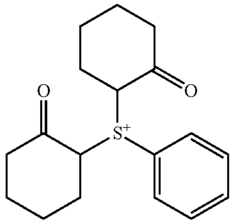
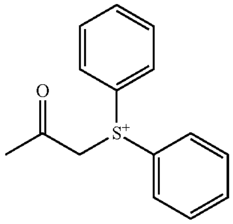
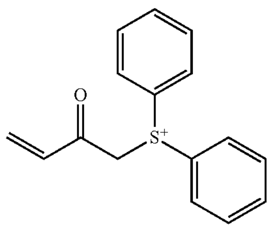
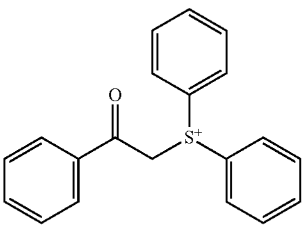

-continued
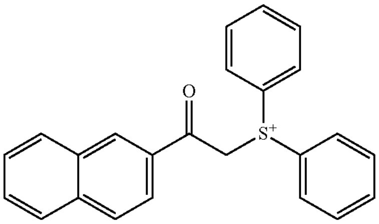
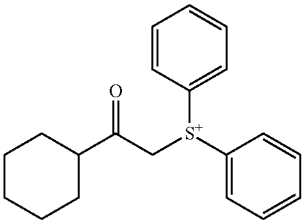
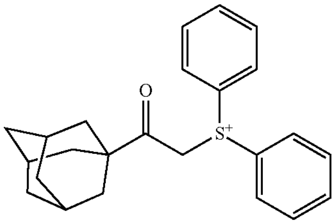
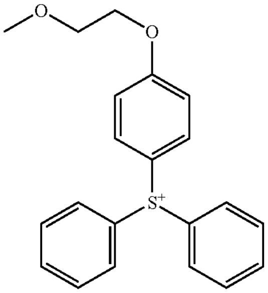
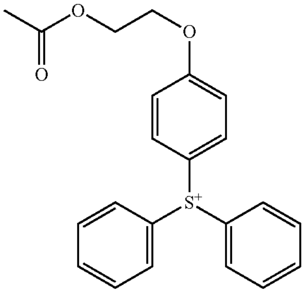
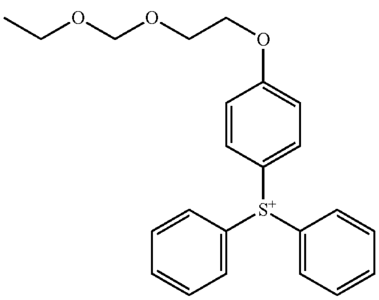
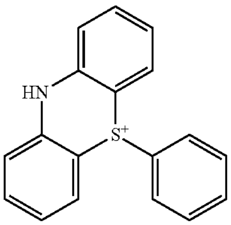
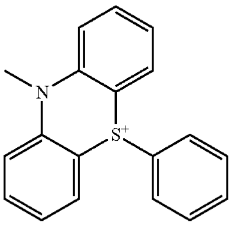
-continued
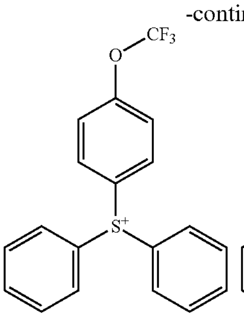
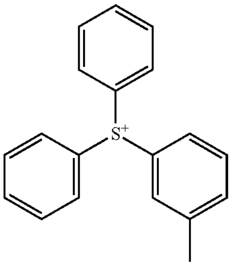
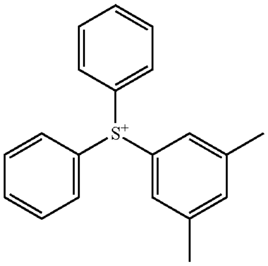
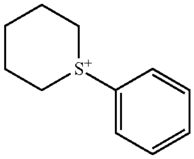
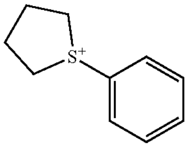
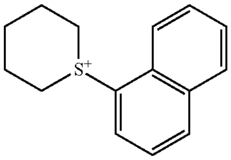
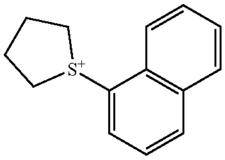
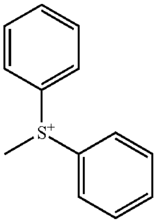
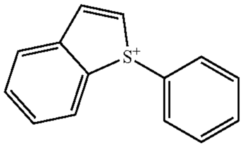
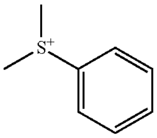
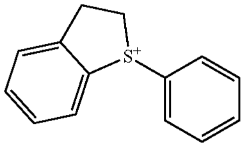
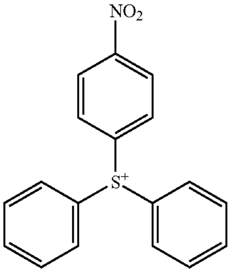
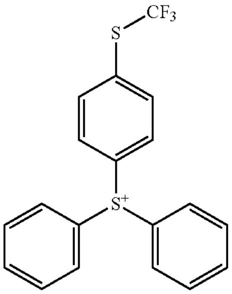
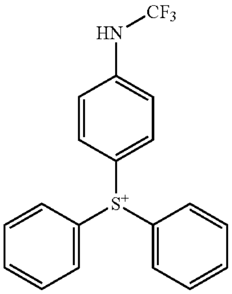

-continued
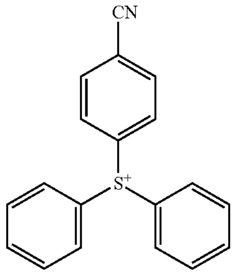
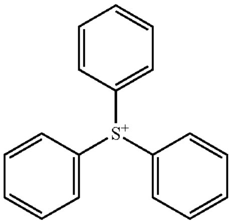
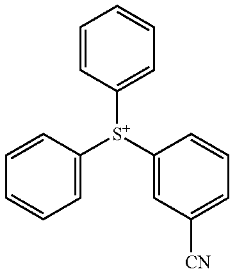
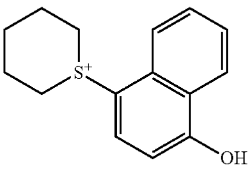
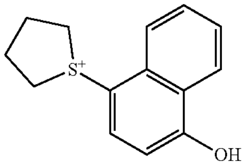
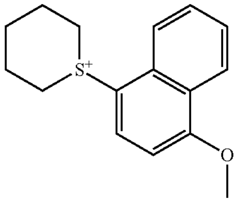
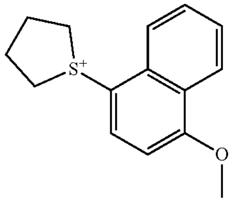
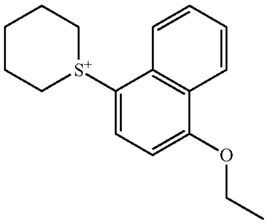
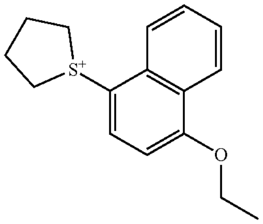
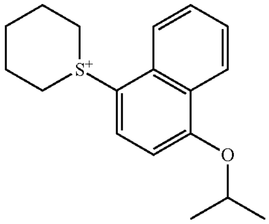
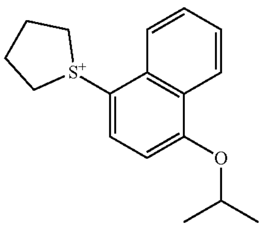
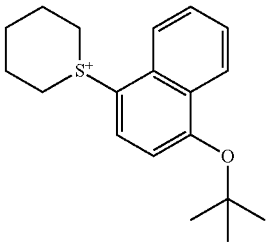
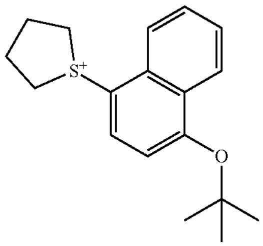
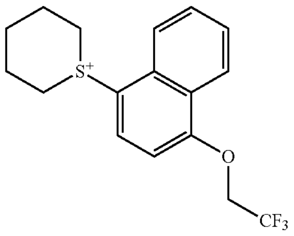
-continued
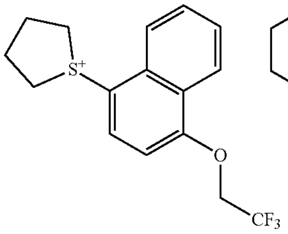
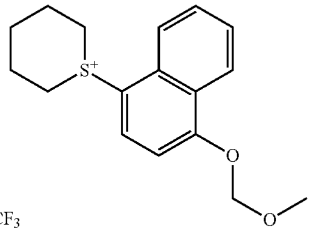
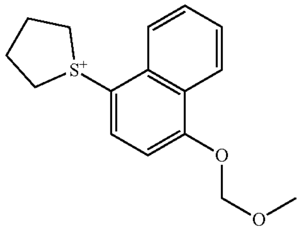
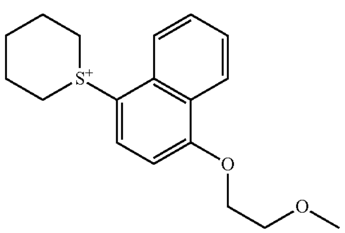
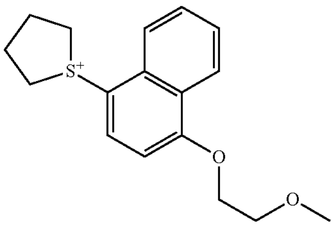
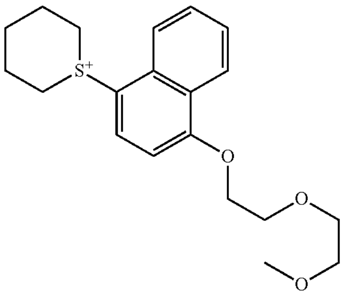
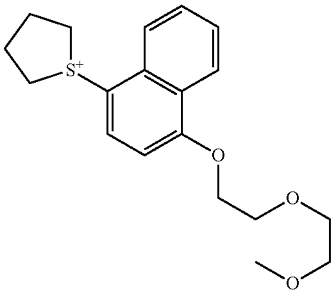

-continued
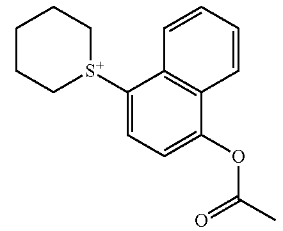
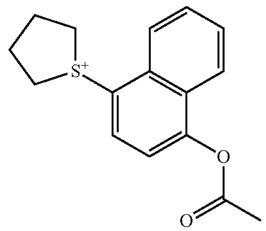
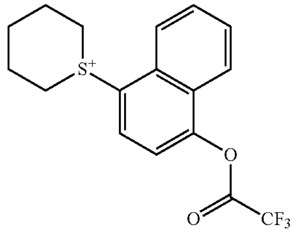
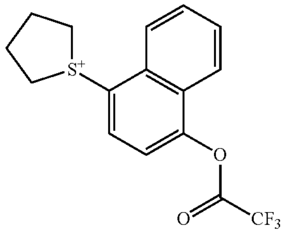
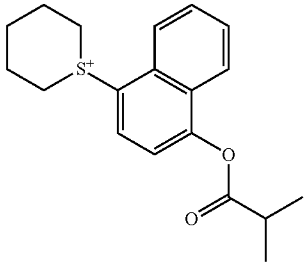
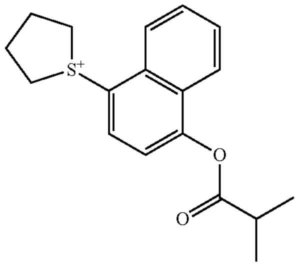
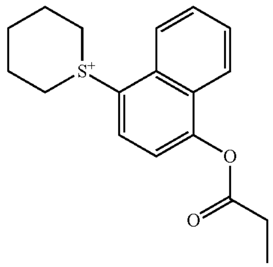
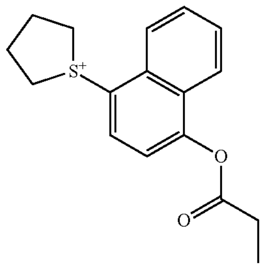
-continued
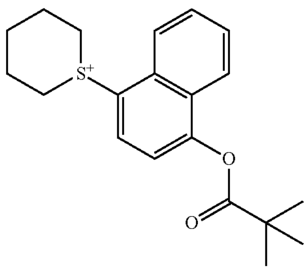
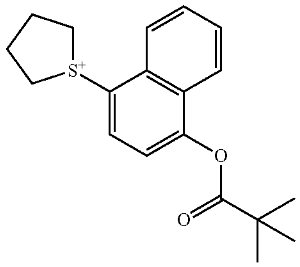
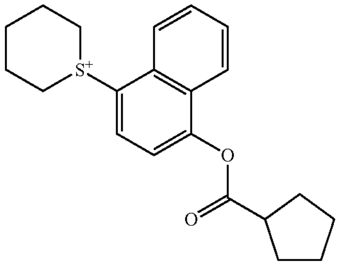
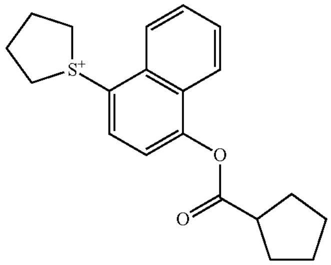
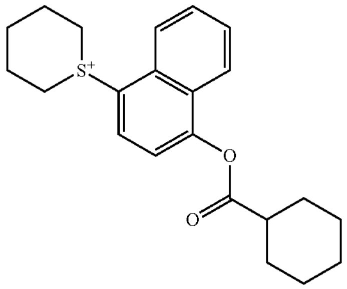
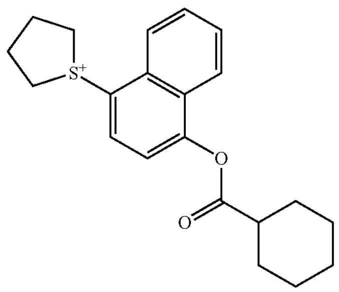

-continued
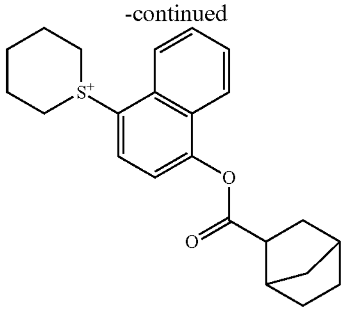
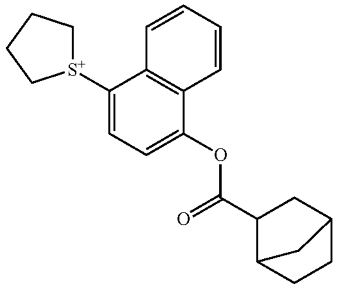
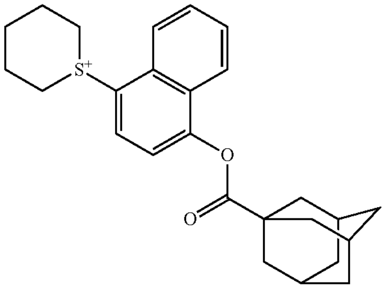
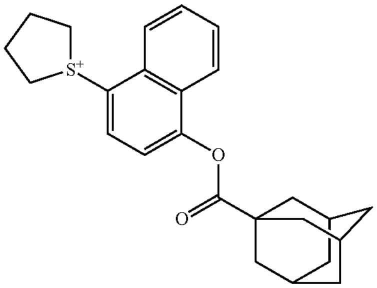
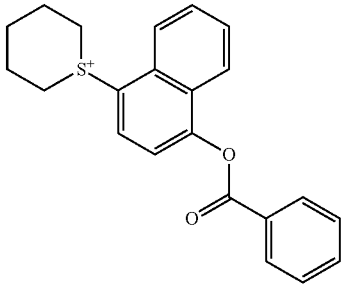
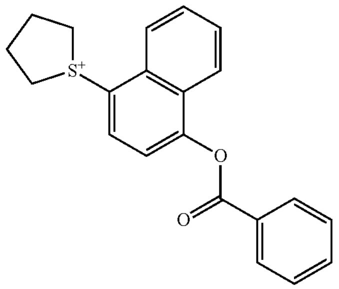
-continued
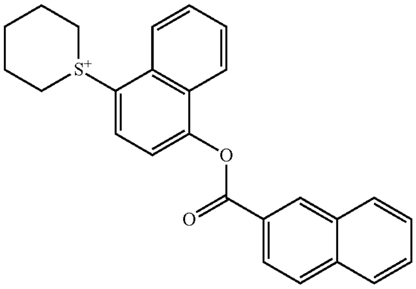
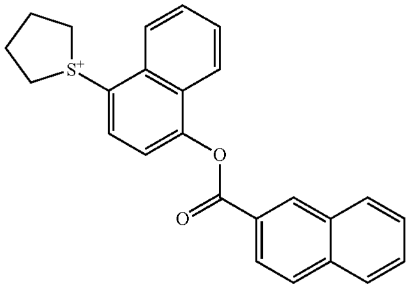
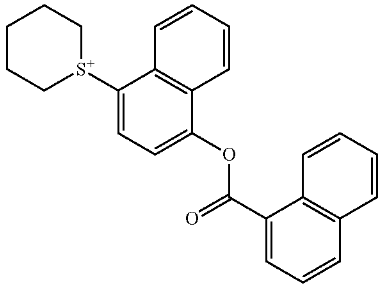
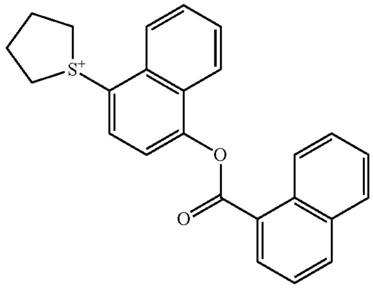
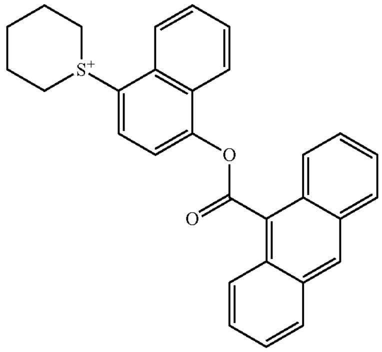

-continued
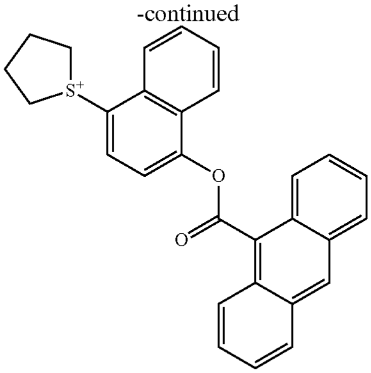
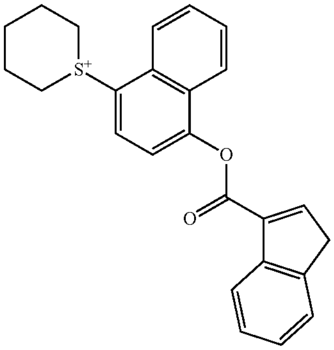
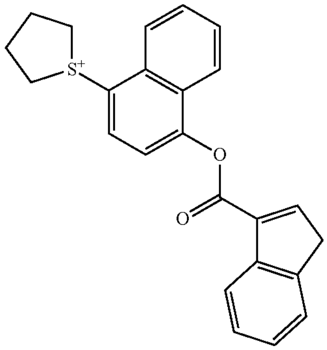
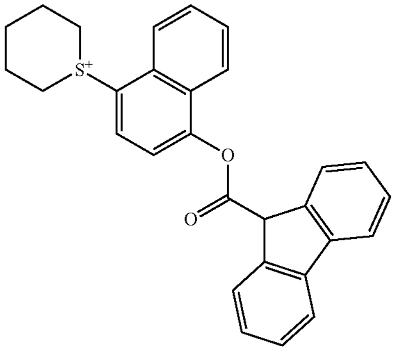
-continued
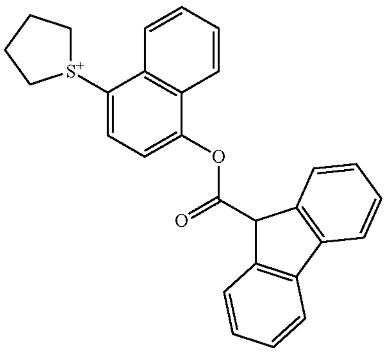
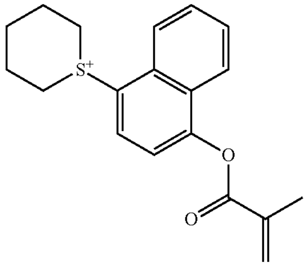
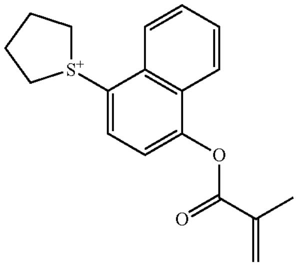
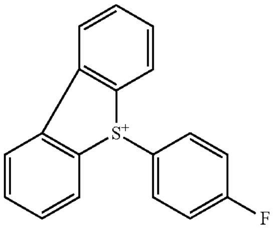
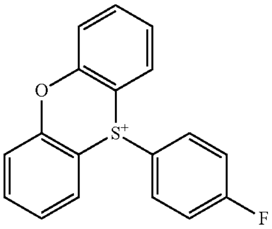
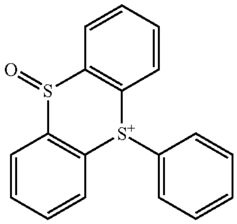
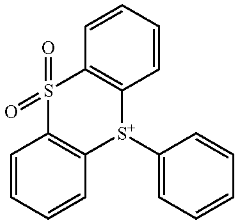
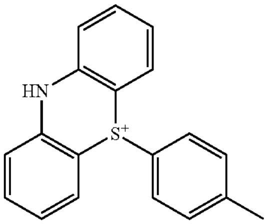
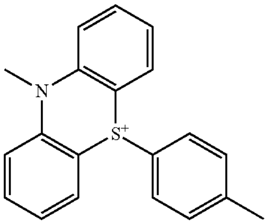

-continued
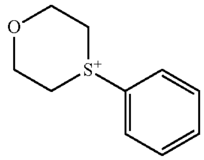
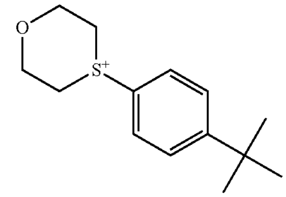
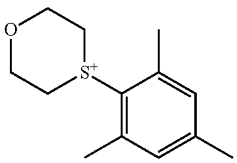
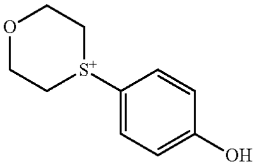
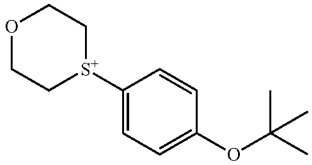
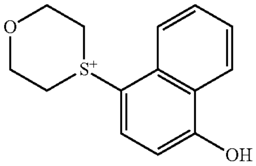
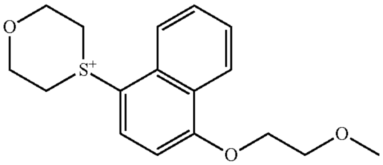
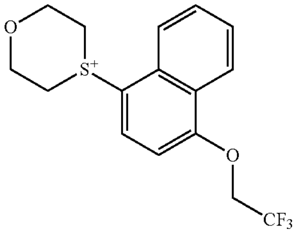
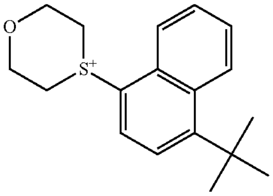
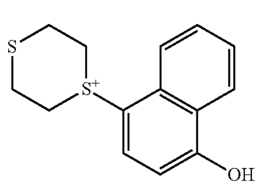
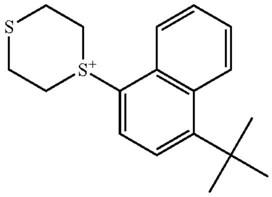
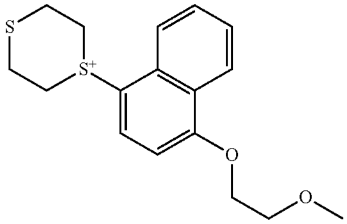
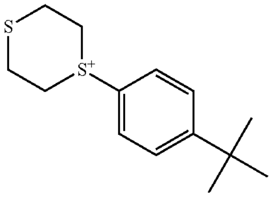
-continued
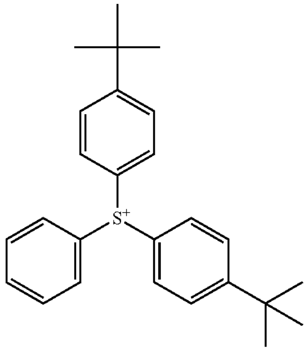
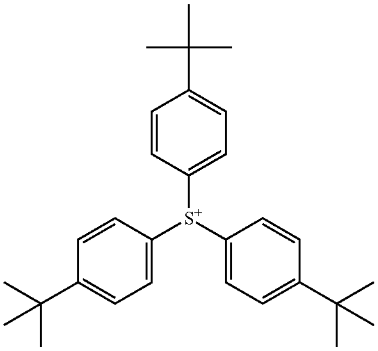
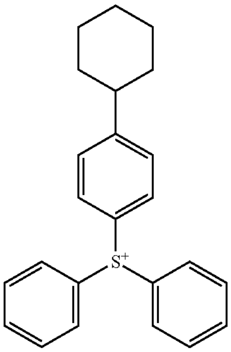
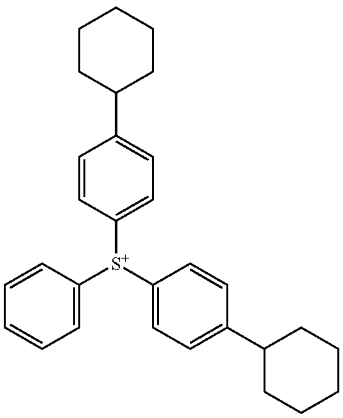

-continued
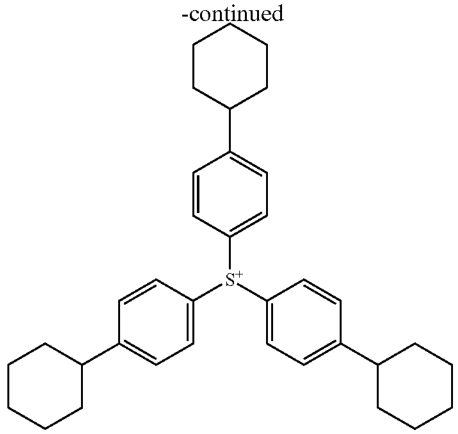
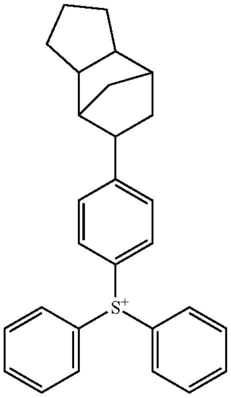
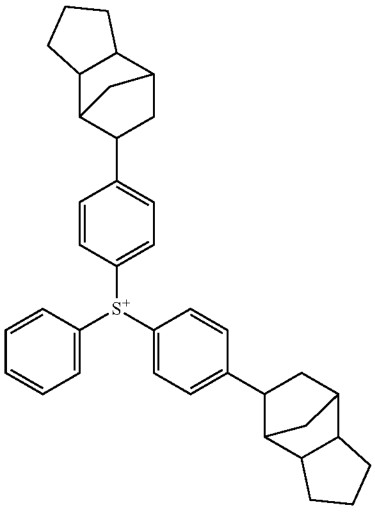
-continued
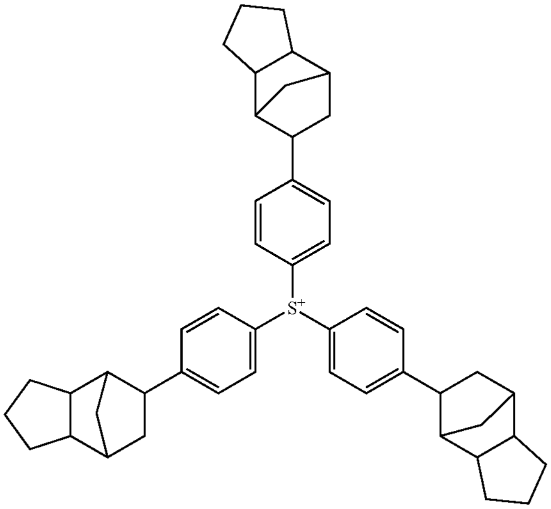
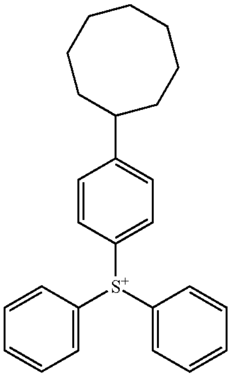
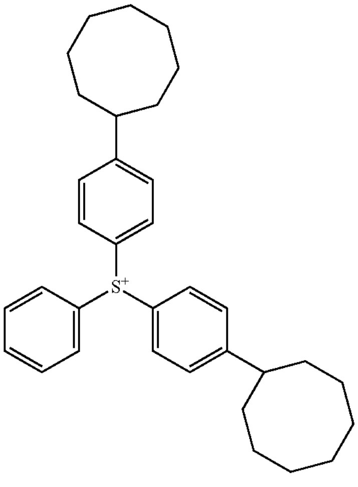

-continued
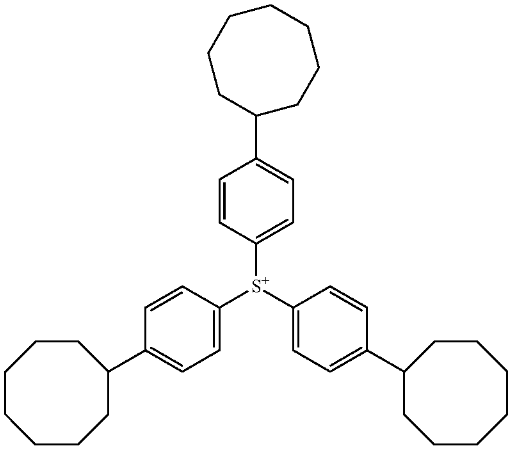
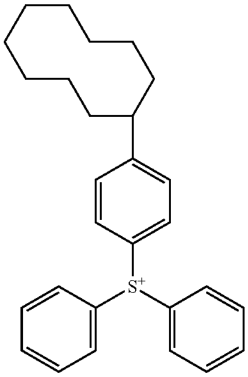
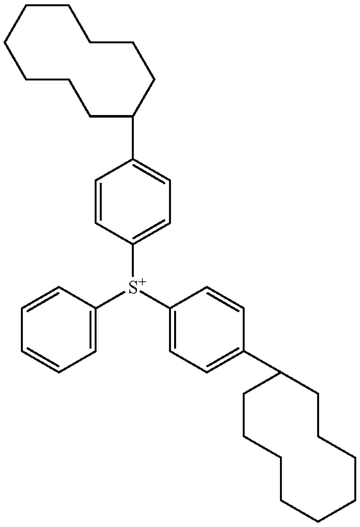
-continued
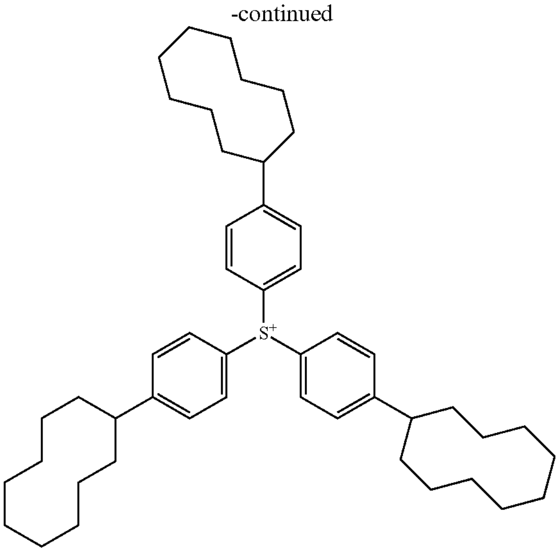
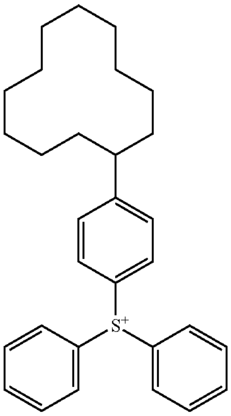
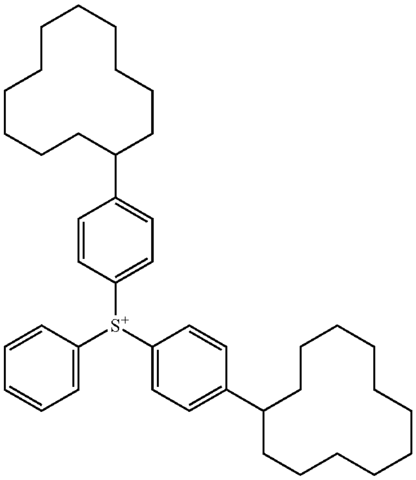

-continued
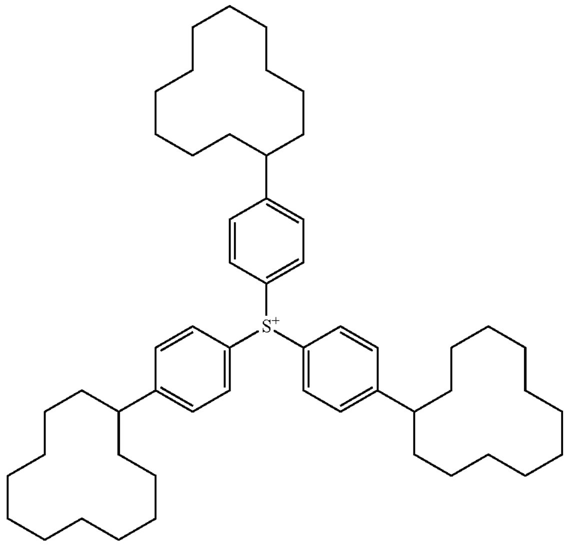
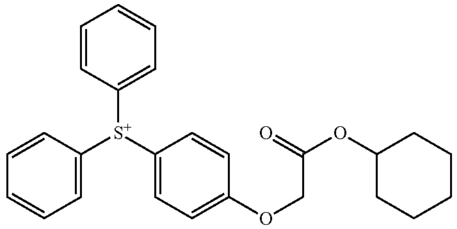
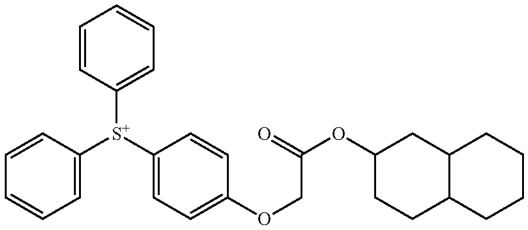
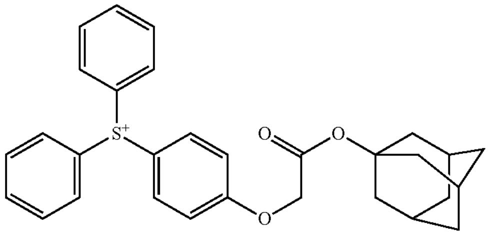
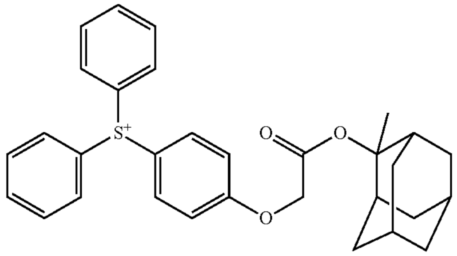
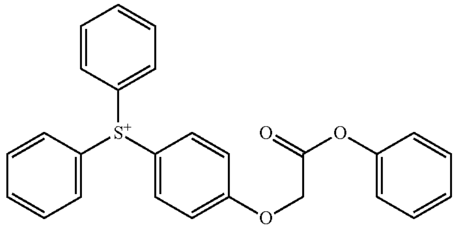
-continued
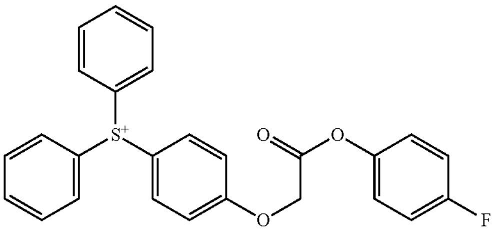
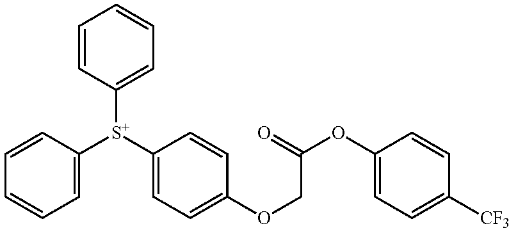
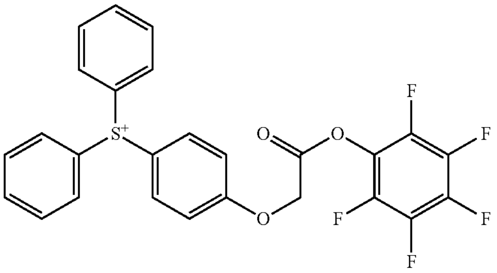
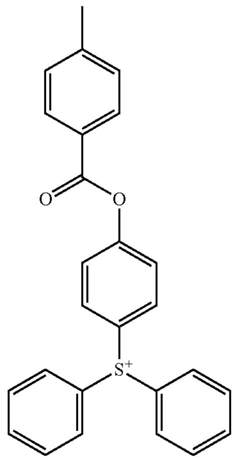
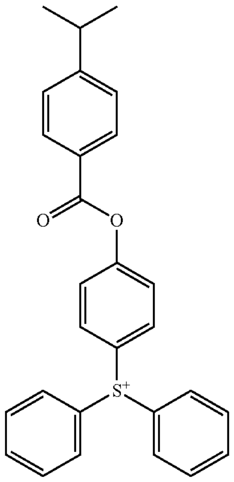
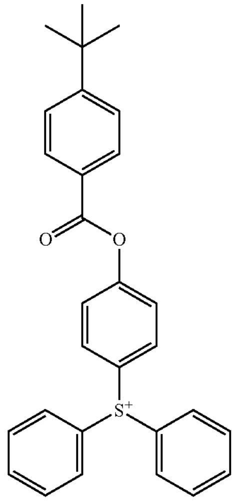
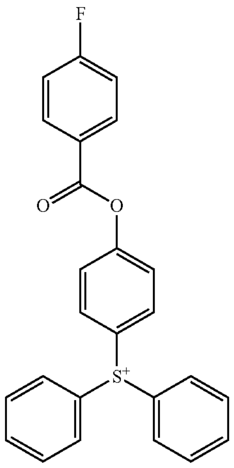

-continued
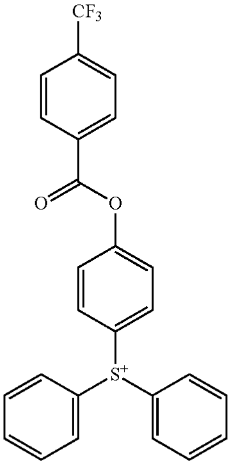
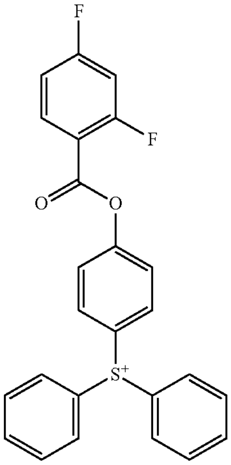
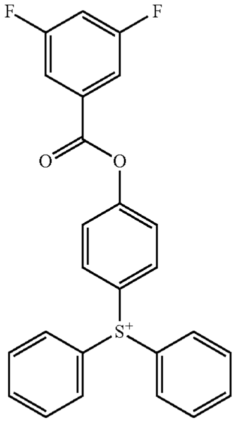
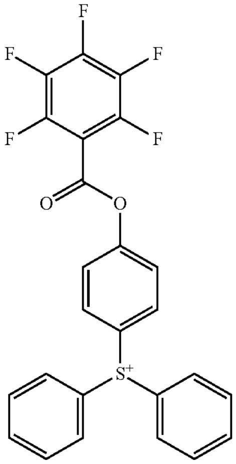
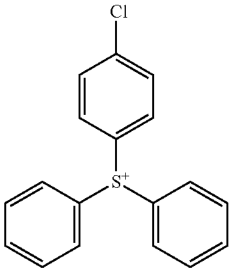
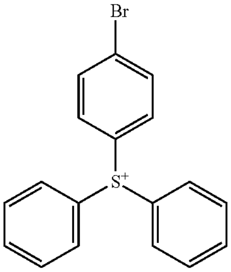
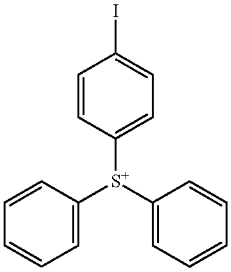
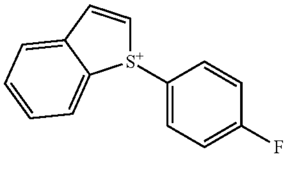
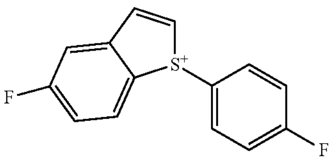
-continued
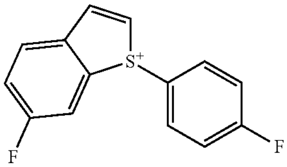
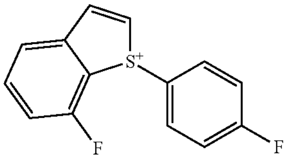
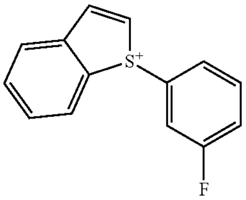
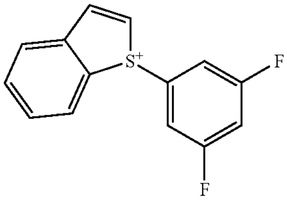
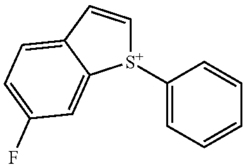
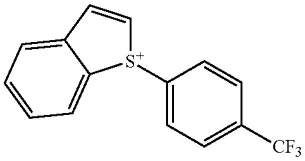
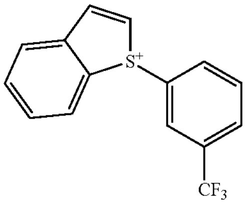
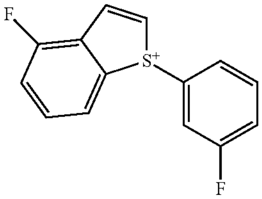
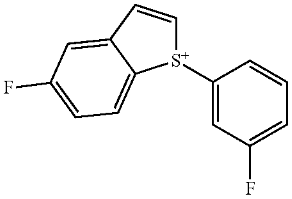
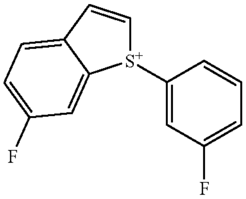
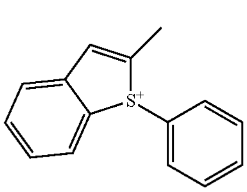
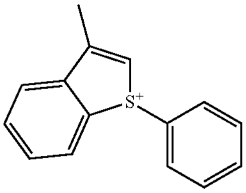
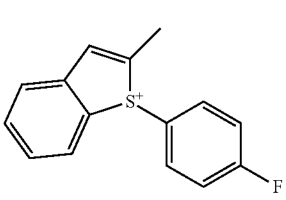
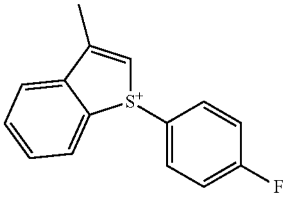

-continued
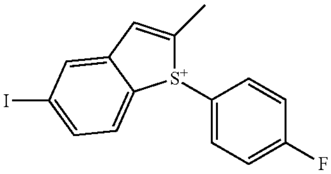
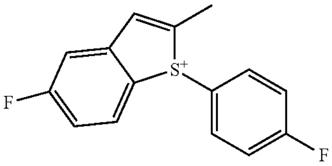
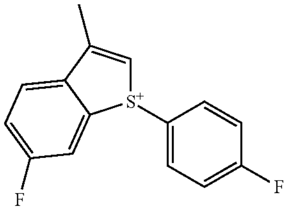
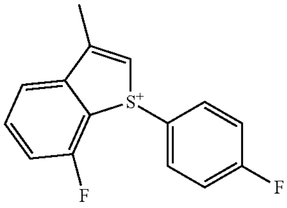
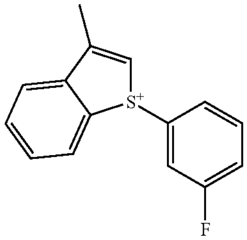
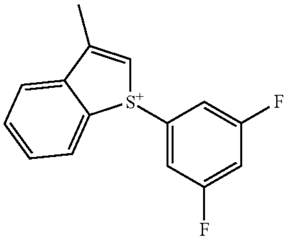
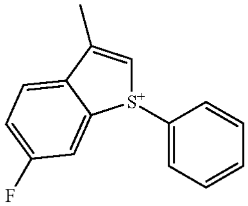
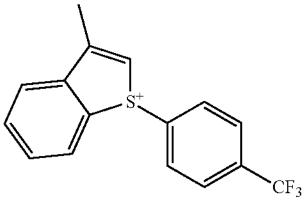
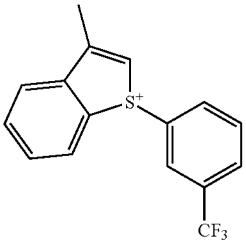
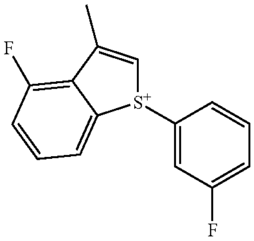
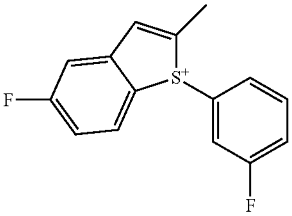
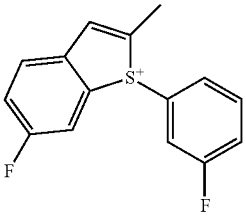
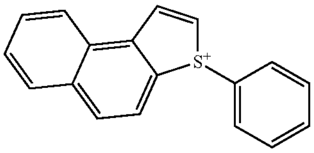
-continued
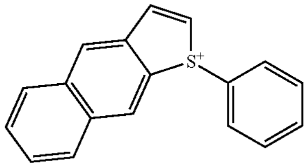
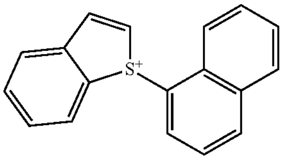
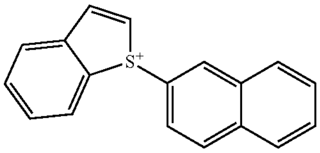
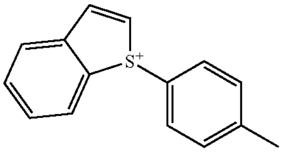
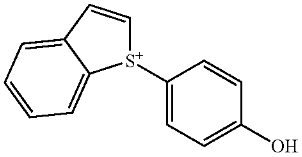
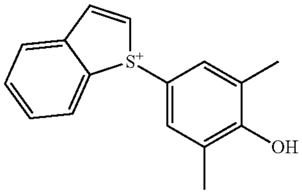
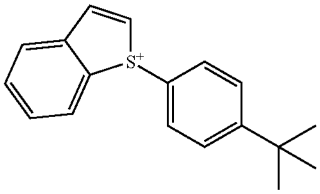
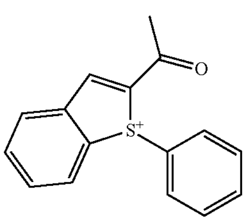
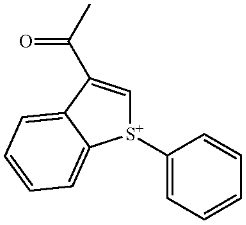
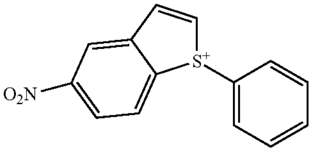
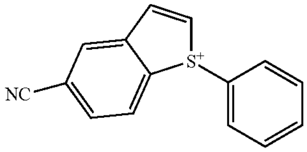

-continued
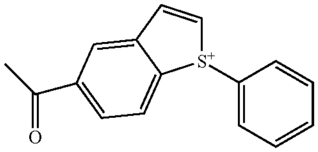
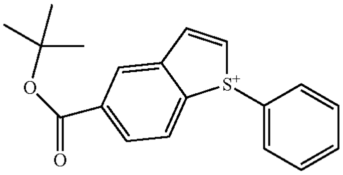
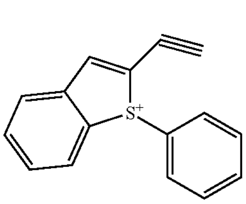
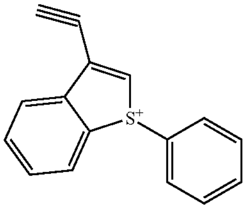
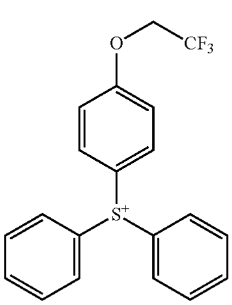
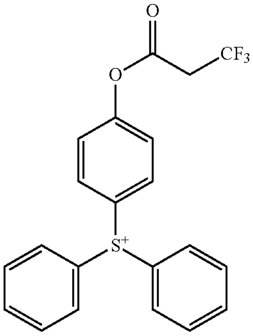
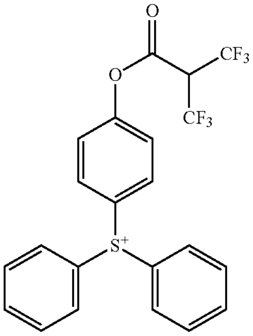
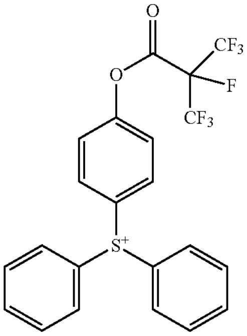
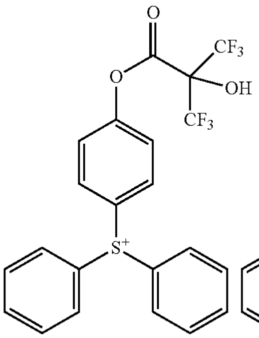
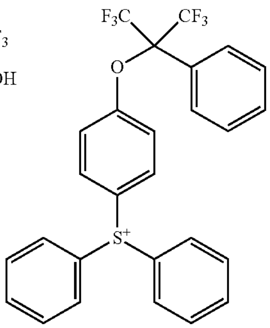
-continued
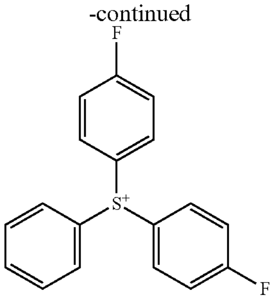
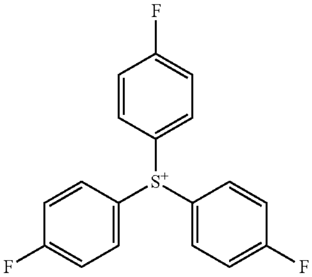
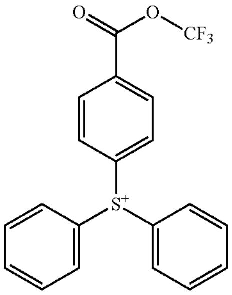
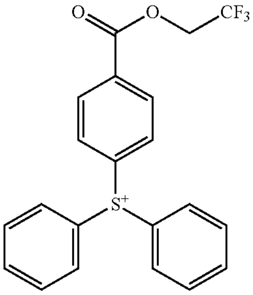
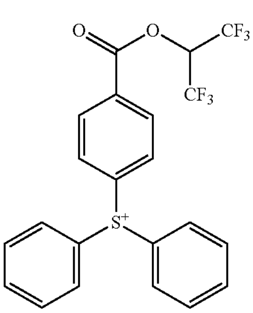
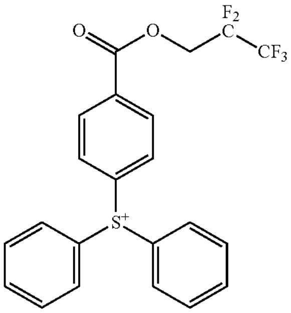
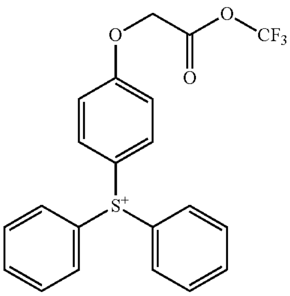

-continued
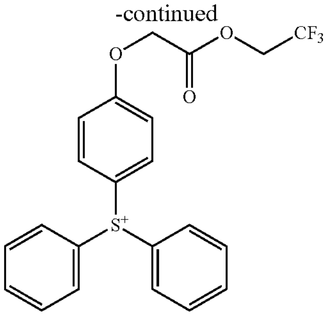
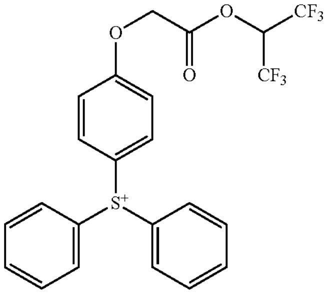
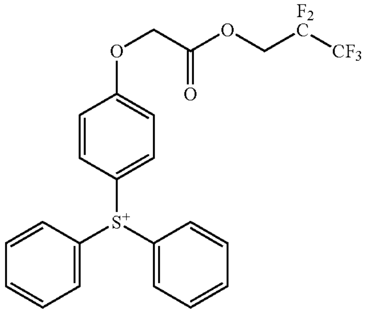
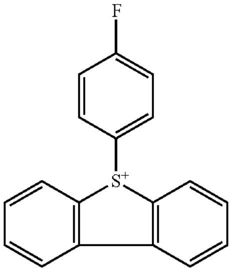
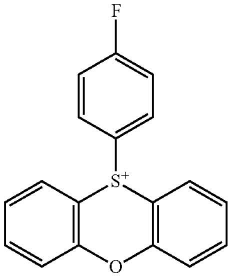
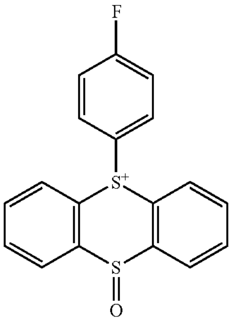
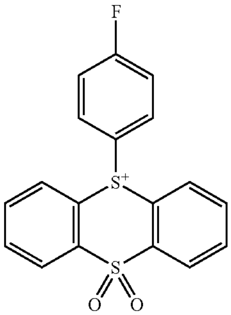
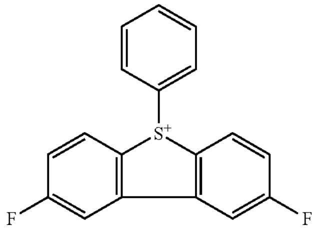
-continued
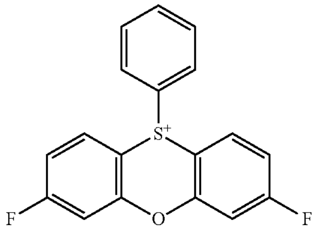
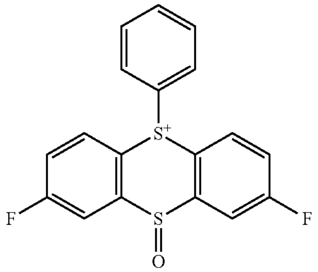
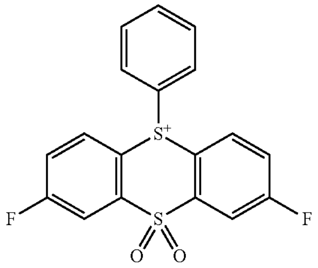
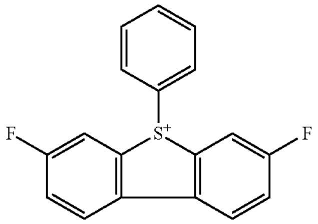
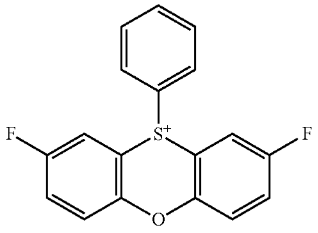
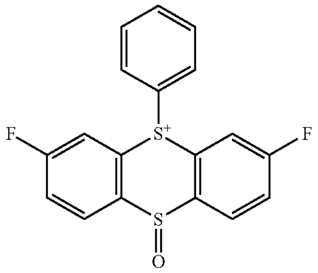

-continued
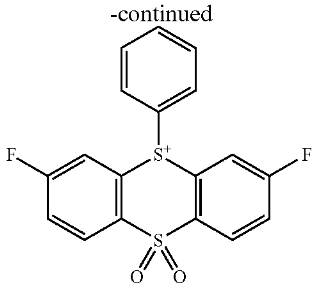
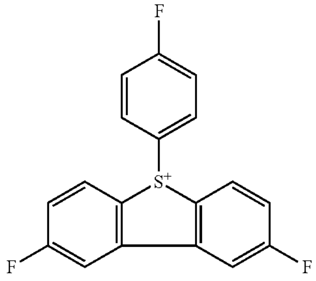
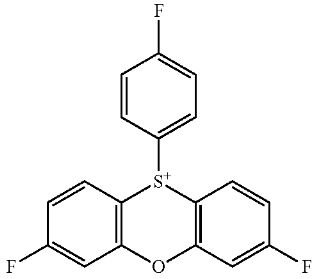
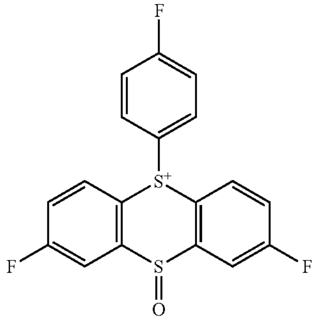
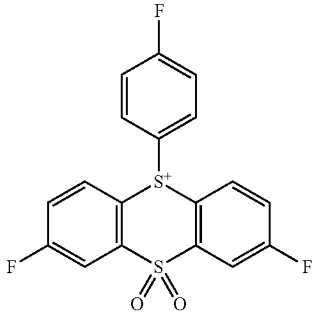
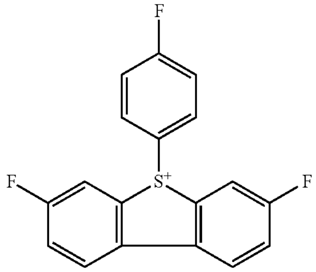
-continued
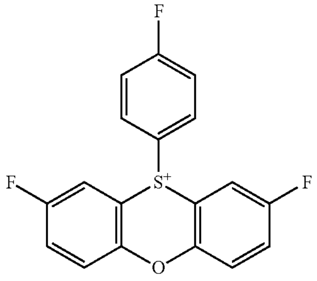
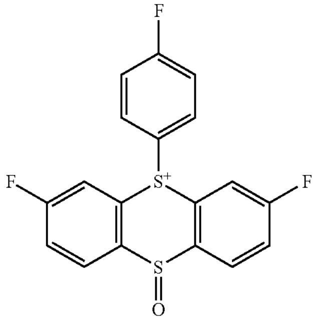
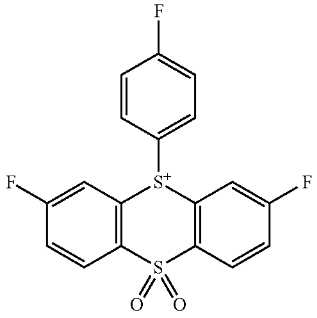
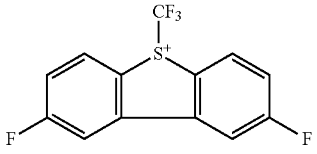
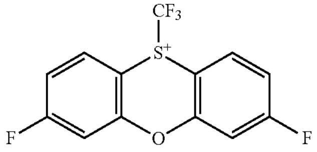
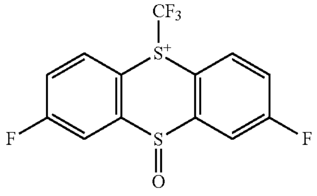
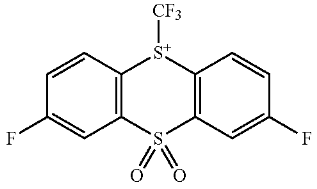

-continued
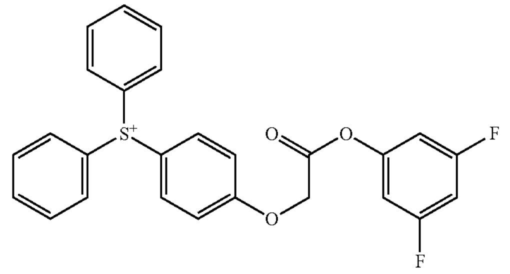
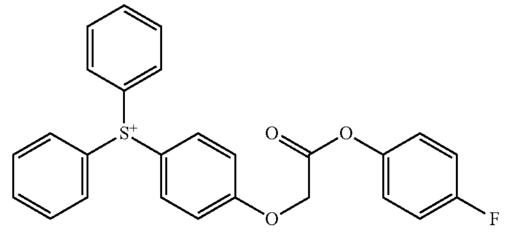
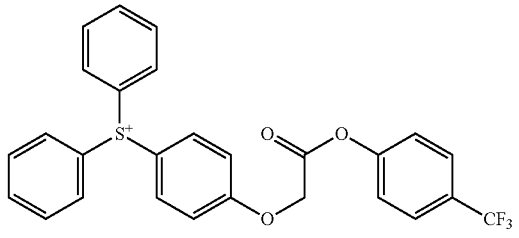
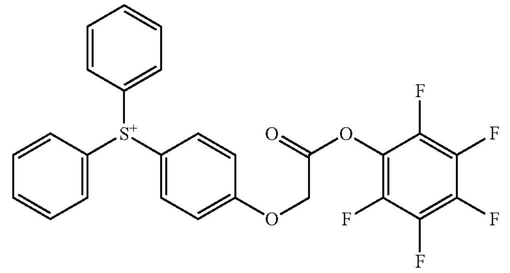
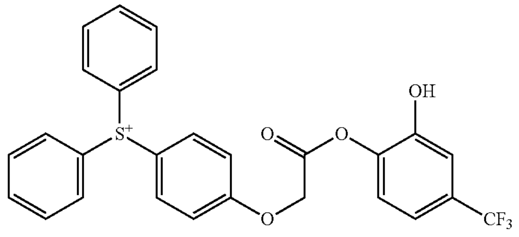
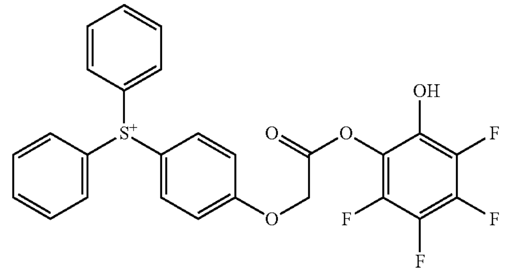
-continued
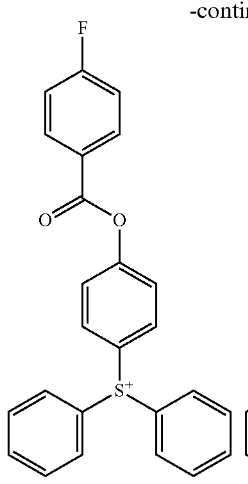
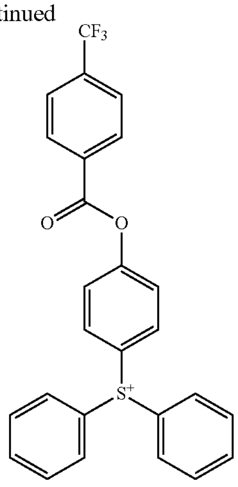
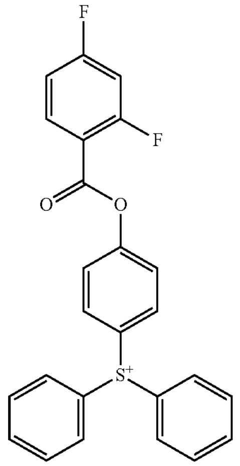
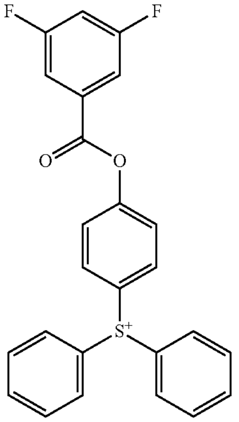
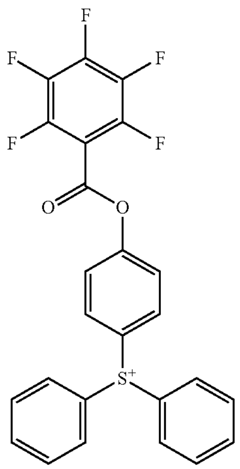
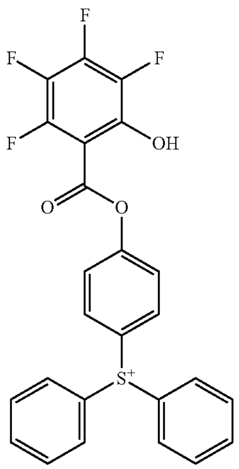

-continued
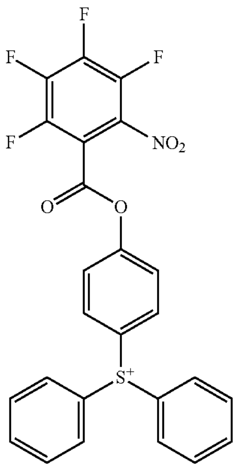
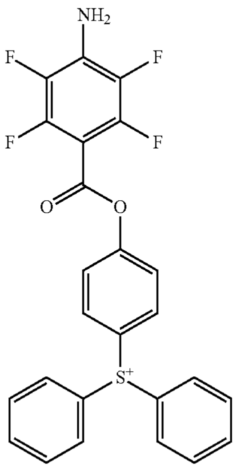
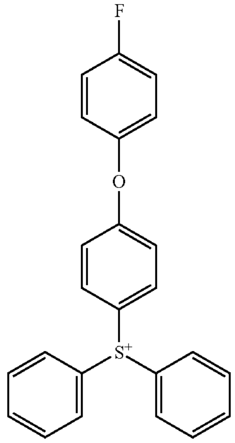
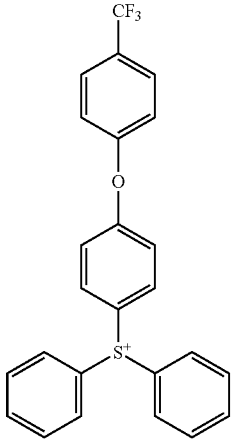
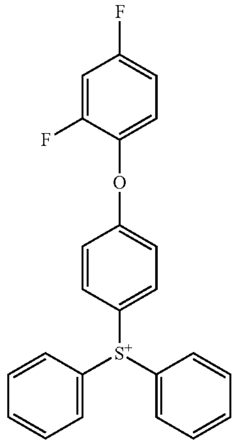
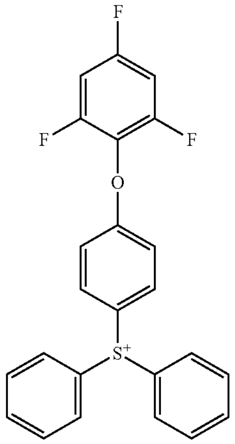
-continued
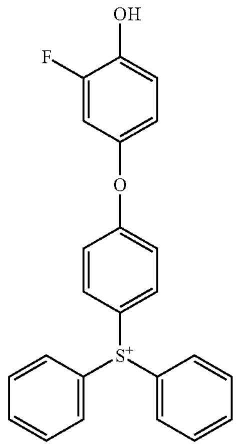
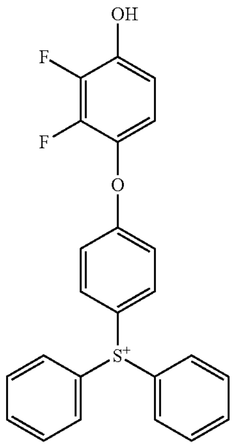
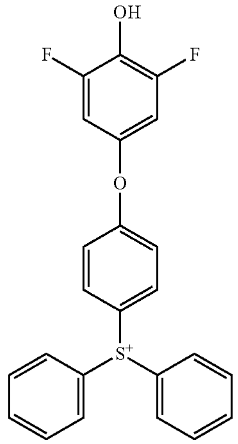
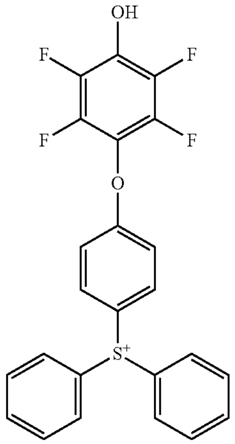
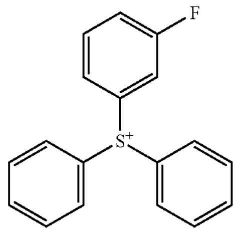
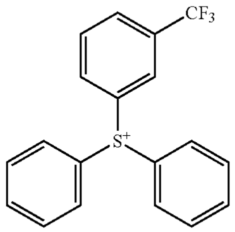
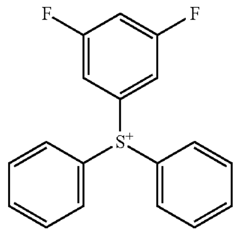
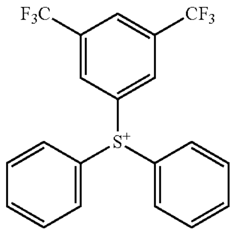
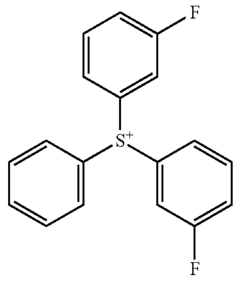
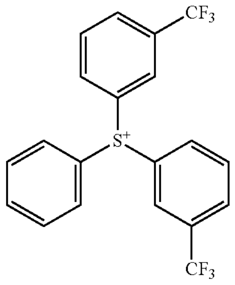

-continued
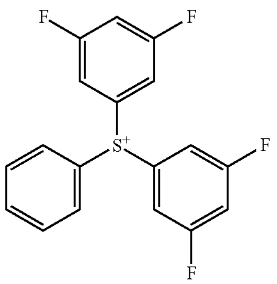
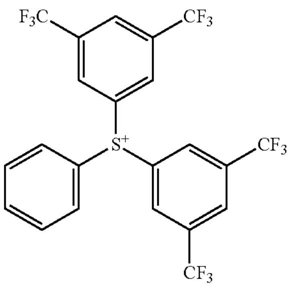
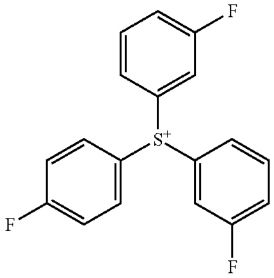
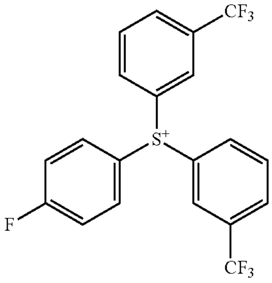
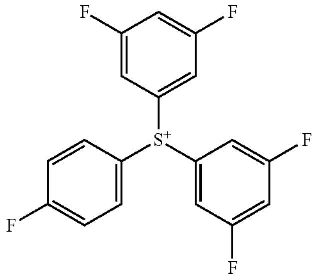
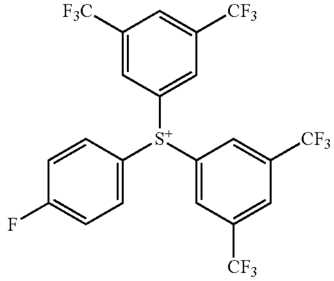
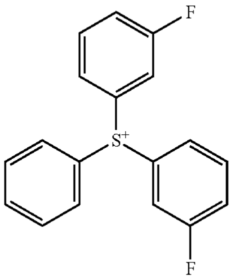
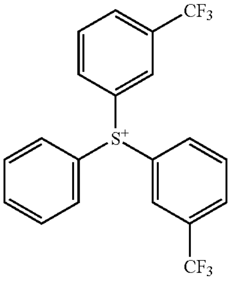
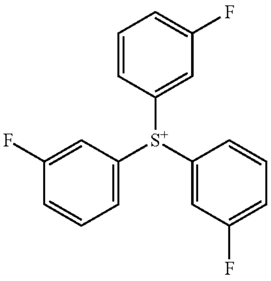
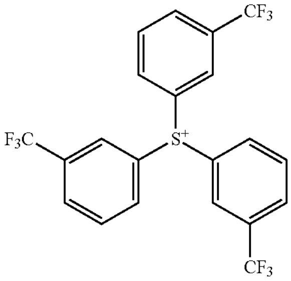
-continued
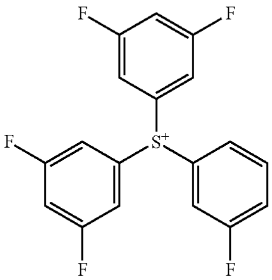
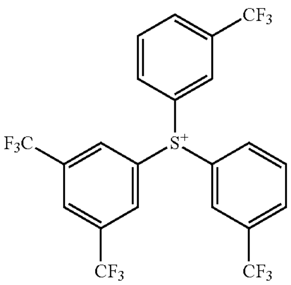
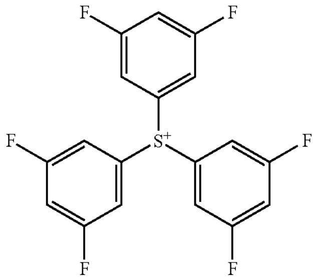
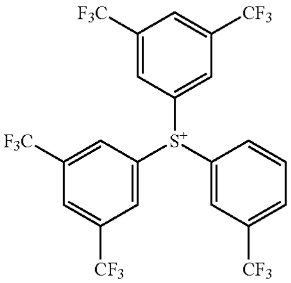
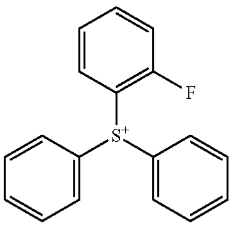
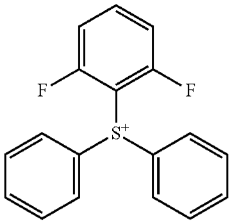
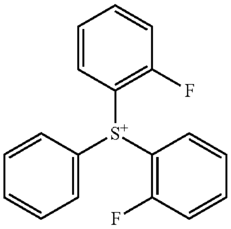
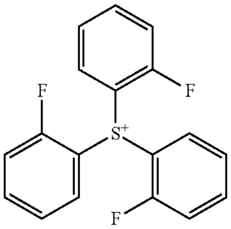
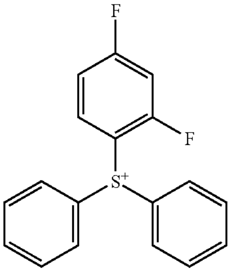
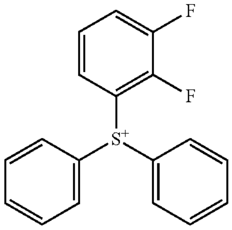
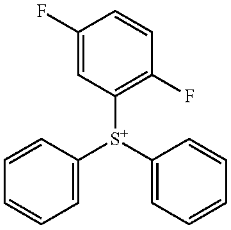

-continued
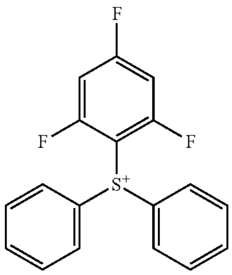
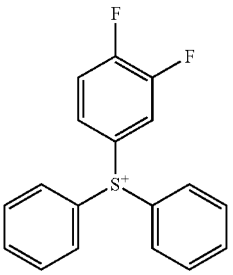
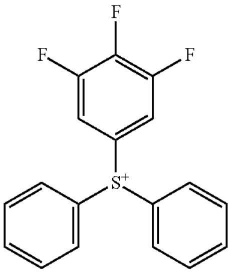
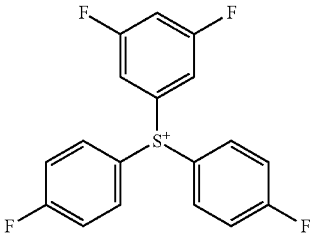
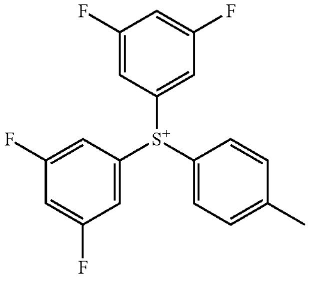
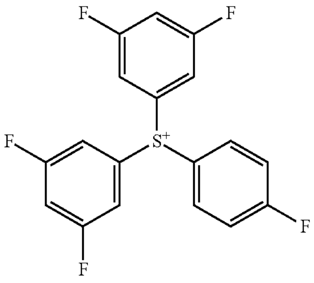
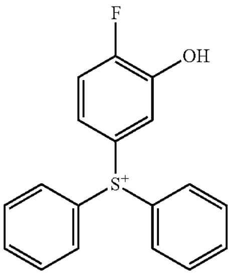
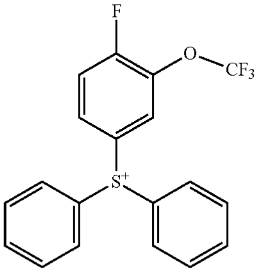
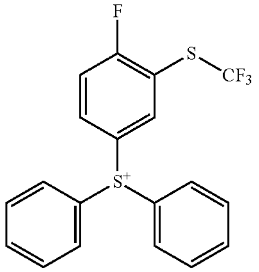
-continued
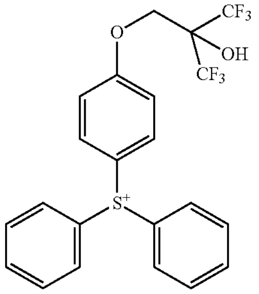
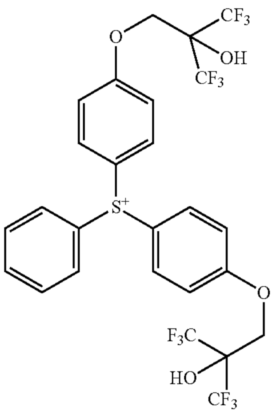
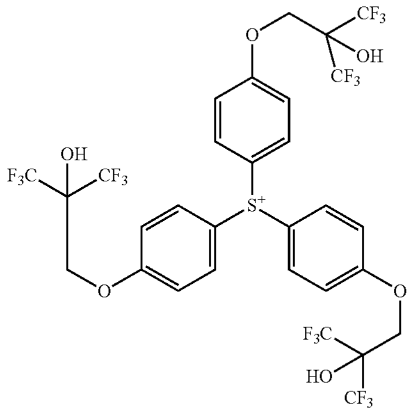
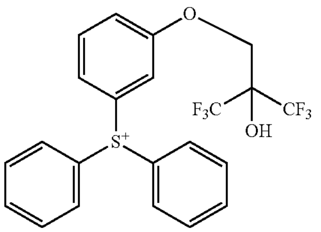
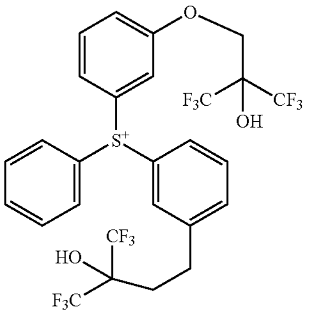
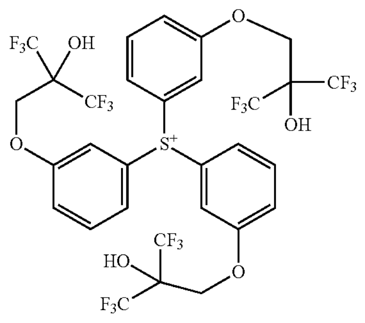

-continued
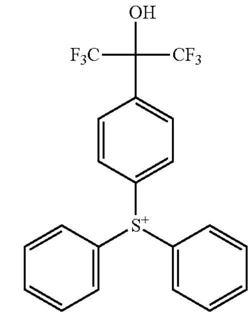
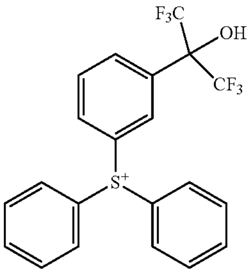
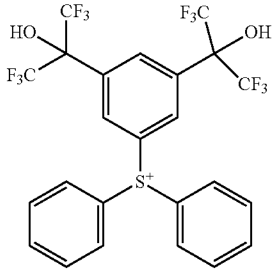
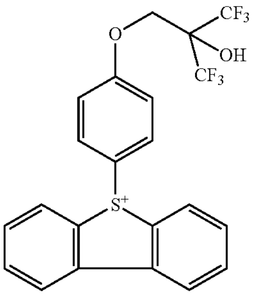
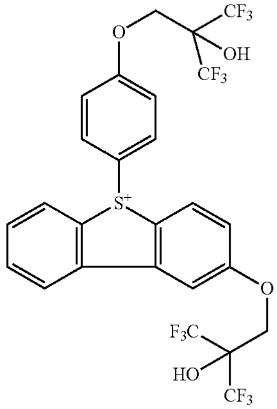
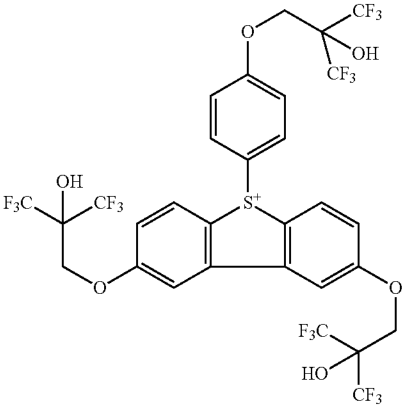
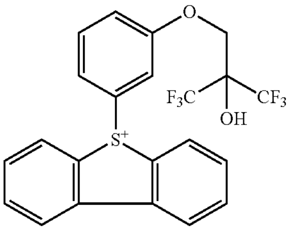
-continued
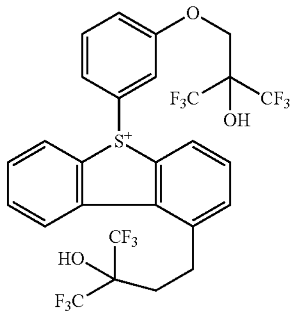
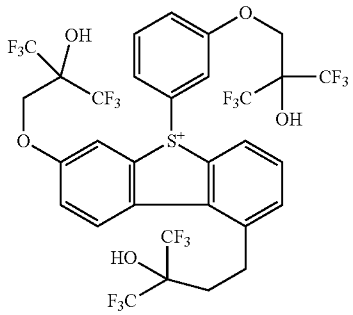
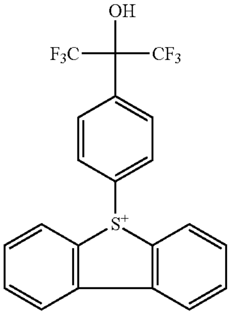
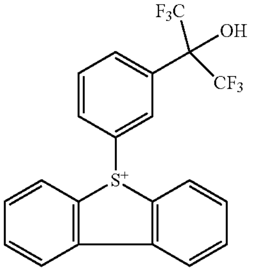
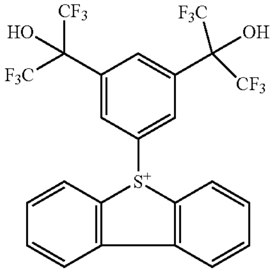
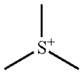
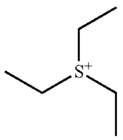
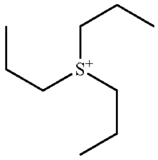
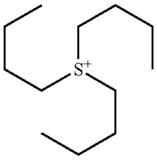
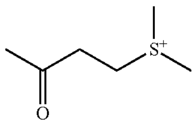
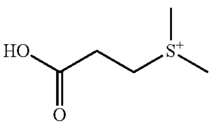
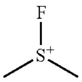
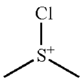
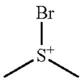
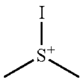
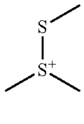
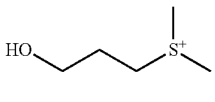

-continued
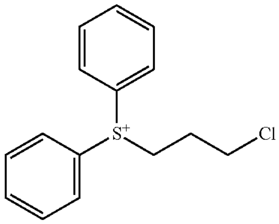
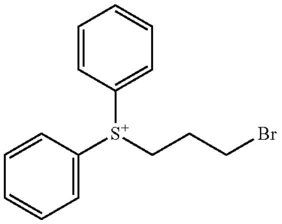
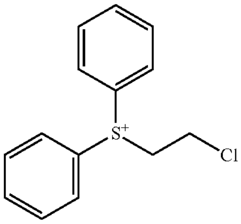
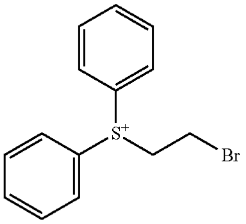
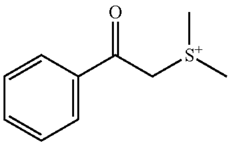
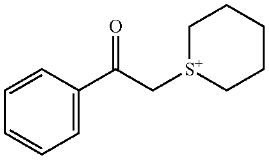
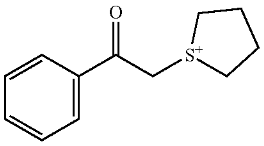
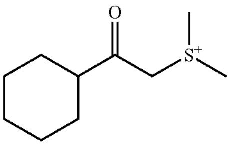
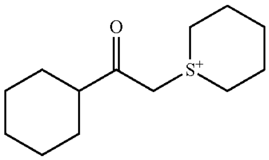
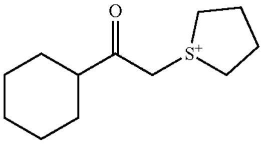
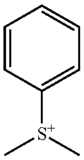
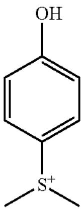
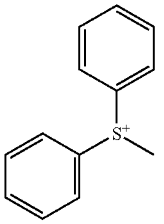
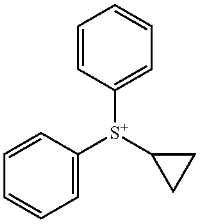
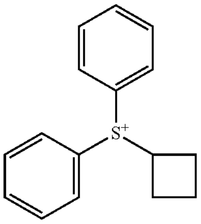
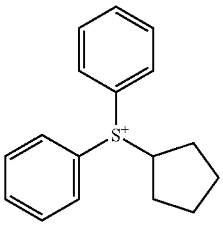
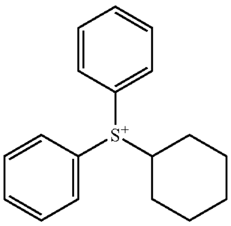
-continued
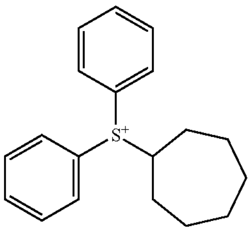
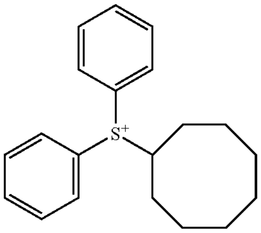
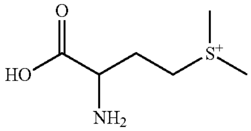
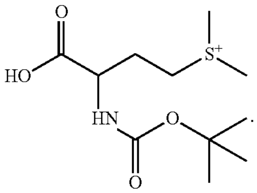
.
Examples of a cation of the iodonium salt shown by the formula (1-2) include ones shown below, but are not limited thereto.
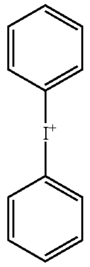
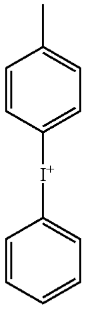
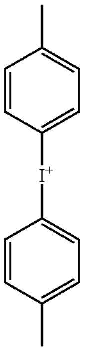
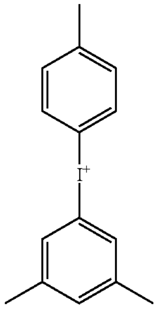
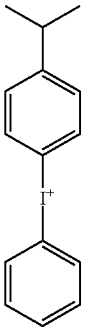
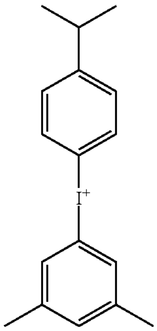
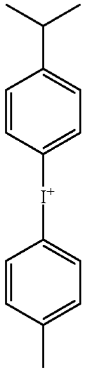
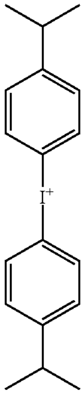

-continued
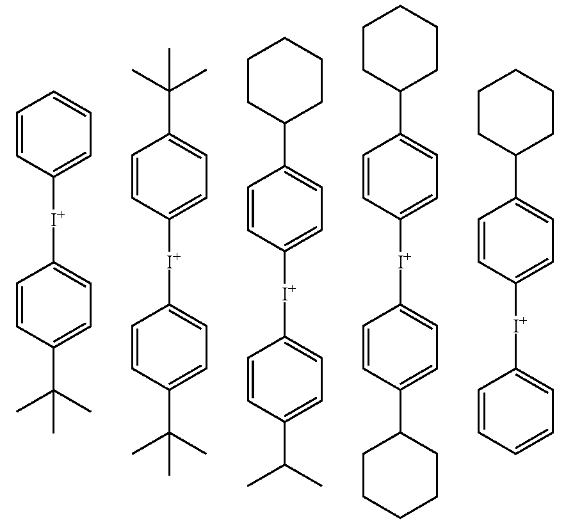
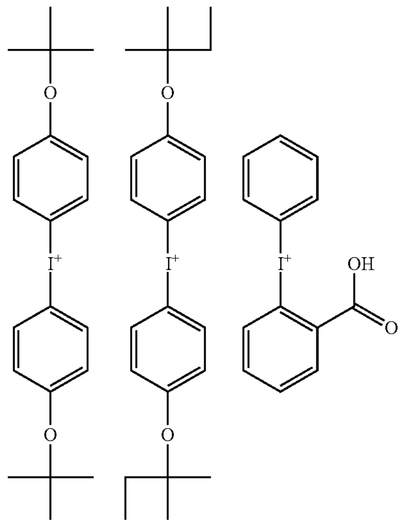
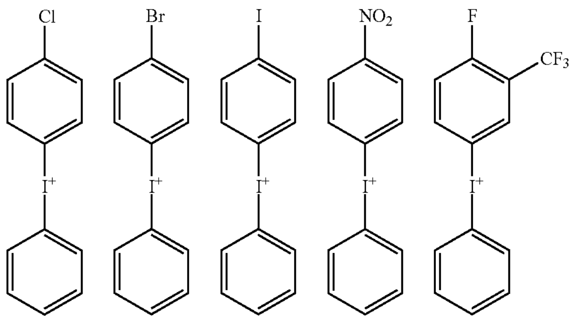
-continued
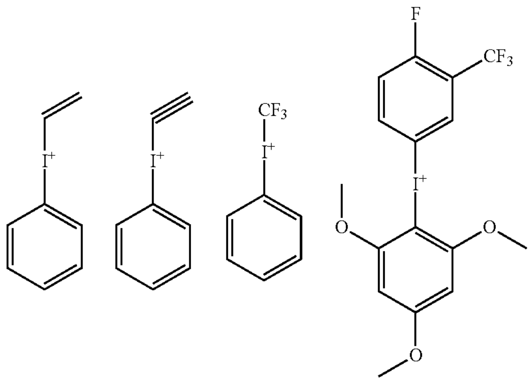
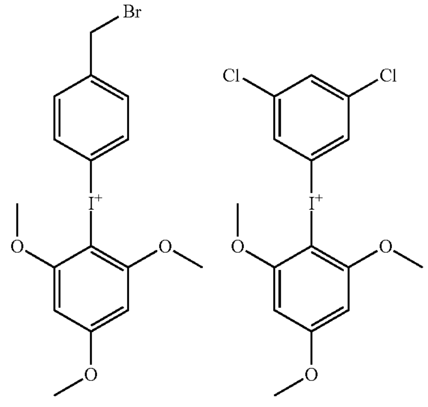
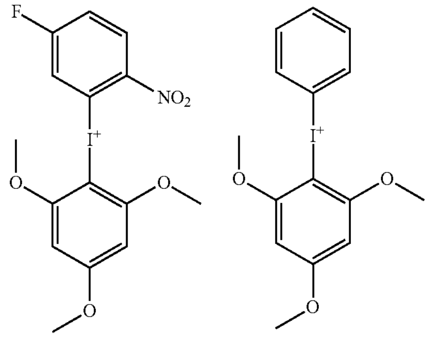
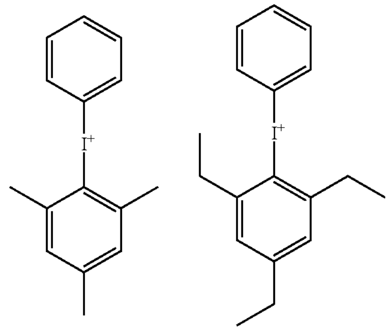

-continued

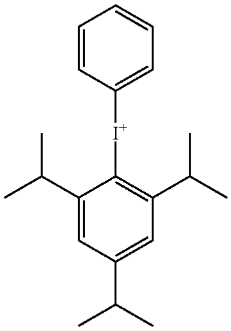

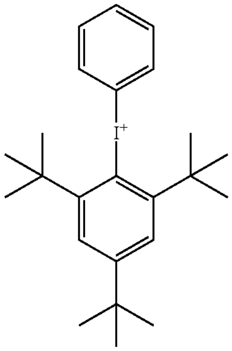

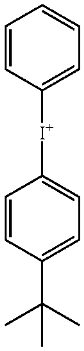 [SMILES: CC(C)(C)c1ccc([I+]c2ccccc2)cc1]

In the formulae (1-1) and (1-2), $X^-$ represents an anion selected from the following formulae (1A) to (1D).

(1A)

$$R^{fa}—CF_2—SO_3^-$$

(1B)

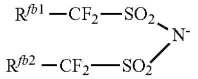

(1C)

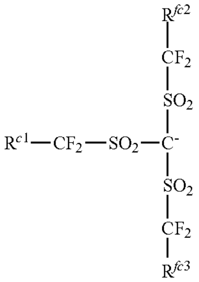

(1D)

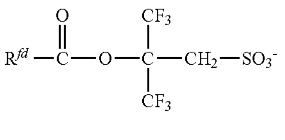

In the formula (1A), $R^{fa}$ represents a fluorine atom, or a hydrocarbyl group having 1 to 40 carbon atoms and optionally containing a heteroatom. The hydrocarbyl group may be saturated or unsaturated, and may be linear, branched, or cyclic. Specific examples thereof include ones to be described later as a hydrocarbyl group which $R^{107}$ represents in the following formula (1A').

The anion shown by the formula (1A) is preferably shown by the following formula (1A').

(1A')

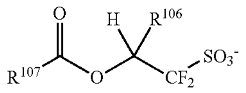

In the formula (1A'), $R^{106}$ represents a hydrogen atom or a trifluoromethyl group, preferably a trifluoromethyl group. $R^{107}$ represents a hydrocarbyl group having 1 to 38 carbon atoms and optionally containing a heteroatom. The heteroatom is preferably an oxygen atom, a nitrogen atom, a sulfur atom, a halogen atom, or the like, more preferably an oxygen atom. The hydrocarbyl group particularly preferably has 6 to 30 carbon atoms from the viewpoint of obtaining high resolution in fine pattern formation.

The hydrocarbyl group represented by $R^{107}$ may be saturated or unsaturated, and may be linear, branched, or cyclic. Specific examples thereof include alkyl groups, such as a methyl group, an ethyl group, a propyl group, an isopropyl group, a butyl group, an isobutyl group, a sec-butyl group, a tert-butyl group, a pentyl group, a neopentyl group, a hexyl group, a heptyl group, a 2-ethylhexyl group, a nonyl group, an undecyl group, a tridecyl group, a pentadecyl group, a heptadecyl group, and an icosanyl group; cyclic saturated hydrocarbyl groups, such as a cyclopentyl group, a cyclohexyl group, a 1-adamantyl group, a 2-adamantyl group, a 1-adamantylmethyl group, a norbornyl group, a norbornylmethyl group, a tricyclodecanyl group, a tetracyclododecanyl group, a tetracyclododecanylmethyl group, and a dicyclohexylmethyl group; unsaturated hydrocarbyl groups, such as an allyl group and a 3-cyclohexenyl group; aryl groups, such as a phenyl group, a 1-naphthyl group, a 2-naphthyl group, an anthracenyl group, an indenyl group, a fluorenyl group, and a pyrenyl group; aralkyl groups, such as a benzyl group and a diphenylmethyl group; etc.

In addition, these groups may have some or all of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbyl group may contain a hydroxy group, a cyano group, a carbonyl group, an ether bond, an ester bond, a sulfonic acid ester bond, a carbonate group, a lactone ring, a sultone ring, a carboxylic anhydride, a haloalkyl group, etc. Examples of the hydrocarbyl group containing a heteroatom include a tetrahydrofuryl group, a methoxymethyl group, an ethoxymethyl group, a methylthiomethyl group, an acetamidomethyl group, a trifluoroethyl group, a (2-methoxyethoxy)methyl group, an acetoxymethyl group, a 2-carboxy-1-cyclohexyl group, a 2-oxopropyl group, a 4-oxo-1-adamantyl group, a 3-oxocyclohexyl group, etc.

The synthesis of the sulfonium salt containing the anion shown by the formula (1A') is described in detail in JP 2007-145797A, JP 2008-106045A, JP 2009-7327A, JP 2009-258695A, etc. In addition, sulfonium salts disclosed in JP 2010-215608A, JP 2012-41320A, JP 2012-106986A, JP 2012-153644A, etc. are also suitably used.

Examples of the anion shown by the formula (1A) include ones exemplified as an anion shown by formula (1A) in JP 2018-197853A.

In the formula (1B), $R^{fb1}$ and $R^{fb2}$ each independently represent a fluorine atom, or a hydrocarbyl group having 1 to 40 carbon atoms and optionally containing a heteroatom. The hydrocarbyl group may be saturated or unsaturated, and may be linear, branched, or cyclic. Specific examples thereof include those exemplified in the description of $R^{107}$ in the formula (1A'). $R^{fb1}$ and $R^{fb2}$ are preferably a fluorine atom or a linear fluorinated alkyl group having 1 to 4 carbon atoms. Alternatively, $R^{fb1}$ and $R^{fb2}$ may bond with each other to form a ring together with a group ($—CF_2—SO_2—N^-—SO_2—CF_2—$) bonded therewith. In this event, the group obtained by bonding $R^{fb1}$ and $R^{fb2}$ with each other is preferably a fluorinated ethylene group or a fluorinated propylene group.

In the formula (1C), $R^{fc1}$, $R^{fc2}$, and $R^{fc3}$ each independently represent a fluorine atom, or a hydrocarbyl group having 1 to 40 carbon atoms and optionally containing a heteroatom. The hydrocarbyl group may be saturated or unsaturated, and may be linear, branched, or cyclic. Specific examples thereof include those exemplified in the description of $R^{107}$ in the formula (1A'). $R^{fc1}$, $R^{fc2}$ and $R^{fc3}$ are preferably a fluorine atom or a linear fluorinated alkyl group having 1 to 4 carbon atoms. Alternatively, $R^{fc1}$ and $R^{fc2}$ may bond with each other to form a ring together with a group ($—CF_2—SO_2—C^-—SO_2—CF_2—$) bonded therewith. In this event, the group obtained by bonding $R^{fc1}$ and $R^{fc2}$ with each other is preferably a fluorinated ethylene group or a fluorinated propylene group.

In the formula (1D), $R^{fd}$ represents a hydrocarbyl group having 1 to 40 carbon atoms and optionally containing a heteroatom. The hydrocarbyl group may be saturated or unsaturated, and may be linear, branched, or cyclic. Specific examples thereof include those exemplified in the description of $R^{107}$ in the formula (1A').

The synthesis of the sulfonium salt containing the anion shown by the formula (1D) is described in detail in JP 2010-215608A and JP 2014-133723A.

Examples of the anion shown by the formula (1D) include ones exemplified as an anion shown by formula (1D) in JP 2018-197853A.

Note that the photo-acid generator containing the anion shown by the formula (1D) does not have fluorine at α position of the sulfo group, but has two trifluoromethyl groups at β position, thereby providing sufficient acidity to cut the acid labile group in the base polymer. Thus, this photo-acid generator is utilizable.

Further, one shown by the following formula (2) can also be used suitably as a photo-acid generator.

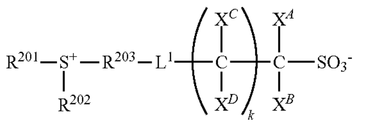

(2)

In the formula (2), $R^{201}$ and $R^{202}$ each independently represent a hydrocarbyl group having 1 to 30 carbon atoms and optionally containing a heteroatom. $R^{203}$ represents a hydrocarbylene group having 1 to 30 carbon atoms and optionally containing a heteroatom. Alternatively, $R^{201}$ and $R^{202}$, or $R^{201}$ and $R^{203}$, may bond with each other to form a ring together with a sulfur atom bonded therewith. In this event, examples of the ring include those exemplified as the ring which can be formed by bonding $R^{101}$ and $R^{102}$ together with the sulfur atom in the description of the formula (1-1).

The hydrocarbyl group represented by $R^{201}$ and $R^{202}$ may be saturated or unsaturated, and may be linear, branched, or cyclic. Specific examples thereof include: alkyl groups, such as a methyl group, an ethyl group, a propyl group, an isopropyl group, an n-butyl group, a sec-butyl group, a tert-butyl group, an n-pentyl group, a tert-pentyl group, an n-hexyl group, an n-octyl group, a 2-ethylhexyl group, an n-nonyl group, and an n-decyl group; cyclic saturated hydrocarbyl groups, such as a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo[5.2.1.$0^{2,6}$]decanyl group, and an adamantyl group; aryl groups, such as a phenyl group, a methylphenyl group, an ethylphenyl group, an n-propylphenyl group, an isopropylphenyl group, an n-butylphenyl group, an isobutylphenyl group, a sec-butylphenyl group, a tert-butylphenyl group, a naphthyl group, a methylnaphthyl group, an ethylnaphthyl group, an n-propylnaphthyl group, an isopropylnaphthyl group, an n-butylnaphthyl group, an isobutylnaphthyl group, a sec-butylnaphthyl group, a tert-butylnaphthyl group, and an anthracenyl group; etc. Additionally, these groups may have some or all of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbyl group may contain a hydroxy group, a cyano group, a carbonyl group, an ether bond, an ester bond, a sulfonic acid ester bond, a carbonate group, a lactone ring, a sultone ring, a carboxylic anhydride, a haloalkyl group, etc.

The hydrocarbylene group represented by $R^{203}$ may be saturated or unsaturated, and may be linear, branched, or cyclic. Specific examples thereof include alkanediyl groups, such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; cyclic saturated hydrocarbylene groups, such as a cyclopentanediyl group, a cyclohexanediyl group, a norbornanediyl group, and an adamantanediyl group; arylene groups, such as a phenylene group, a methylphenylene group, an ethylphenylene group, an n-propylphenylene group, an isopropylphenylene group, an n-butylphenylene group, an isobutylphenylene group, a sec-butylphenylene group, a tert-butylphenylene group, a naphthylene group, a methylnaphthylene group, an ethylnaphthylene group, an n-propylnaphthylene group, an isopropylnaphthylene group, an n-butylnaphthylene group, an isobutylnaphthylene group, a sec-butylnaphthylene group, and a tert-butylnaphthylene group; etc. Additionally, these groups may have some or all of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbylene group may contain a hydroxy group, a cyano group, a carbonyl group, an ether bond, an ester bond, a sulfonic acid ester bond, a carbonate group, a lactone ring, a sultone ring, a carboxylic anhydride, a haloalkyl group, etc. The heteroatom is preferably an oxygen atom.

In the formula (2), $L^1$ represents a single bond, an ether bond, or a hydrocarbylene group having 1 to 20 carbon atoms and optionally containing a heteroatom. The hydrocarbylene group may be saturated or unsaturated, and may be linear, branched, or cyclic. Specific examples thereof include those exemplified as the hydrocarbylene group represented by $R^{203}$.

In the formula (2), $X^A$, $X^B$, $X^C$, and $X^D$ each independently represent a hydrogen atom, a fluorine atom, or a trifluoromethyl group. Nevertheless, at least one of $X^A$, $X^B$, $X^C$, and $X^D$ is a fluorine atom or a trifluoromethyl group.

In the formula (2), "k" represents an integer of 0 to 3.

The photo-acid generator shown by the formula (2) is preferably shown by the following formula (2').

(2')

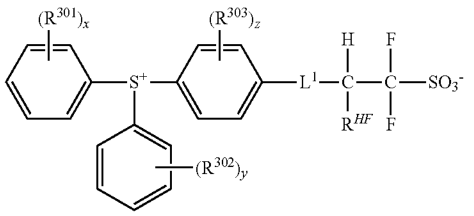

In the formula (2'), $L^1$ is as defined above. $R^{HF}$ represents a hydrogen atom or a trifluoromethyl group, preferably a trifluoromethyl group. $R^{301}$, $R^{302}$, and $R^{303}$ each independently represent a hydrogen atom, or a hydrocarbyl group having 1 to 20 carbon atoms and optionally containing a heteroatom. The hydrocarbyl group may be saturated or unsaturated, and may be linear, branched, or cyclic. Specific examples thereof include those exemplified in the description of $R^{107}$ in the formula (1A'). "x" and "y" each independently represent an integer of 0 to 5. "z" represents an integer of 0 to 4.

Examples of the photo-acid generator shown by the formula (2) include ones exemplified as a photo-acid generator shown by formula (2) in JP 2017-026980A.

The photo-acid generators containing the anion shown by the formula (1A') or (1D) are particularly preferable because of small acid diffusion and excellent solubility to a resist solvent. One shown by the formula (2') is also particularly preferable because the acid diffusion is quite small.

Furthermore, the photo-acid generator can be a sulfonium salt or iodonium salt of a sulfonic acid containing an iodine atom-substituted aromatic ring. Examples of such sulfonium salt or iodonium salt of a sulfonic acid containing an iodine atom-substituted aromatic ring include ones shown by the following formula (2-1) or (2-2). The iodine atom-substituted aromatic ring may be substituted with a bromine atom(s) instead of an iodine atom(s).

(2-1)

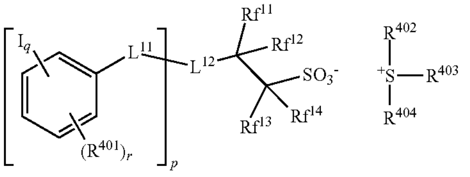

-continued (2-2)

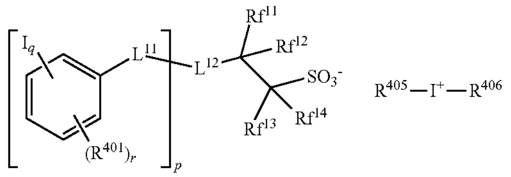

In the formulae (2-1) and (2-2), "p" represents an integer satisfying 1≤p≤3. "q" and "r" represent integers satisfying 1≤q≤5, 0≤r≤3, and 1≤q+r≤5. $L^{11}$ represents a single bond, or a linear, branched, or cyclic saturated hydrocarbylene group having 1 to 6 carbon atoms and optionally containing an ether bond or an ester bond. $L^{12}$ represents a single bond or a divalent linking group having 1 to 20 carbon atoms when "p" is 1, or represents a trivalent or tetravalent linking group having 1 to 20 carbon atoms when "p" is 2 or 3, the linking groups optionally containing an oxygen atom, a sulfur atom, a nitrogen atom, a chlorine atom, a bromine atom, or an iodine atom. $R^{401}$ represents a hydroxy group, a carboxyl group, a fluorine atom, a chlorine atom, a bromine atom, an amino group, $—NR^{401A}—C(═O)—R^{401B}$, or $—NR^{401A}—C(═O)—O—R^{401B}$, or a saturated hydrocarbyl group having 1 to 20 carbon atoms, a saturated hydrocarbyloxy group having 1 to 20 carbon atoms, a saturated hydrocarbyloxycarbonyl group having 2 to 10 carbon atoms, a saturated hydrocarbylcarbonyloxy group having 2 to 20 carbon atoms, a saturated hydrocarbylsulfonyloxy group having 1 to 20 carbon atoms, or an aromatic hydrocarbon group having 6 to 20 carbon atoms each of which optionally contains an ether bond. $R^{401A}$ represents a hydrogen atom or a saturated hydrocarbyl group having 1 to 6 carbon atoms, and optionally contains a halogen atom, a hydroxy group, an alkoxy group having 1 to 6 carbon atoms, a saturated hydrocarbylcarbonyl group having 2 to 6 carbon atoms, or a saturated hydrocarbylcarbonyloxy group having 2 to 6 carbon atoms. $R^{401B}$ represents an aliphatic hydrocarbyl group having 1 to 16 carbon atoms or an aryl group having 6 to 12 carbon atoms, and optionally contains a halogen atom, a hydroxy group, a saturated hydrocarbyloxy group having 1 to 6 carbon atoms, a saturated hydrocarbylcarbonyl group having 2 to 6 carbon atoms, or a saturated hydrocarbylcarbonyloxy group having 2 to 6 carbon atoms; the aliphatic hydrocarbyl group is saturated or unsaturated, and linear, branched, or cyclic; and the saturated hydrocarbyl group, saturated hydrocarbyloxy group, saturated hydrocarbyloxycarbonyl group, saturated hydrocarbylcarbonyl groups, saturated hydrocarbylcarbonyloxy groups, and saturated hydrocarbylsulfonyloxy group are linear, branched, or cyclic. When "p" and/or "r" are 2 or more, $R^{401}$'s are identical to or different from one another. $Rf^{11}$ to $Rf^{14}$ each independently represent a hydrogen atom, a fluorine atom, or a trifluoromethyl group, at least one of $Rf^{11}$ to $Rf^{14}$ is a fluorine atom or a trifluoromethyl group, and $Rf^{11}$ and $Rf^{12}$ optionally bond with each other to form a carbonyl group. $R^{402}$, $R^{403}$, $R^{404}$, $R^{405}$ and $R^{906}$ each independently represent a hydrocarbyl group having 1 to 20 carbon atoms and optionally containing a fluorine atom, a chlorine atom, a bromine atom, an iodine atom, or a heteroatom; the hydrocarbyl group is saturated or unsaturated, and linear, branched, or cyclic; and the groups as $R^{402}$, $R^{403}$, $R^{404}$, $R^{405}$, and $R^{406}$ have some or all of hydrogen atoms optionally substituted with a hydroxy group, a carboxyl group, a halogen atom, a cyano group, a nitro group, a mercapto group, a sultone group, a sultone group, or a sulfonium salt-containing group, and have some of carbon atoms optionally substituted with an ether bond, an ester bond, a carbonyl group, an amide bond, a carbonate group, or a sulfonic acid ester bond. $R^{402}$ and $R^{403}$ are optionally bonded to each other to form a ring together with a sulfur atom bonded thereto.

In the formulae (2-1) and (2-2), "p" is an integer of $1 \leq p \leq 3$. "q" and "r" are integers satisfying $1 \leq q \leq 5$, $0 \leq r \leq 3$, and $1 \leq q+r \leq 5$. Preferably, "q" is an integer of $1 \leq q \leq 3$, and "r" is an integer of $0 \leq r \leq 2$.

$L^{11}$ is a single bond, or a linear, branched, or cyclic saturated hydrocarbylene group having 1 to 6 carbon atoms optionally containing an ether bond or an ester bond. $L^{12}$ is a single bond or a divalent linking group having 1 to 20 carbon atoms when "p" is 1, or a trivalent or tetravalent linking group having 1 to 20 carbon atoms when "p" is 2 or 3. The linking groups may contain an oxygen atom, a sulfur atom, a nitrogen atom, a chlorine atom, a bromine atom, or an iodine atom.

$R^{401}$ is a hydroxy group, a carboxyl group, a fluorine atom, a chlorine atom, a bromine atom, an amino group, $-NR^{401A}-C(=O)-R^{401B}$, or $-NR^{401A}-C(=O)-O-R^{401B}$. Alternatively, $R^{401}$ is a saturated hydrocarbyl group having 1 to 20 carbon atoms, a saturated hydrocarbyloxy group having 1 to 20 carbon atoms, a saturated hydrocarbyloxycarbonyl group having 2 to 10 carbon atoms, a saturated hydrocarbylcarbonyloxy group having 2 to 20 carbon atoms, a saturated hydrocarbylsulfonyloxy group having 1 to 20 carbon atoms, or an aromatic hydrocarbon group having 6 to 20 carbon atoms, and each of these groups may contain an ether bond.

$R^{401A}$ is a hydrogen atom or a saturated hydrocarbyl group having 1 to 6 carbon atoms, and may contain a halogen atom, a hydroxy group, an alkoxy group having 1 to 6 carbon atoms, a saturated hydrocarbylcarbonyl group having 2 to 6 carbon atoms, or a saturated hydrocarbylcarbonyloxy group having 2 to 6 carbon atoms. $R^{401B}$ is an aliphatic hydrocarbyl group having 1 to 16 carbon atoms or an aryl group having 6 to 12 carbon atoms, and may contain a halogen atom, a hydroxy group, a saturated hydrocarbyloxy group having 1 to 6 carbon atoms, a saturated hydrocarbylcarbonyl group having 2 to 6 carbon atoms, or a saturated hydrocarbylcarbonyloxy group having 2 to 6 carbon atoms. The aliphatic hydrocarbyl group may be saturated or unsaturated, and may be linear, branched, or cyclic. The saturated hydrocarbyl group, saturated hydrocarbyloxy group, saturated hydrocarbyloxycarbonyl group, saturated hydrocarbylcarbonyl groups, saturated hydrocarbylcarbonyloxy groups, and saturated hydrocarbylsulfonyloxy group may be linear, branched, or cyclic. When "p" and/or "r" are 2 or more, $R^{401}$'s may be identical to or different from one another.

$Rf^{11}$ to $Rf^{14}$ are each independently a hydrogen atom, a fluorine atom, or a trifluoromethyl group, but at least one of $Rf^{11}$ to $Rf^{14}$ is a fluorine atom or a trifluoromethyl group. $Rf^{11}$ and $Rf^{12}$ may bond with each other to form a carbonyl group.

$R^{402}$, $R^{403}$, $R^{404}$, $R^{405}$, and $R^{406}$ are each independently a hydrocarbyl group having 1 to 20 carbon atoms, and may contain a fluorine atom, a chlorine atom, a bromine atom, an iodine atom, or a heteroatom. The hydrocarbyl group may be saturated or unsaturated, and may be linear, branched, or cyclic. The groups as $R^{402}$, $R^{403}$, $R^{404}$, $R^{405}$, and $R^{406}$ may have some or all of hydrogen atoms substituted with a hydroxy group, a carboxyl group, a halogen atom, a cyano group, a nitro group, a mercapto group, a sultone group, a sulfone group, or a sulfonium salt-containing group, and may have some of carbon atoms substituted with an ether bond, an ester bond, a carbonyl group, an amide bond, a carbonate group, or a sulfonic acid ester bond. Alternatively, $R^{402}$ and $R^{403}$ may bond to each other to form a ring together with a sulfur atom bonded thereto. Specific examples of $R^{402}$, $R^{403}$, $R^{404}$, $R^{405}$, and $R^{406}$ include those described above for $R^{101}$ to $R^{105}$.

Examples of the anions of the onium salts shown by the formula (2-1) or (2-2) include ones shown below, but are not limited thereto.

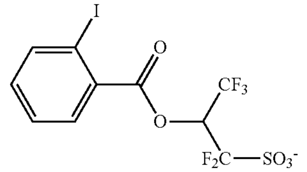

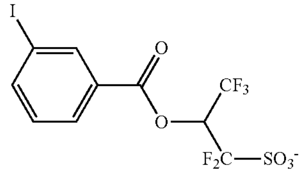

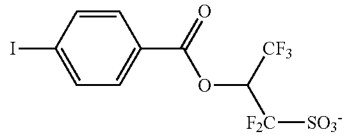

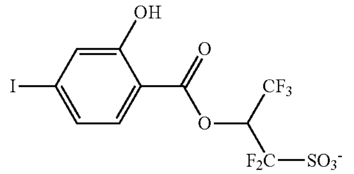

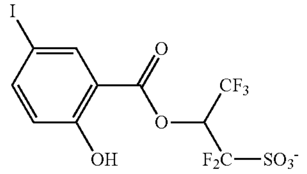

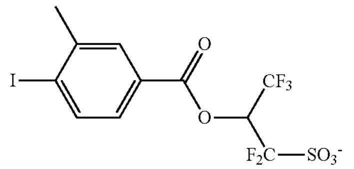

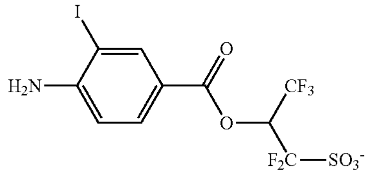

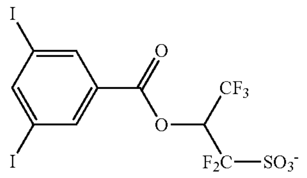

-continued
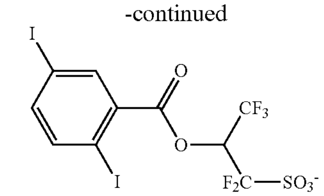
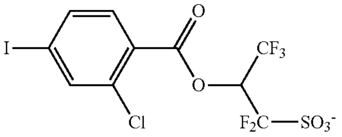
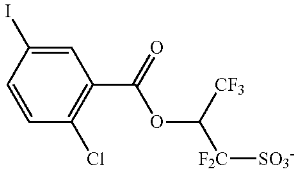
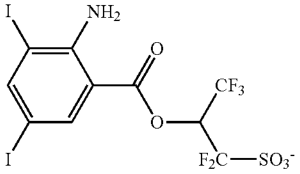
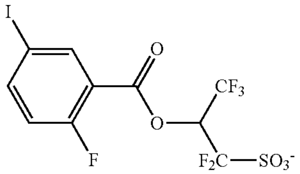
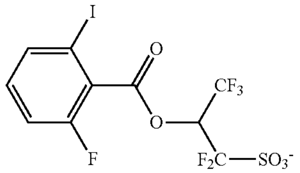
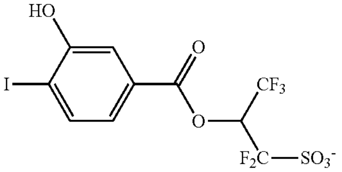
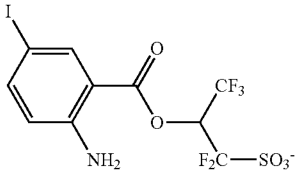
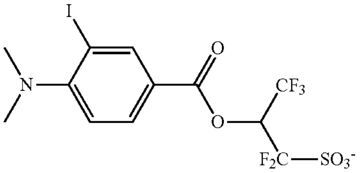
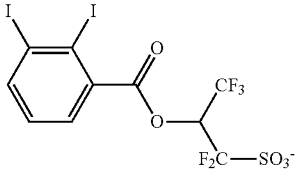
-continued
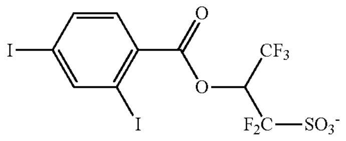
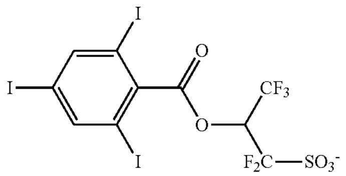
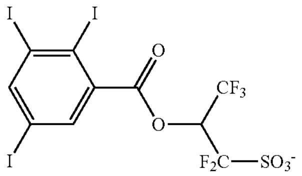
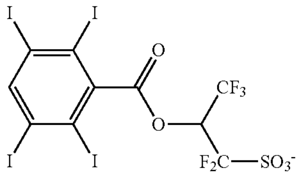
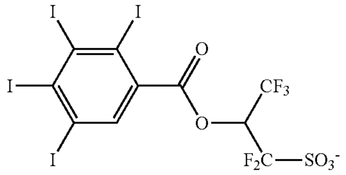
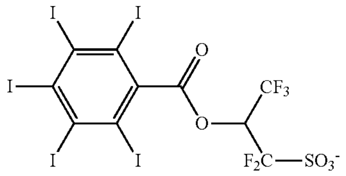
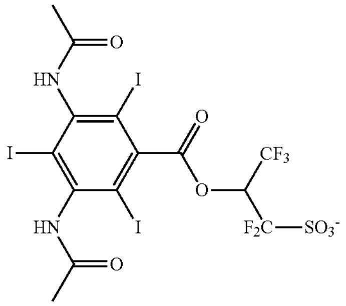
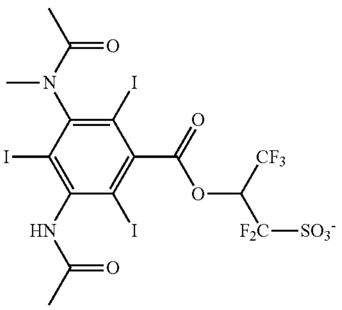

-continued
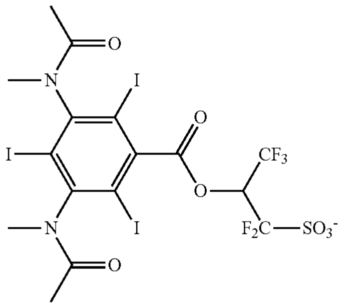
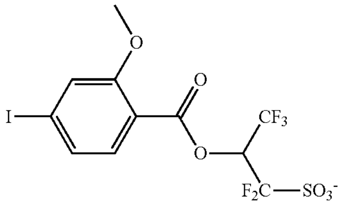
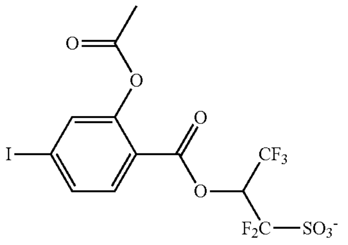
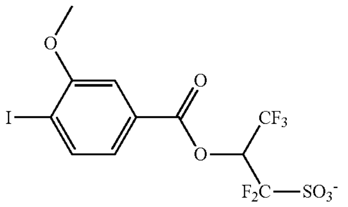
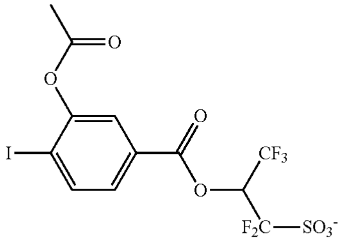
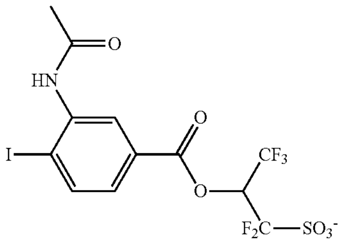
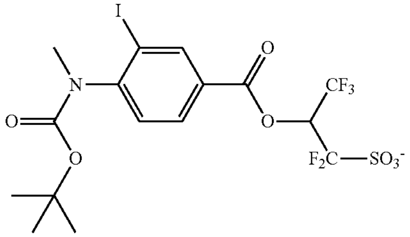
-continued
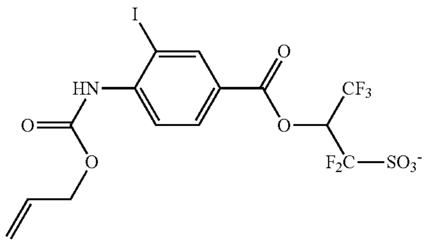
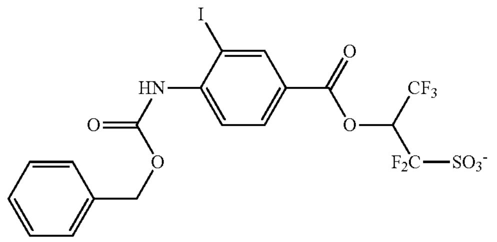
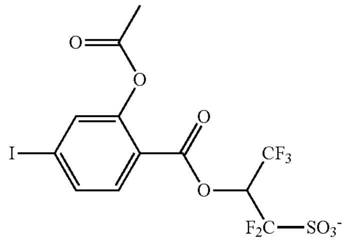
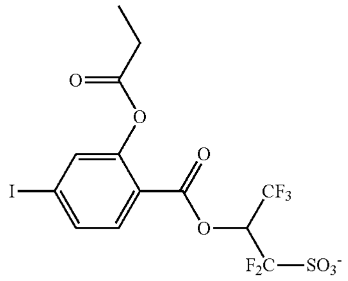
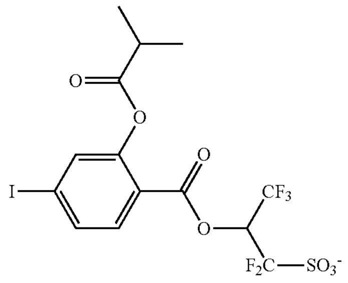
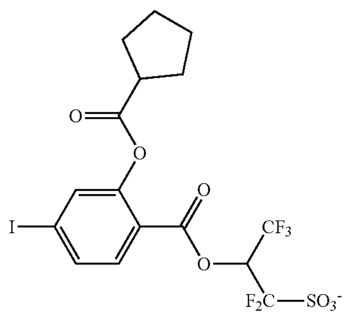

-continued
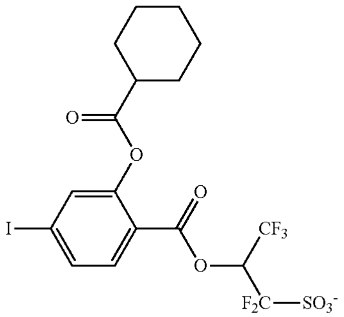
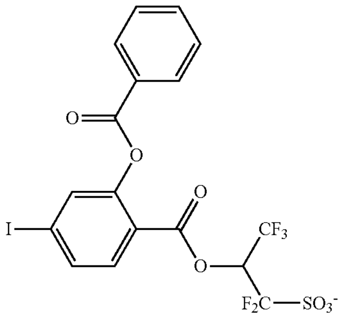
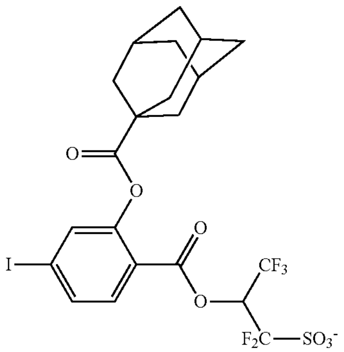
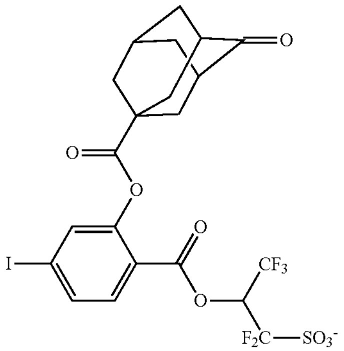
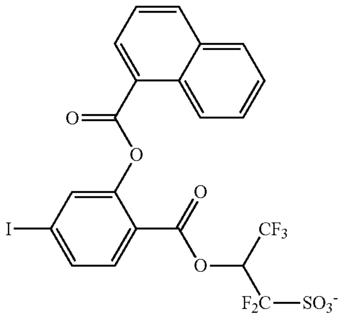
-continued
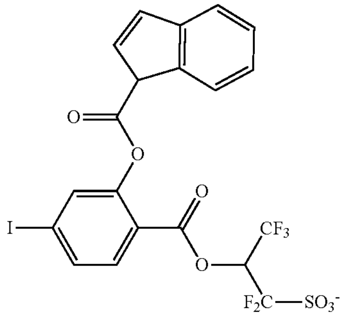
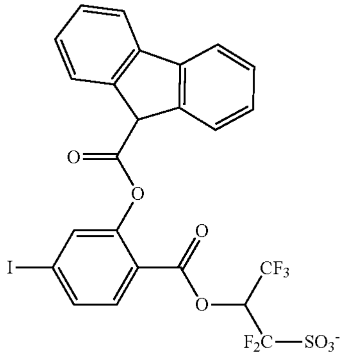
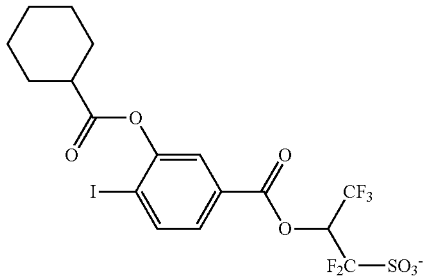
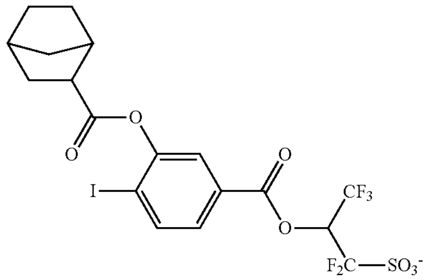
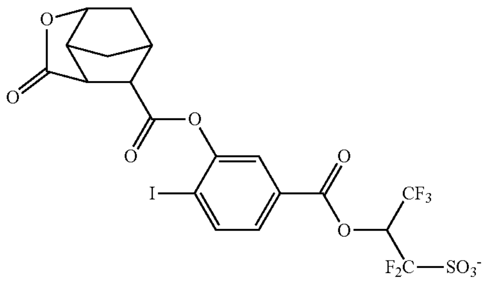
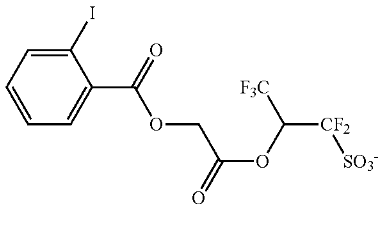

-continued
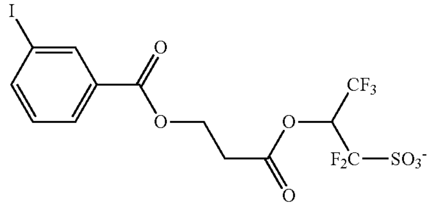
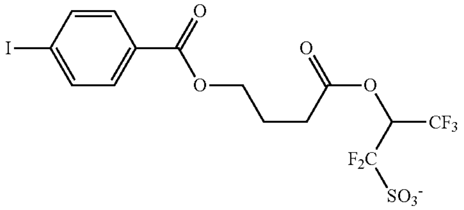
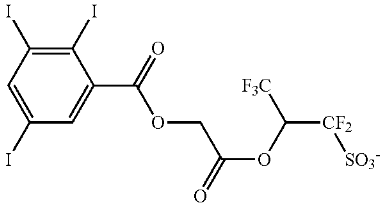
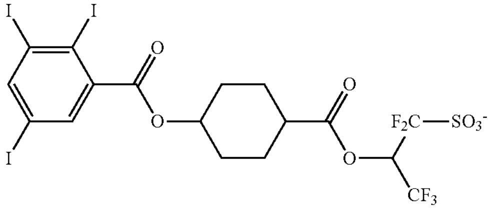
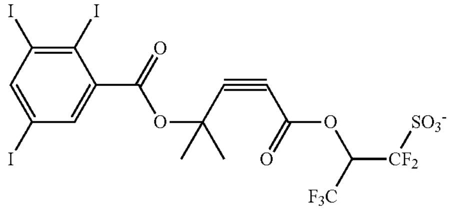
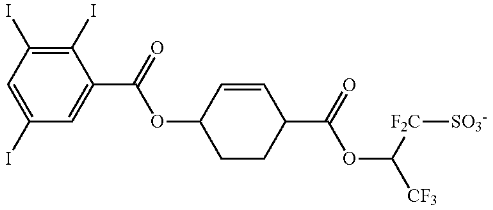
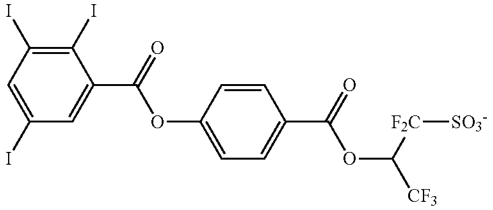
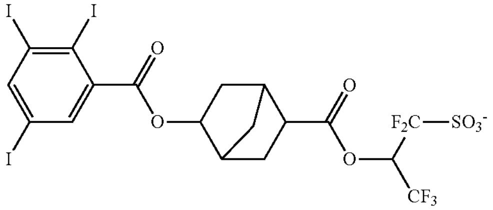
-continued
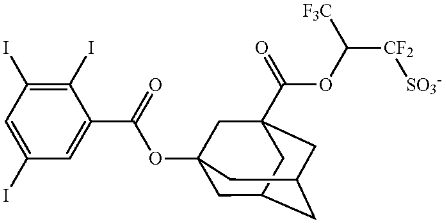
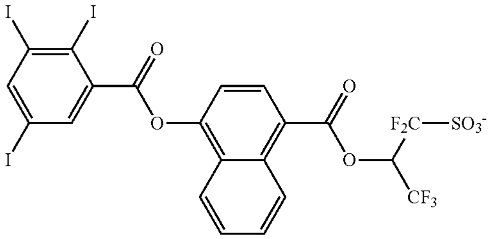
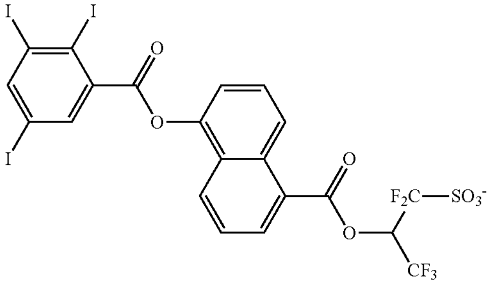
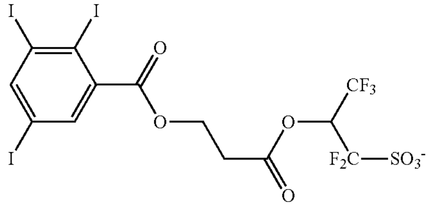
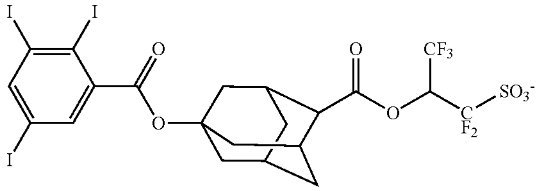
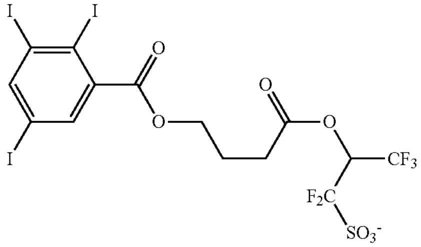

-continued
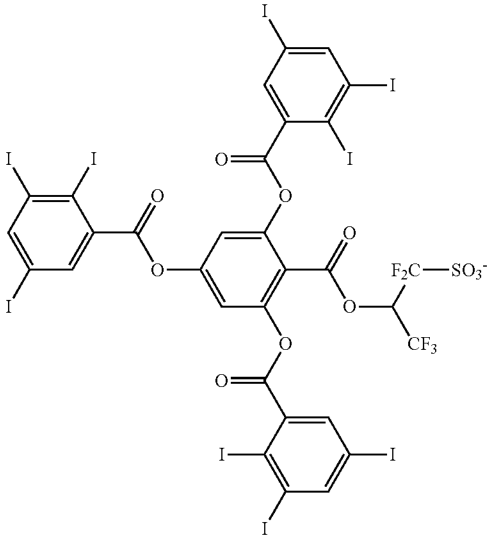
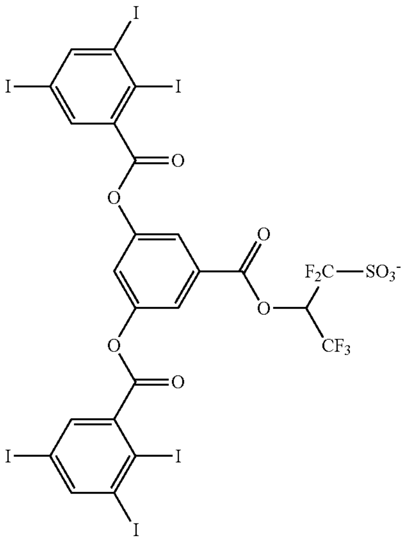
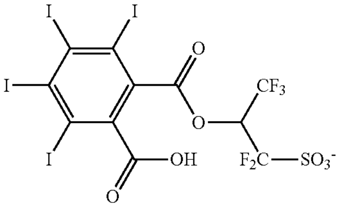
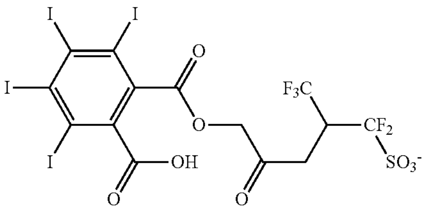
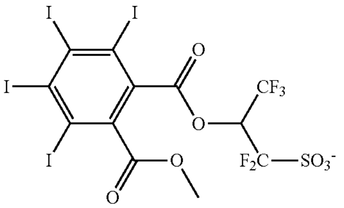
-continued
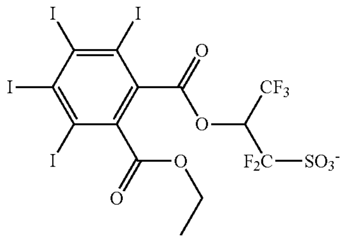
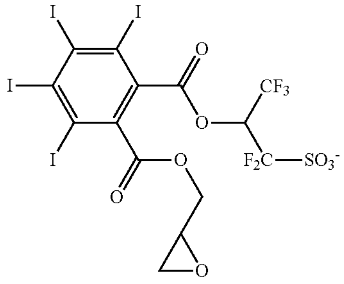
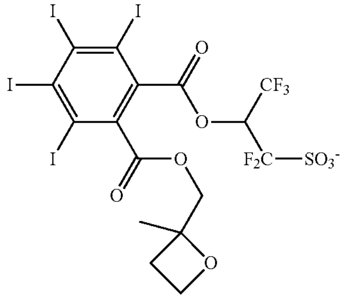
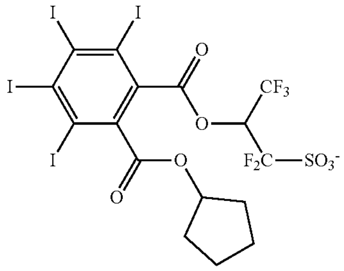
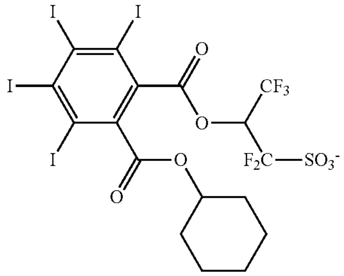
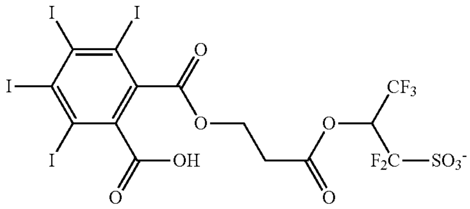

-continued
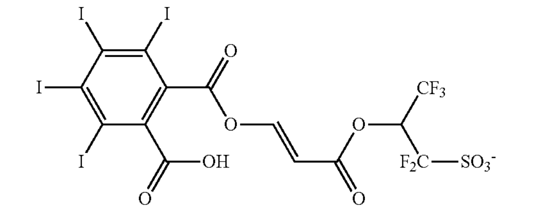
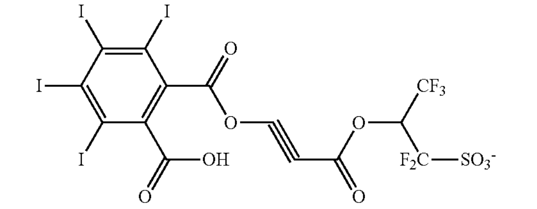
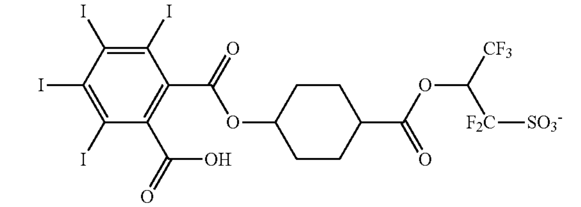
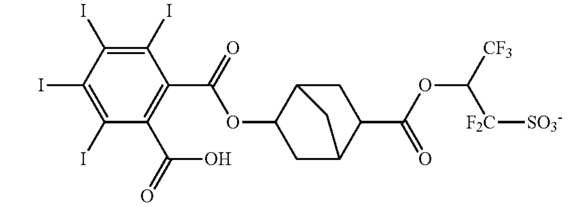
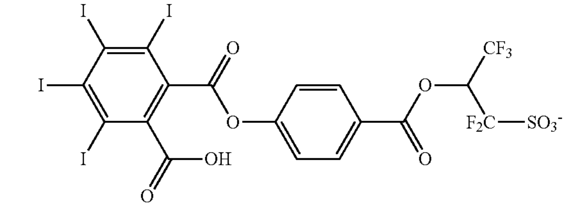
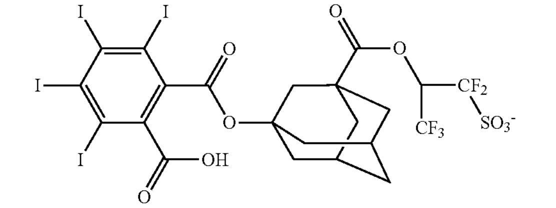
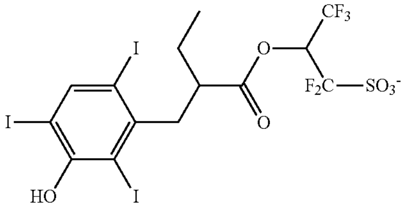
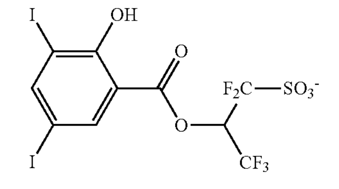
-continued
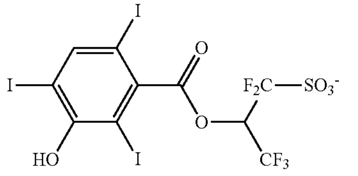
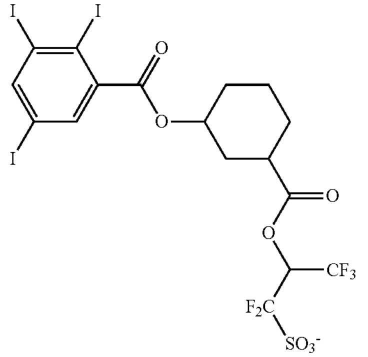
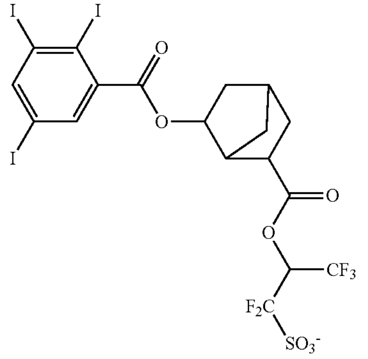
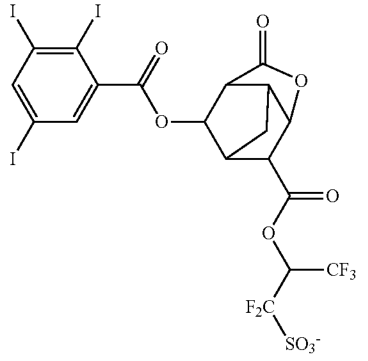
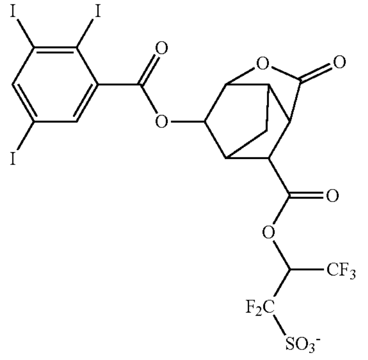

-continued
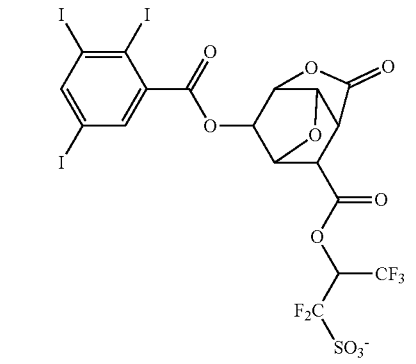
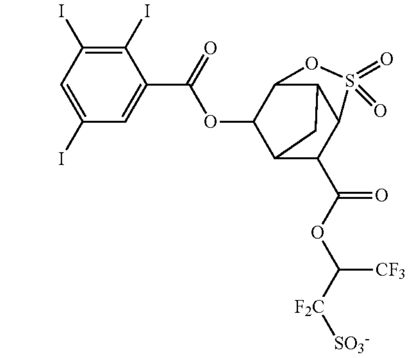
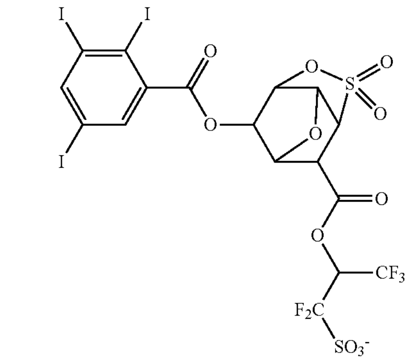
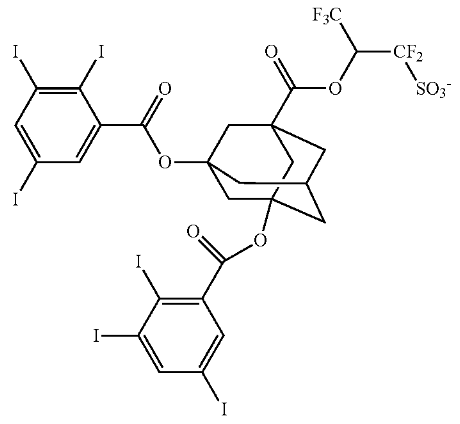
-continued
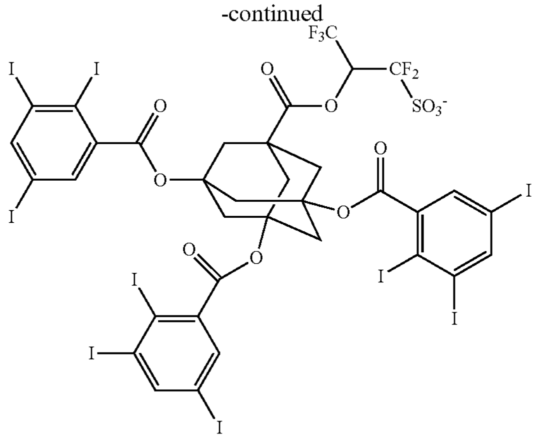
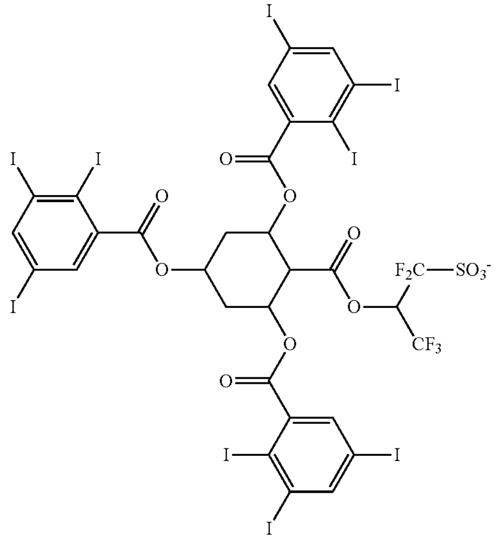
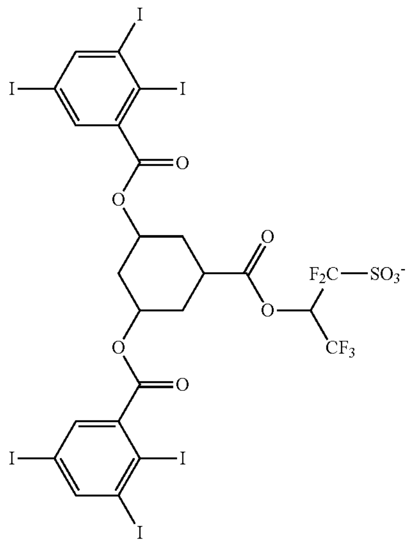

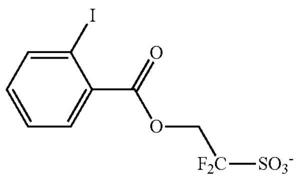
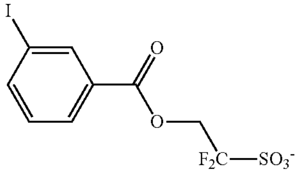
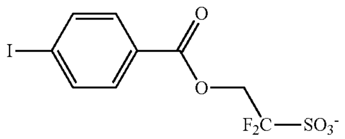
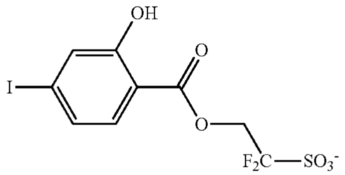
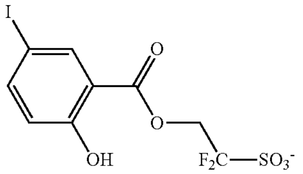
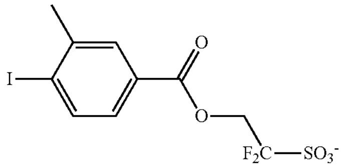
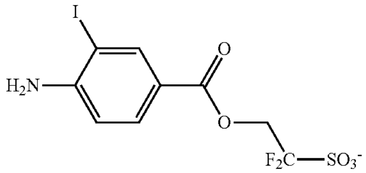
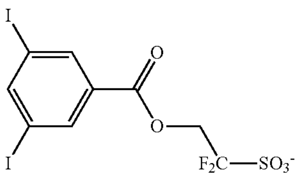
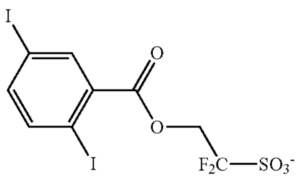
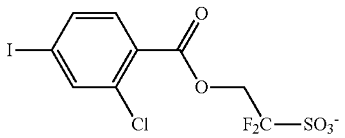
-continued
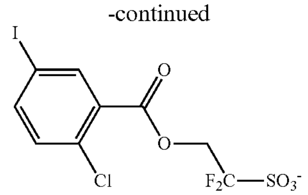
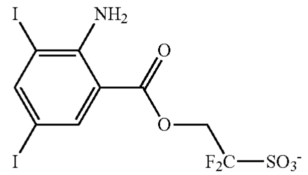
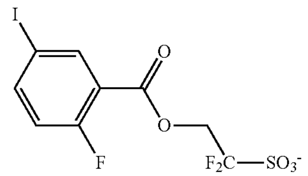
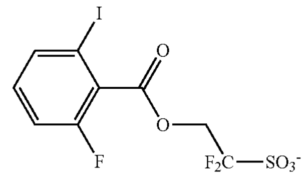
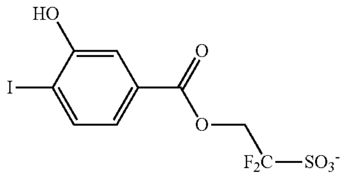
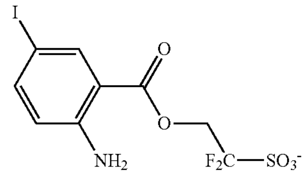
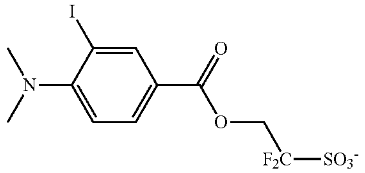
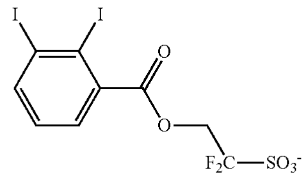
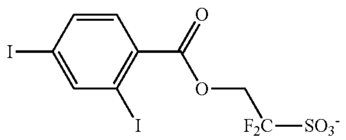
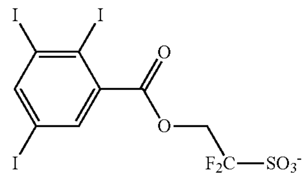

-continued
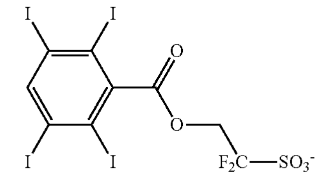
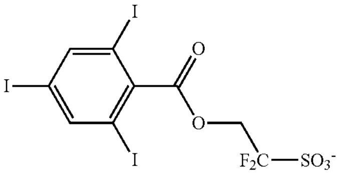
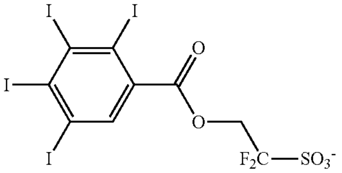
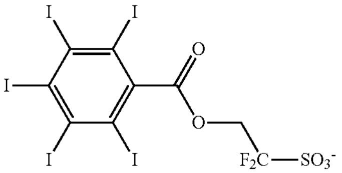
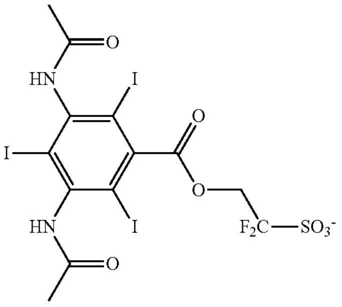
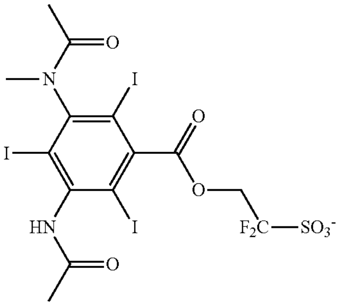
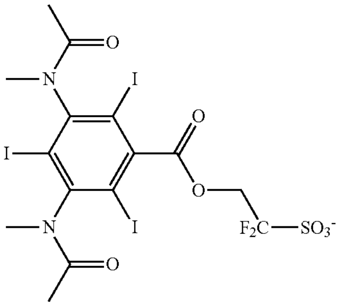
-continued
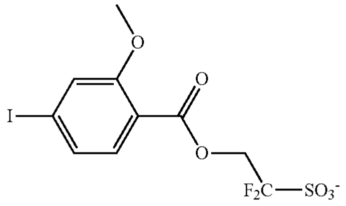
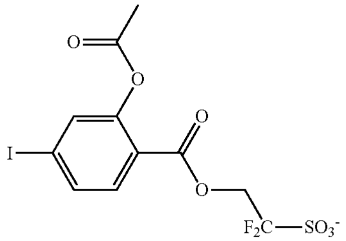
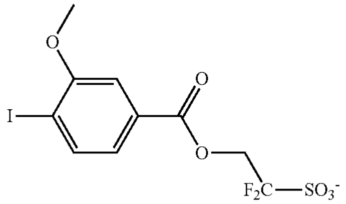
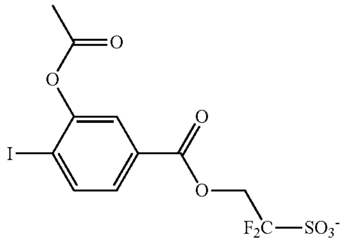
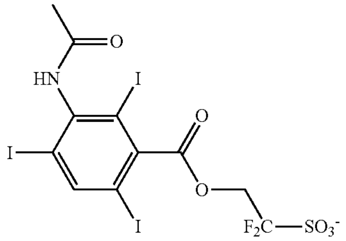
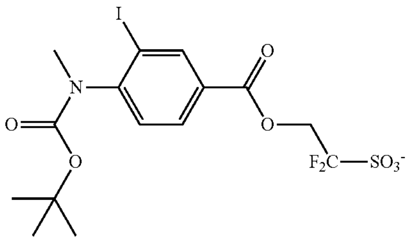
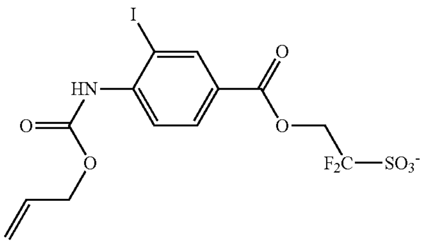

-continued
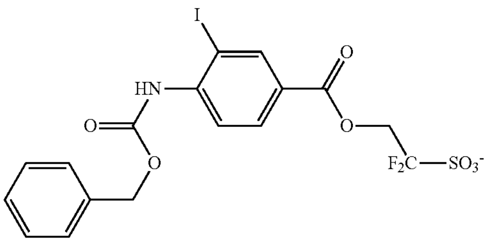
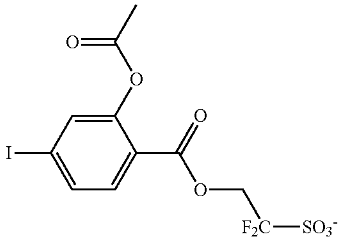
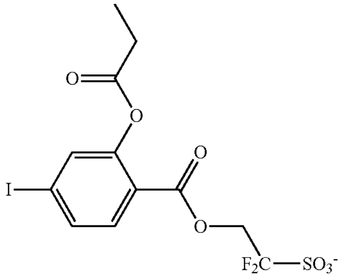
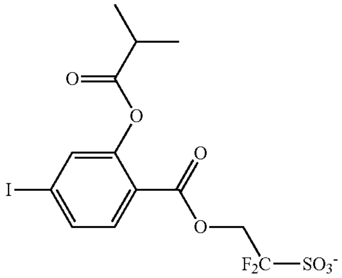
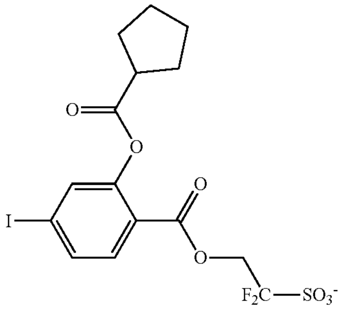
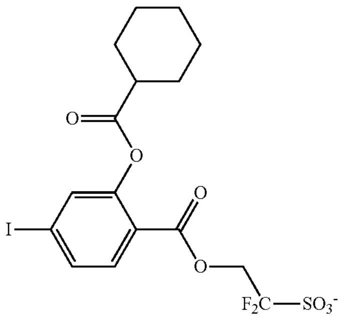
-continued
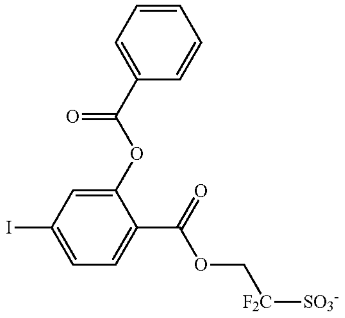
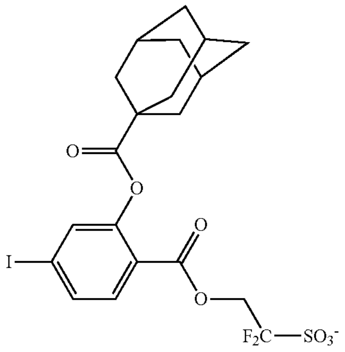
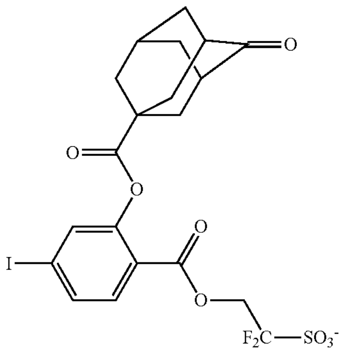
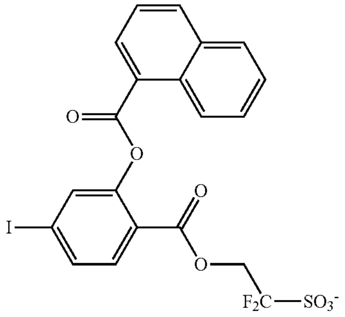
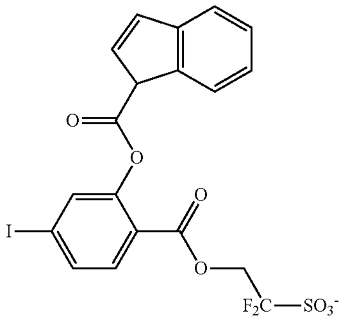

-continued
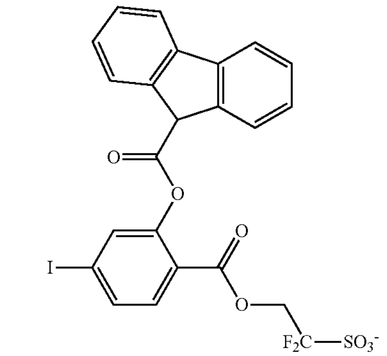
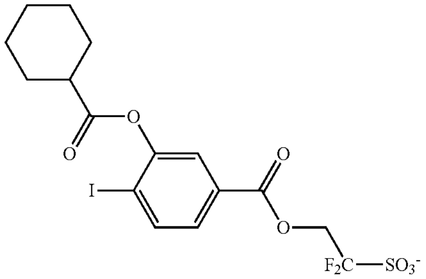
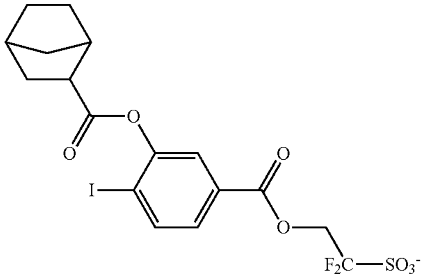
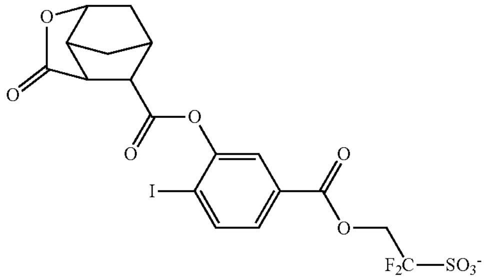
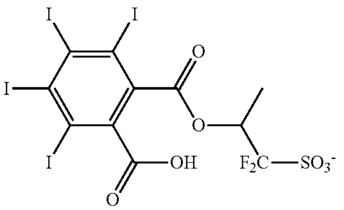
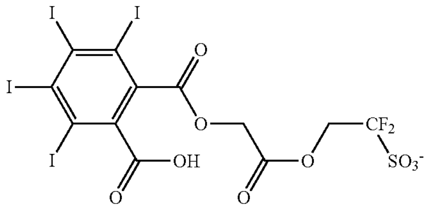
-continued
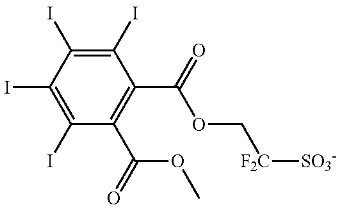
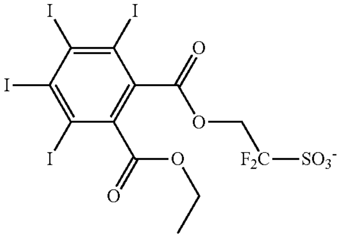
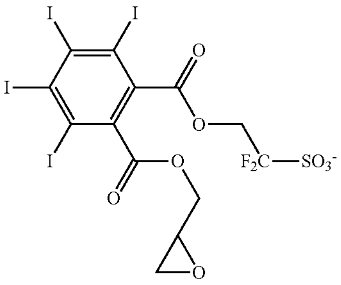
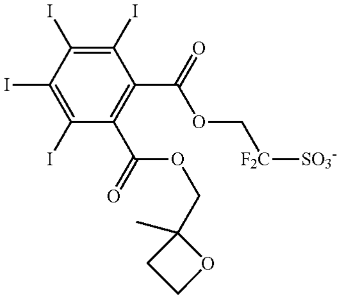
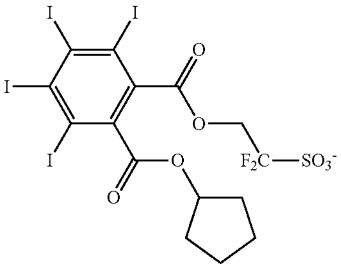
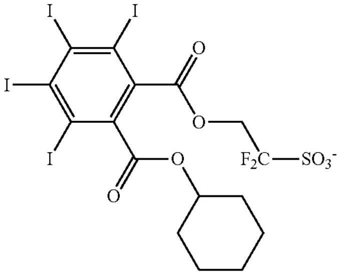

-continued
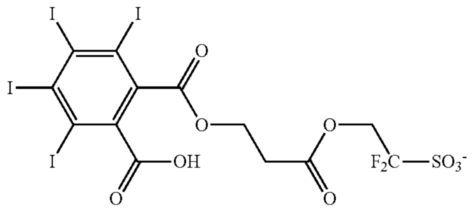
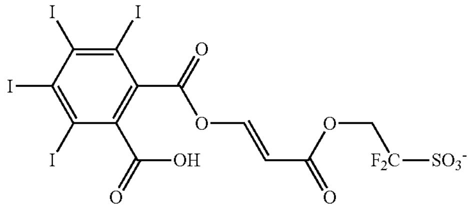
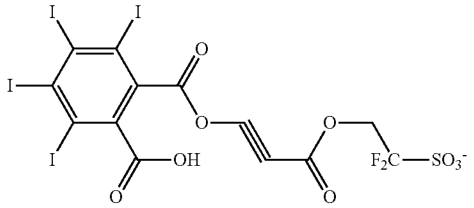
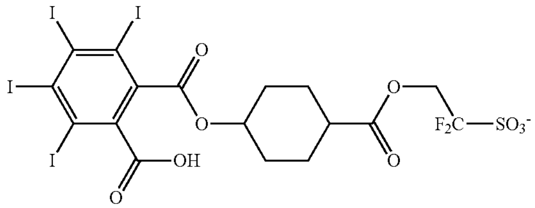
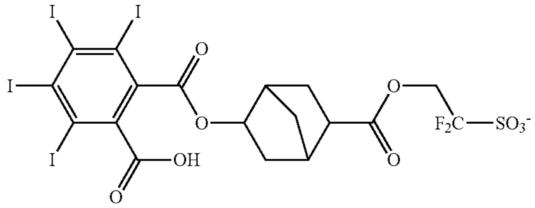
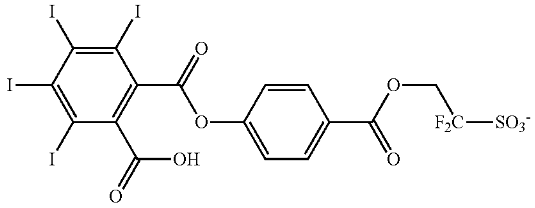
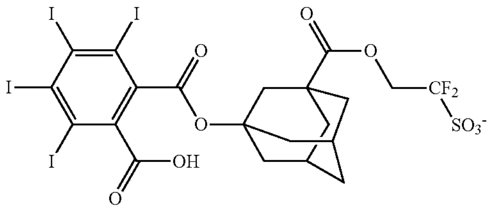
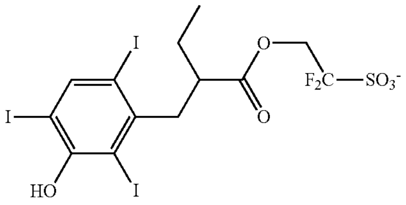
-continued
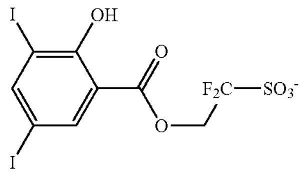
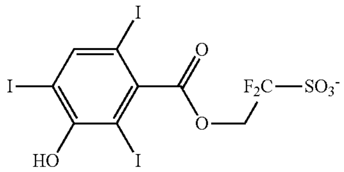
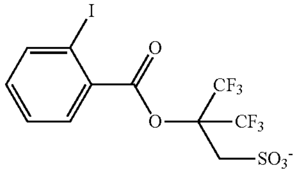
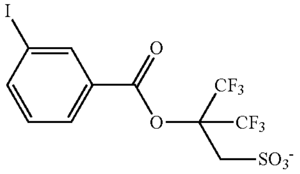
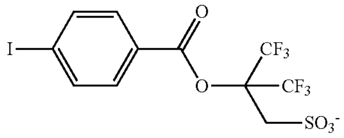
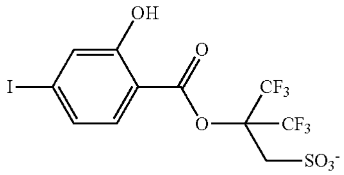
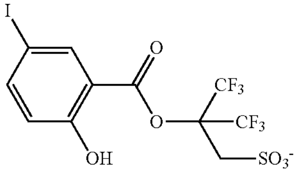
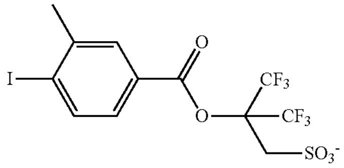
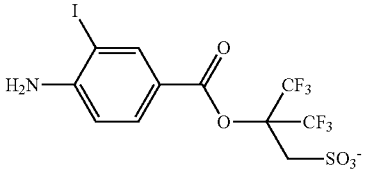
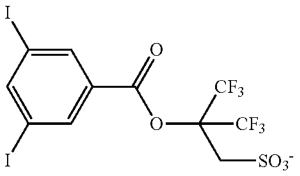

-continued
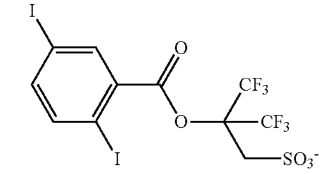
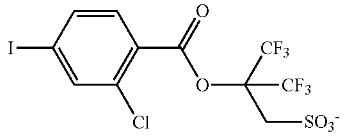
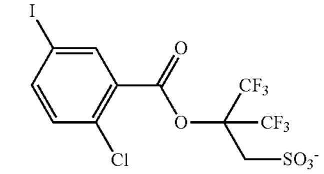
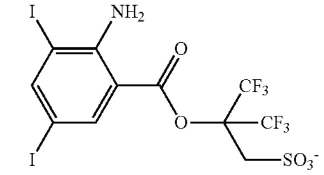
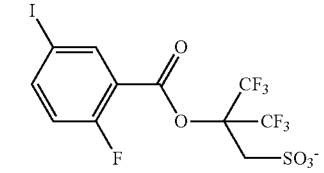
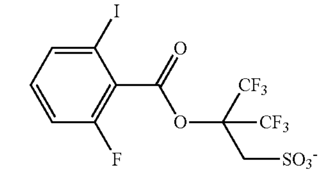
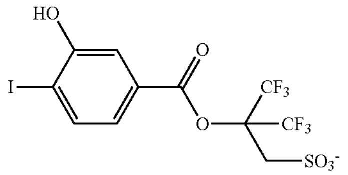
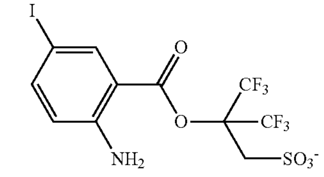
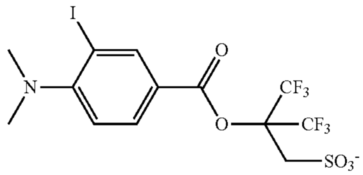
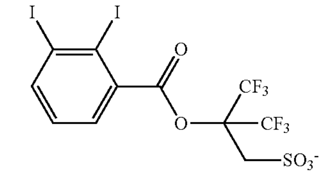
-continued
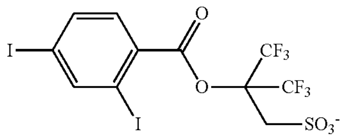
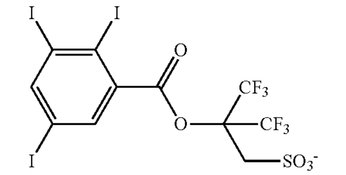
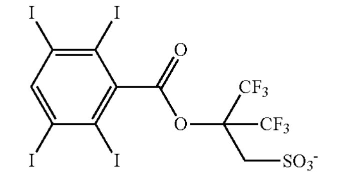
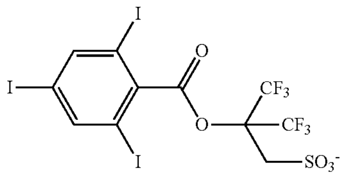
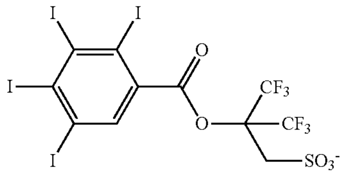
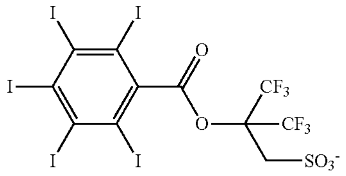
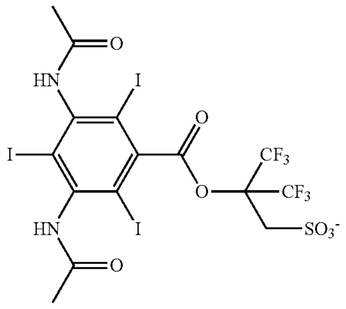
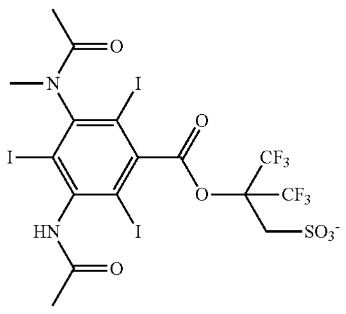

-continued
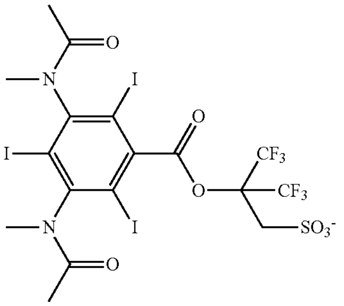
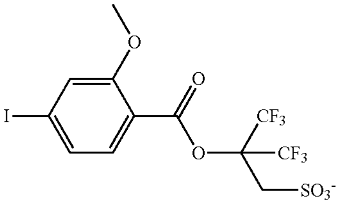
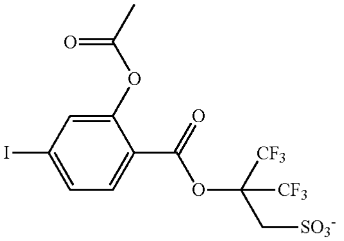
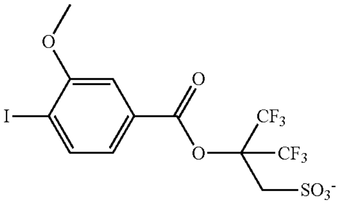
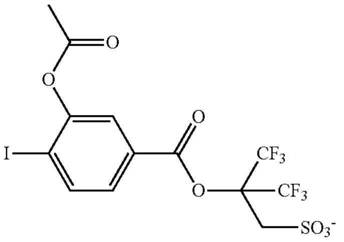
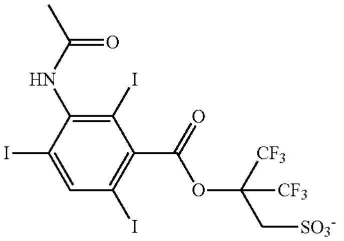
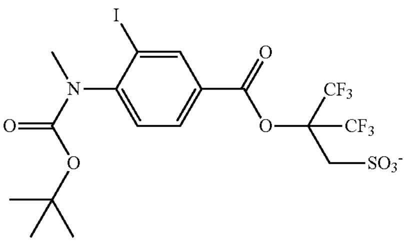
-continued
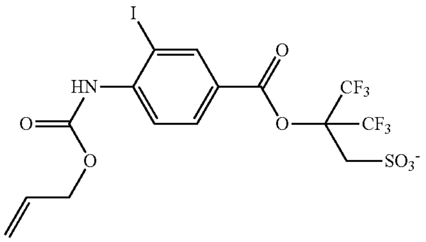
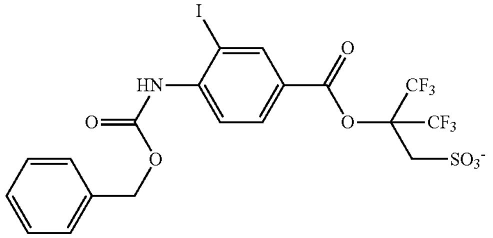
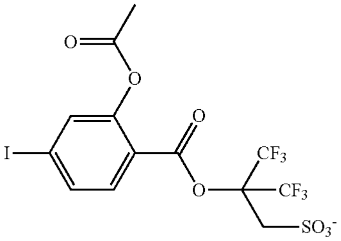
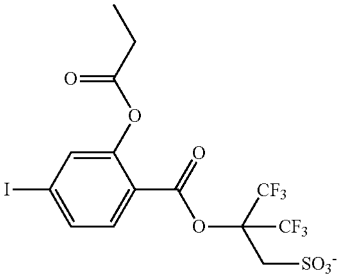
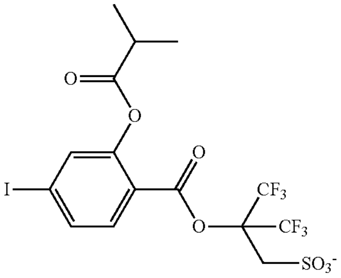
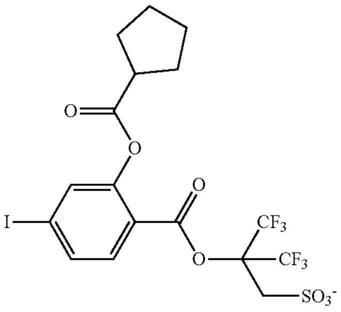

-continued
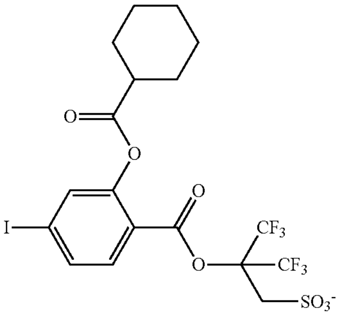
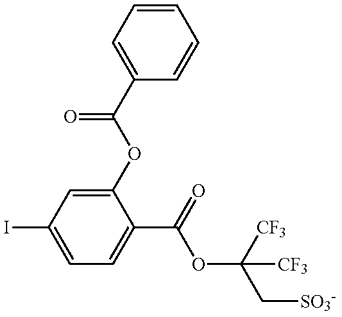
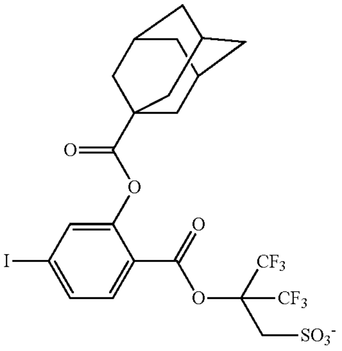
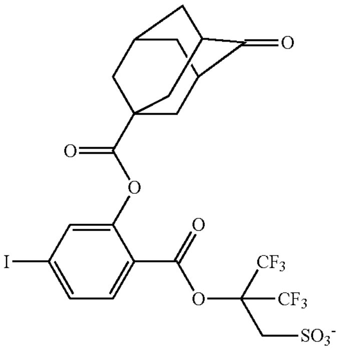
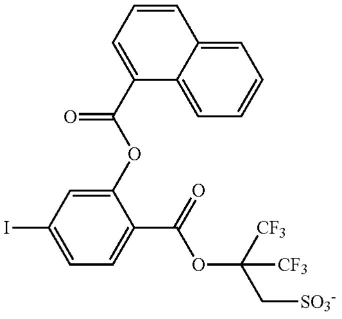
-continued
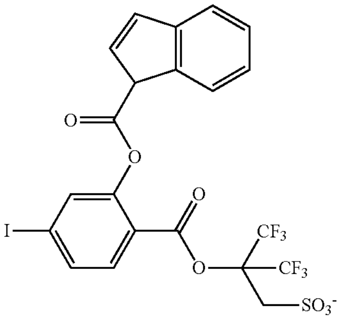
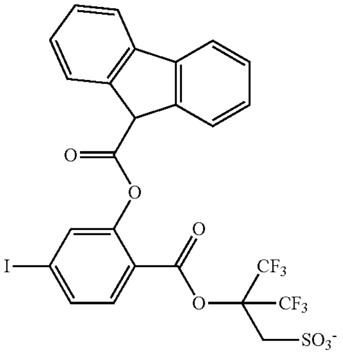
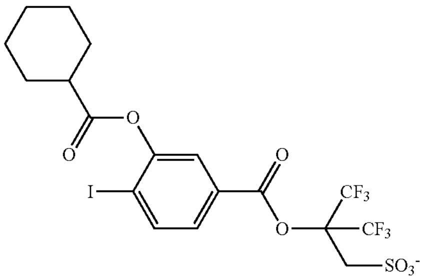
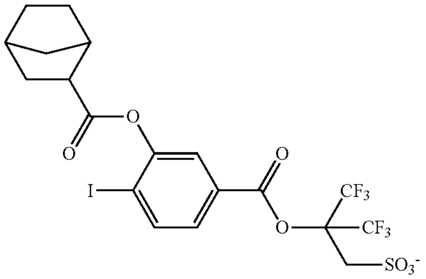
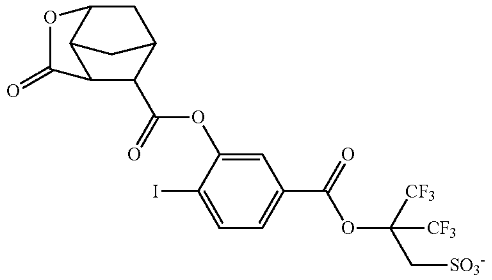
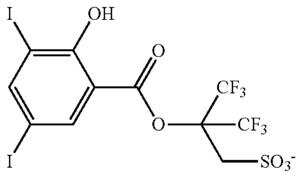

-continued
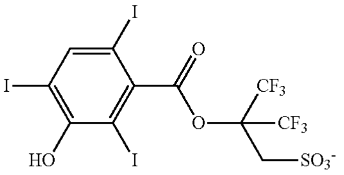
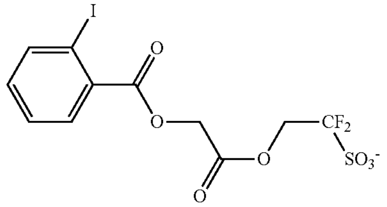
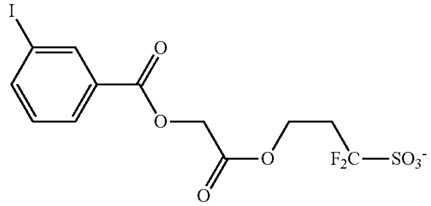
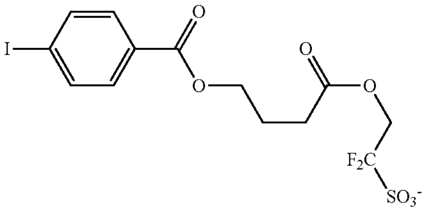
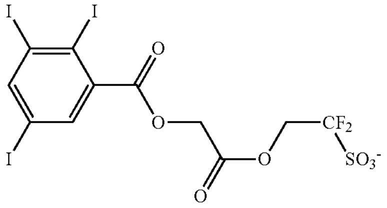
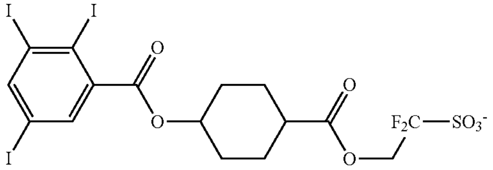
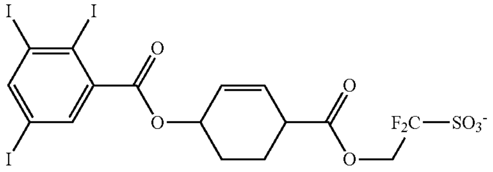
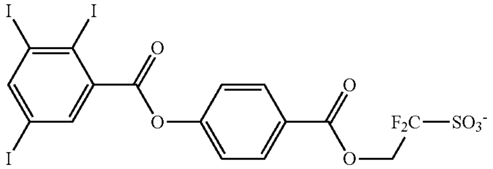
-continued
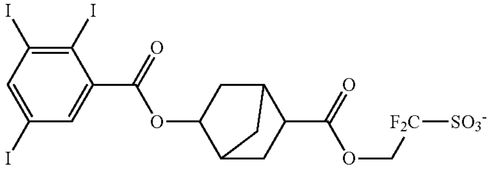
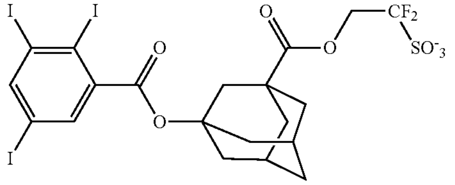
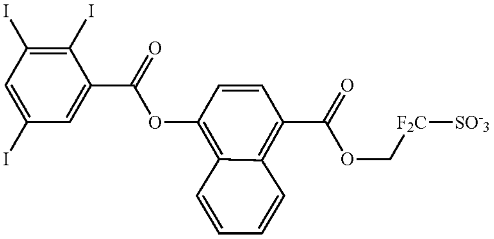
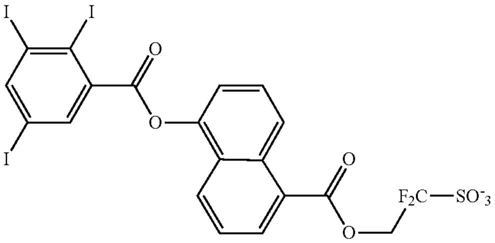
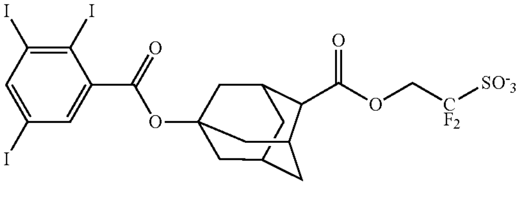
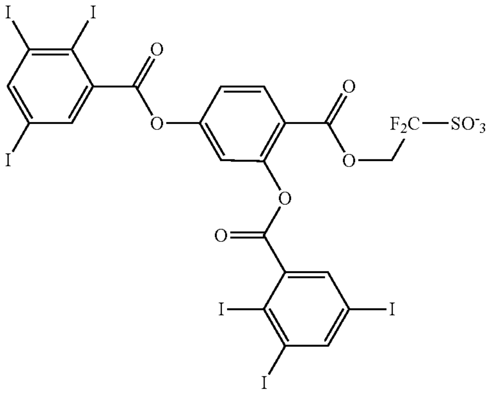

-continued
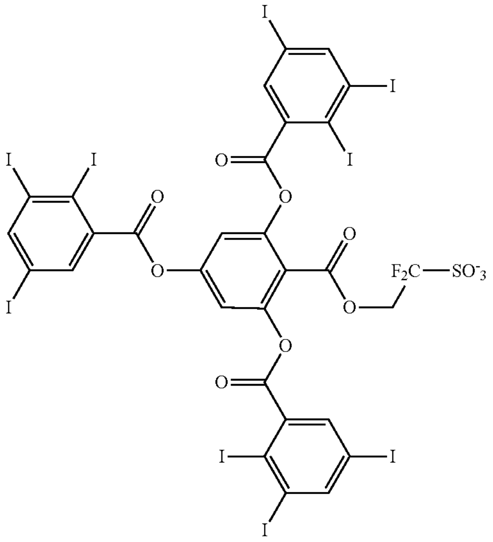
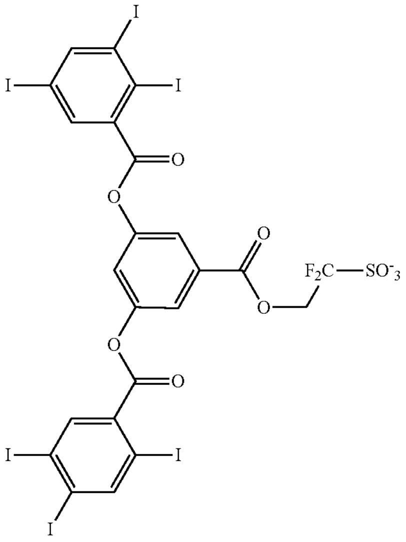
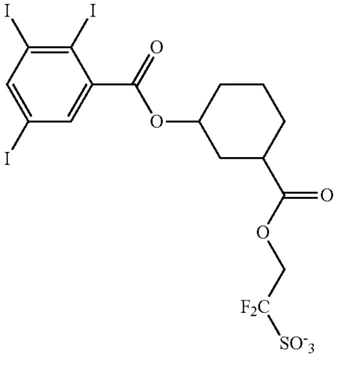
-continued
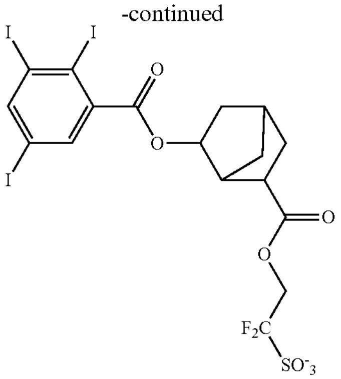
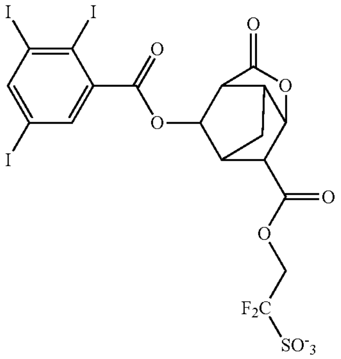
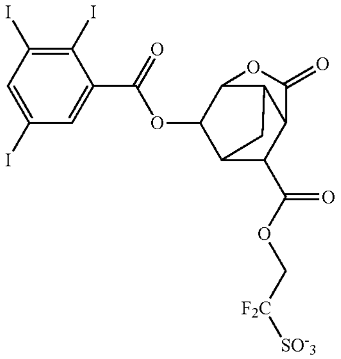
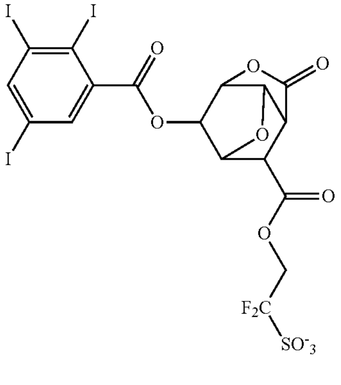

-continued
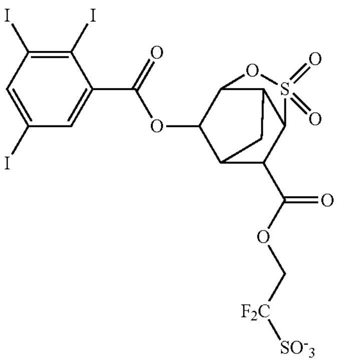
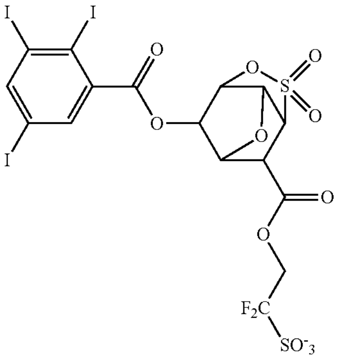
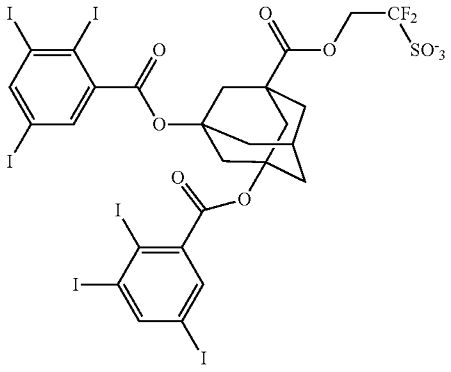
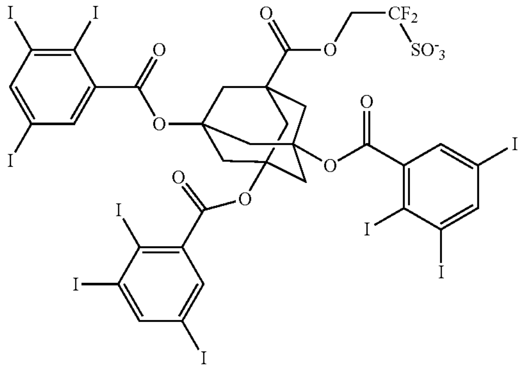
-continued
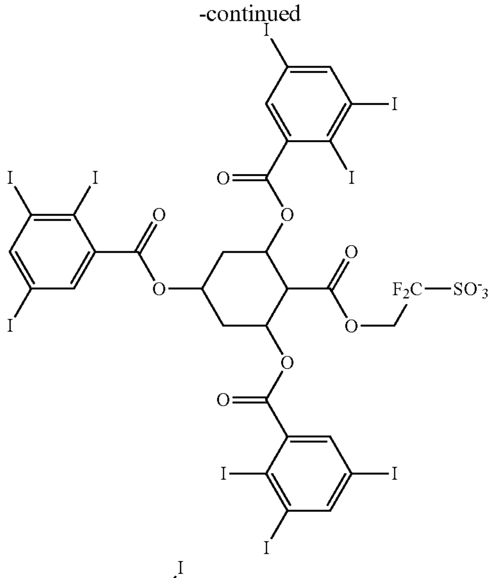
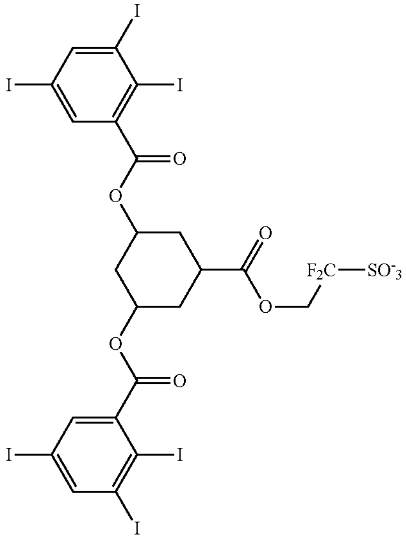
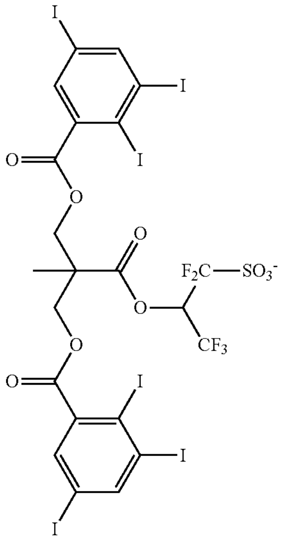

-continued
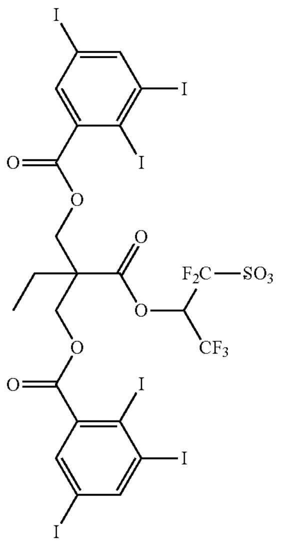
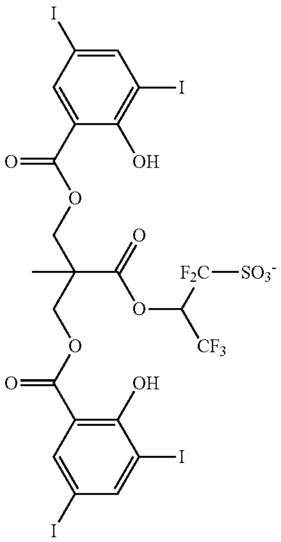
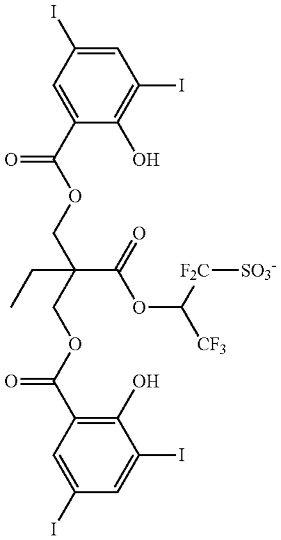
-continued
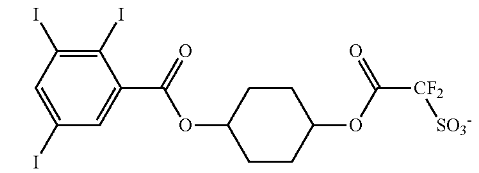
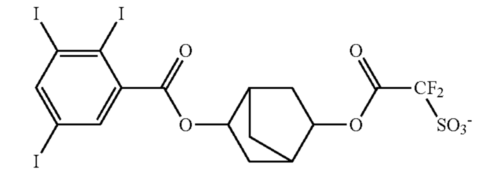
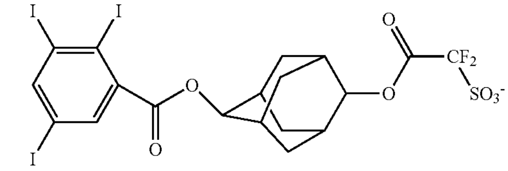
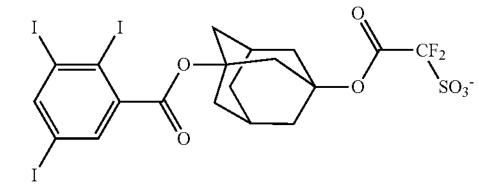
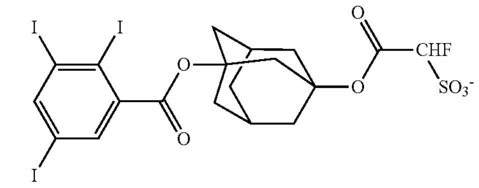
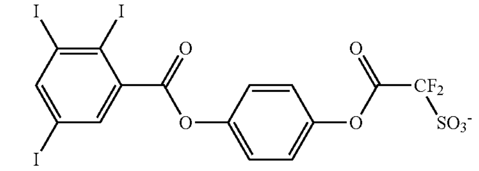
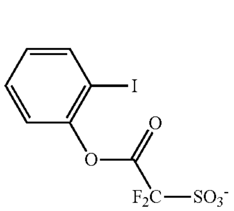
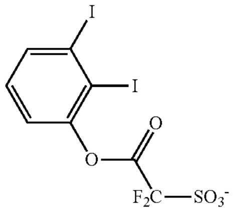
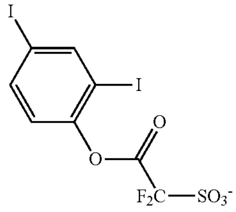
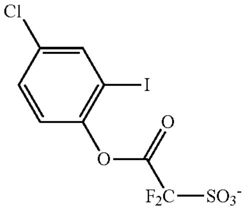
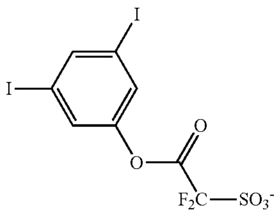
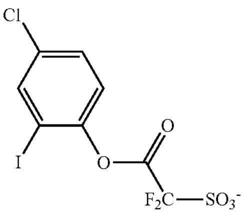

-continued
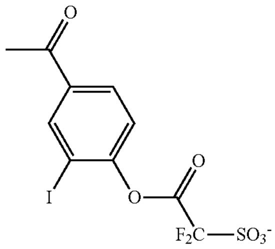
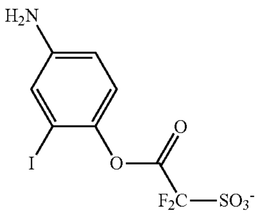
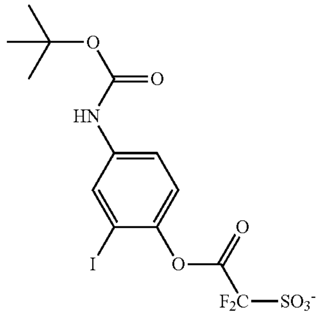
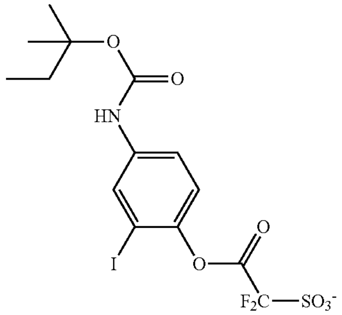
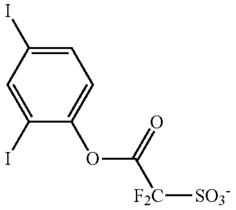
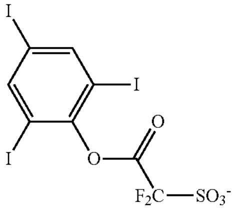
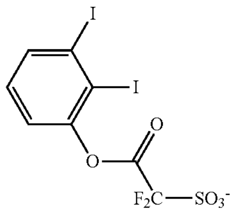
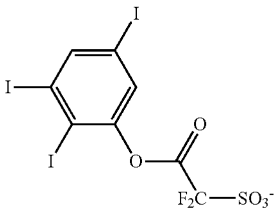
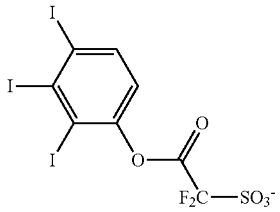
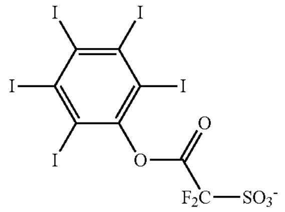
-continued
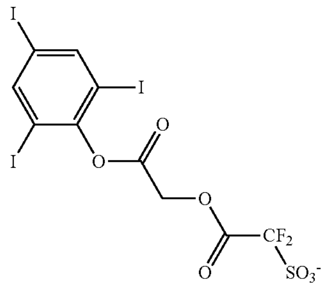
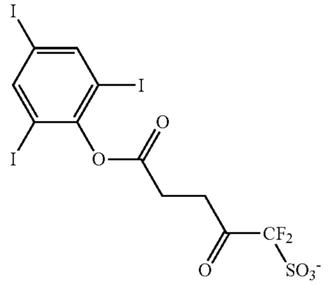
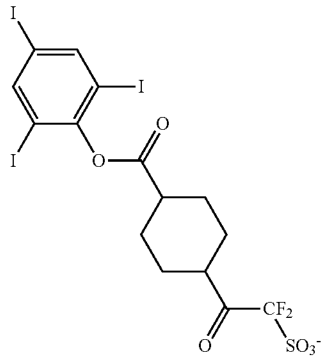
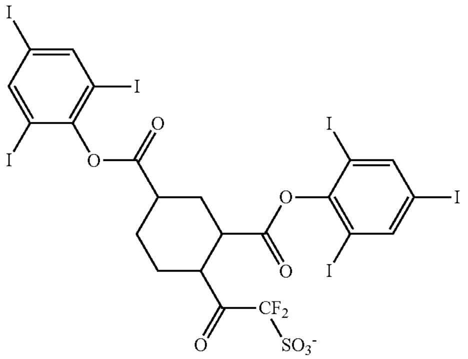
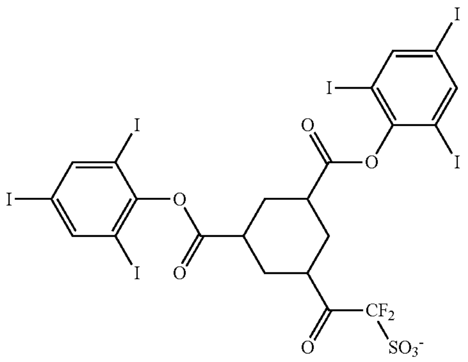

-continued
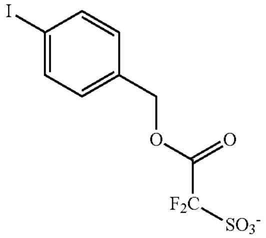
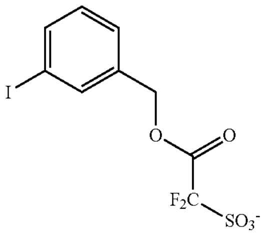
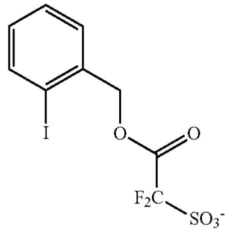
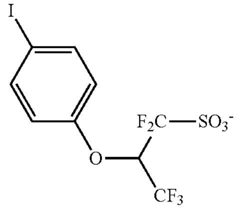
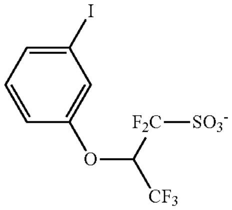
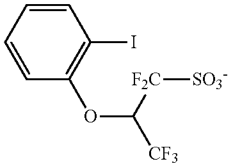
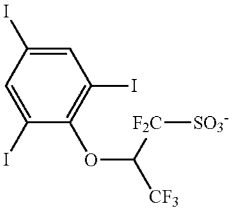
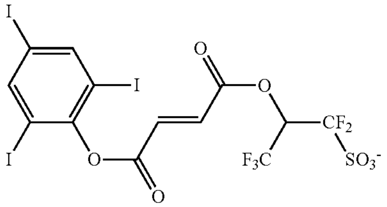
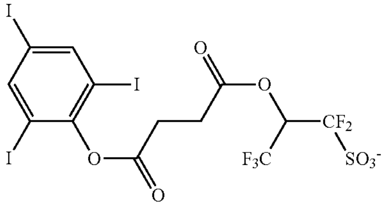
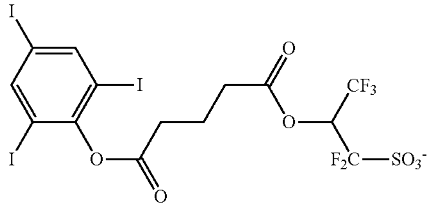
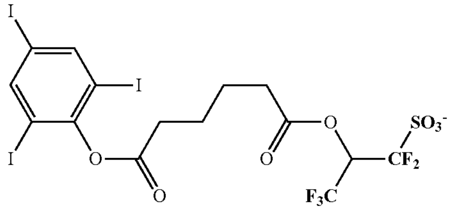
-continued
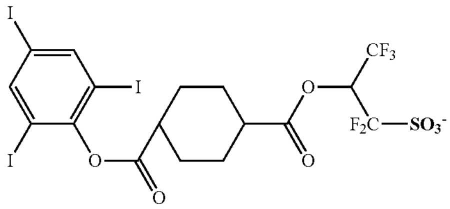
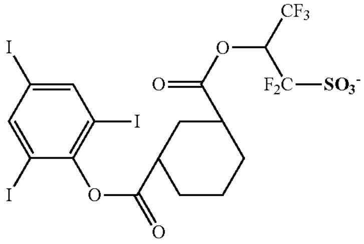
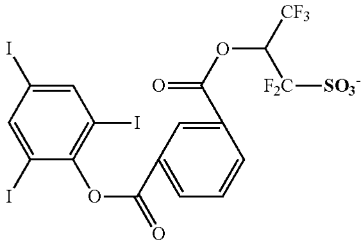
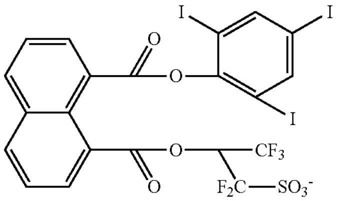
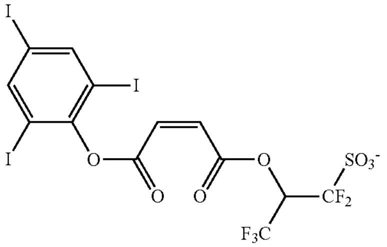
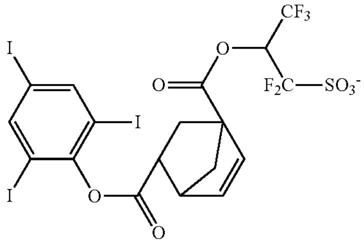
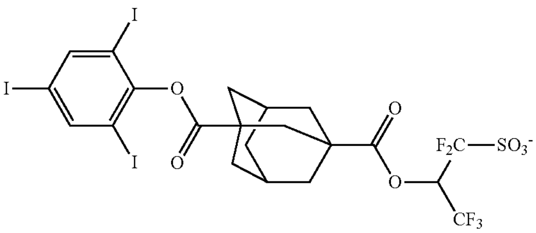

-continued
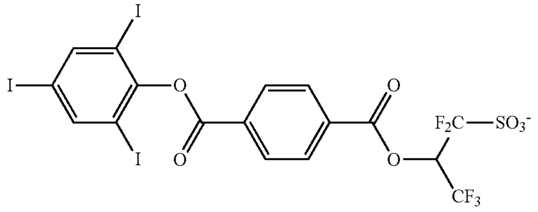
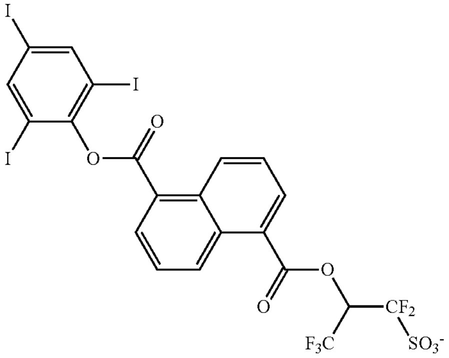
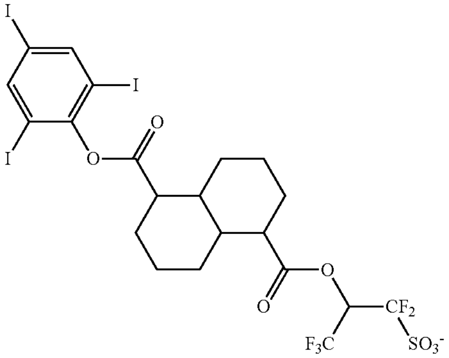
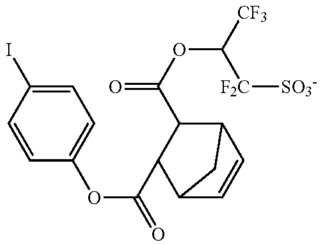
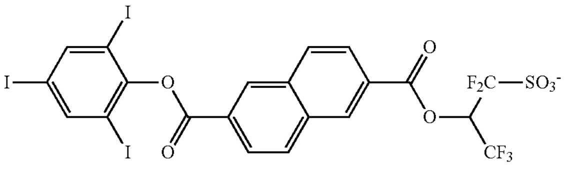
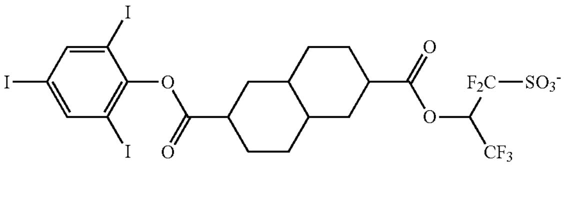
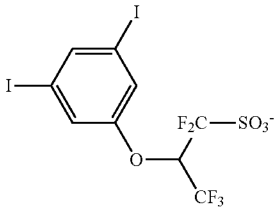
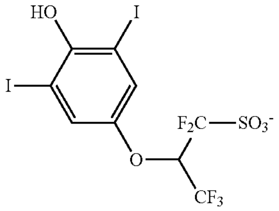
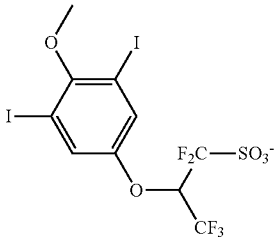
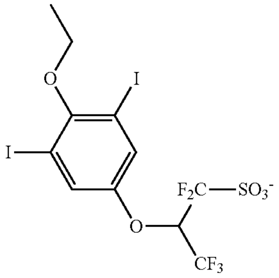
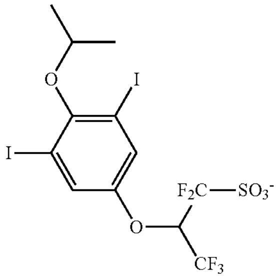
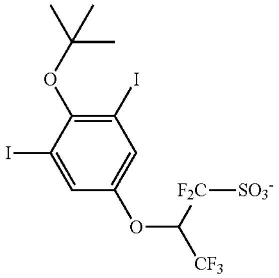
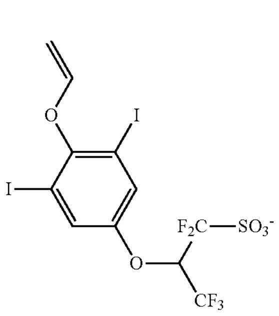
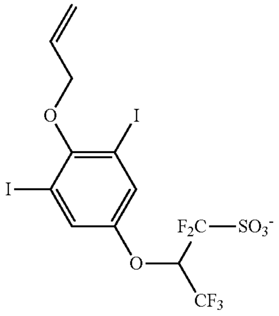
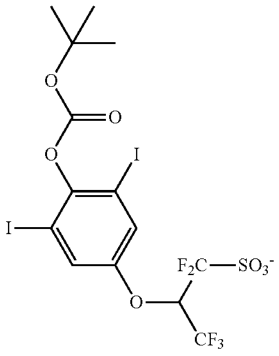
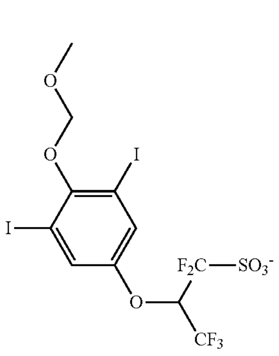
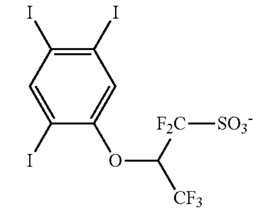
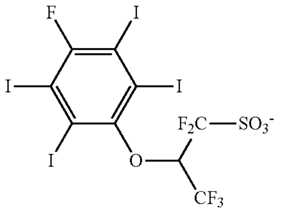

-continued
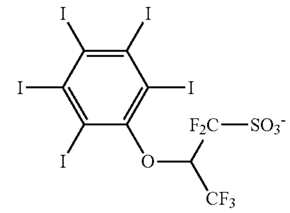
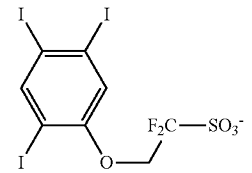
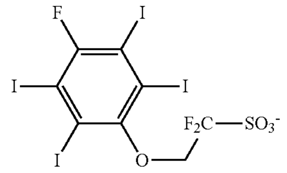
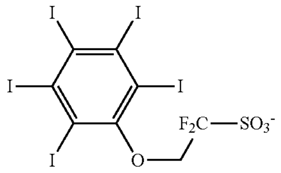
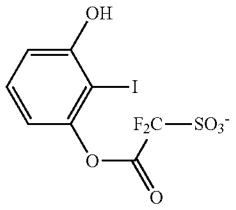
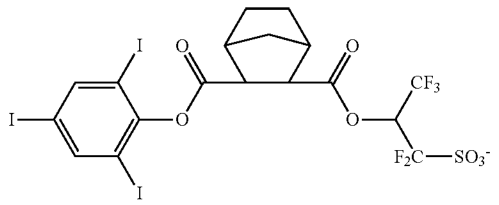
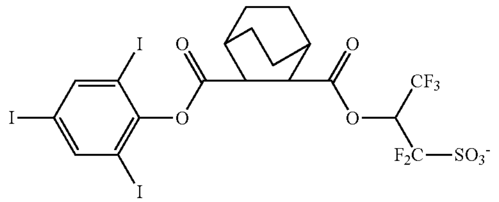
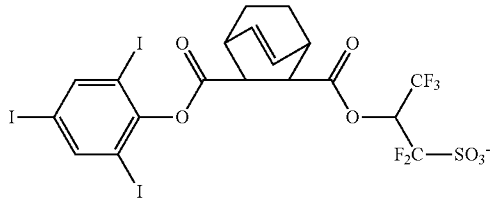
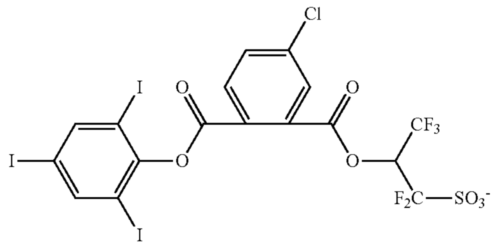
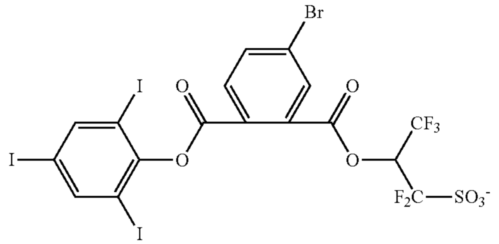
-continued
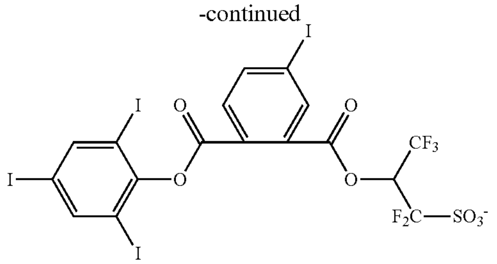
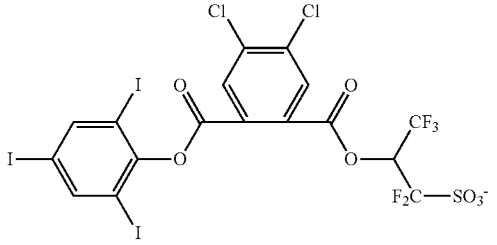
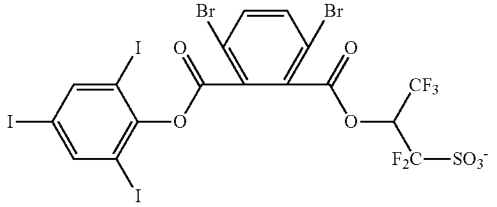
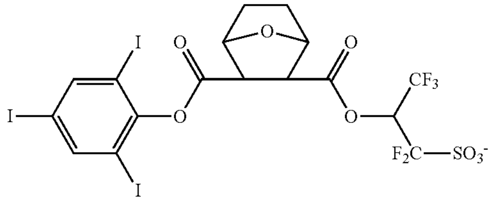
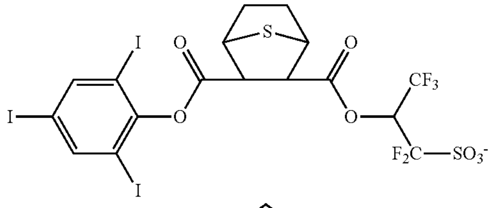
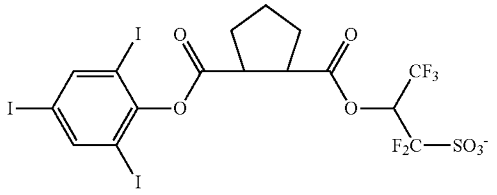
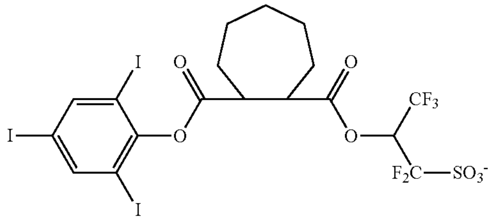
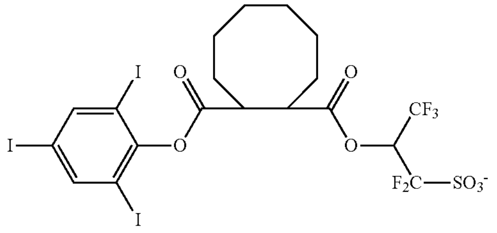

-continued
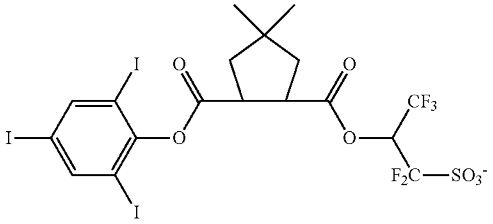
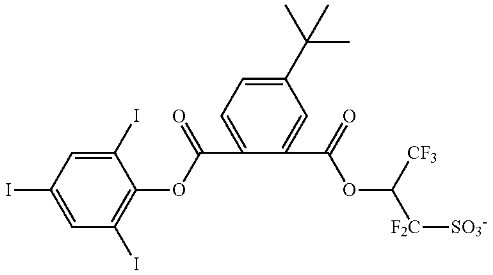
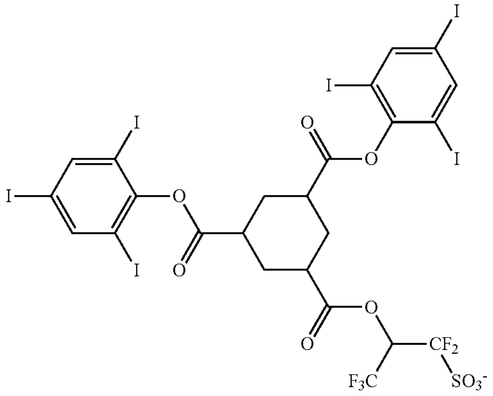
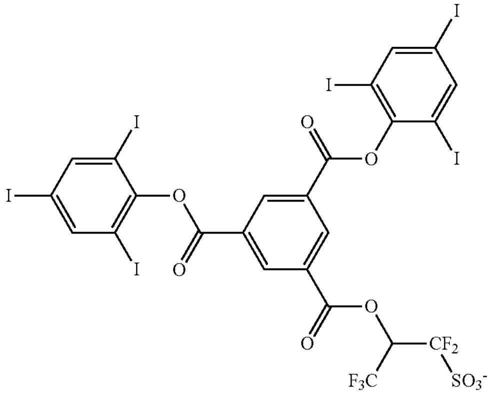
-continued
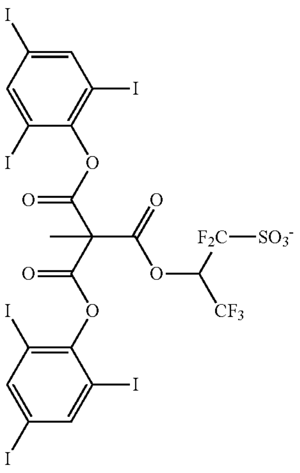
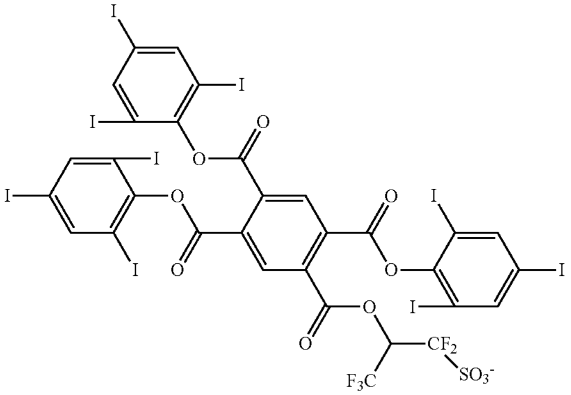
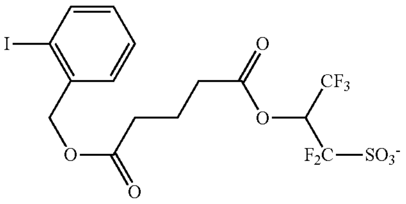
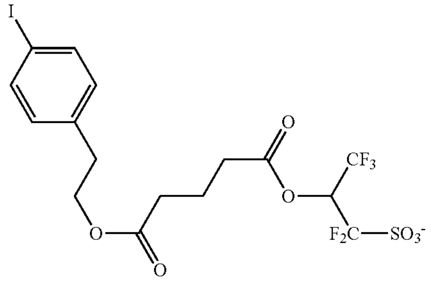
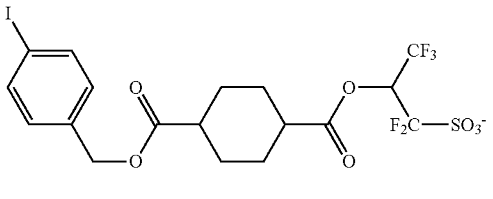

-continued
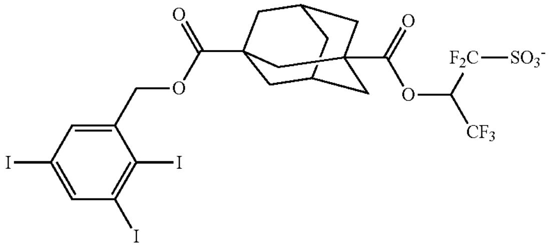
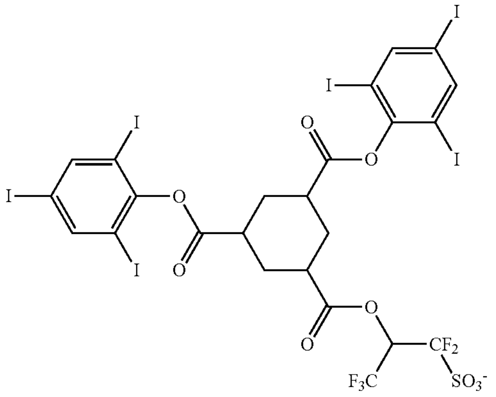
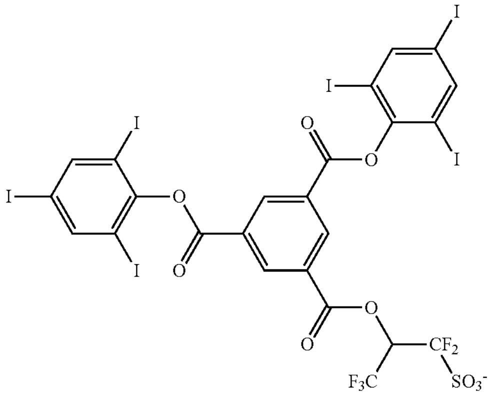
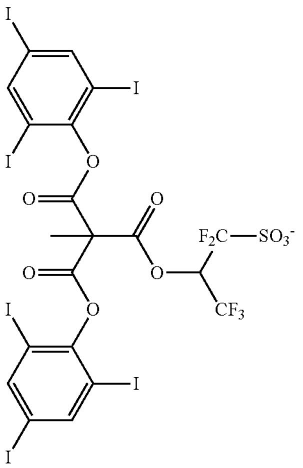
-continued
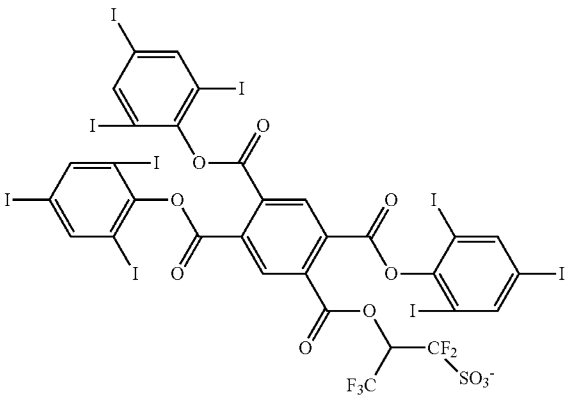
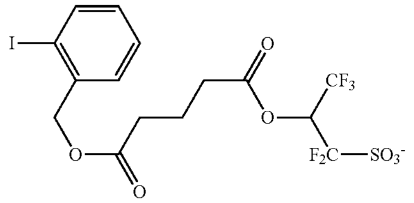
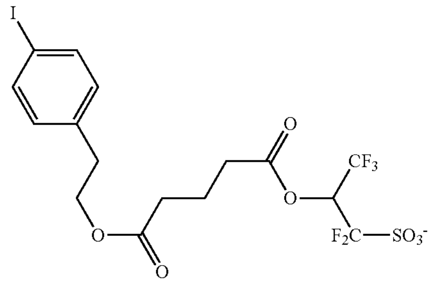
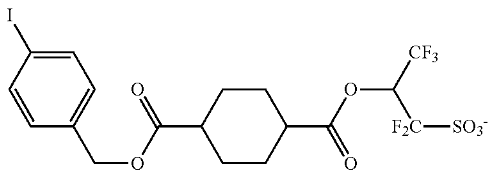
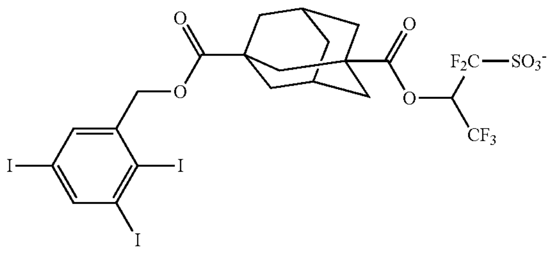
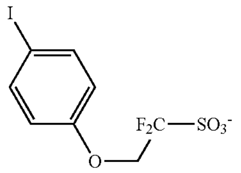
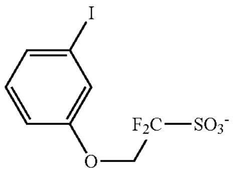
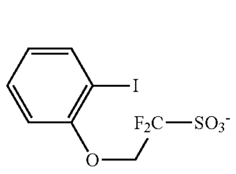
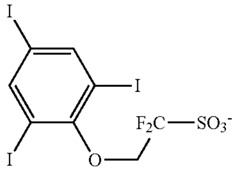

-continued
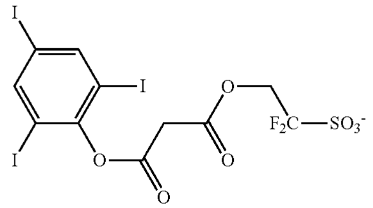
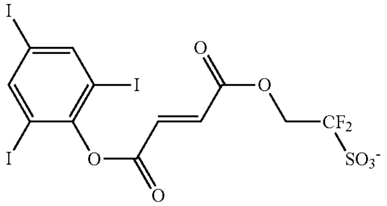
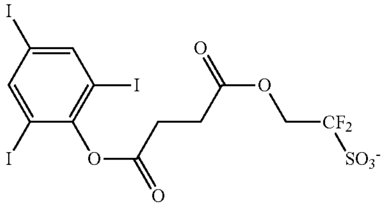
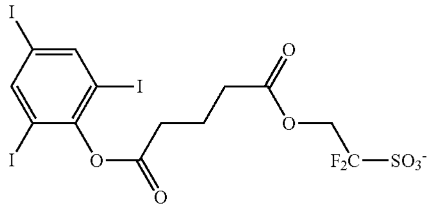
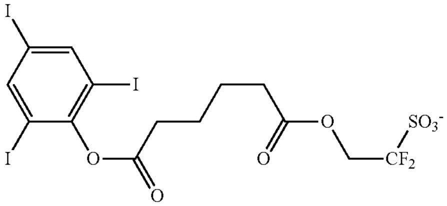
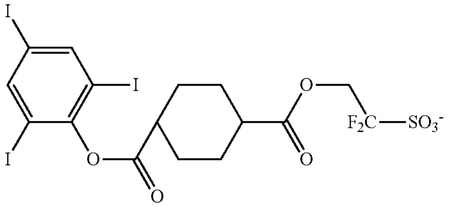
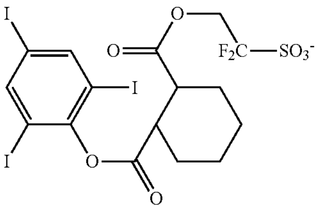
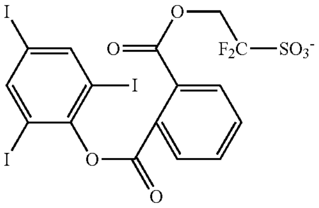
-continued
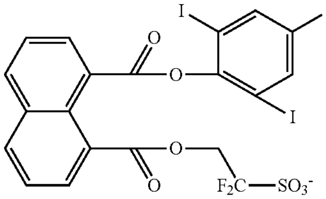
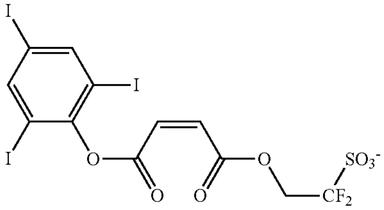
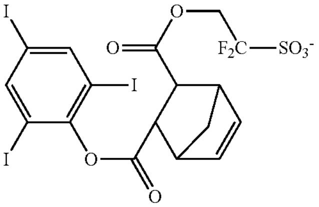
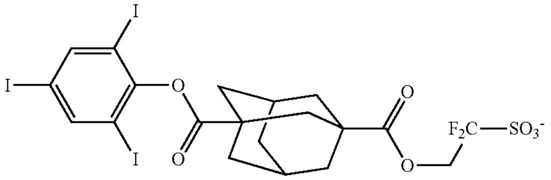
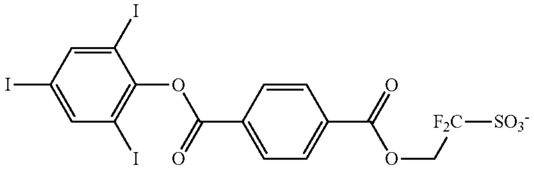
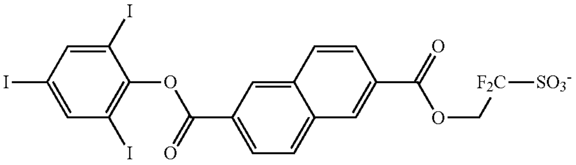
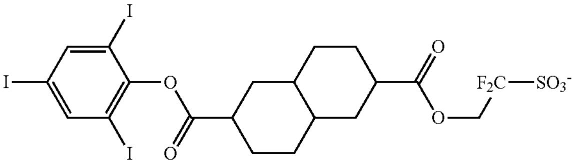
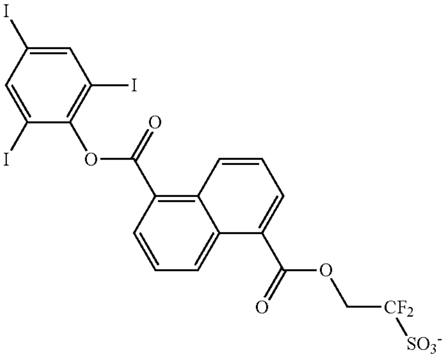

-continued
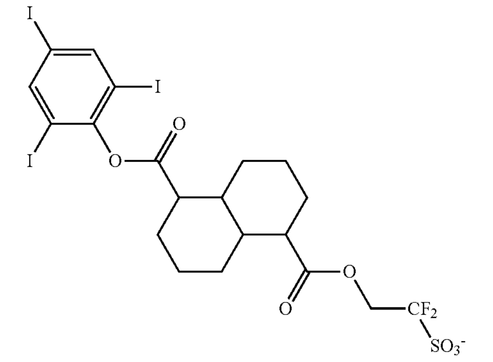
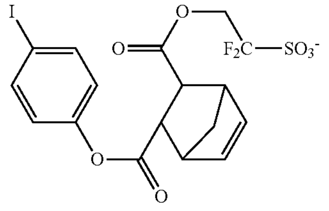
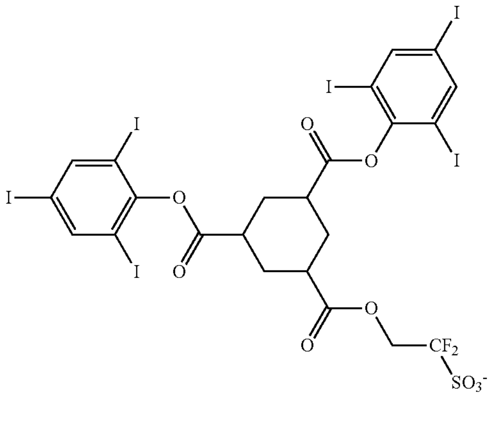
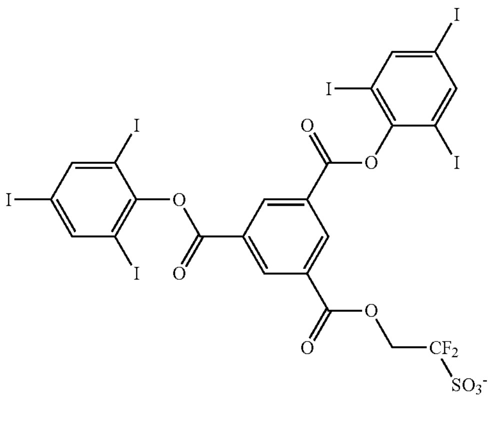
-continued
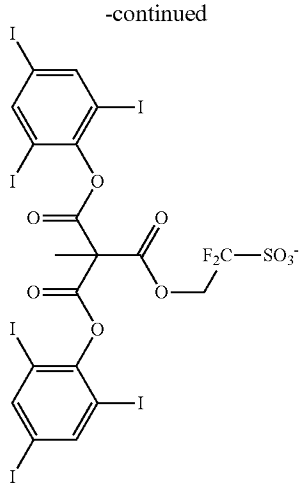
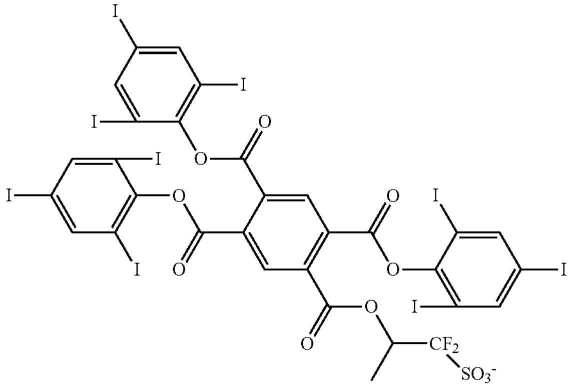
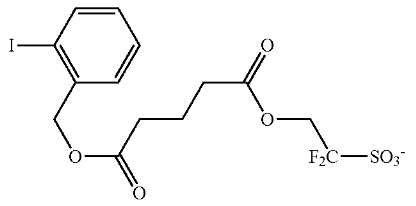
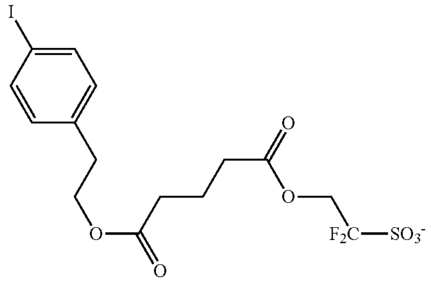
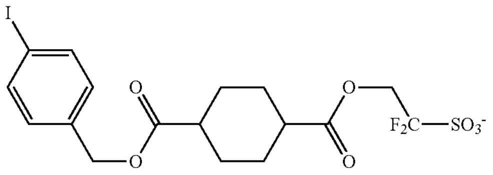
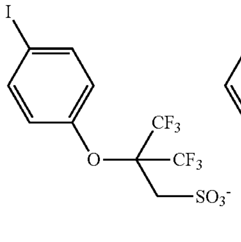
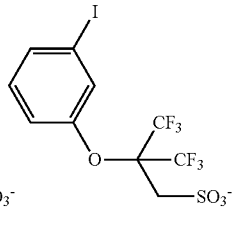

-continued
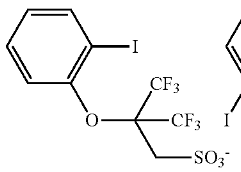
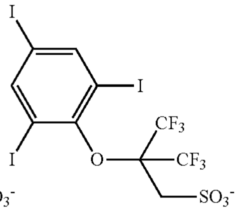
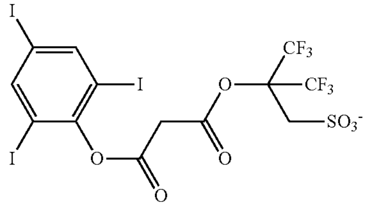
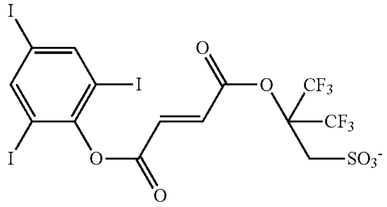
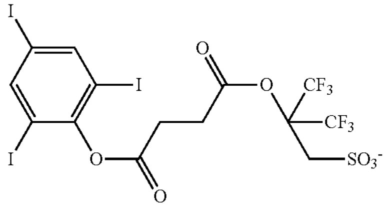
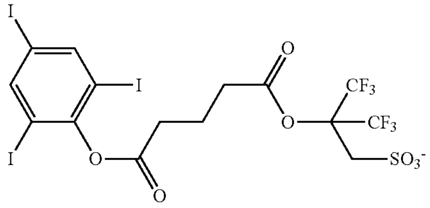
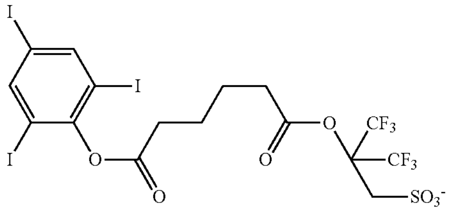
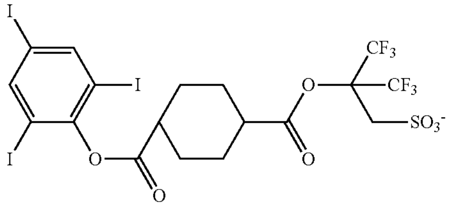
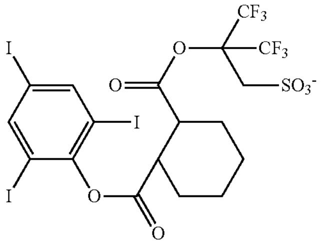
-continued
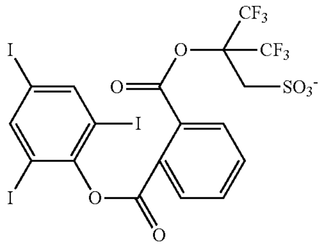
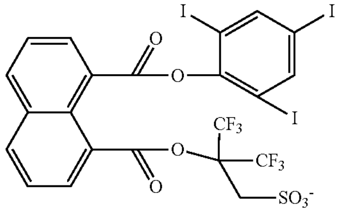
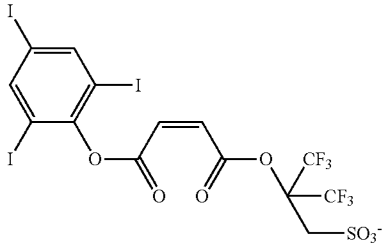
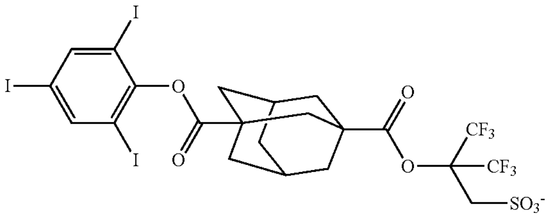
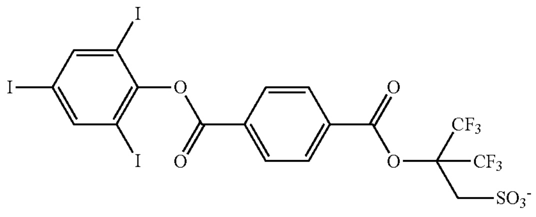
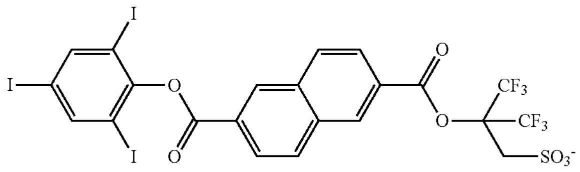
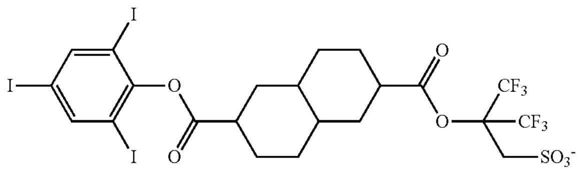

-continued
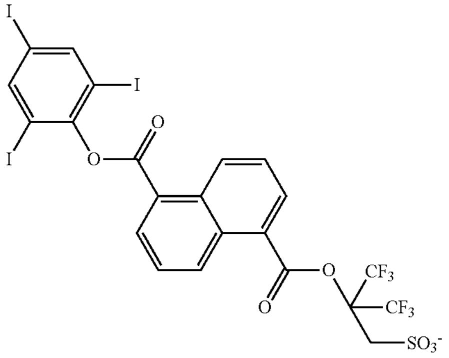
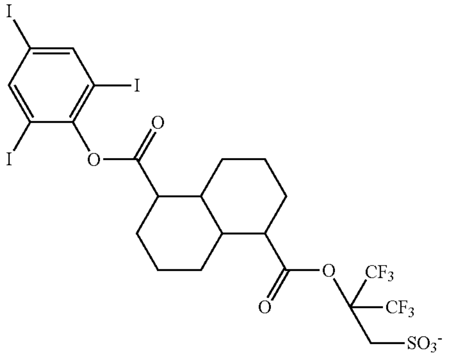
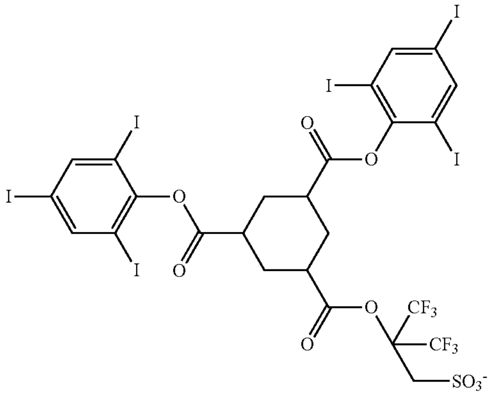
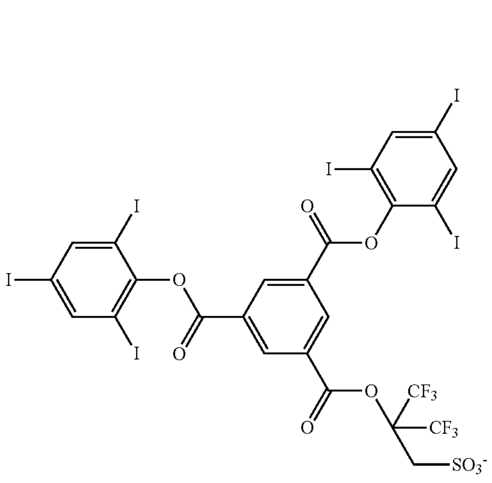
-continued
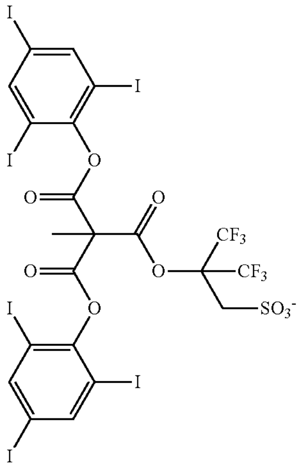
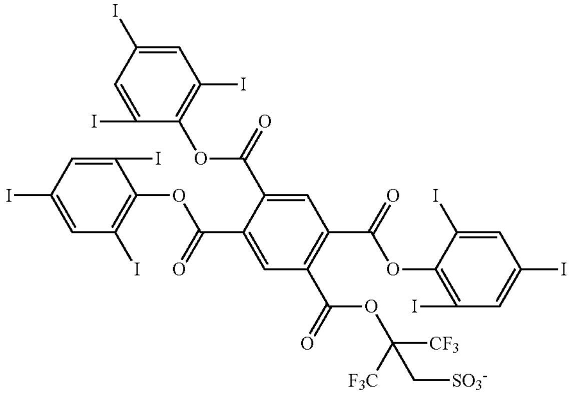
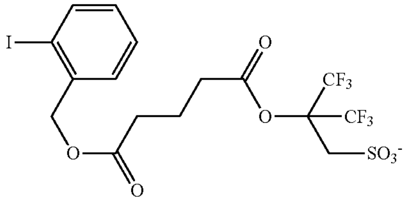
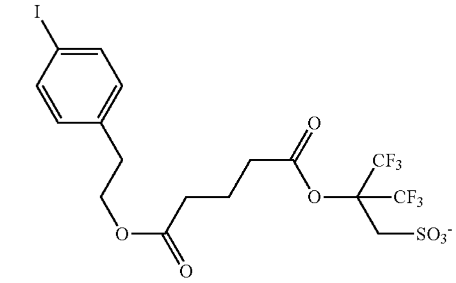
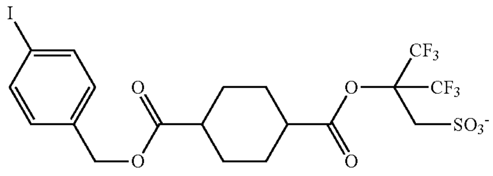
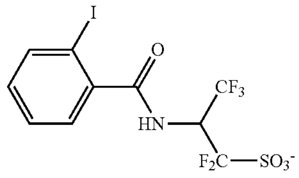

-continued
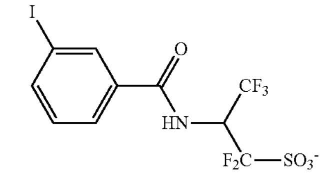
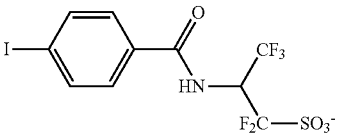
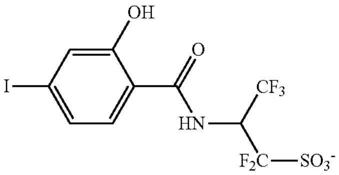
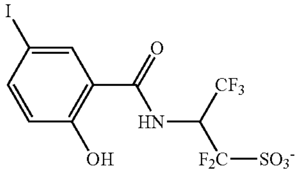
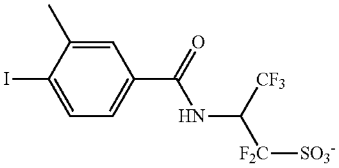
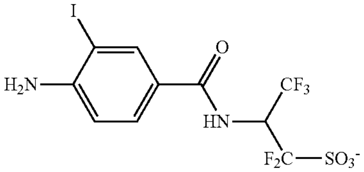
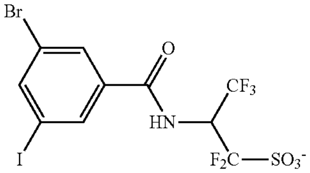
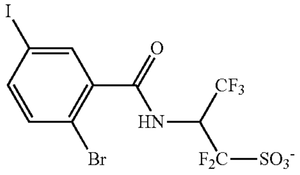
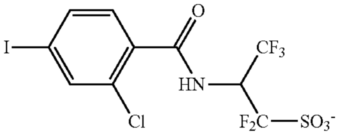
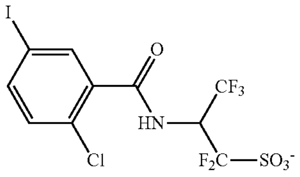
-continued
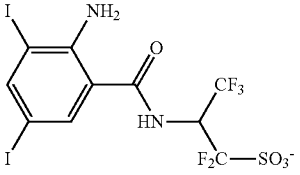
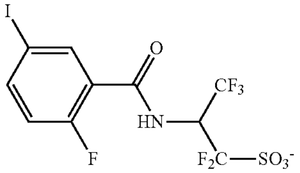
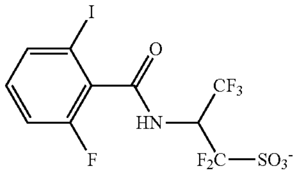
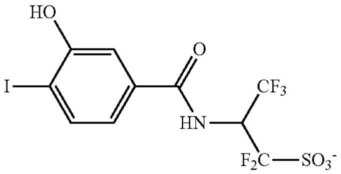
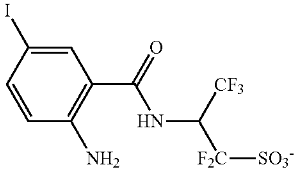
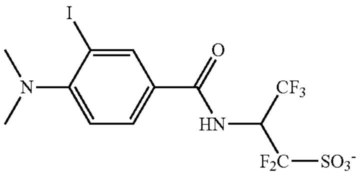
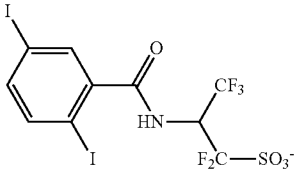
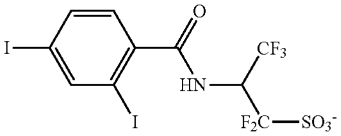
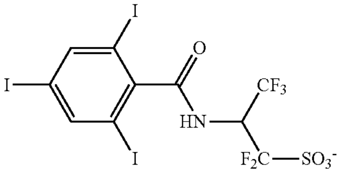
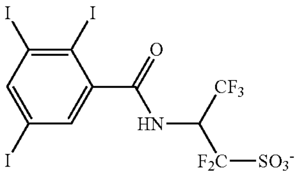

-continued
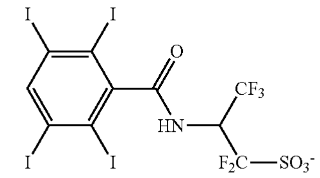
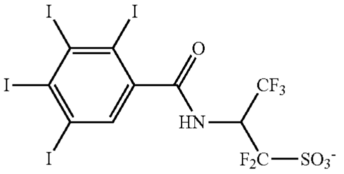
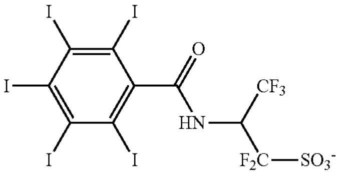
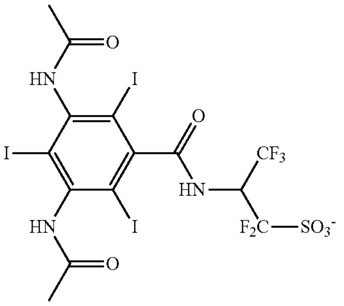
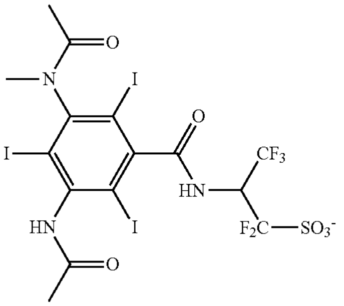
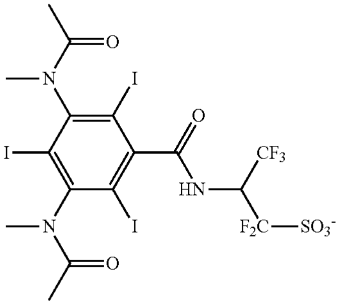
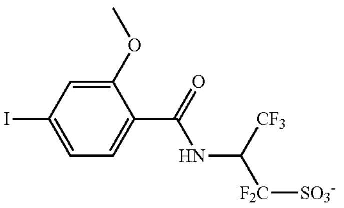
-continued
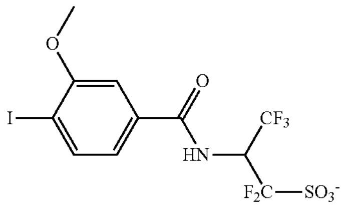
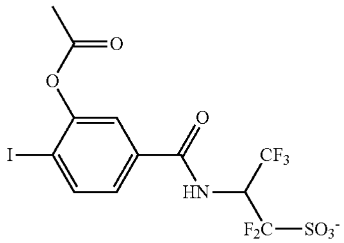
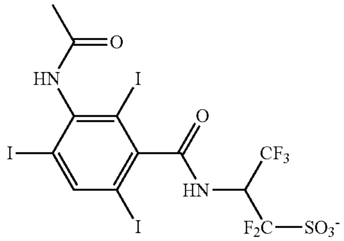
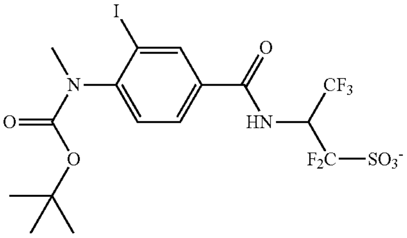
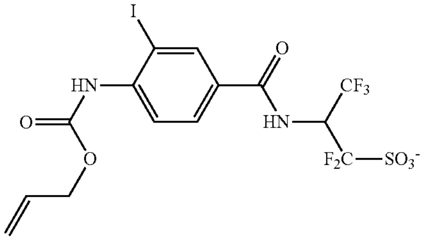
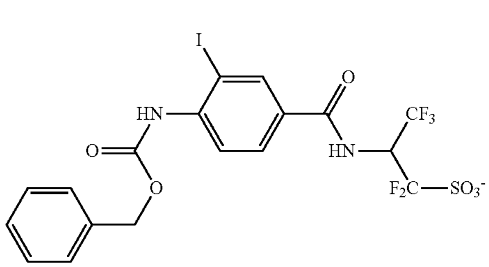
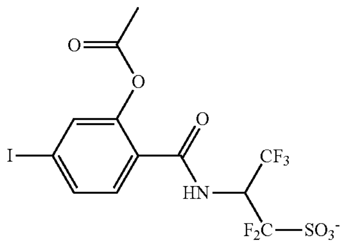

-continued
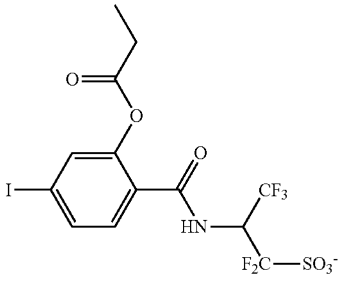
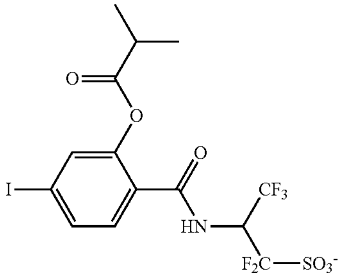
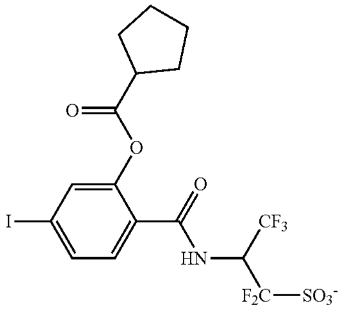
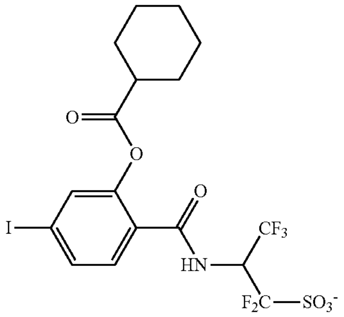
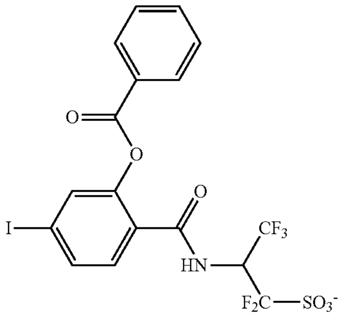
-continued
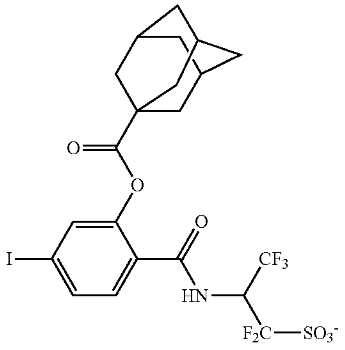
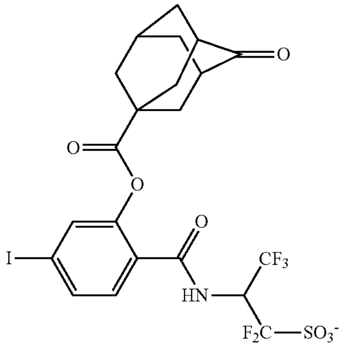
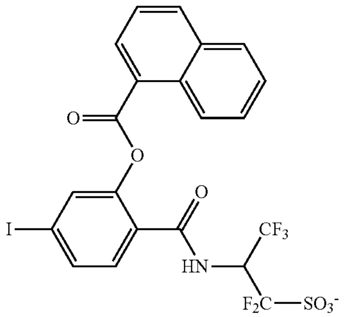
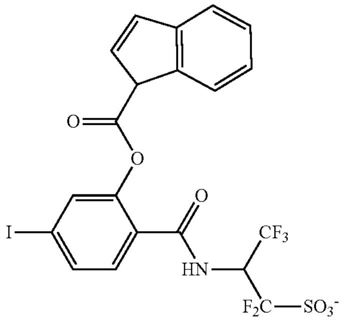
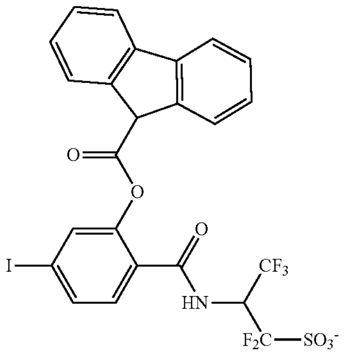

-continued
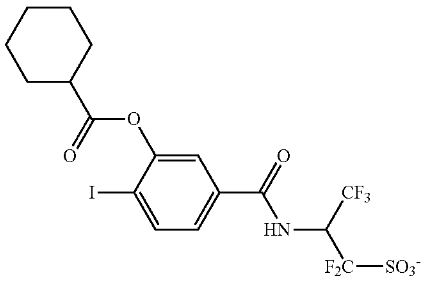
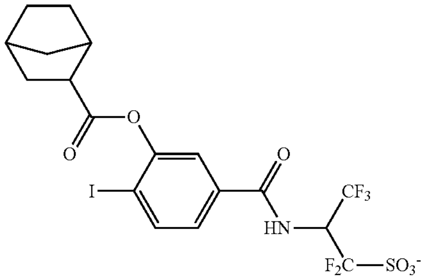
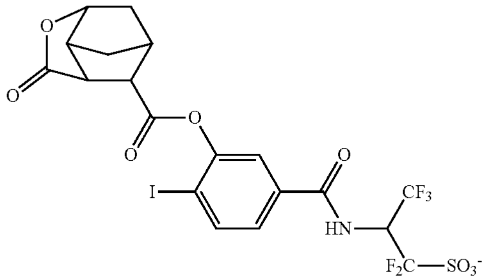
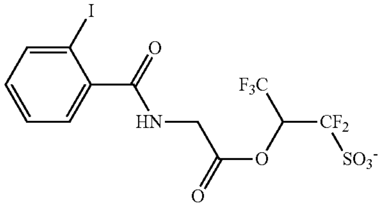
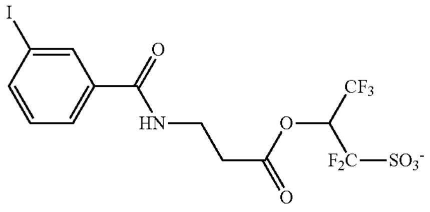
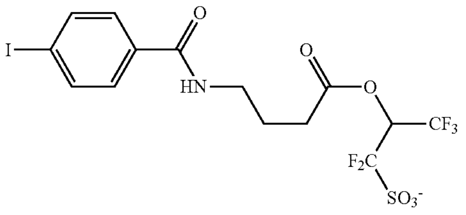
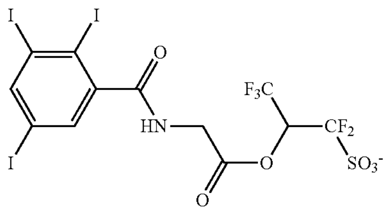
-continued
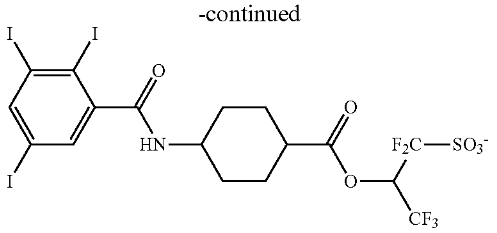
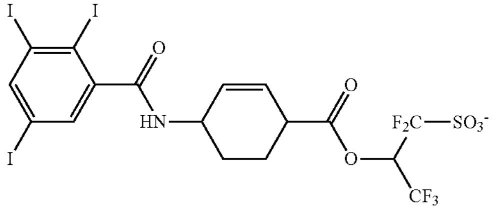
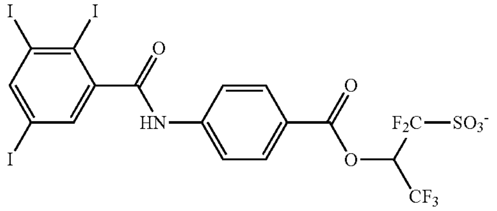
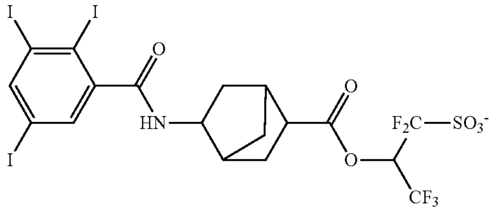
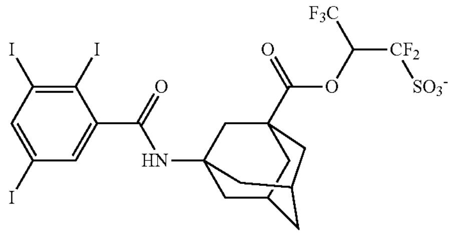
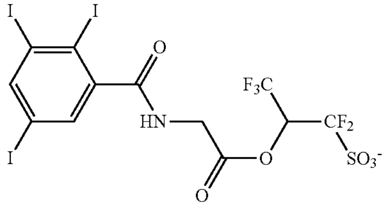
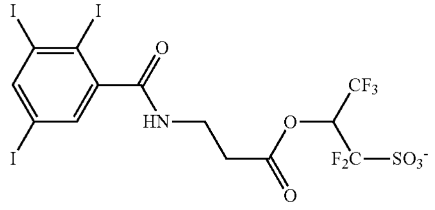
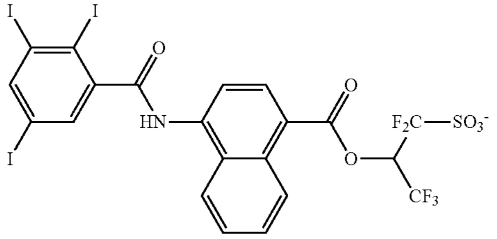

-continued
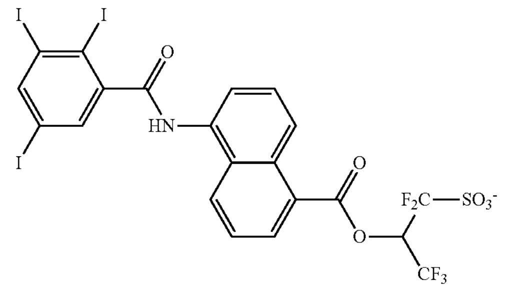
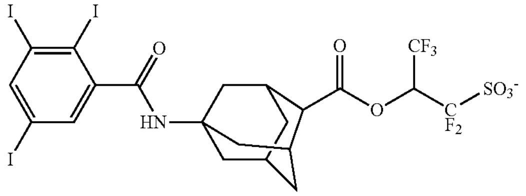
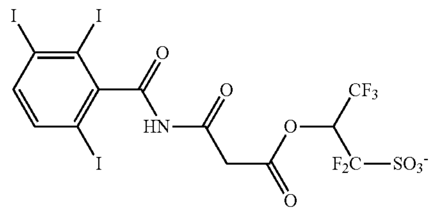
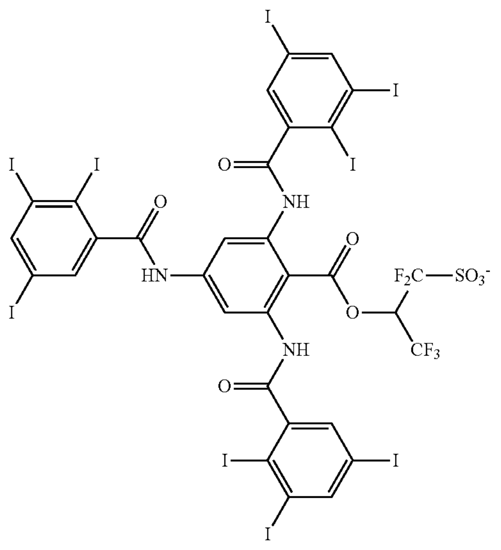
-continued
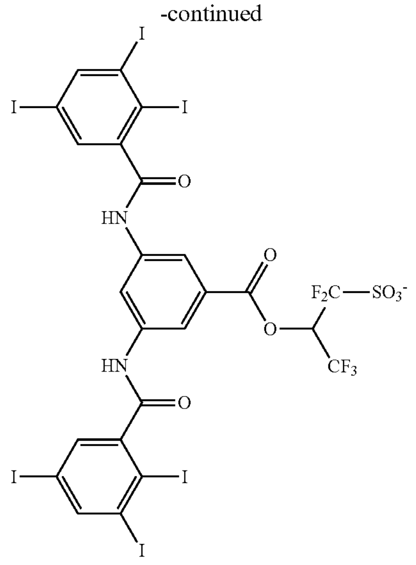
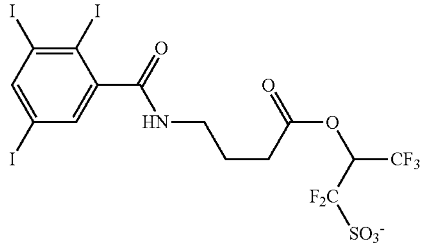
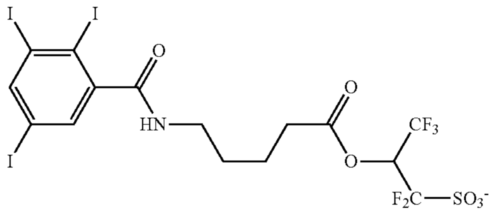
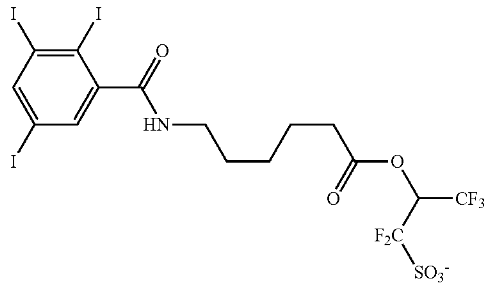
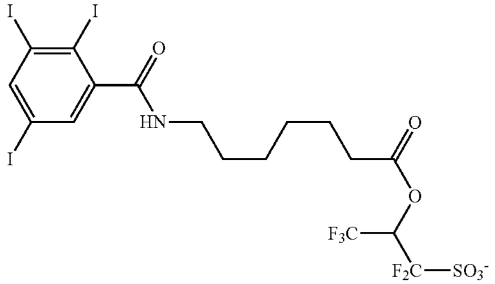

-continued
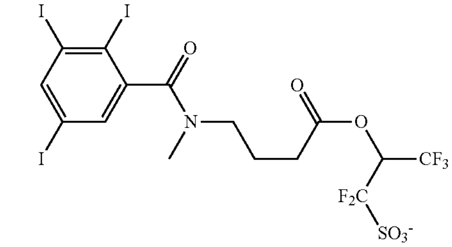
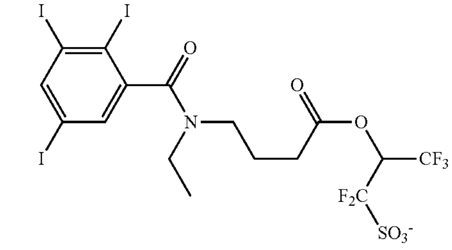
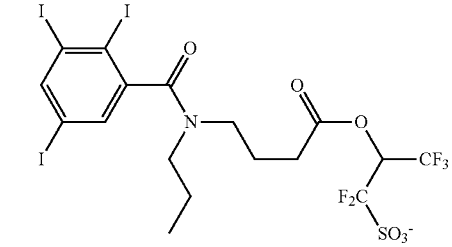
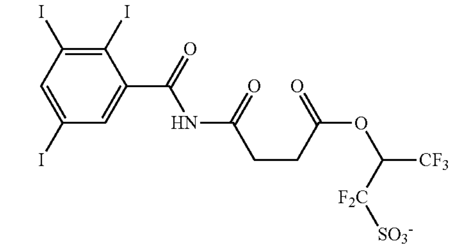
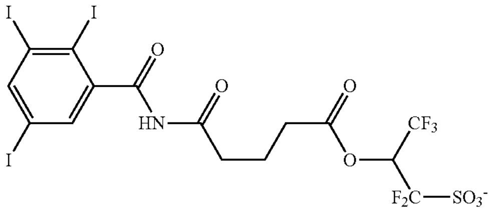
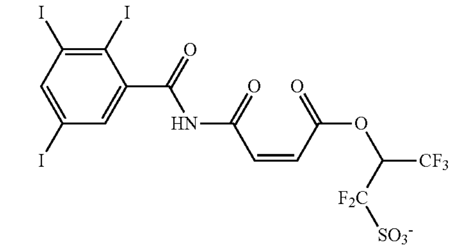
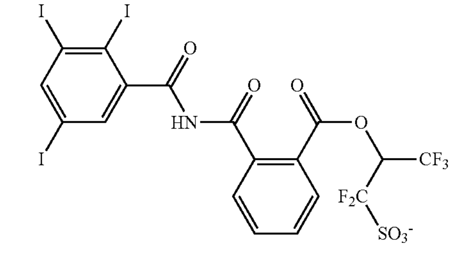
-continued
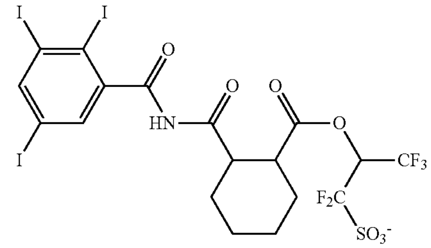
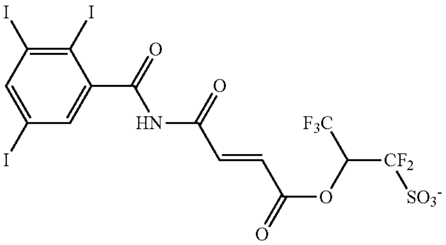
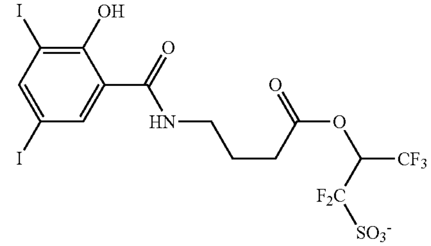
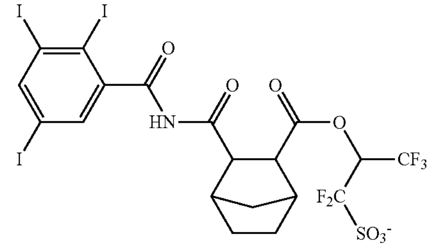
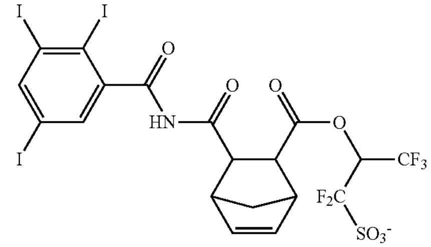
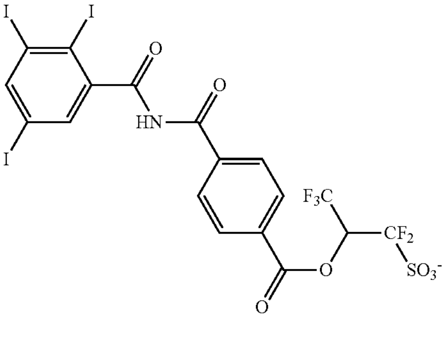

-continued
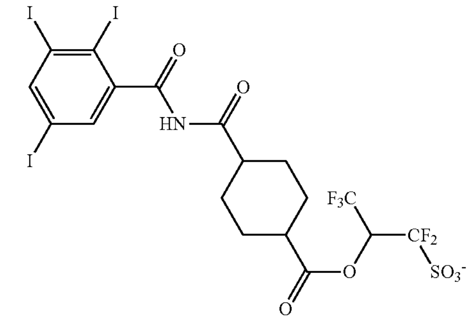
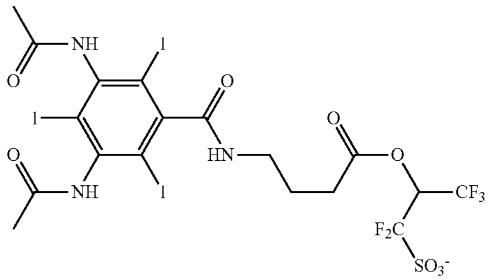
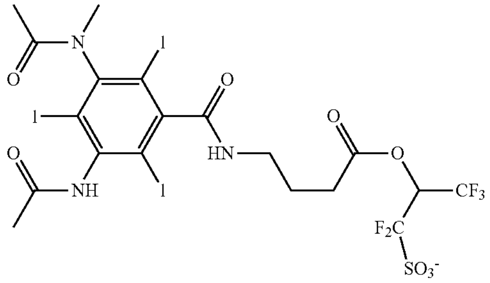
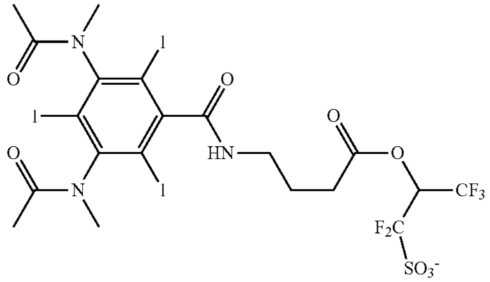
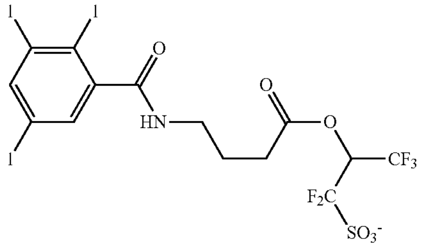
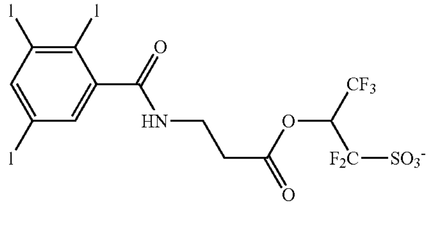
-continued
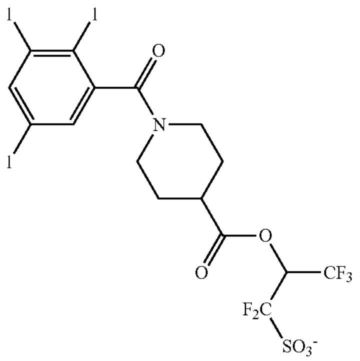
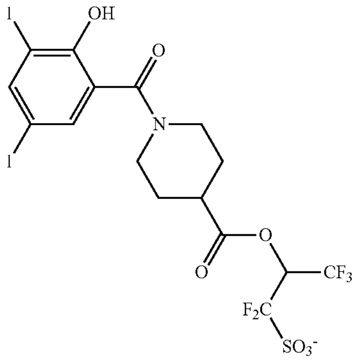
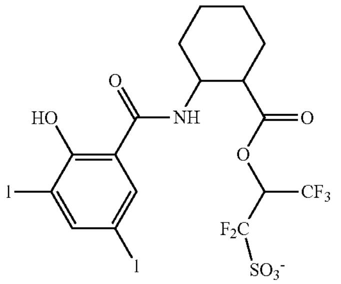
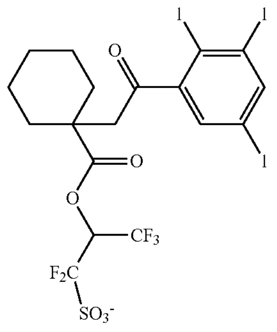
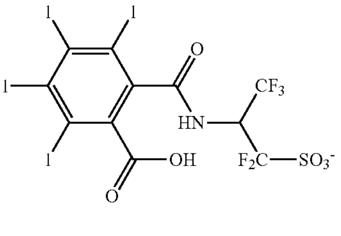

-continued
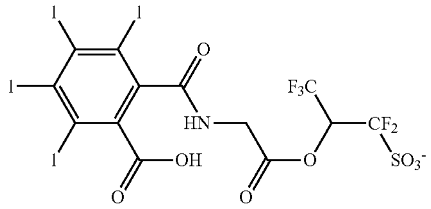
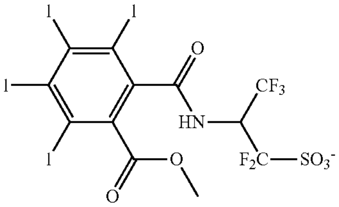
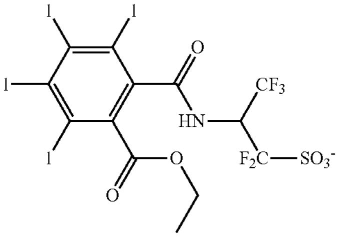
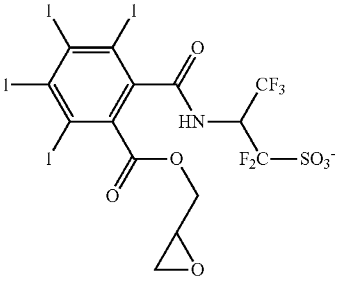
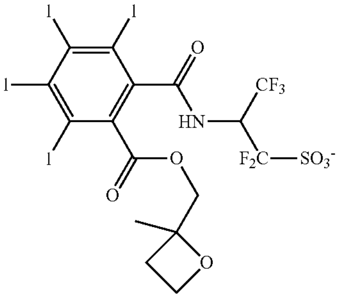
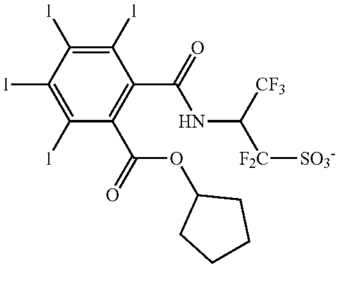
-continued
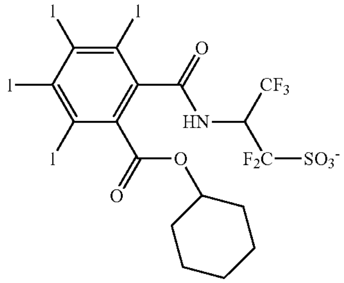
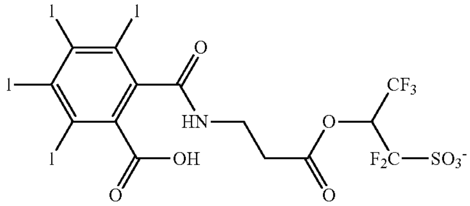
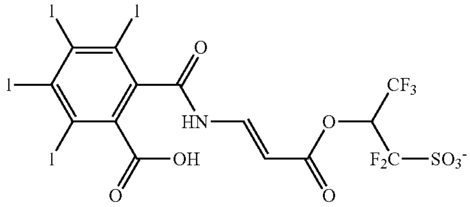
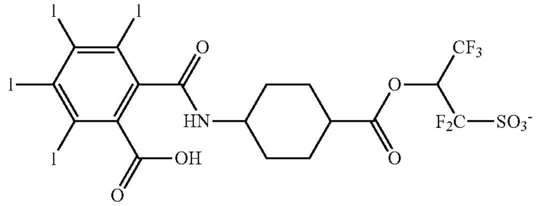
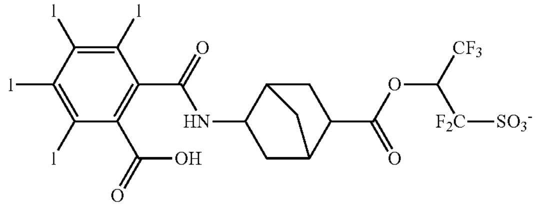
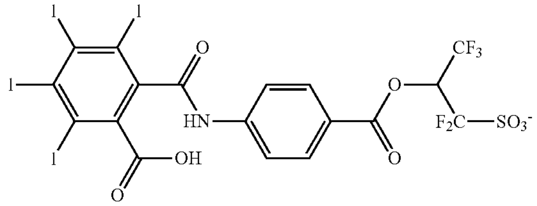
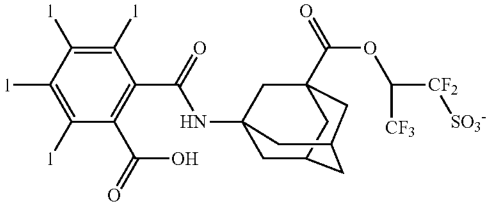
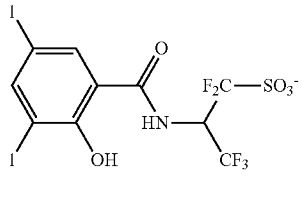

-continued
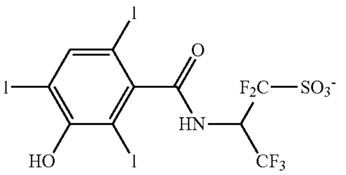
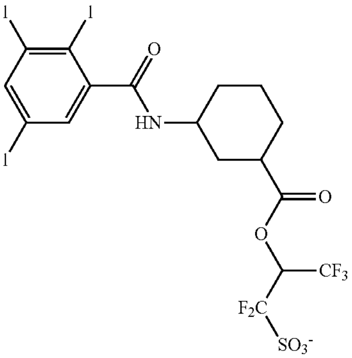
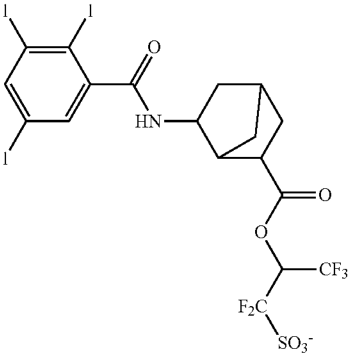
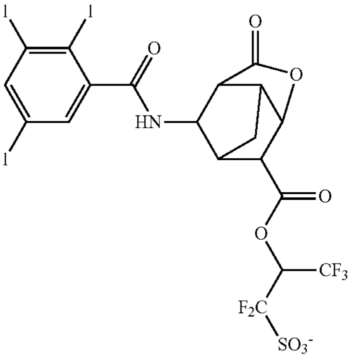
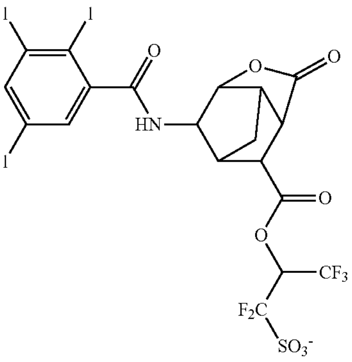
-continued
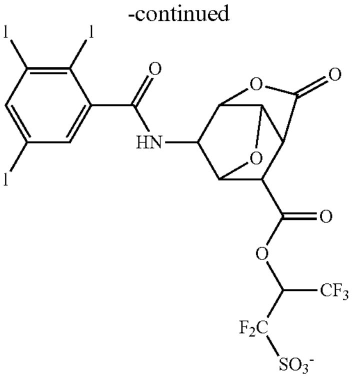
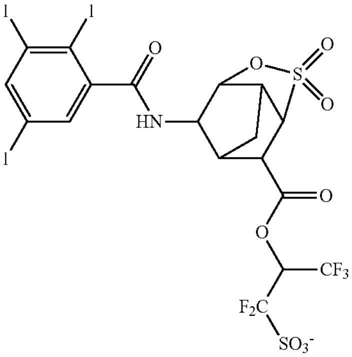
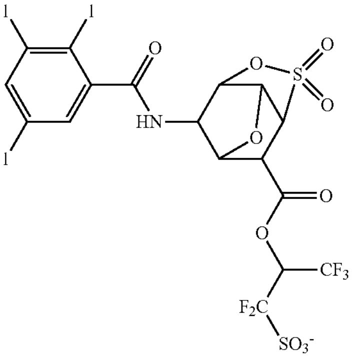
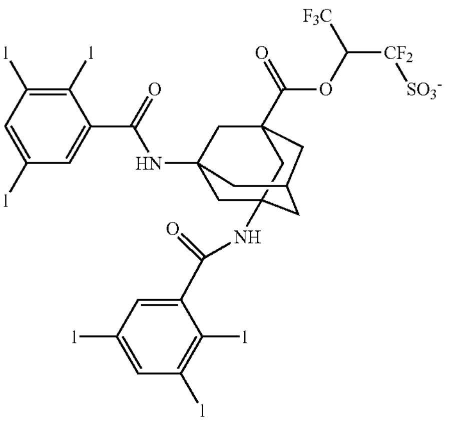

-continued
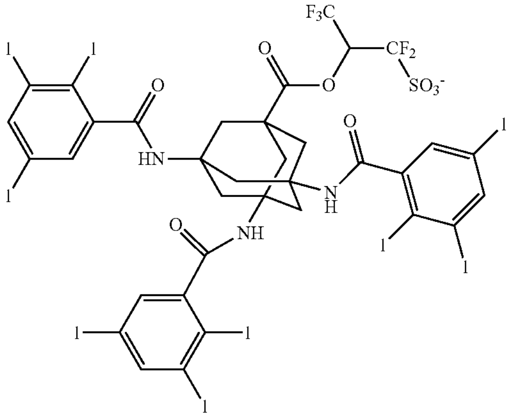
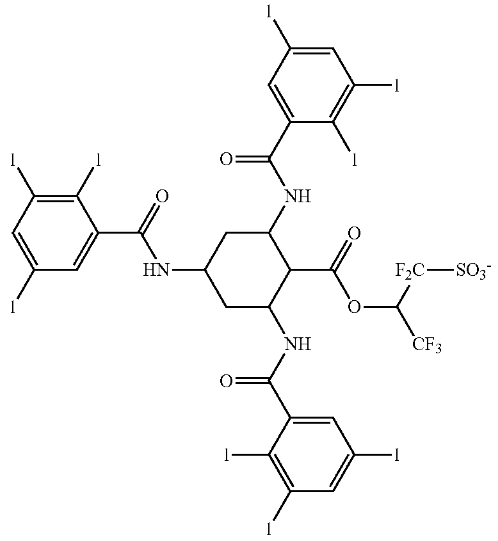
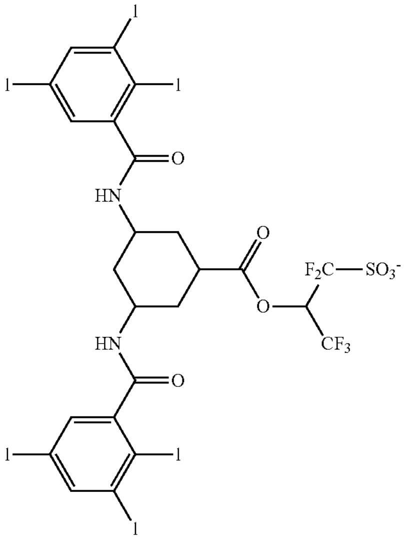
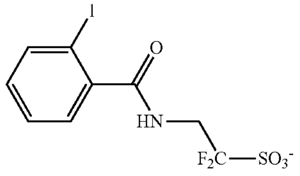
-continued
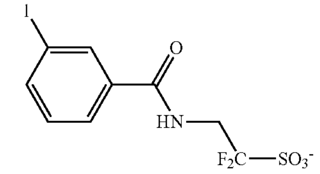
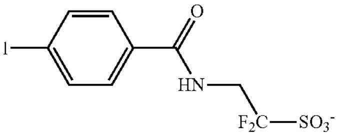
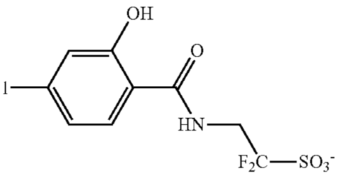
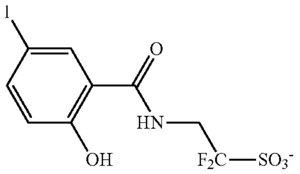
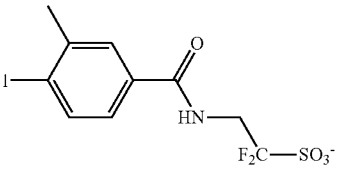
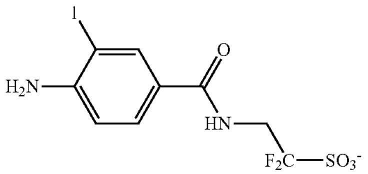
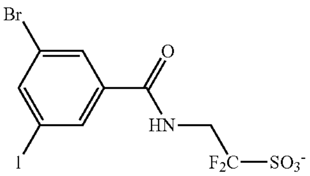
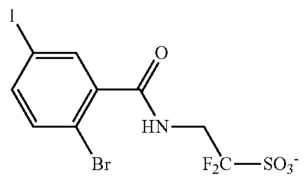
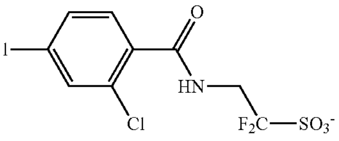
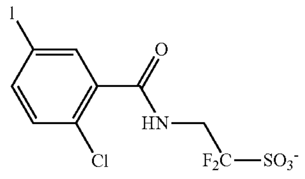

-continued
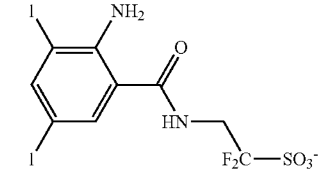
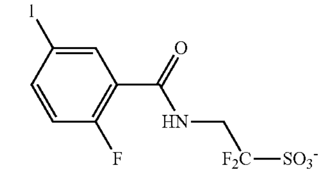
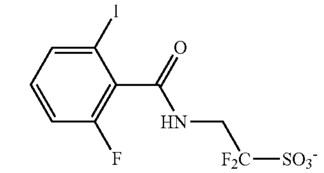
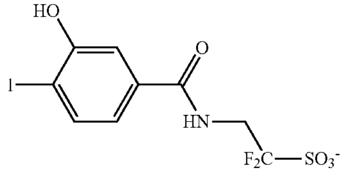
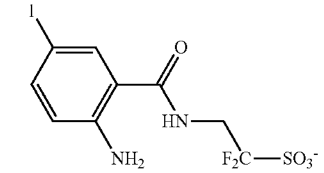
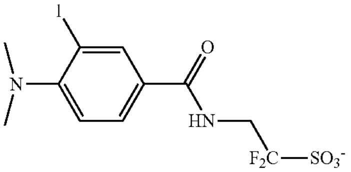
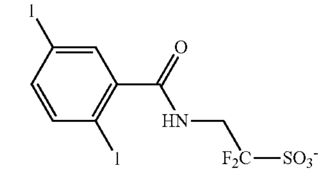
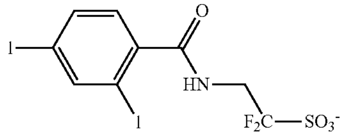
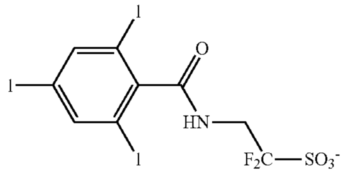
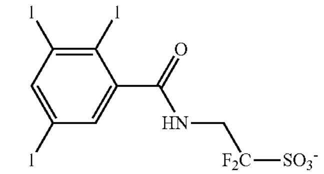
-continued
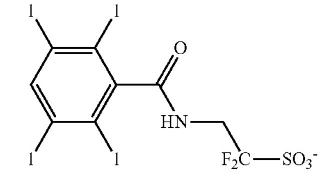
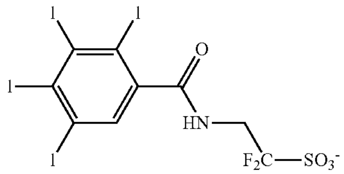
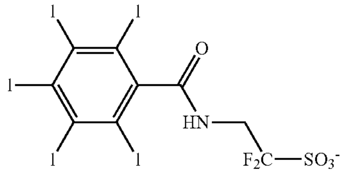
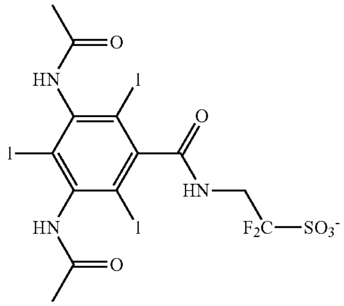
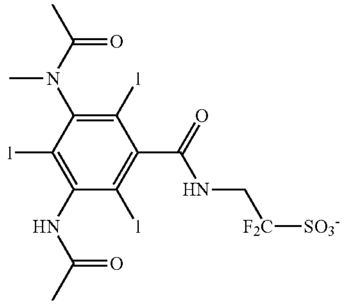
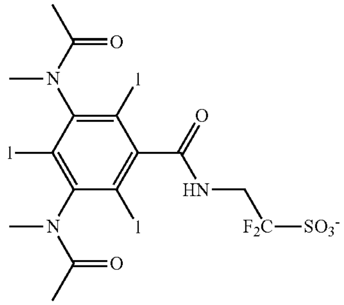
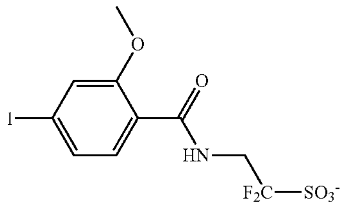

-continued
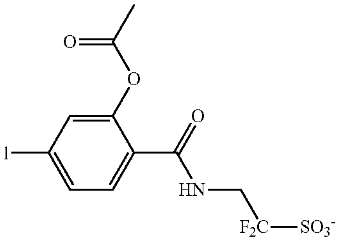
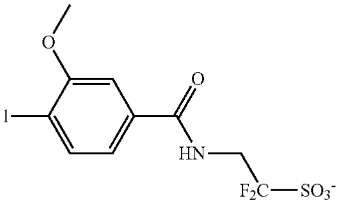
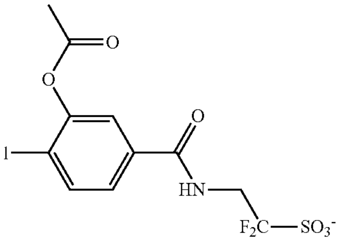
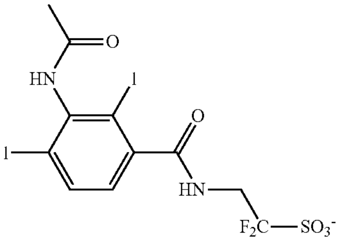
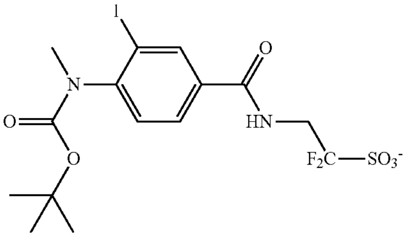
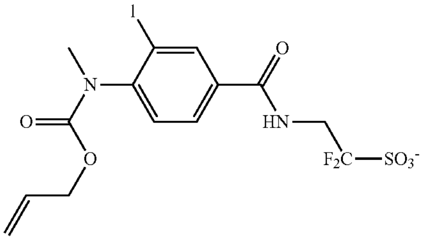
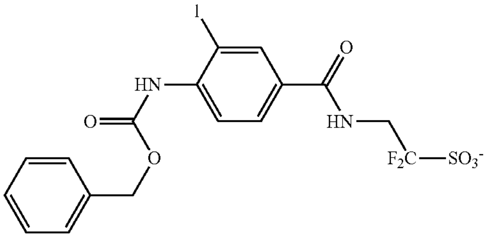
-continued
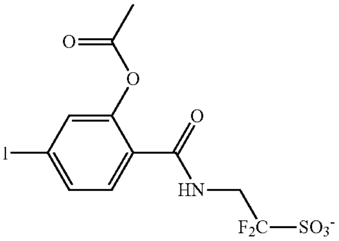
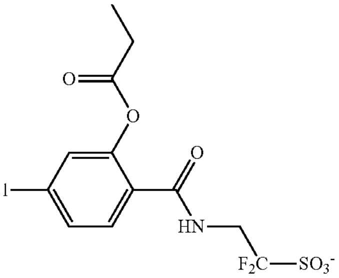
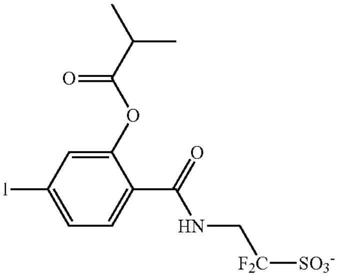
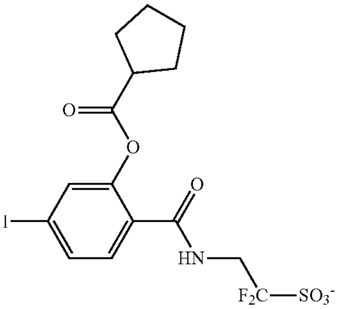
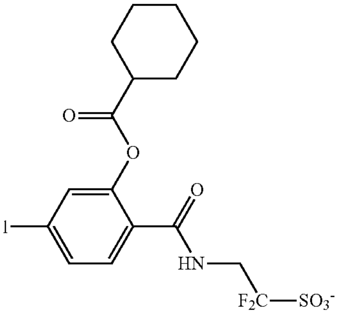

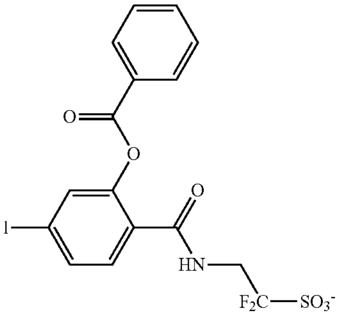
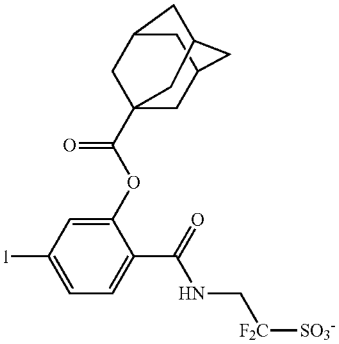
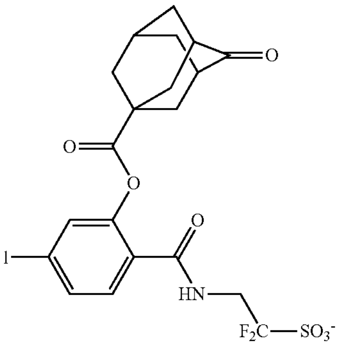
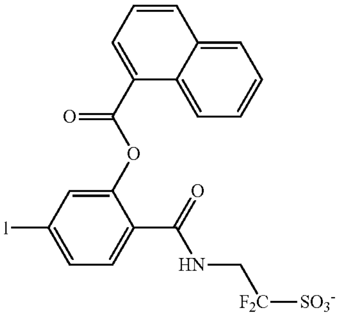
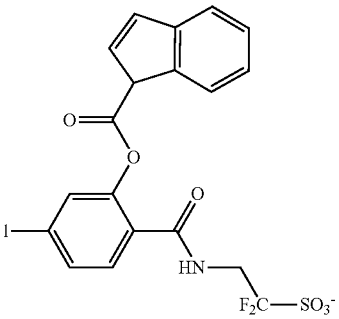
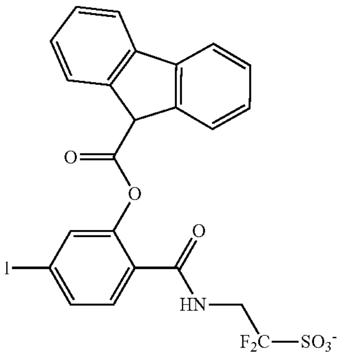
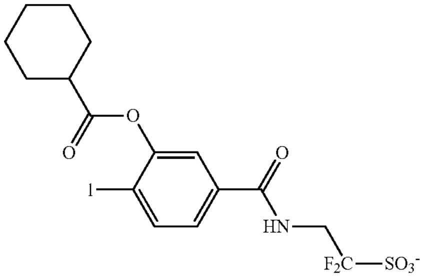
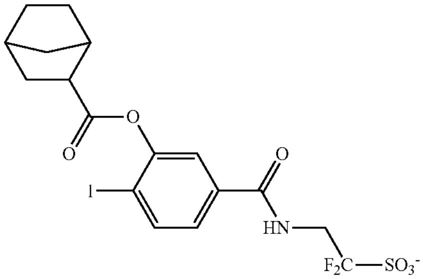
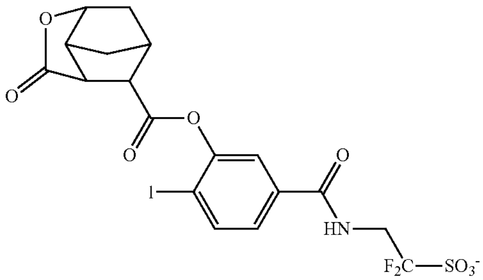
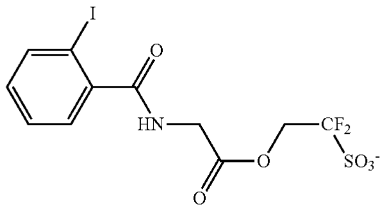
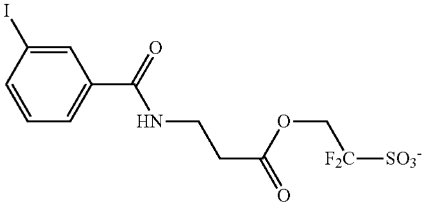

-continued
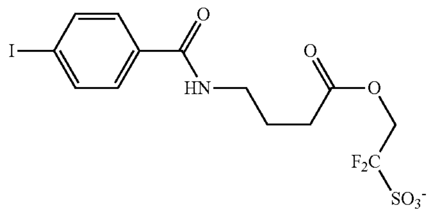
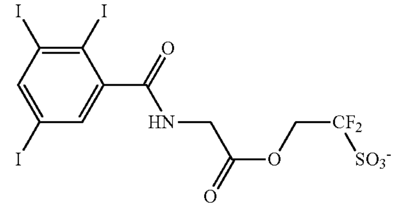
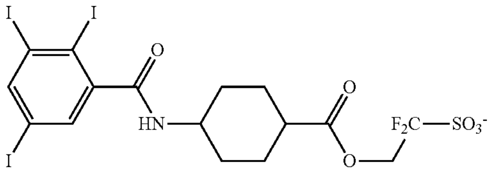
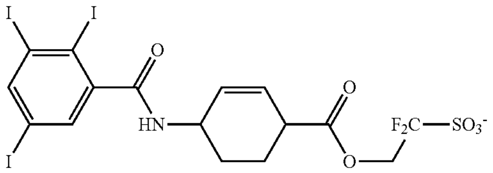
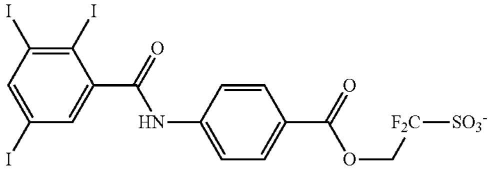
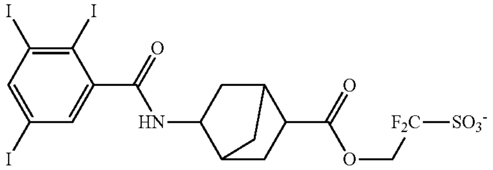
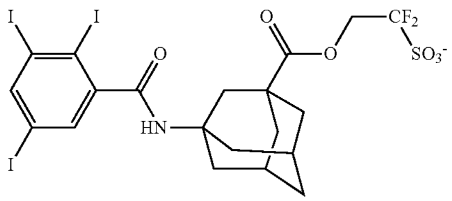
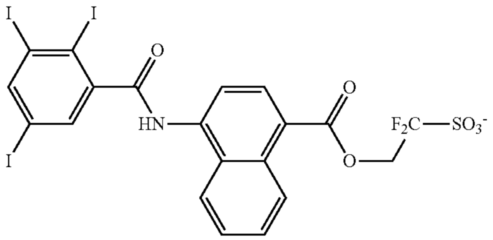
-continued
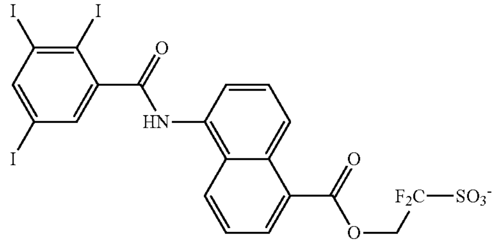
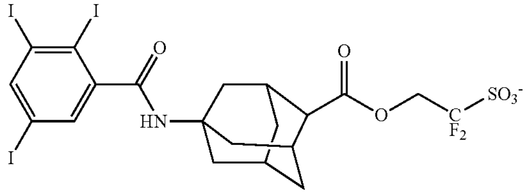
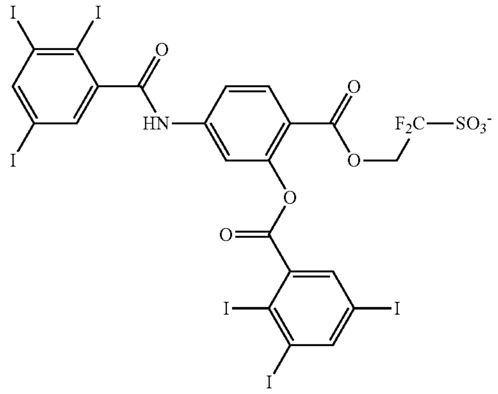
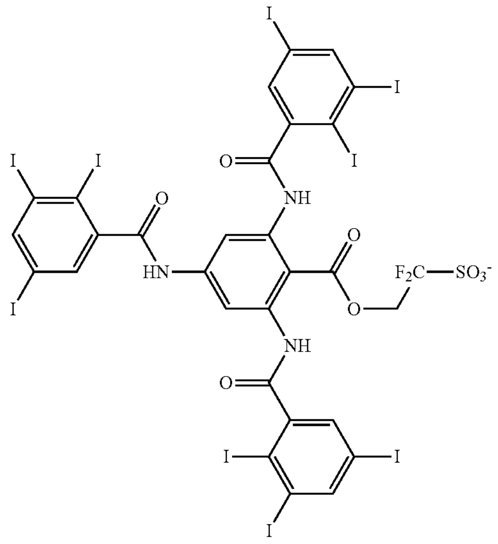

-continued
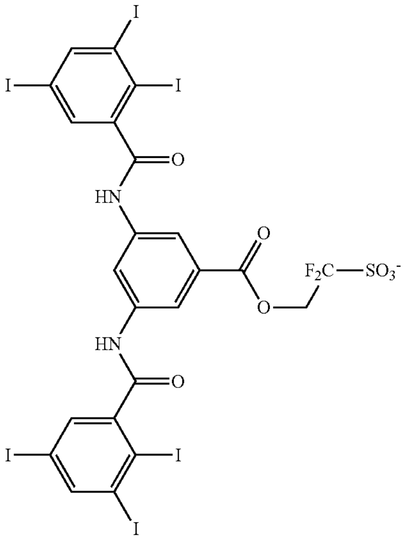
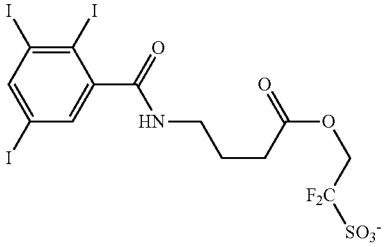
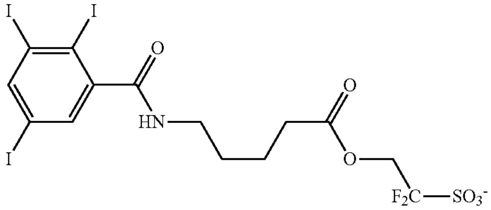
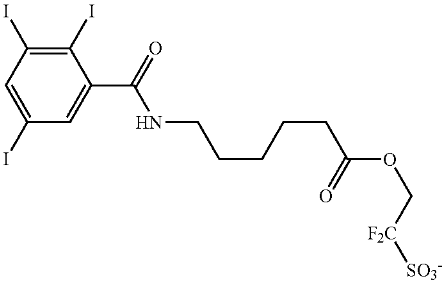
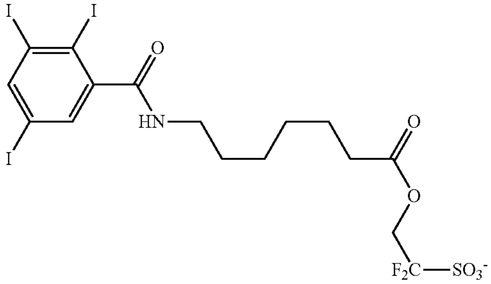
-continued
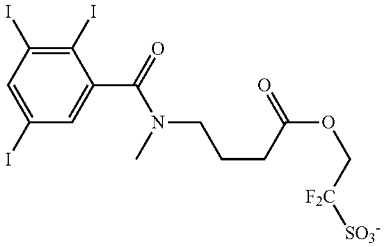
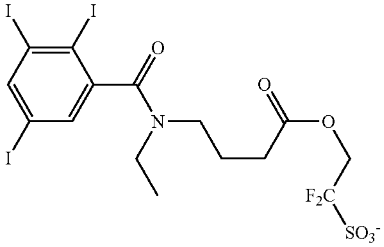
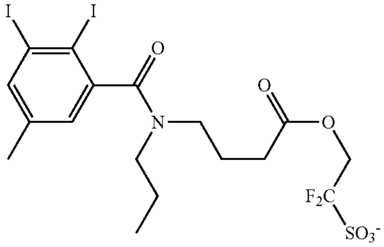
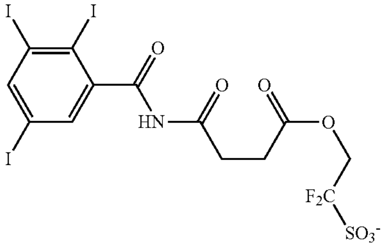
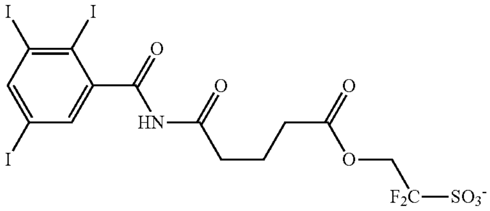
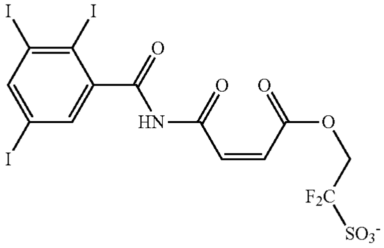
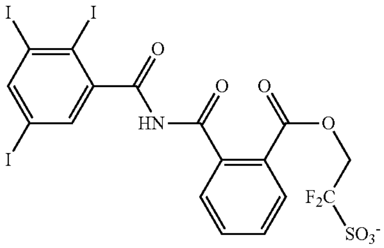

-continued
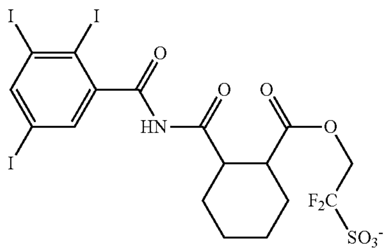
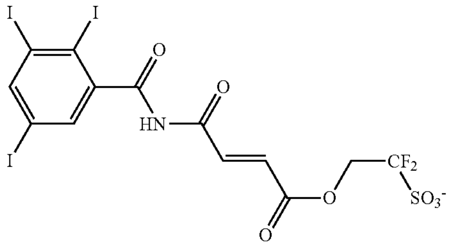
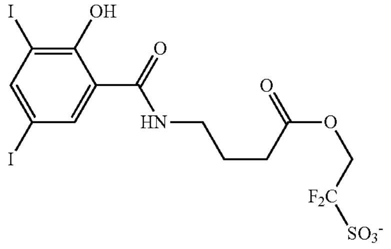
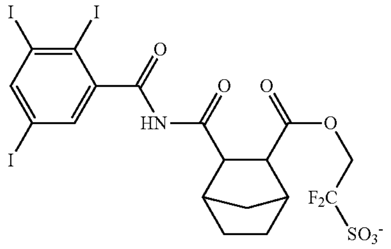
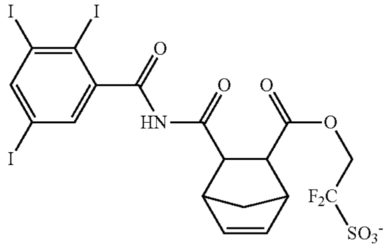
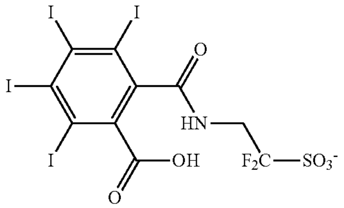
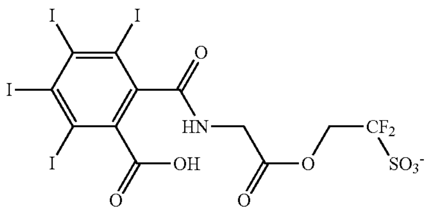
-continued
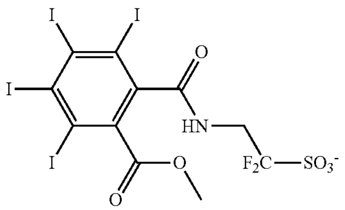
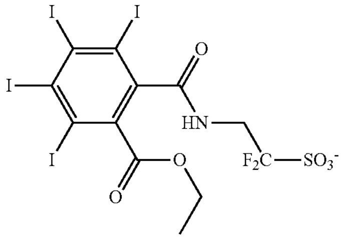
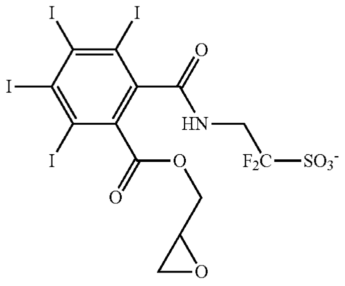
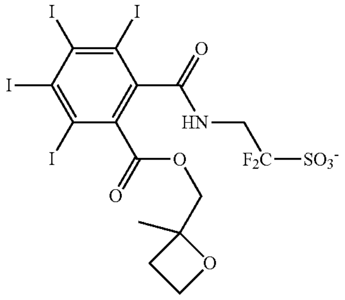
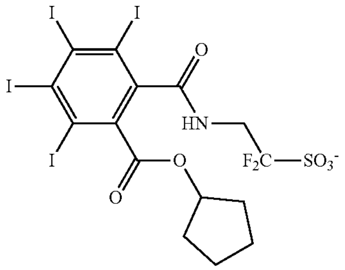
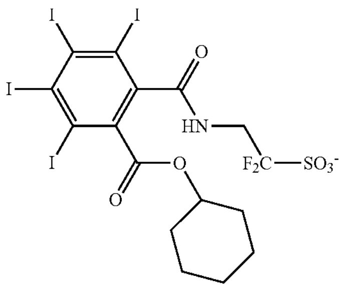

-continued
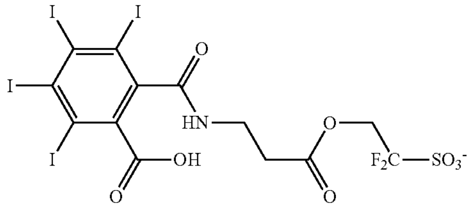
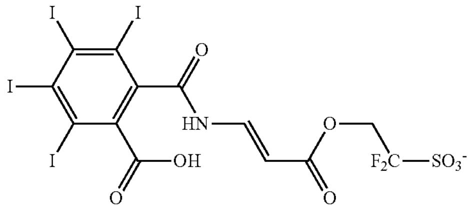
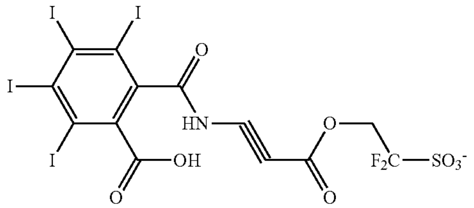
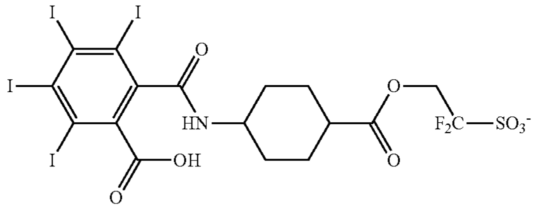
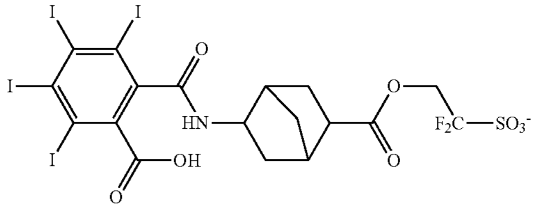
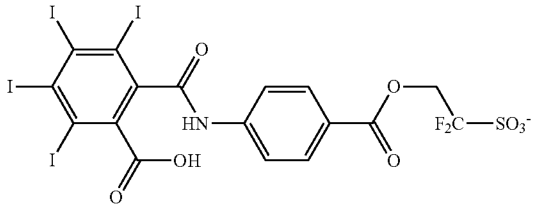
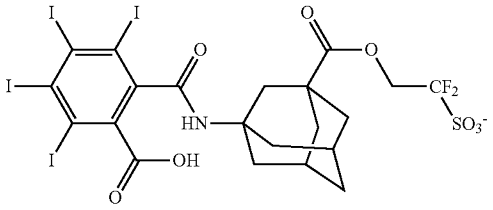
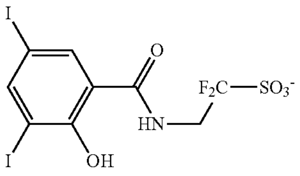
-continued
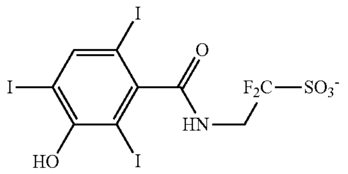
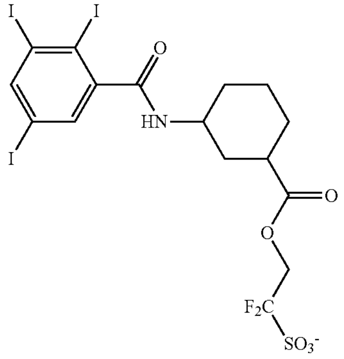
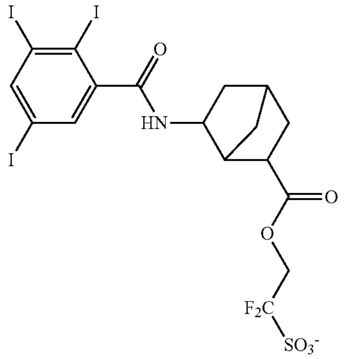
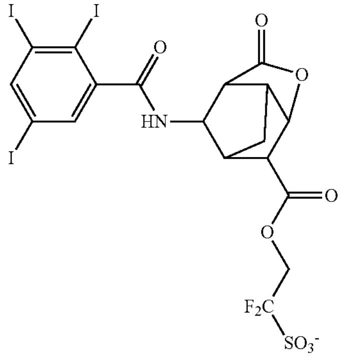
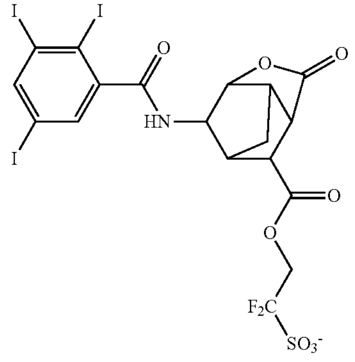

-continued
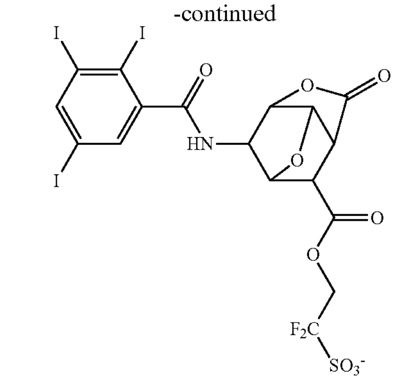
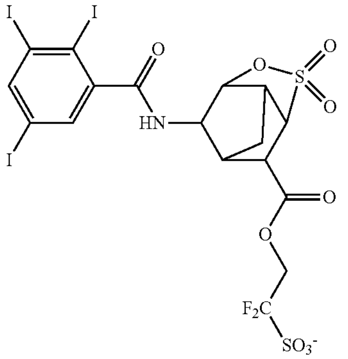
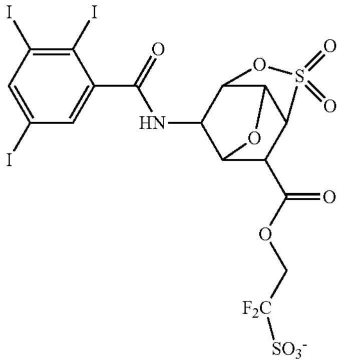
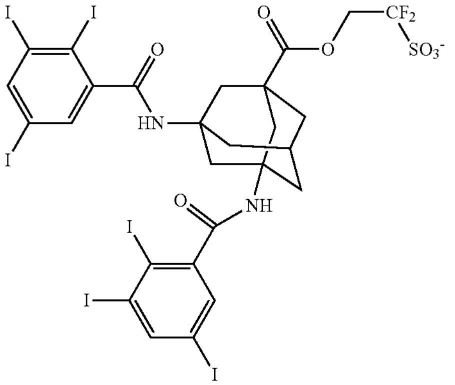
-continued
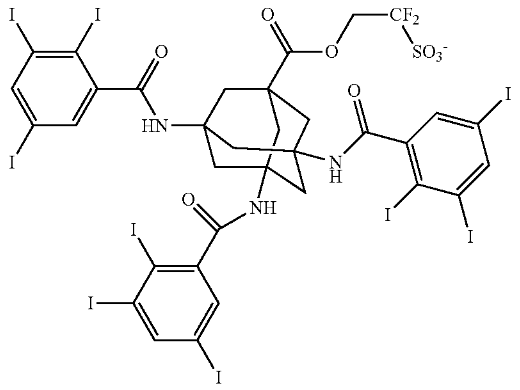
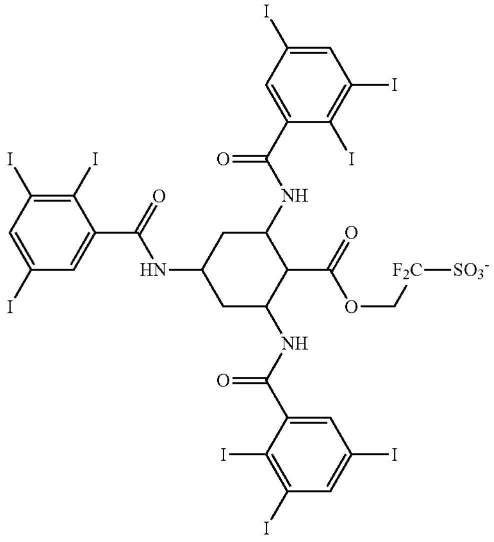
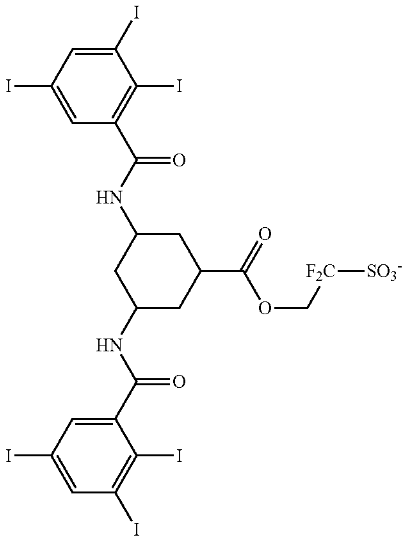
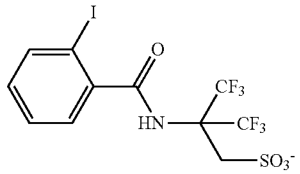

-continued
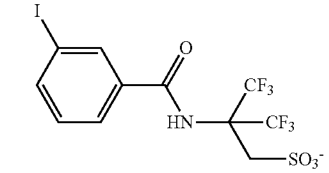
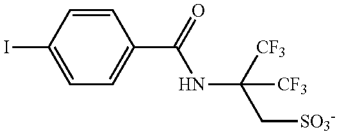
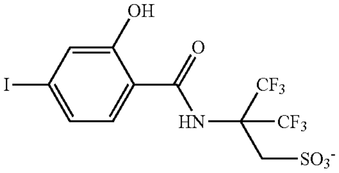
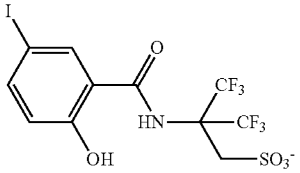
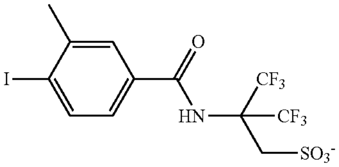
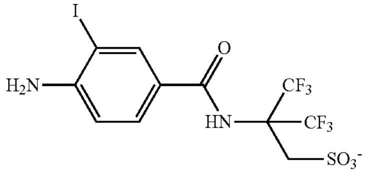
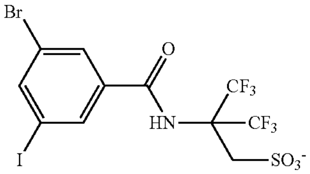
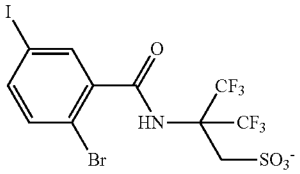
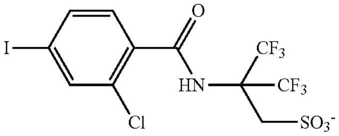
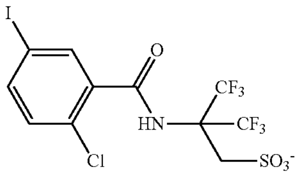
-continued
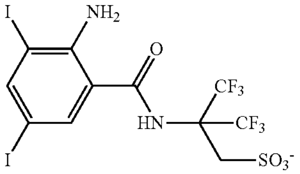
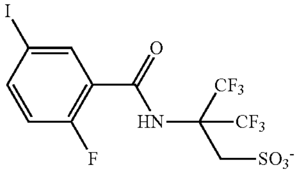
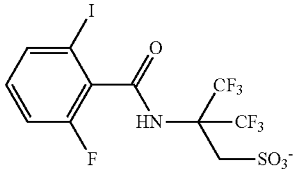
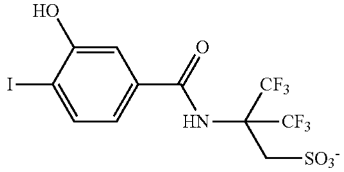
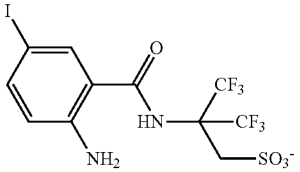
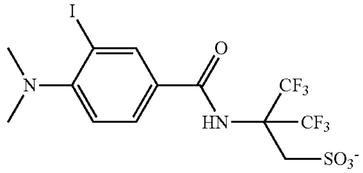
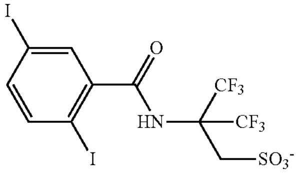
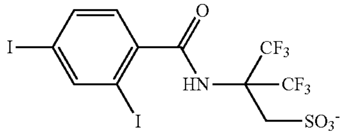
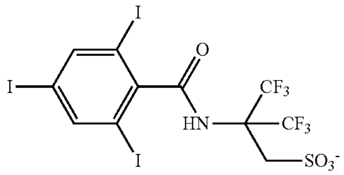
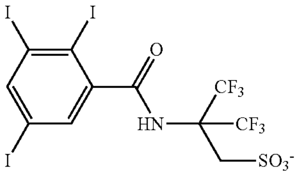

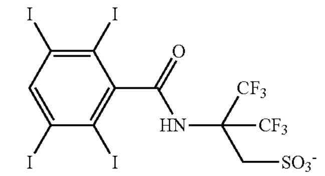
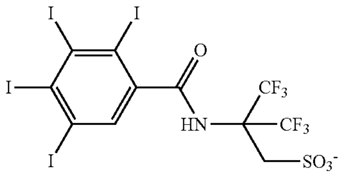
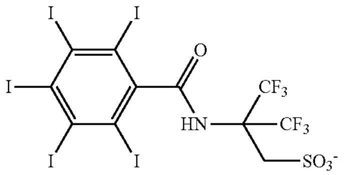
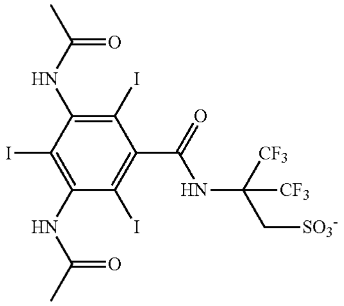
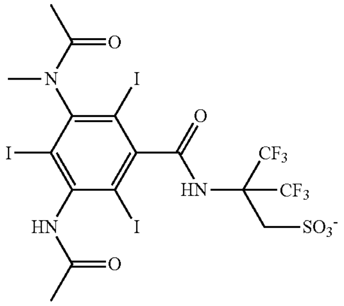
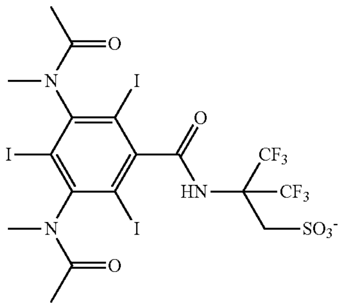
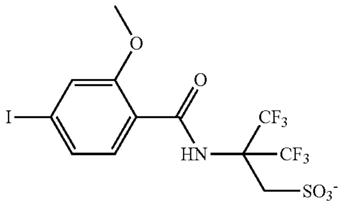
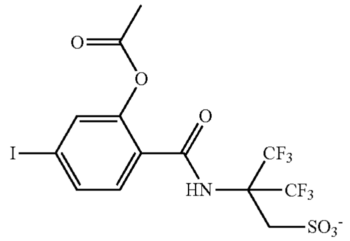
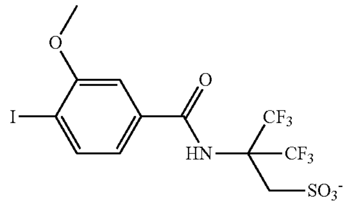
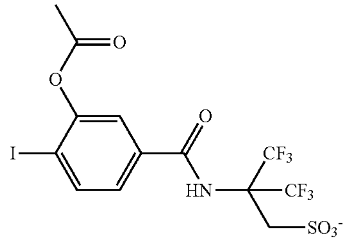
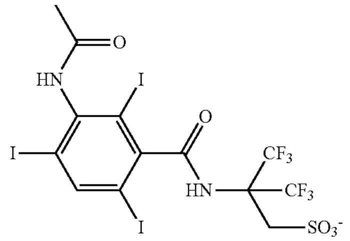
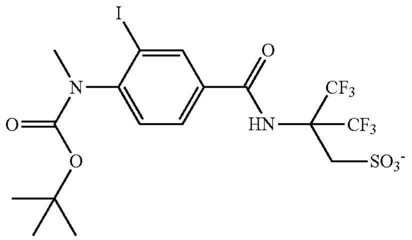
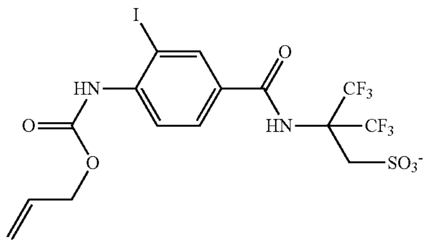
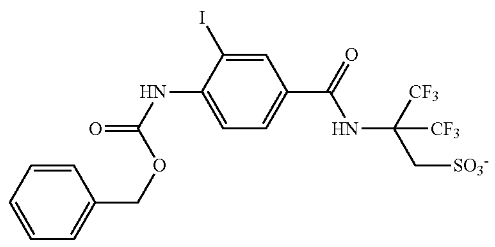

-continued
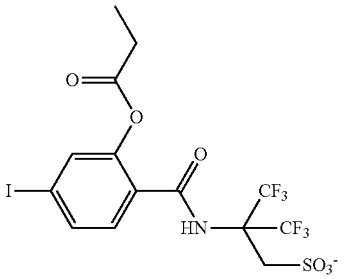
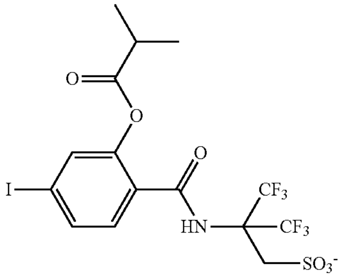
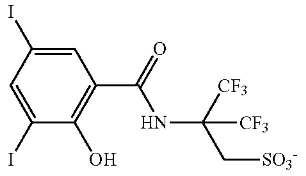
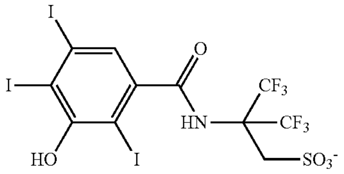
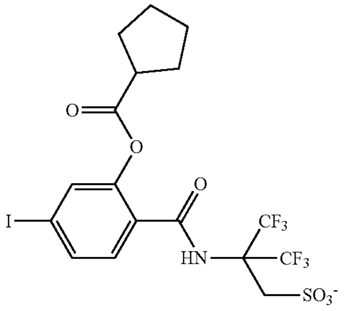
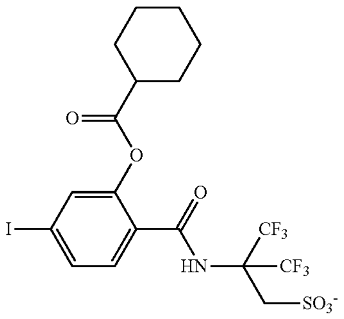
-continued
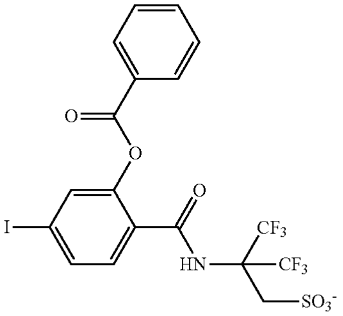
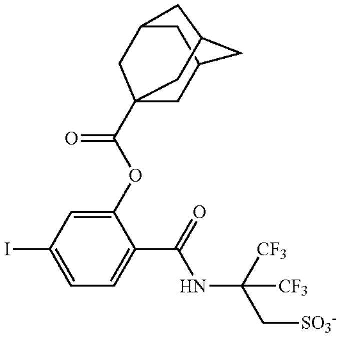
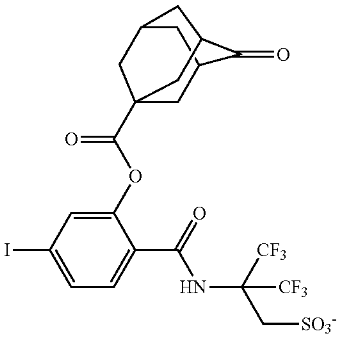
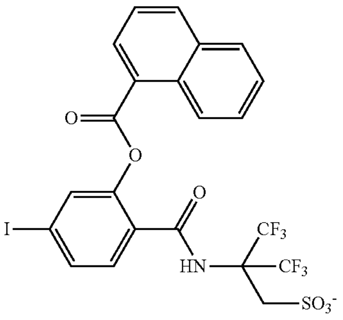
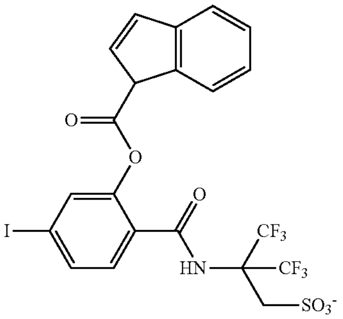

-continued
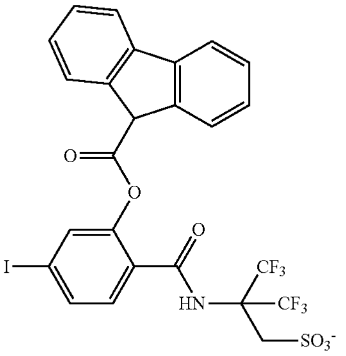
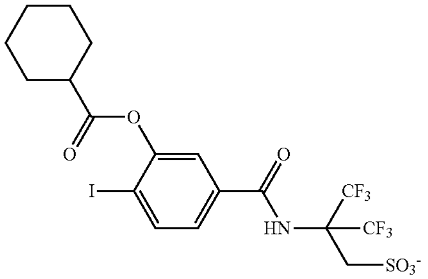
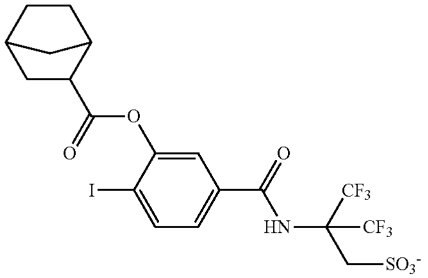
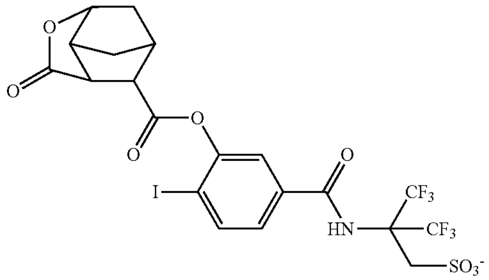
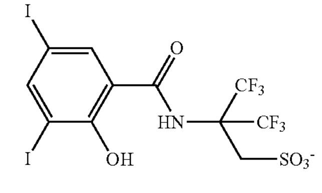
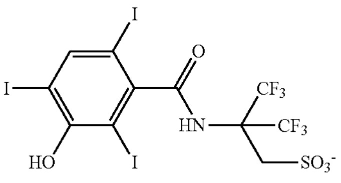
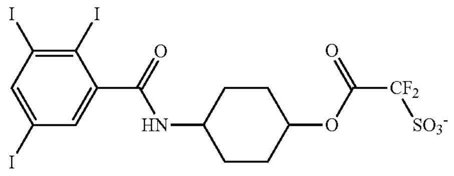
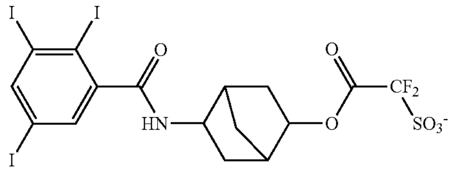
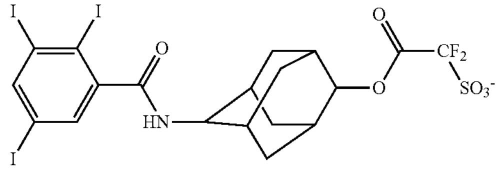
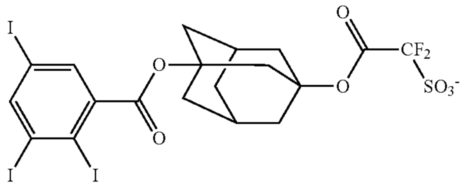
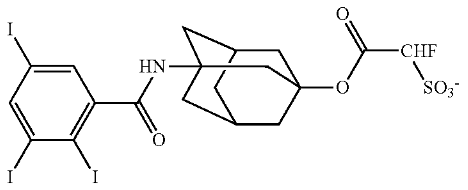
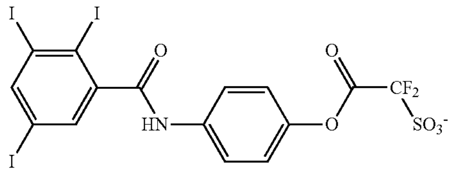
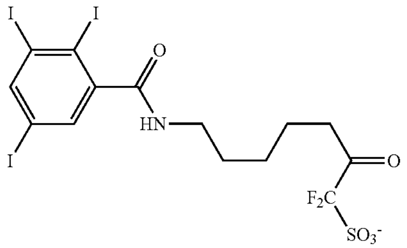
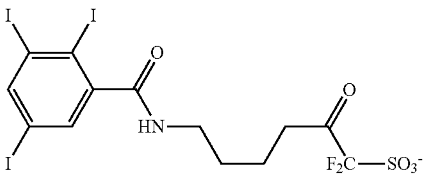
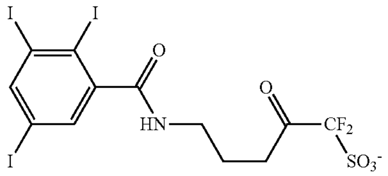

-continued
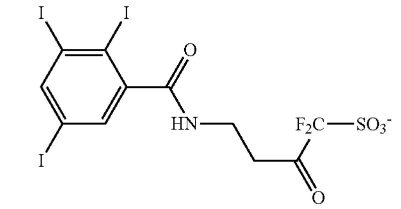
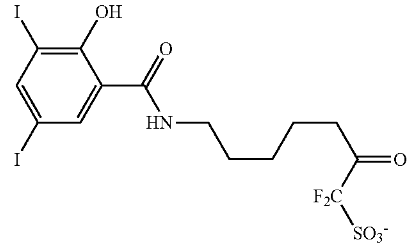
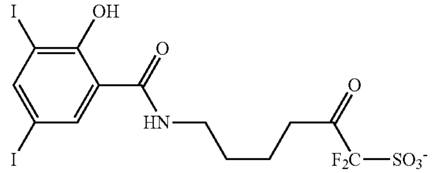
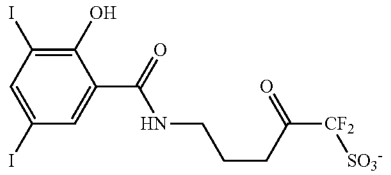
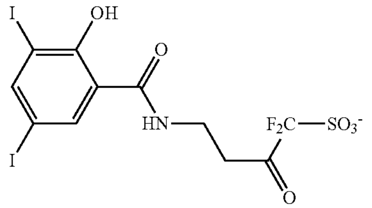
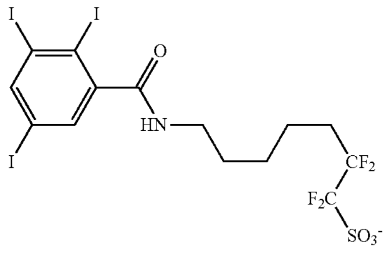
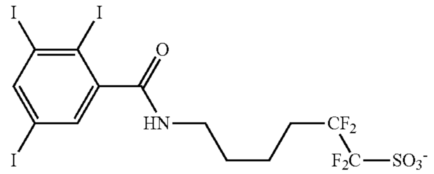
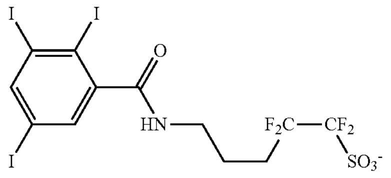
-continued
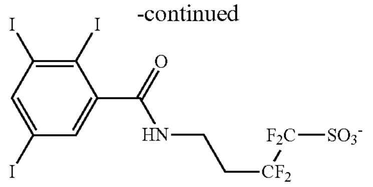
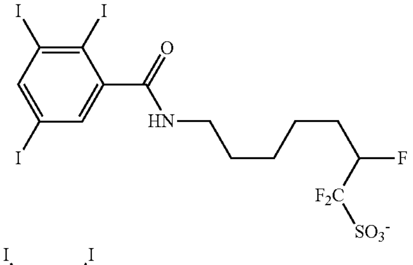
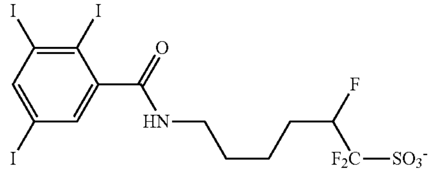
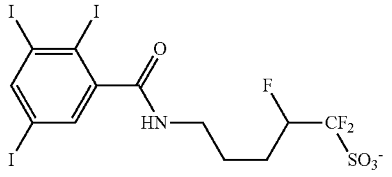
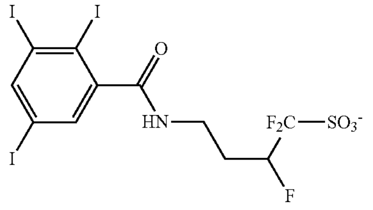
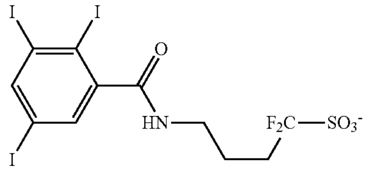
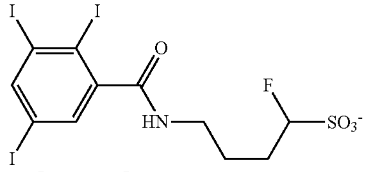
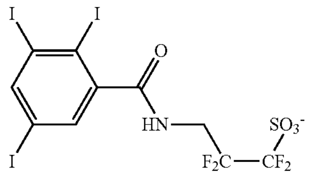
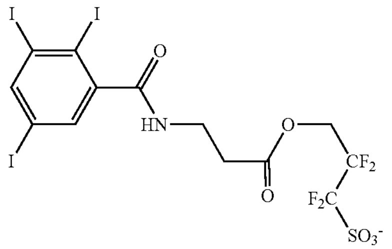

-continued
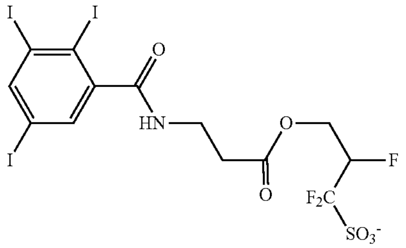
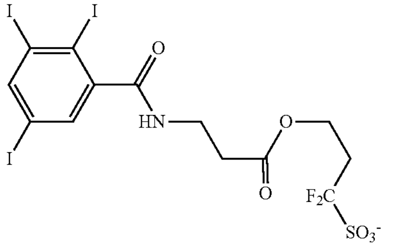
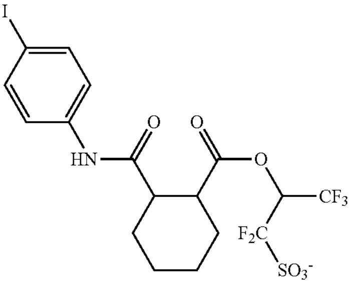
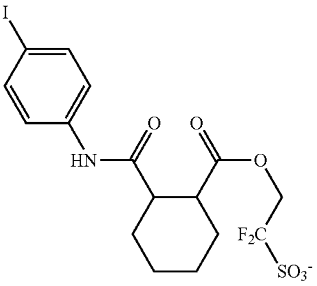
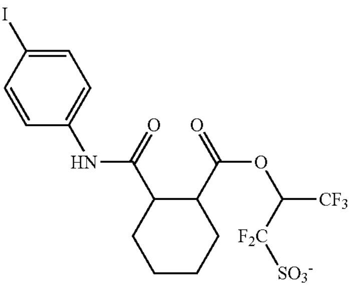
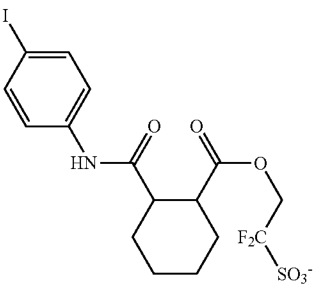
-continued
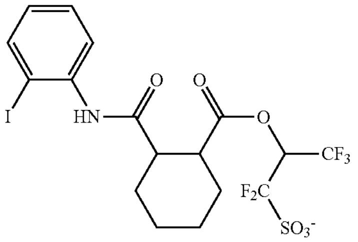
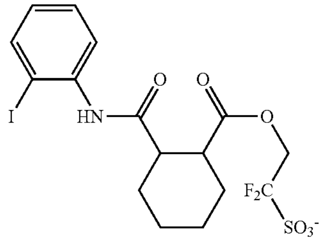
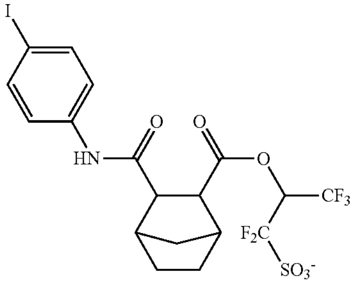
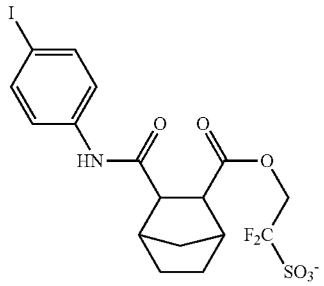
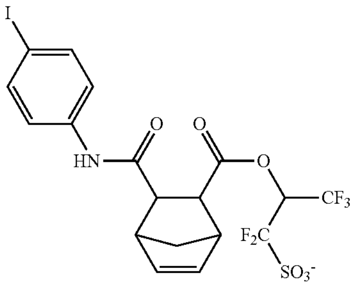
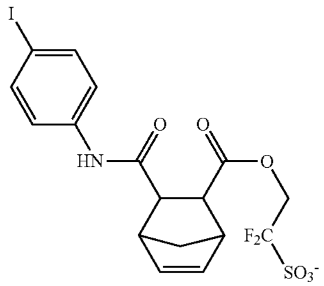

-continued
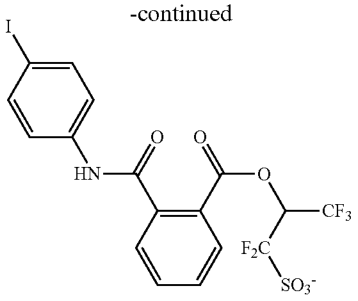
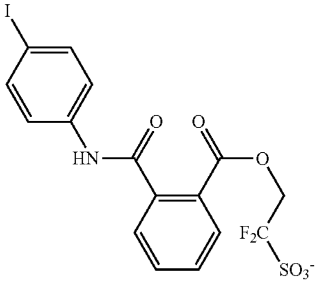
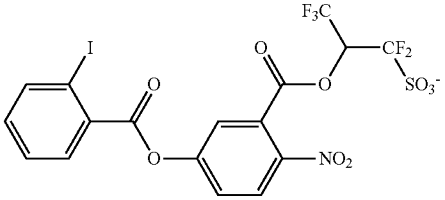
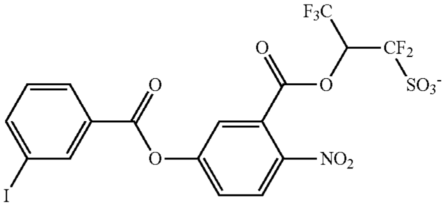
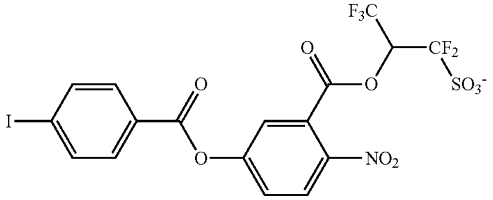
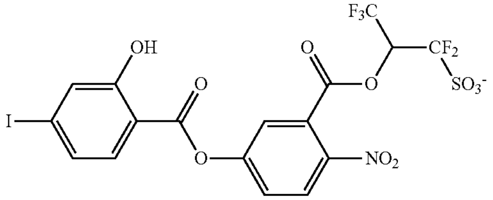
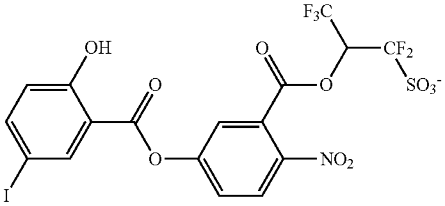
-continued
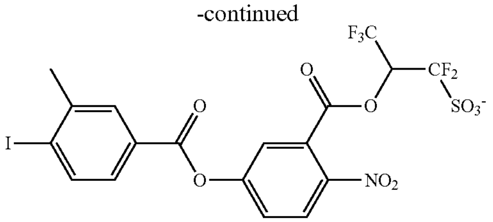
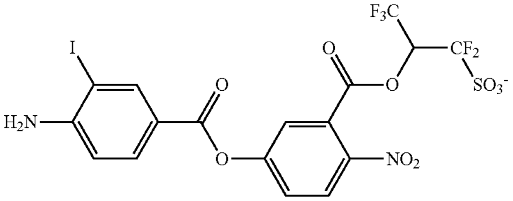
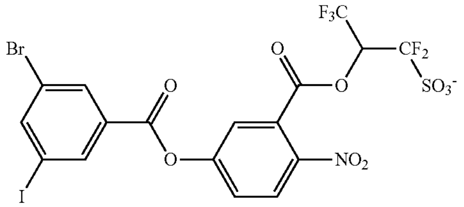
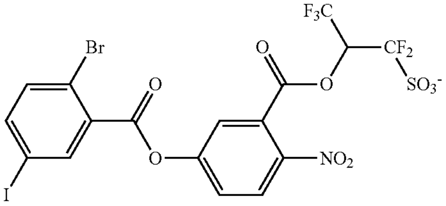
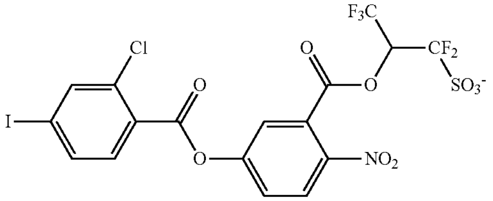
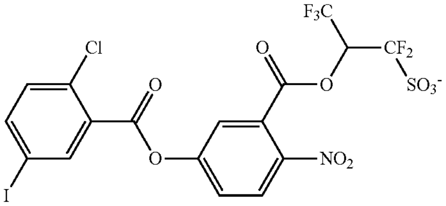
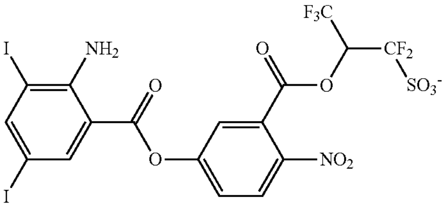
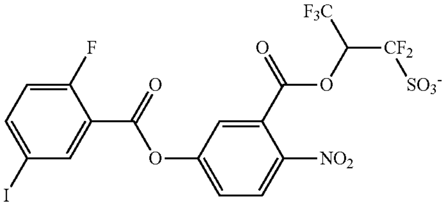

-continued
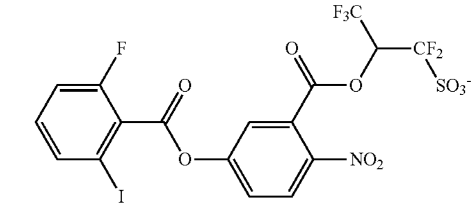
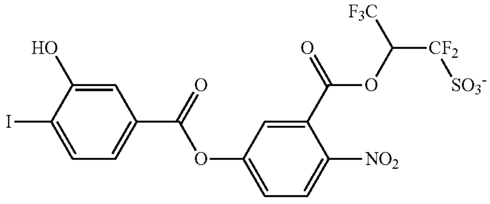
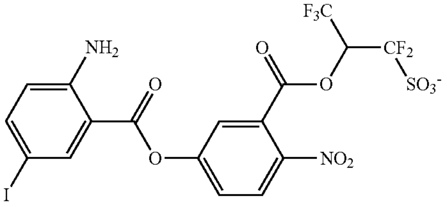
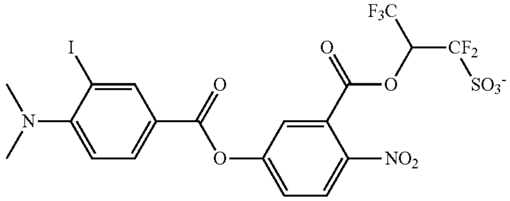
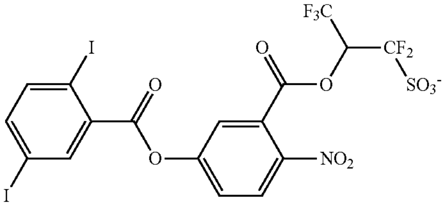
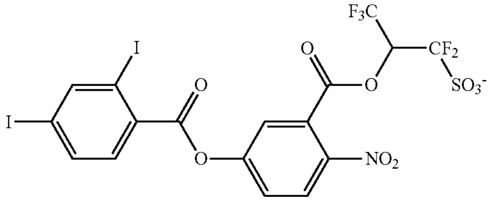
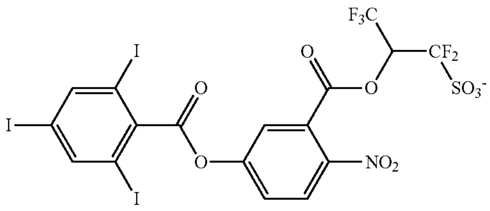
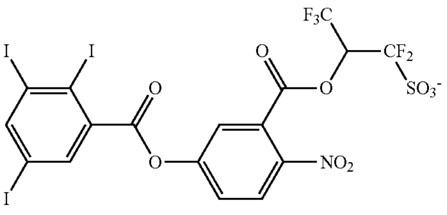
-continued
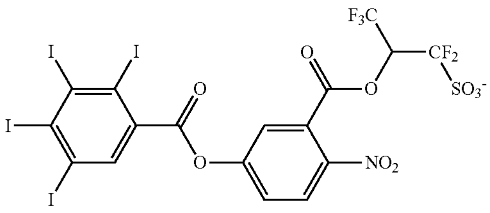
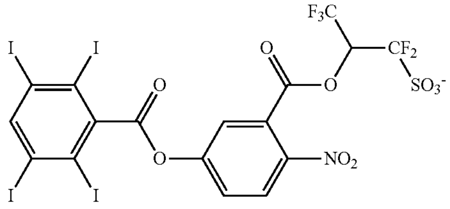
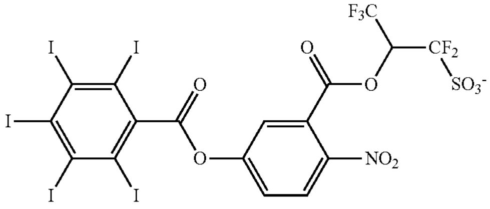
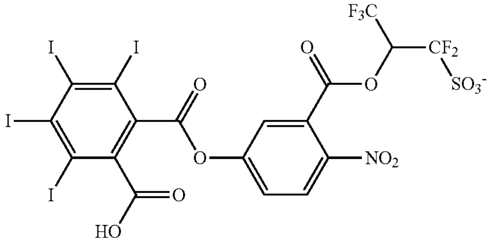
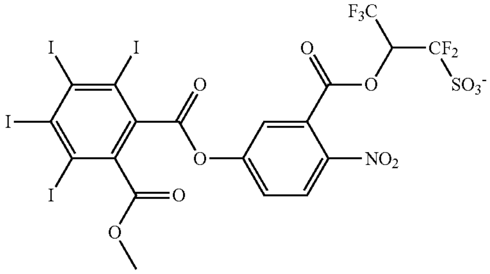
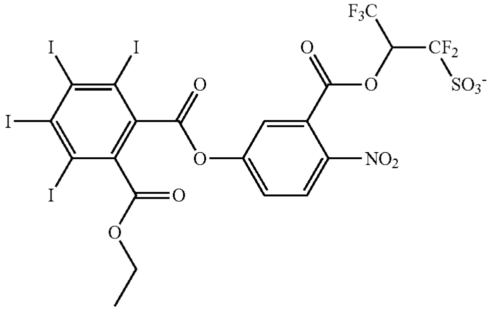

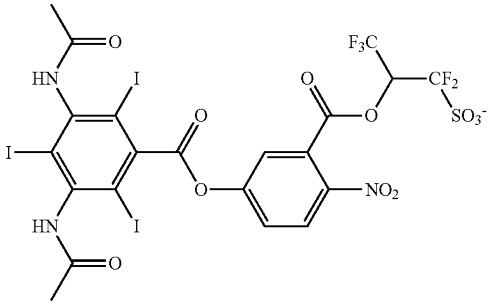
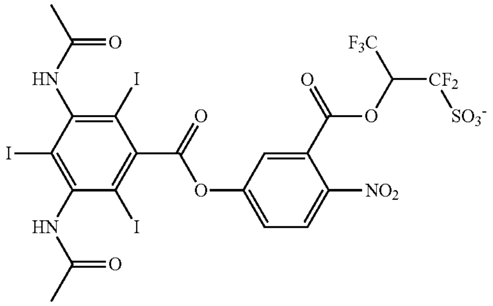
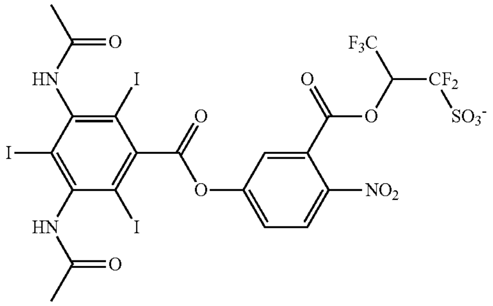
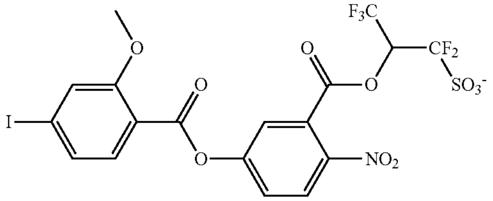
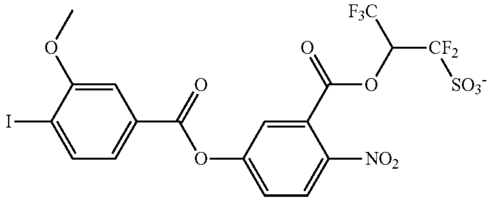
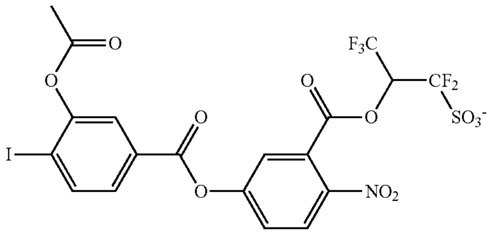
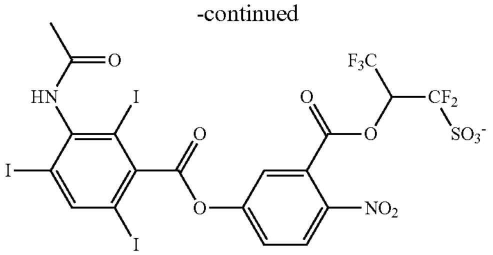
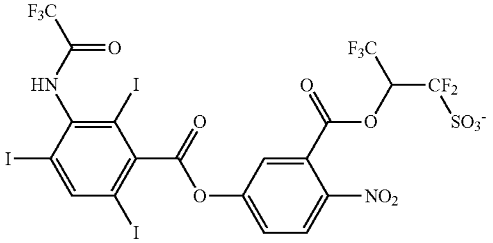
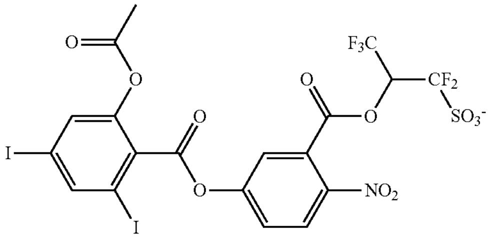
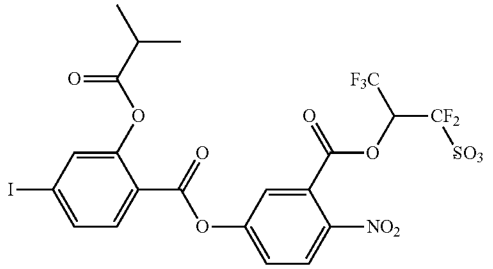
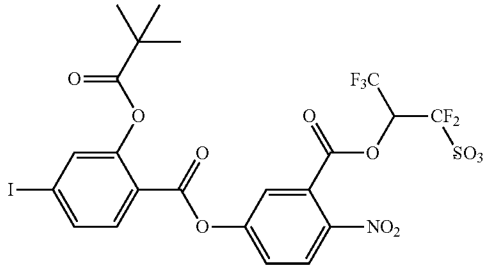
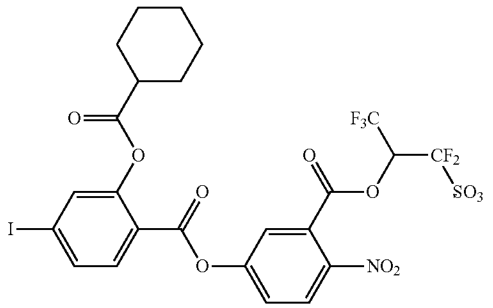

-continued
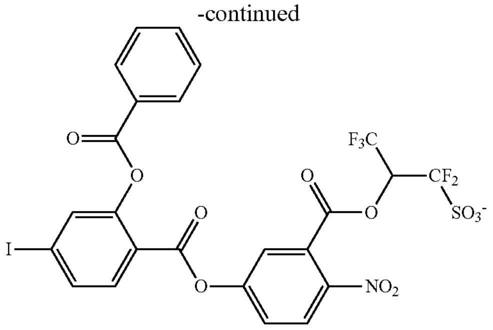
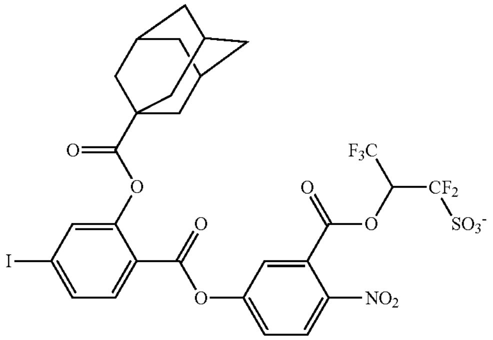
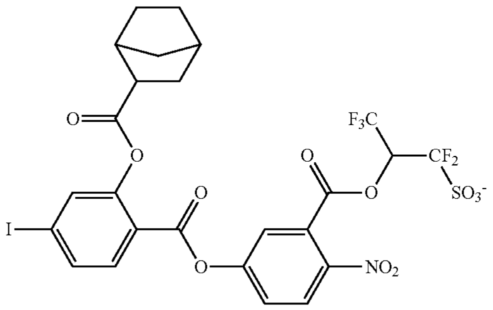
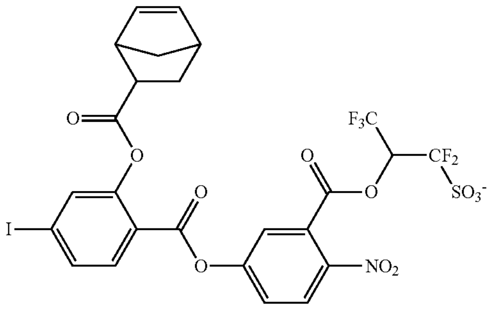
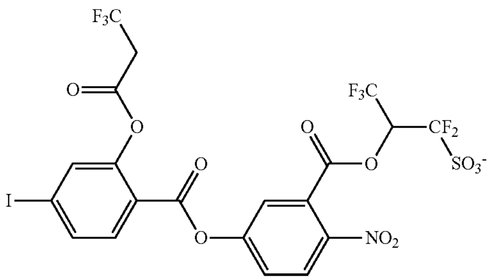
-continued
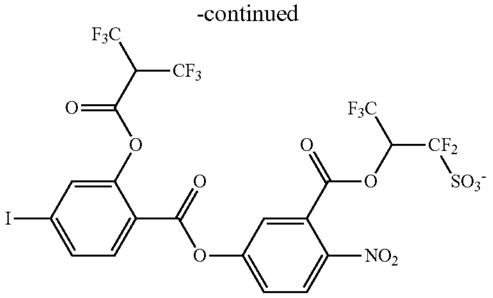
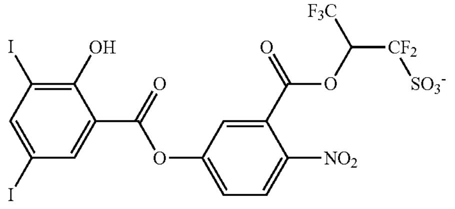
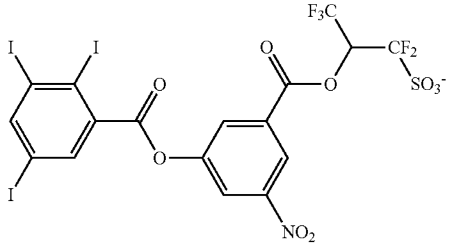
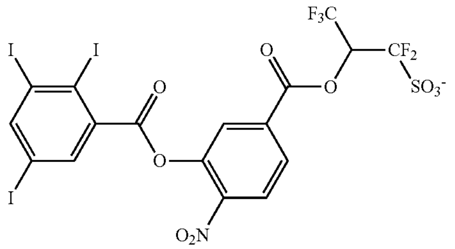
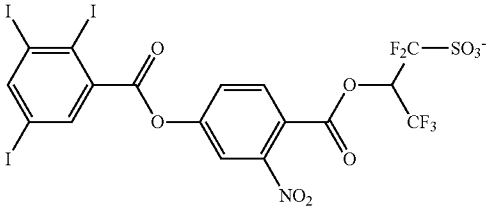
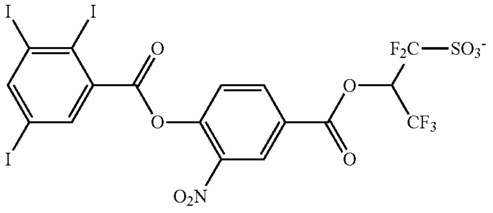
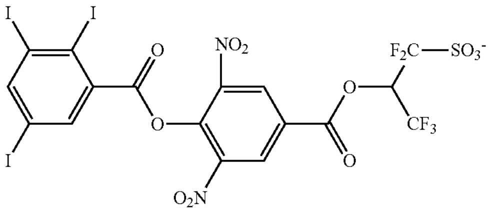

-continued
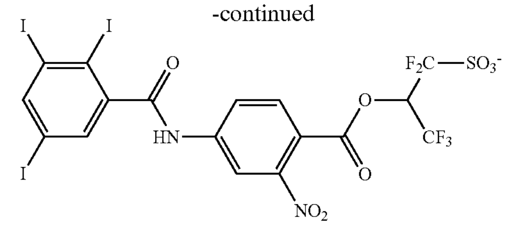
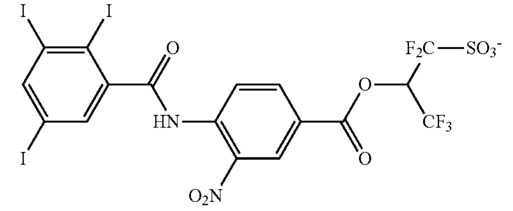
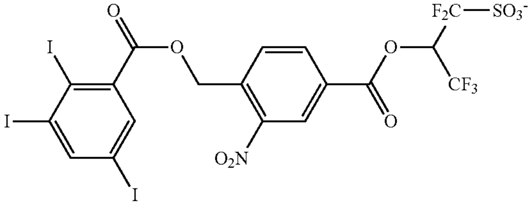
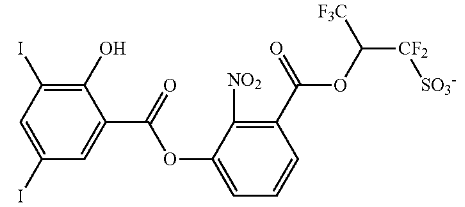
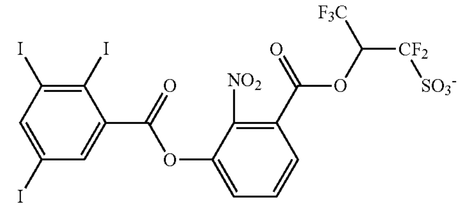
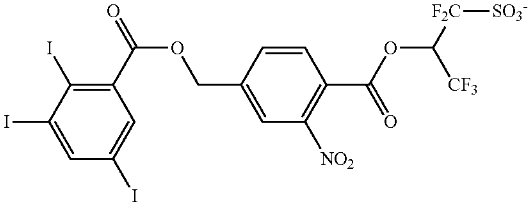
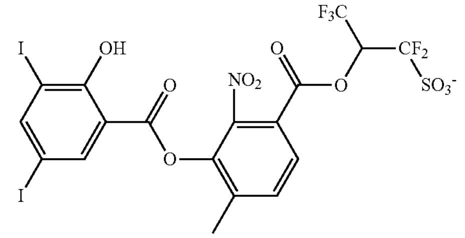
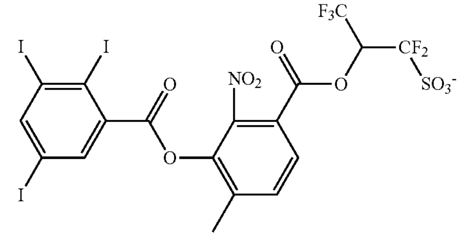
-continued
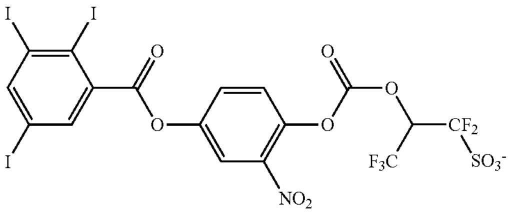
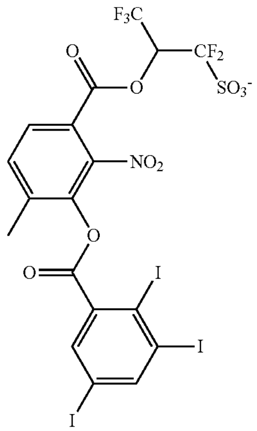
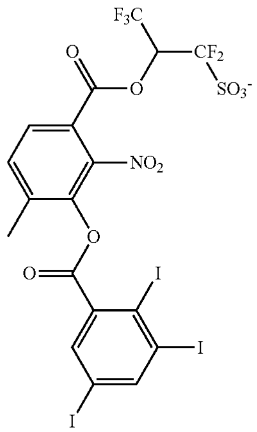
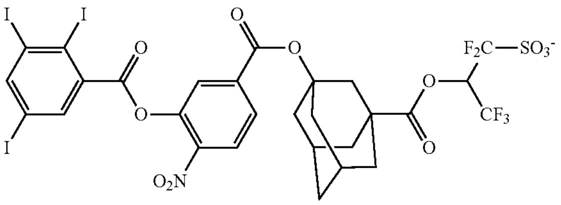
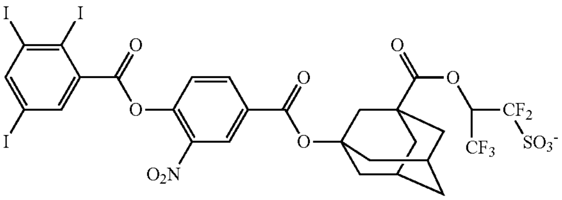
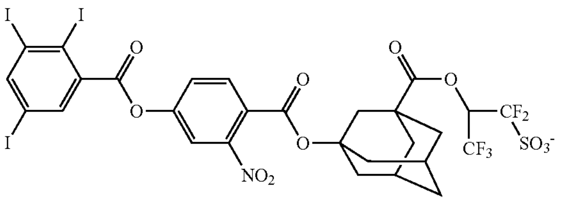

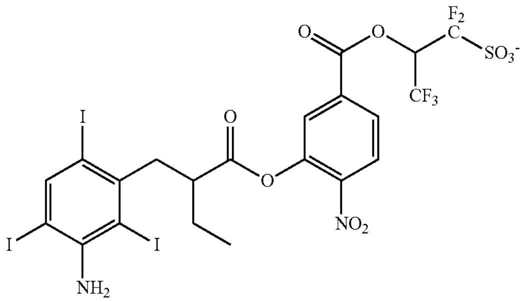
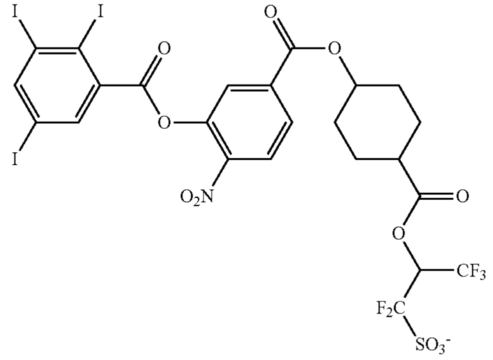
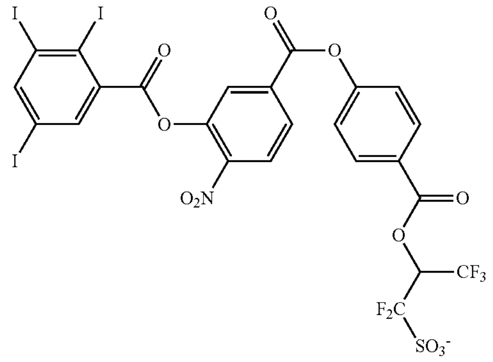
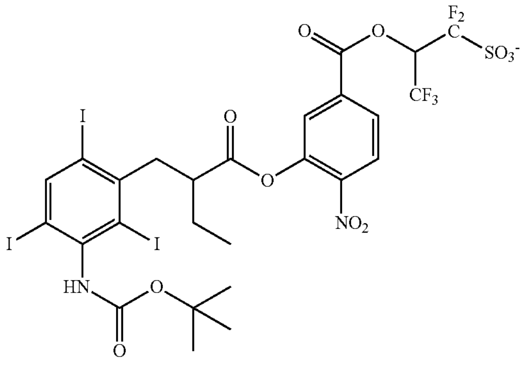
-continued
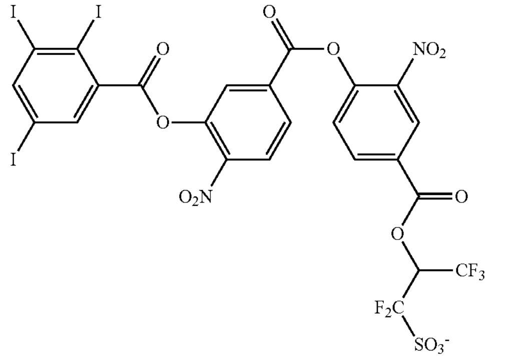
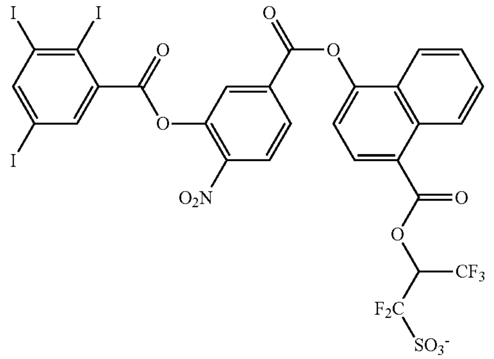
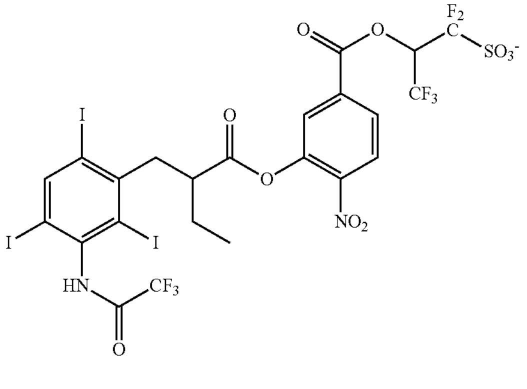
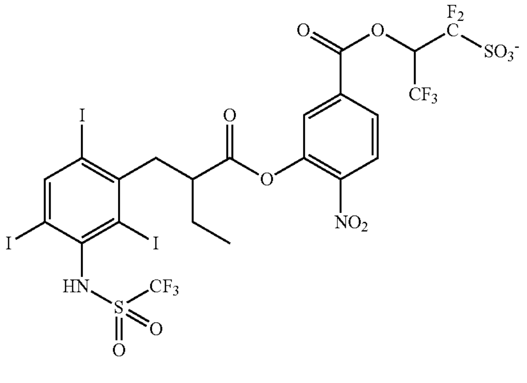

-continued
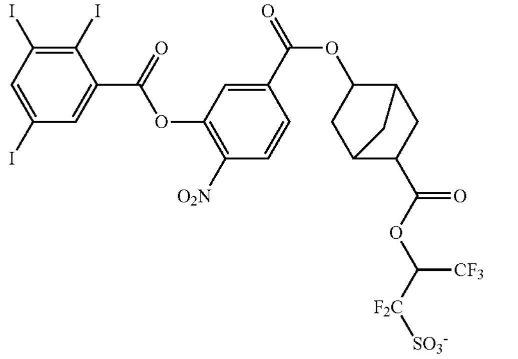
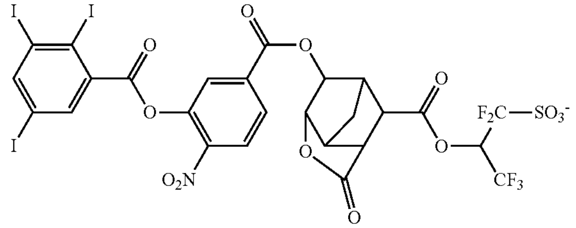
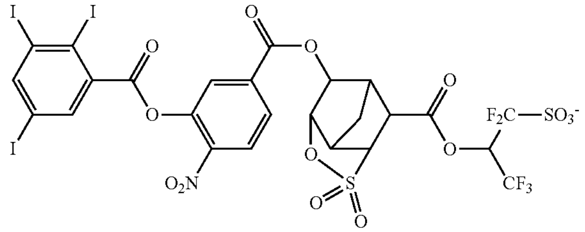
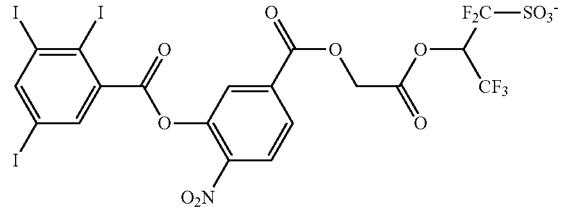
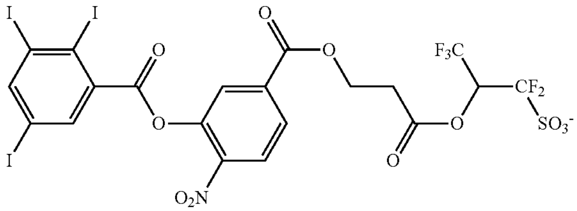
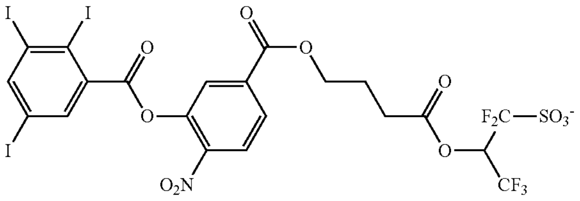
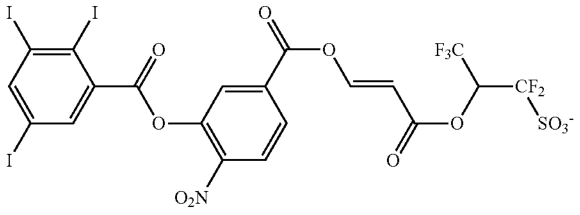
-continued
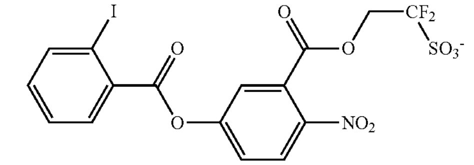
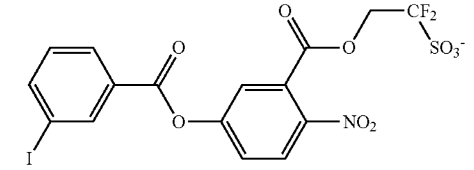
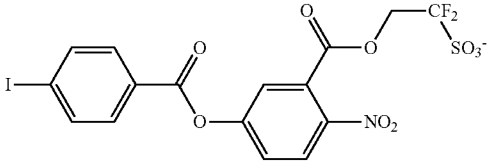
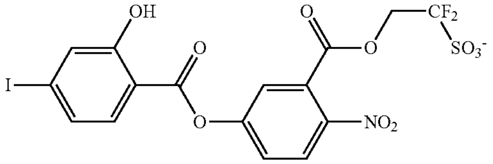
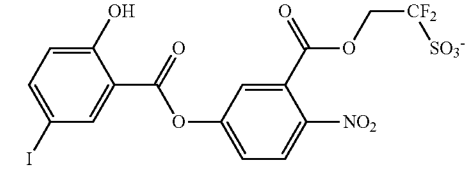
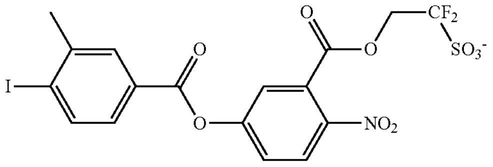
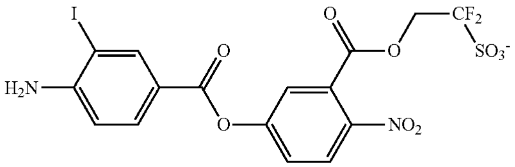
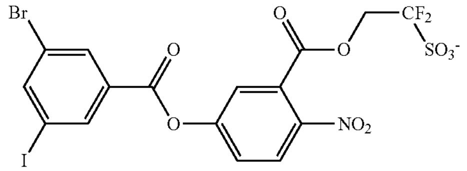
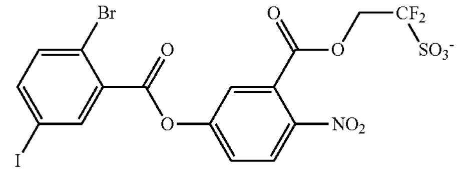
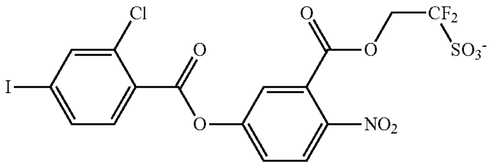

-continued
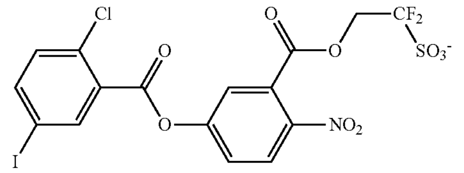
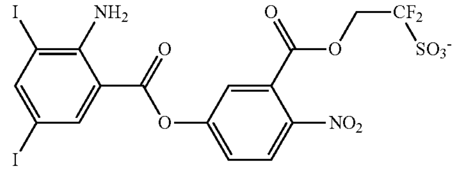
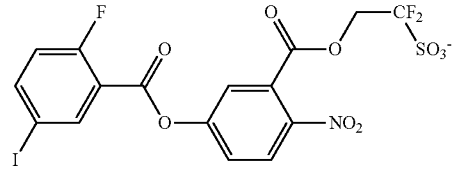
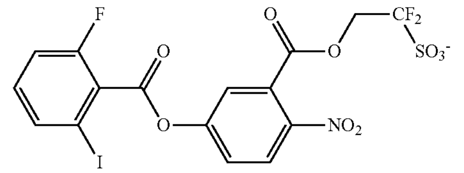
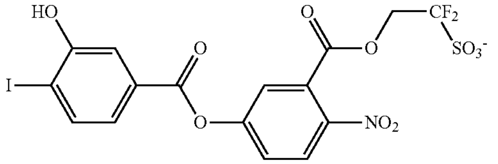
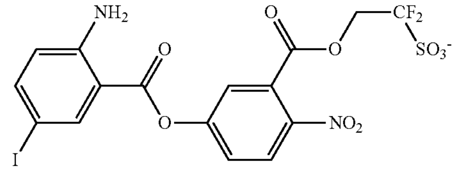
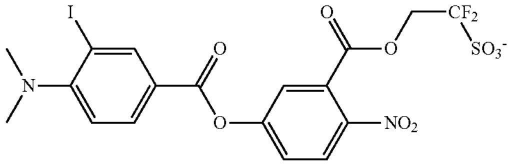
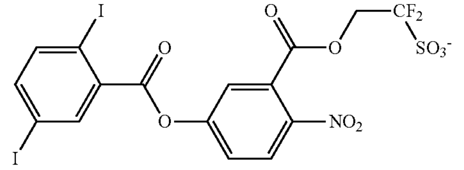
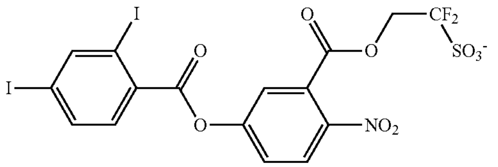
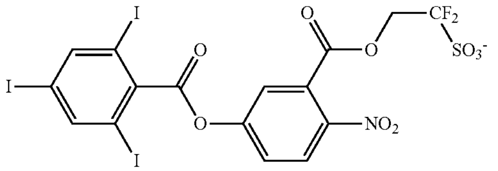
-continued
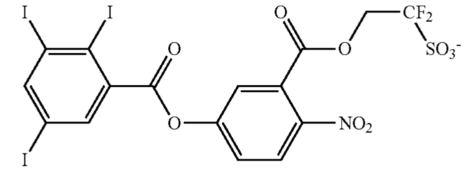
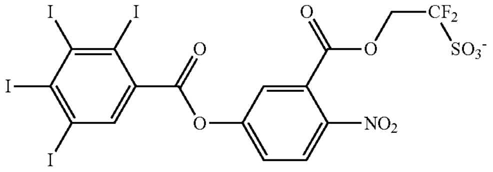
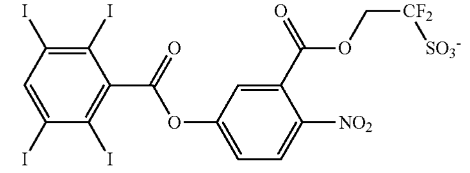
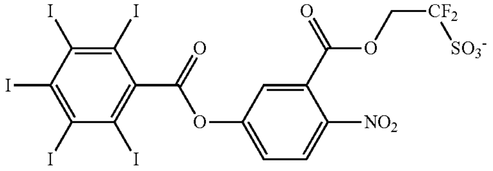
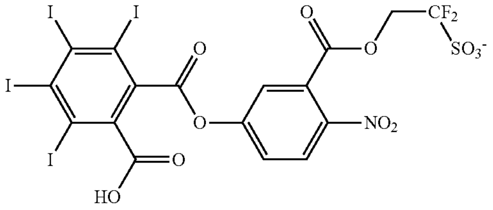
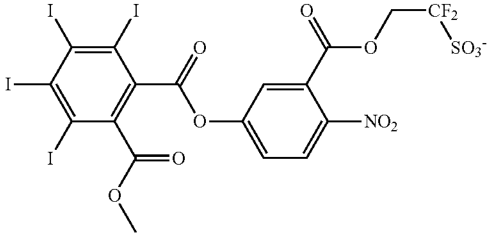
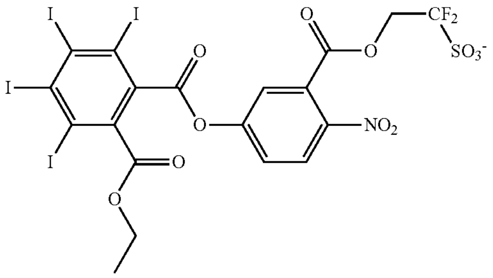
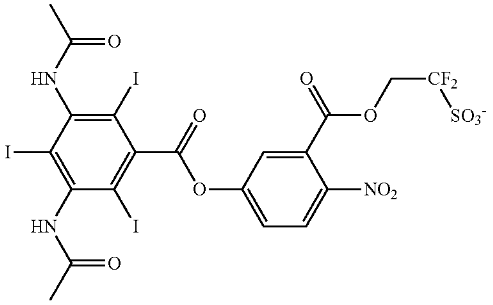

-continued
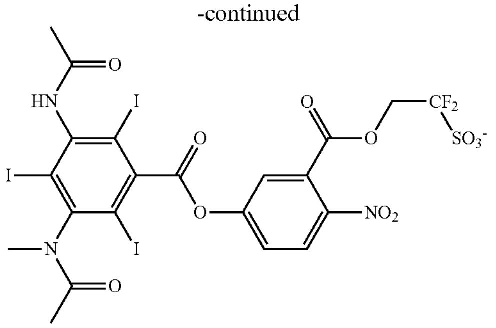
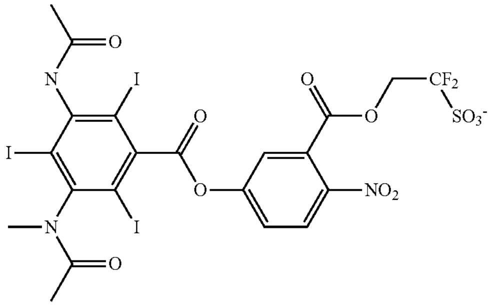
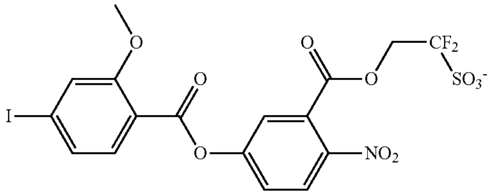
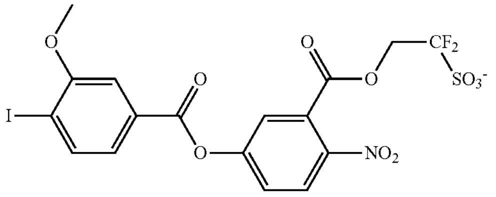
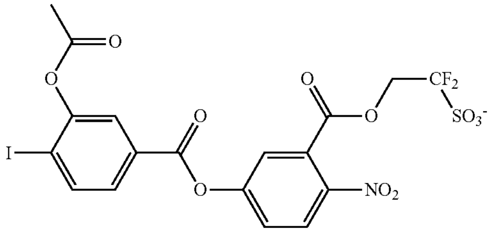
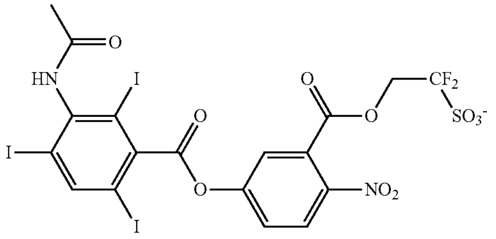
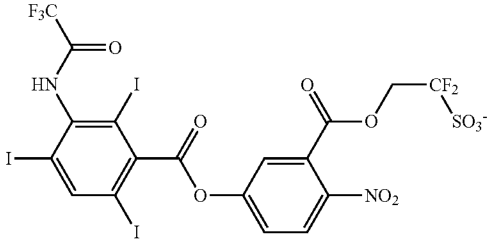
-continued
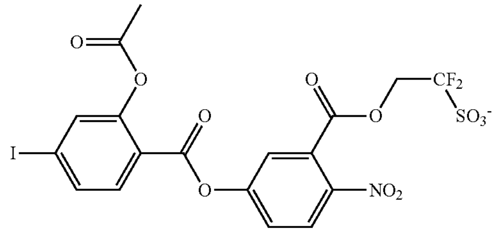
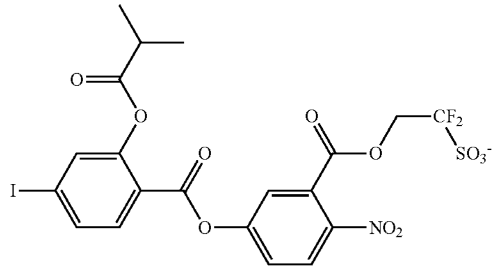
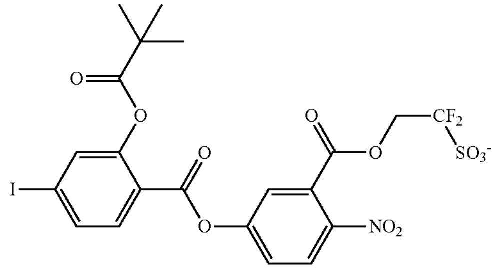
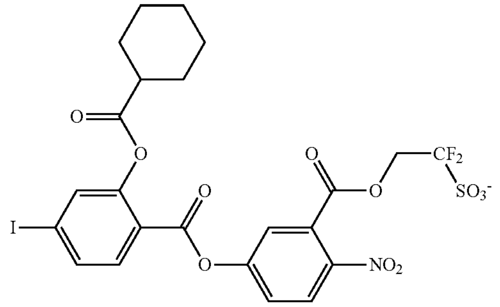
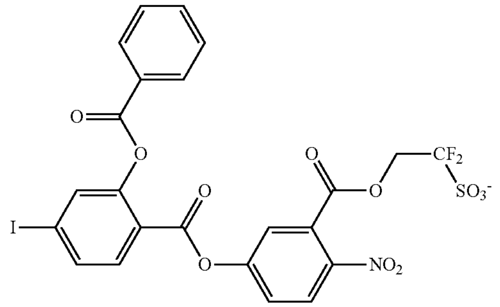
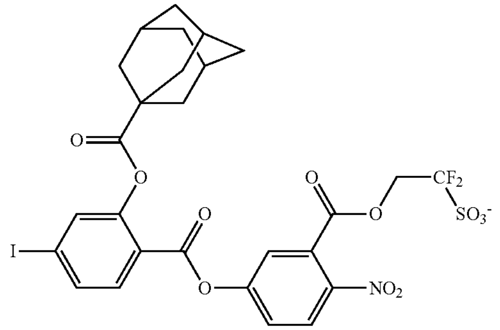

-continued
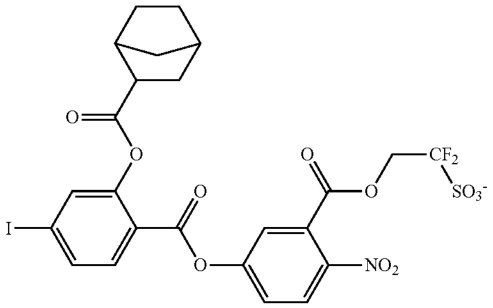
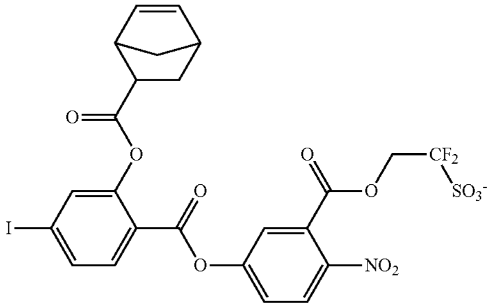
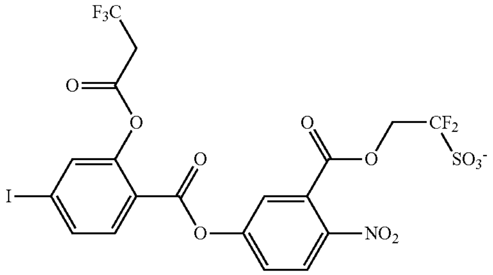
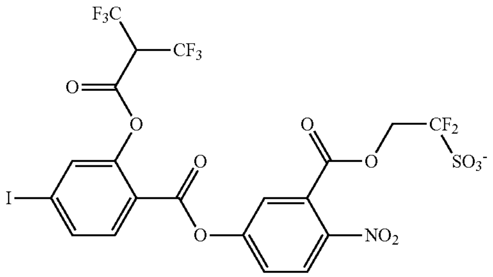
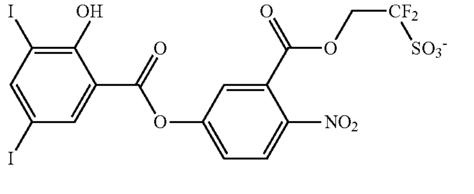
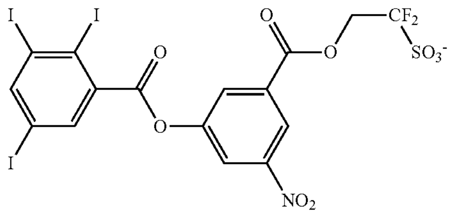
-continued
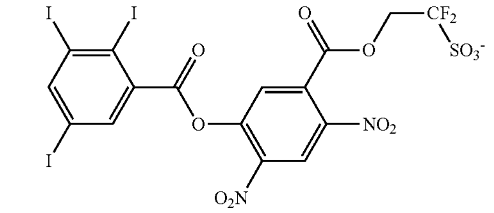
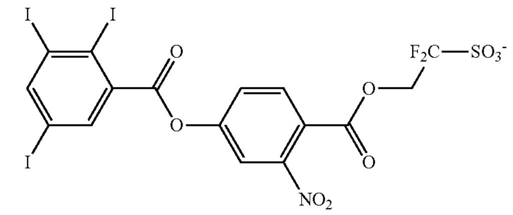
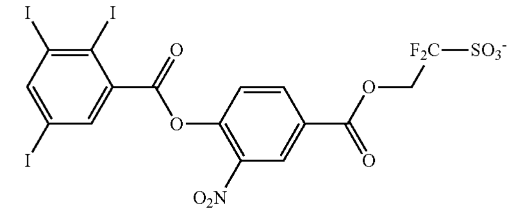
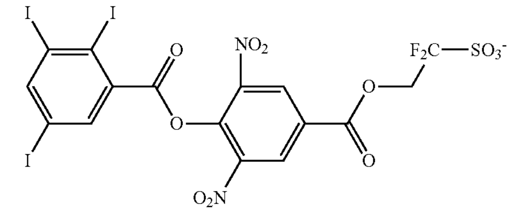
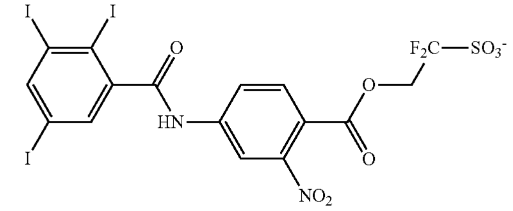
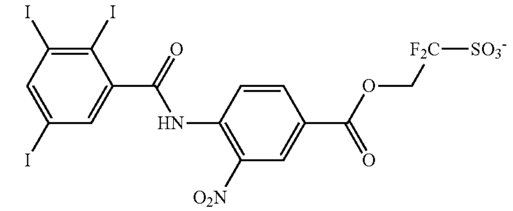
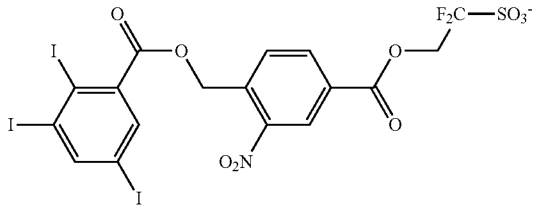
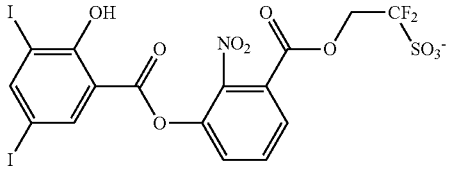

-continued
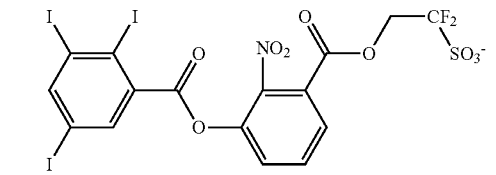
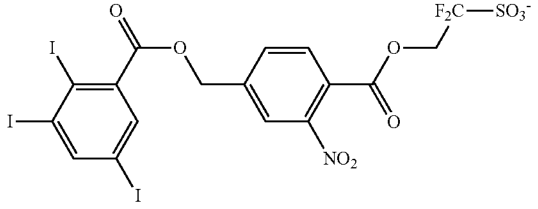
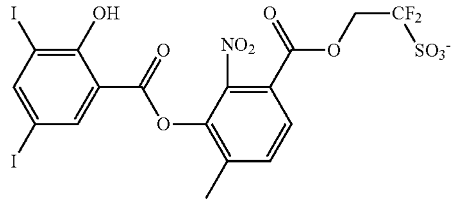
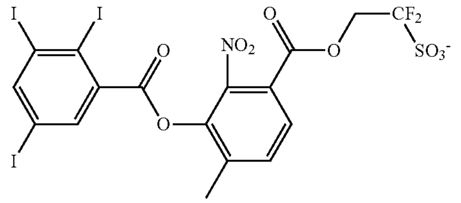
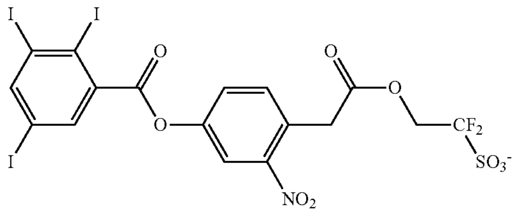
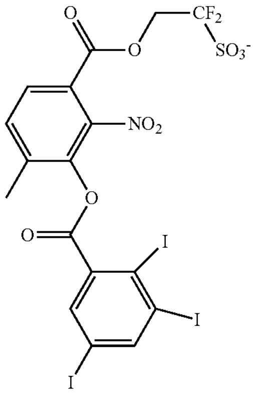
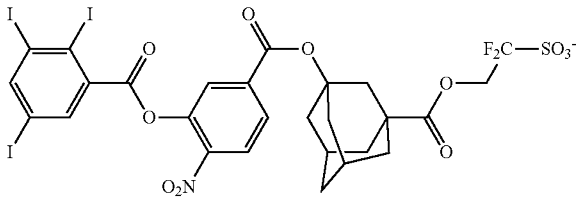
-continued
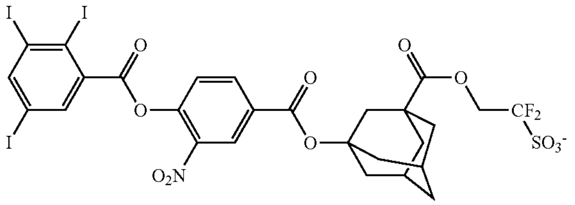
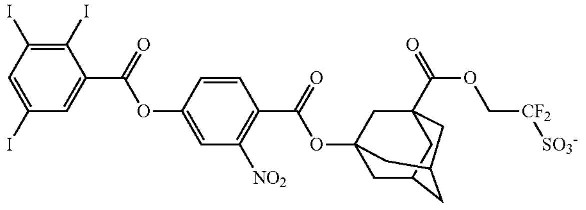
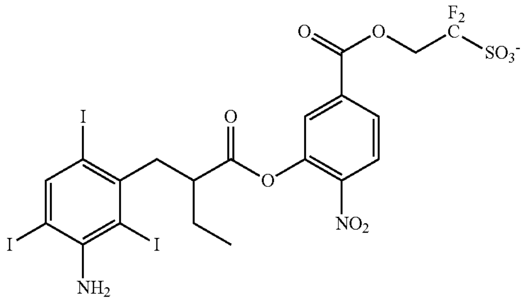
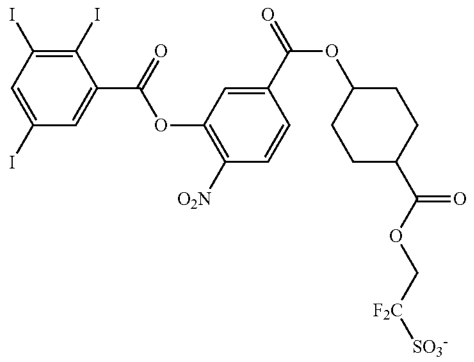
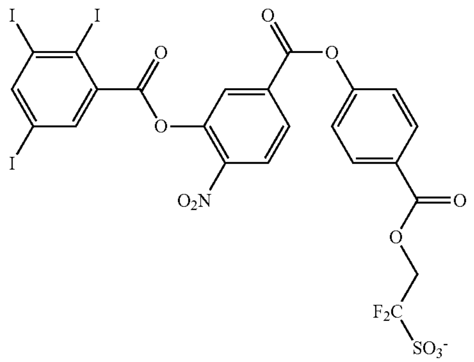

-continued
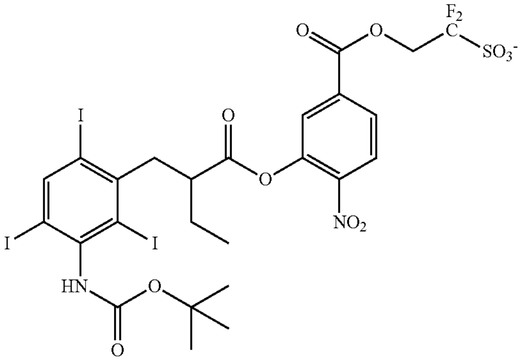
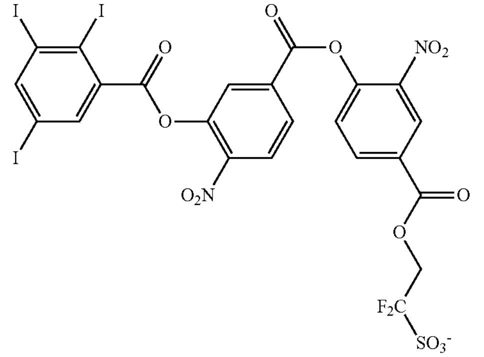
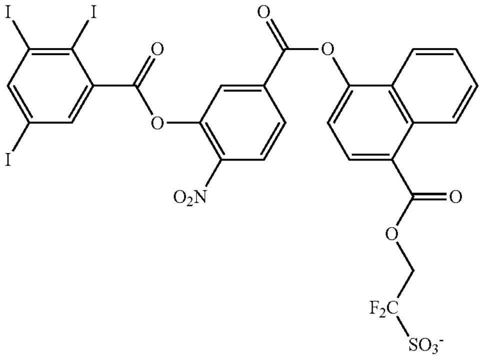
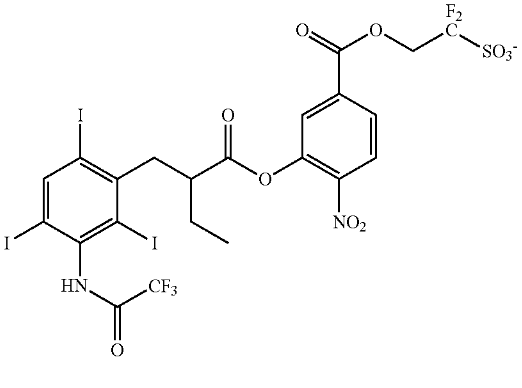
-continued
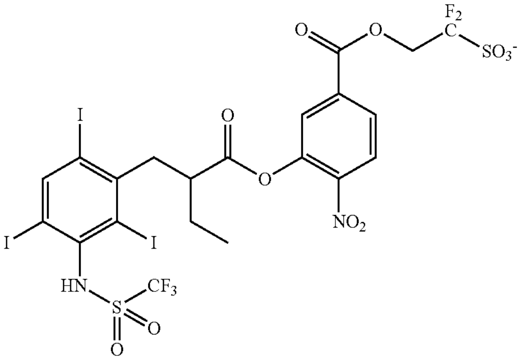
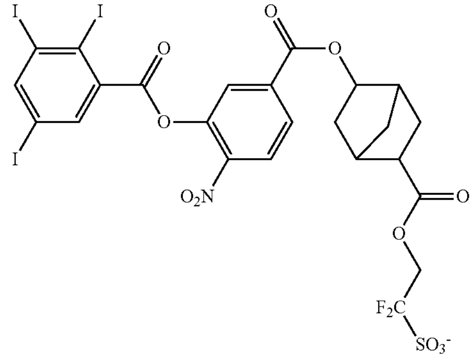
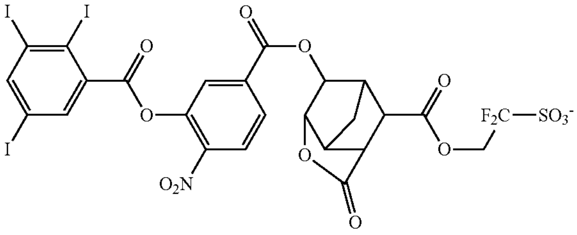
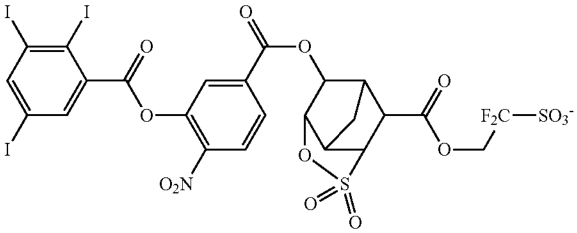
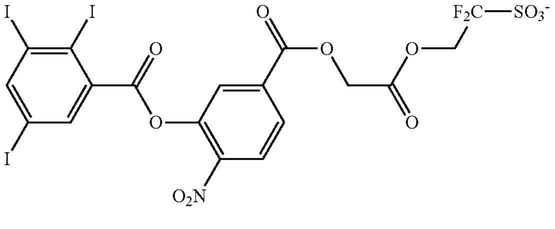
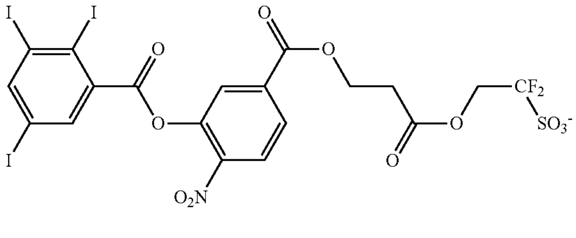

-continued
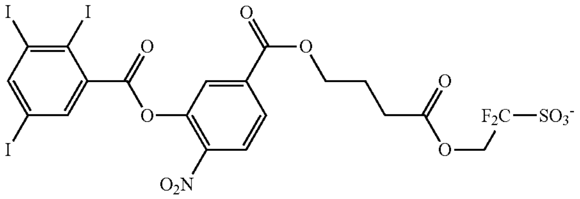
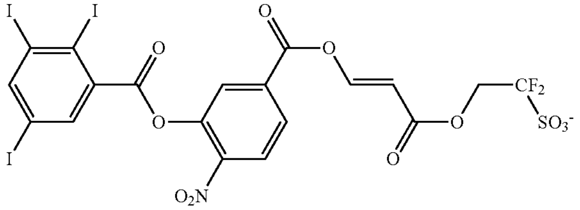
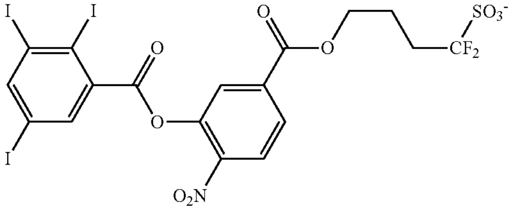
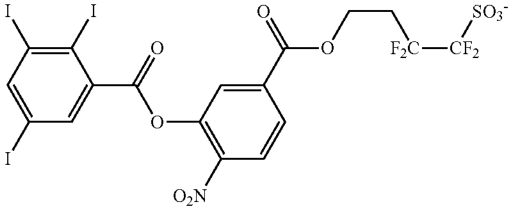
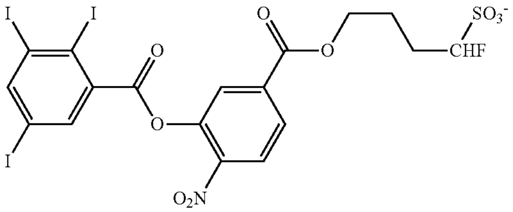
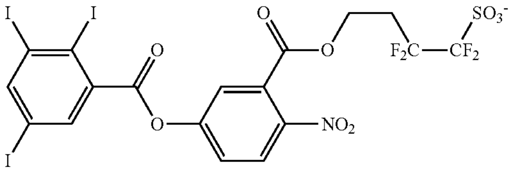
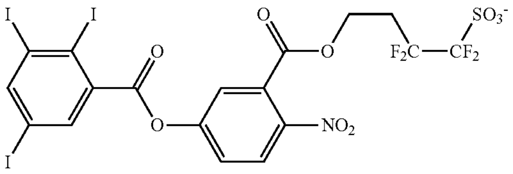
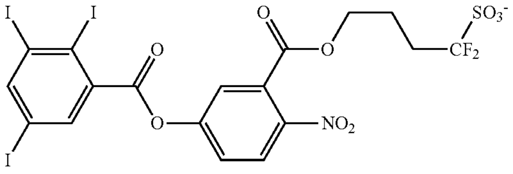
-continued
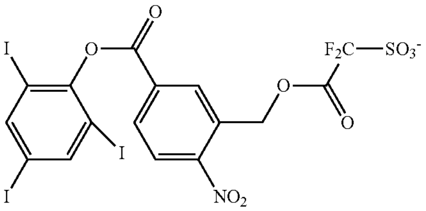
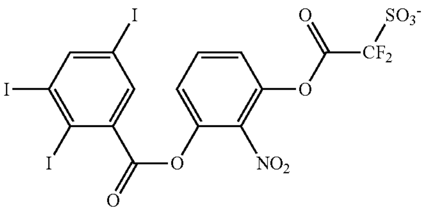
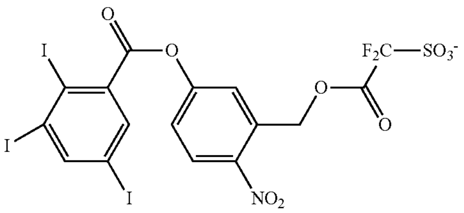
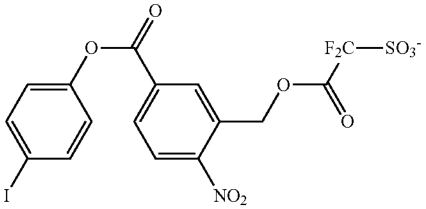
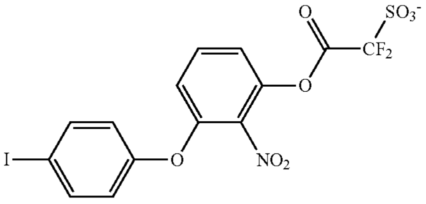
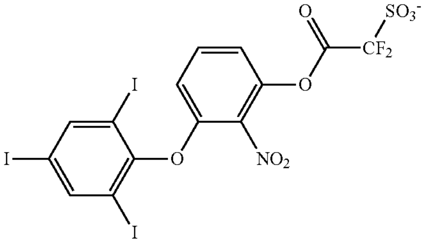
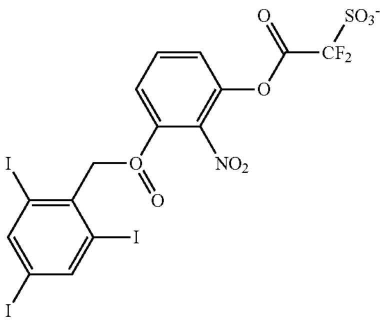

-continued

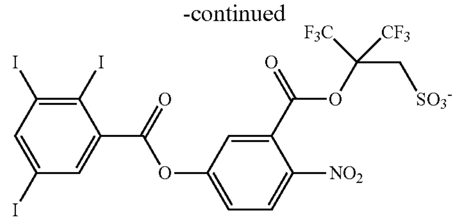

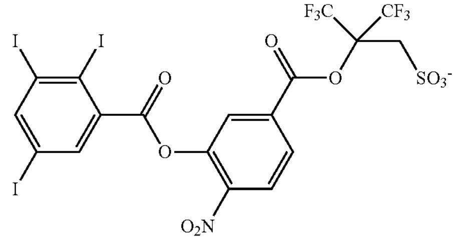

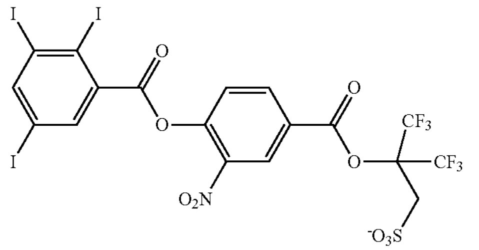

The inventive positive resist material contains the additive-type acid generator in an amount of preferably 0.1 to 50 parts by mass, more preferably 1 to 40 parts by mass, based on 100 parts by mass of the base polymer. Incorporating the additive-type acid generator enables the inventive positive resist material to function as a chemically amplified positive resist material. Meanwhile, incorporating the repeating unit-d into the base polymer can improve the function of the inventive positive resist material as a chemically amplified positive resist material.

[Organic Solvent]

The inventive positive resist material may be blended with an organic solvent. This organic solvent is not particularly limited, as long as it is capable of dissolving the above-described components and components to be described later. Examples of such an organic solvent include ones disclosed in paragraphs [0144] to [0145] of JP 2008-111103A: ketones, such as cyclohexanone, cyclopentanone, and methyl-2-n-pentyl ketone, and 2-heptanone; alcohols, such as 3-methoxybutanol, 3-methyl-3-methoxybutanol, 1-methoxy-2-propanol, 1-ethoxy-2-propanol, and diacetone alcohol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones, such as γ-butyrolactone; mixed solvents thereof; etc.

The inventive positive resist material contains the organic solvent in an amount of preferably 100 to 10,000 parts by mass, more preferably 200 to 8,000 parts by mass, based on 100 parts by mass of the base polymer.

[Quencher]

The inventive positive resist material may be blended with a quencher. Examples of the quencher include conventional basic compounds. Examples of the conventional basic compounds include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, etc. Particularly preferable are primary, secondary, and tertiary aliphatic amines disclosed in paragraphs [0146] to [0164] of JP 2008-111103A; especially, aliphatic amines having a hydroxy group, an ether bond, an ester bond, a lactone ring, a cyano group, or a sulfonic acid ester bond; compounds having a carbamate group disclosed in JP 3790649B; etc. Adding such a basic compound can, for example, further suppress the acid diffusion rate in the resist film and correct the shape.

Other examples of the quencher include onium salts, such as sulfonium salts, iodonium salts, and ammonium salts of carboxylic acids and sulfonic acids which are not fluorinated at a position as disclosed in JP 2008-158339A. While α-fluorinated sulfonic acid, imide acid, or methide acid is necessary to deprotect the acid labile group of carboxylic acid ester, a carboxylic acid or sulfonic acid not fluorinated at a position is released by salt exchange with the onium salt not fluorinated at a position. Such carboxylic acid and sulfonic acid not fluorinated at a position hardly induce deprotection reaction, and thus function as quenchers.

Examples of such quenchers include a compound shown by the following formula (B) (onium salt of sulfonic acid not fluorinated at a position), a compound shown by the following formula (C) (onium salt of carboxylic acid), and an onium salt of alkoxide shown by the following formula (D).

$$R^{501}—SO_3^- \quad Mq^+ \tag{B}$$

$$R^{502}—CO_2^- \quad Mq^+ \tag{C}$$

$$R^{501}—O^- \quad Mq^+ \tag{D}$$

In the formula (B), $R^{501}$ represents a hydrogen atom or a hydrocarbyl group having 1 to 40 carbon atoms and optionally containing a heteroatom, but excludes groups in which a hydrogen atom bonded to the carbon atom at a position of the sulfo group is substituted with a fluorine atom or a fluoroalkyl group.

The hydrocarbyl group may be saturated or unsaturated, and may be linear, branched, or cyclic. Specific examples thereof include: alkyl groups, such as a methyl group, an ethyl group, a propyl group, an isopropyl group, an n-butyl group, a sec-butyl group, a tert-butyl group, a tert-pentyl group, an n-pentyl group, an n-hexyl group, an n-octyl group, a 2-ethylhexyl group, an n-nonyl group, and an n-decyl group; cyclic saturated hydrocarbyl groups, such as a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo [5.2.1.$0^{2,6}$]decanyl group, an adamantyl group, and an adamantylmethyl group; alkenyl groups, such as a vinyl group, an allyl group, a propenyl group, a butenyl group, and a hexenyl group; cyclic unsaturated aliphatic hydrocarbyl groups, such as a cyclohexenyl group; aryl groups, such as a phenyl group, a naphthyl group, alkylphenyl groups (such as a 2-methylphenyl group, a 3-methylphenyl group, a 4-methylphenyl group, a 4-ethylphenyl group, a 4-tert-butylphenyl group, a 4-n-butylphenyl group), dialkylphenyl groups (such as a 2,4-dimethylphenyl group, a 2,4,6-triisopropylphenyl group), alkylnaphthyl groups (such as a methylnaphthyl group, an ethylnaphthyl group), and dialkylnaphthyl groups (such as a dimethylnaphthyl group, a diethylnaphthyl group); heteroaryl groups, such as a thienyl group; aralkyl groups, such as a benzyl group, a 1-phenylethyl group, and a 2-phenylethyl group; etc.

Moreover, these groups may have some of hydrogen atoms substituted with a group containing a heteroatom, such as an oxygen atom, a sulfur atom, a nitrogen atom, or a halogen atom, while these groups may have some of carbon atoms substituted with a group containing a heteroatom, such as an oxygen atom, a sulfur atom, or a nitrogen atom. Thus, the resulting hydrocarbyl group may contain a hydroxy group, a cyano group, a carbonyl group, an ether bond, an ester bond, a sulfonic acid ester group, a carbonate bond, a lactone ring, a sultone ring, carboxylic anhydride, a haloalkyl group, etc. Examples of the hydrocarbyl group containing a heteroatom include: alkoxyphenyl groups, such as a 4-hydroxyphenyl group, a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkoxynaphthyl groups, such as a methoxynaphthyl group, an ethoxynaphthyl group, an n-propoxynaphthyl group, and an n-butoxynaphthyl group; dialkoxynaphthyl groups, such as a dimethoxynaphthyl group and a diethoxynaphthyl group; aryloxoalkyl groups, such as 2-aryl-2-oxoethyl groups including a 2-phenyl-2-oxoethyl group, a 2-(1-naphthyl)-2-oxoethyl group, and a 2-(2-naphthyl)-2-oxoethyl group; etc.

In the formula (C), $R^{502}$ represents a hydrocarbyl group having 1 to 40 carbon atoms and optionally containing a heteroatom. Examples of the hydrocarbyl group represented by $R^{502}$ include those exemplified as the hydrocarbyl group represented by $R^{501}$. Other specific examples thereof include fluorine-containing alkyl groups, such as a trifluoromethyl group, a trifluoroethyl group, a 2,2,2-trifluoro-1-methyl-1-hydroxyethyl group, and a 2,2,2-trifluoro-1-(trifluoromethyl)-1-hydroxyethyl group; fluorine-containing aryl groups, such as pentafluorophenyl group and a 4-trifluoromethylphenyl group; etc.

In the formula (D), $R^{503}$ represents a linear, branched, or cyclic alkyl group or an aryl group each having 1 to 8 carbon atoms and at least three or more fluorine atoms and optionally having a nitro group.

In the formulae (B), (C), and (D), $Mq^+$ represents an onium cation. The onium cation is preferably a sulfonium cation, an iodonium cation, or an ammonium cation, more preferably a sulfonium cation or an iodonium cation. Examples of the sulfonium cation and the iodonium cation include those exemplified as the cation of the sulfonium salt shown by the formula (1-1) and the cation of the iodonium salt shown by the formula (1-2).

Other examples of the quencher include a polymeric quencher disclosed in JP 2008-239918A. This quencher is oriented on the resist film surface after coating, and enhances the rectangularity of the resist film after patterning. The polymeric quencher also has effects of preventing rounding of pattern top and film thickness loss of pattern when a top coat for immersion exposure is applied.

The inventive positive resist material contains the quencher in an amount of preferably 0 to 5 parts by mass, more preferably 0 to 4 parts by mass, based on 100 parts by mass of the base polymer.

[Other Components]

In addition to the above-described components, a surfactant, a dissolution inhibitor, and so forth can be blended in appropriate combination depending on the purpose to formulate a positive resist material. Thereby, in an exposed area of the base polymer, the dissolution rate to a developer is accelerated by the catalytic reaction, so that the positive resist material successfully has quite high sensitivity. In this case, the resist film has high dissolution contrast and resolution, exposure latitude, excellent process adaptability, and favorable pattern profile after exposure. Particularly, the positive resist material is capable of suppressing acid diffusion, resulting in a small difference in profile between isolated and nested. Because of these advantages, the inventive positive resist material is highly practical and very effective resist material for VLSI.

Examples of the surfactant include ones disclosed in paragraphs [0165] to [0166] of JP 2008-111103A. Adding a surfactant can further enhance or control the coatability of the resist material. The inventive positive resist material contains the surfactant in an amount of preferably 0.0001 to 10 parts by mass, based on 100 parts by mass of the base polymer. One kind of the surfactant can be used alone, or two or more kinds thereof can be used in combination.

Blending a dissolution inhibitor can further increase the difference in dissolution rate between exposed and unexposed areas, and further enhance the resolution. Examples of the dissolution inhibitor include a compound which contains two or more phenolic hydroxy groups per molecule, and in which 0 to 100 mol % of all the hydrogen atoms of the phenolic hydroxy groups are substituted with acid labile groups; and a compound which contains a carboxyl group in a molecule, and in which 50 to 100 mol % of all the hydrogen atoms of such carboxyl groups are substituted with acid labile groups on average. The compounds each have a molecular weight of preferably 100 to 1,000, more preferably 150 to 800. Specific examples include compounds obtained by substituting acid labile groups for hydrogen atoms of a hydroxy groups or carboxyl groups of bisphenol A, trisphenol, phenolphthalein, cresol novolak, naphthalenecarboxylic acid, adamantanecarboxylic acid, or cholic acid; etc. Examples of such compounds are disclosed in paragraphs [0155] to [0178] of JP 2008-122932A.

The dissolution inhibitor is contained in an amount of preferably 0 to 50 parts by mass, more preferably 5 to 40 parts by mass, based on 100 parts by mass of the base polymer. One kind of the dissolution inhibitor can be used alone, or two or more kinds thereof can be used in combination.

The inventive positive resist material may be blended with a water-repellency enhancer for enhancing the water repellency on the resist surface after spin coating. The water-repellency enhancer can be employed in immersion lithography with no top coat. The water-repellency enhancer is preferably a polymer compound containing a fluorinated alkyl group, a polymer compound containing a 1,1,1,3,3,3-hexafluoro-2-propanol residue with a particular structure, etc., more preferably ones exemplified in JP 2007-297590A, JP 2008-111103A, etc. The water-repellency enhancer needs to be dissolved in an alkali developer or an organic solvent developer. The water-repellency enhancer having a particular 1,1,1,3,3,3-hexafluoro-2-propanol residue mentioned above has favorable solubility to developers. A polymer compound containing a repeating unit with an amino group or amine salt as a water-repellency enhancer exhibits high effects of preventing acid evaporation during PEB and opening failure of a hole pattern after development. The inventive positive resist material contains the water-repellency enhancer in an amount of preferably 0 to 20 parts by mass, more preferably 0.5 to 10 parts by mass, based on 100 parts by mass of the base polymer. One kind of the water-repellency enhancer can be used alone, or two or more kinds thereof can be used in combination.

The inventive positive resist material may be blended with an acetylene alcohol. Examples of the acetylene alcohol include ones disclosed in paragraphs [0179] to [0182] of JP 2008-122932A. The inventive positive resist material contains the acetylene alcohol in an amount of preferably 0 to 5 parts by mass based on 100 parts by mass of the base polymer.

[Patterning Process]

When the inventive positive resist material is used for manufacturing various integrated circuits, known lithography techniques are applicable. An exemplary patterning process includes steps of:

forming a resist film on a substrate by using the above-described resist material;

exposing the resist film to a high-energy beam; and developing the exposed resist film by using a developer.

First, the inventive positive resist material is applied onto a substrate (such as Si, $SiO_2$, SiN, SiON, TiN, WSi, BPSG, SOG, organic antireflective film) for manufacturing an integrated circuit or a substrate (such as Cr, CrO, CrON, $MoSi_2$, $SiO_2$) for manufacturing a mask circuit by appropriate coating process such as spin coating, roll coating, flow coating, dip coating, spray coating, or doctor coating so that the coating film can have a thickness of 0.01 to 2 μm. The resultant is prebaked on a hot plate preferably at 60 to 150° C. for 10 seconds to 30 minutes, more preferably at 80 to 120° C. for 30 seconds to 20 minutes. In this manner, a resist film is formed.

Then, the resist film is exposed using a high-energy beam. Examples of the high-energy beam include ultraviolet ray, deep ultraviolet ray, EB, EUV, X-ray, soft X-ray, excimer laser beam, γ-ray, synchrotron radiation, etc. When ultraviolet ray, deep ultraviolet ray, EUV, X-ray, soft X-ray, excimer laser beam, γ-ray, synchrotron radiation, or the like is employed as the high-energy beam, the irradiation is performed directly or using a mask for forming a target pattern, at an exposure dose of preferably about 1 to 200 $mJ/cm^2$, more preferably about 10 to 100 $mJ/cm^2$. When EB is employed as the high-energy beam, the exposure dose is preferably about 0.1 to 100 $\mu C/cm^2$, more preferably about 0.5 to 50 $\mu C/cm^2$, and the writing is performed directly or using a mask for forming a target pattern. Note that the inventive positive resist material is particularly suitable for fine patterning with an i-line beam, a KrF excimer laser beam, an ArF excimer laser beam, an electron beam, or an extreme ultraviolet ray having a wavelength of 3 to 15 nm among the high-energy beams, and is especially suitable for fine patterning with EB or EUV.

The exposure may be followed by PEB on a hot plate or in an oven preferably at 50 to 150° C. for 10 seconds to 30 minutes, more preferably at 60 to 120° C. for 30 seconds to 20 minutes.

After the exposure or PEB, development is performed using a developer of 0.1 to 10 mass %, preferably 2 to 5 mass %, alkaline aqueous solution, such as tetramethylammonium hydroxide (TMAH), tetraethylammonium hydroxide (TEAH), tetrapropylammonium hydroxide (TPAH), or tetrabutylammonium hydroxide (TBAH), for 3 seconds to 3 minutes, preferably 5 seconds to 2 minutes, by conventional technique, such as dip, puddle, or spray method. Thereby, the portion irradiated with the light is dissolved by the developer, while the unexposed portion remains undissolved. In this way, the target positive pattern is formed on the substrate.

The positive resist material can also be used to perform negative development for obtaining a negative pattern by organic solvent development. Examples of the developer in this event include 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, phenylmethyl acetate, benzyl formate, phenylethyl formate, methyl 3-phenylpropionate, benzyl propionate, phenylethyl acetate, 2-phenylethyl acetate, etc. One of these organic solvents can be used alone, or two or more thereof can be used in mixture.

When the development is completed, rinsing can be performed. The rinsing liquid is preferably a solvent that is miscible with the developer but does not dissolve the resist film. As such a solvent, it is preferable to use an alcohol having 3 to 10 carbon atoms, an ether compound having 8 to 12 carbon atoms, an aromatic solvent, and an alkane, alkene, and alkyne each having 6 to 12 carbon atoms.

Specific examples of the alcohol having 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanoi, cyclohexanol, 1-octanol, etc.

Examples of the ether compound having 8 to 12 carbon atoms include di-n-butyl ether, diisobutyl ether, di-sec-butyl ether, di-n-pentyl ether, diisopentyl ether, di-sec-pentyl ether, di-tert-pentyl ether, di-n-hexyl ether, etc.

Examples of the alkane having 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, cyclononane, etc. Examples of the alkene having 6 to 12 carbon atoms include hexene, heptene, octene, cyclohexene, methylcyclohexene, dimethylcyclohexene, cycloheptene, cyclooctene, etc. Examples of the alkyne having 6 to 12 carbon atoms include hexyne, heptyne, octyne, etc.

Examples of the aromatic solvent include toluene, xylene, ethylbenzene, isopropylbenzene, tert-butylbenzene, mesitylene, etc.

The rinsing can reduce resist pattern collapse and defect formation. Meanwhile, the rinsing is not necessarily essential, and the amount of the solvent used can be reduced by not performing the rinsing.

After the development, a hole pattern or trench pattern can be shrunk by thermal flow, RELACS process, or DSA process. A shrink agent is applied onto the hole pattern, and the shrink agent undergoes crosslinking on the resist surface by diffusion of the acid catalyst from the resist layer during baking, so that the shrink agent is attached to sidewalls of the hole pattern. The baking temperature is preferably 70 to 180° C., more preferably 80 to 170° C. The baking time is preferably 10 to 300 seconds. The extra shrink agent is removed, and thus the hole pattern is shrunk.

EXAMPLE

Hereinafter, the present invention will be specifically described with reference to Synthetic Examples, Examples, and Comparative Examples. However, the present invention is not limited to the following Examples.

[1] Synthesis of Monomers

[Synthesis Example 1-1] Synthesis of Monomer 1

14.2 g of 2,5-dimethyl-3-hexyne-2,5-diol was dissolved in 50 g of THF, and 11.5 g of methacrylate chloride was added dropwise thereto under ice-cooling condition. The resultant was stirred at room temperature for 5 hours. Then, water was added to stop the reaction. After standard aqueous work-up and purification by silica gel column chromatography, Monomer 1 shown by the following formula was obtained.

Monomer 1

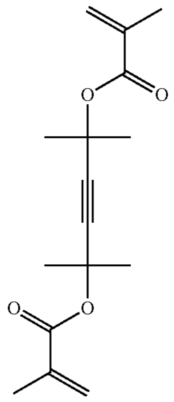

[Synthesis Example 1-2] Synthesis of Monomer 2

Monomer 2 shown by the following formula was obtained through similar reaction, but 2,5-dimethyl-3-hexyne-2,5-diol was changed to 17.0 g of 3,6-dimethyl-4-octyne-3,6-diol.

Monomer 2

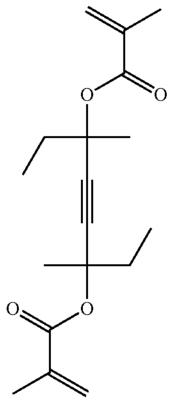

[Synthesis Example 1-3] Synthesis of Monomer 3

Monomer 3 shown by the following formula was obtained through similar reaction, but 2,5-dimethyl-3-hexyne-2,5-diol was changed to 14.4 g of 2,5-dimethyl hexene-2,5-diol.

Monomer 3

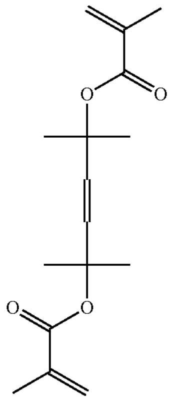

[Synthesis Example 1-4] Synthesis of Monomer 4

Monomer 4 shown by the following formula was obtained through similar reaction, but methacrylate chloride was changed to 18.0 g of 4-styrenecarboxylate chloride.

Monomer 4
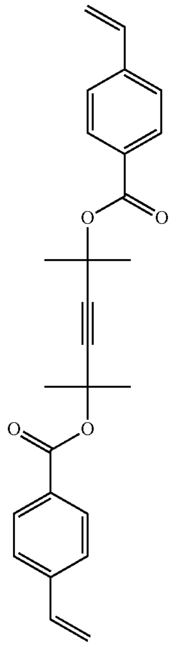
[2] Synthesis of Polymers
ALG Monomers 1 to 6, F Monomer 1, and Comparative Monomer 1 used for polymer synthesis are as follows. The Mw of each polymer indicates a value measured in terms of polystyrene by GPC using THF as a solvent.
ALG Monomer 1
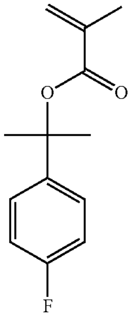
ALG Monomer 2
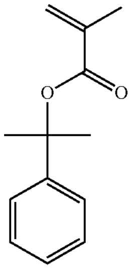
-continued
ALG Monomer 3
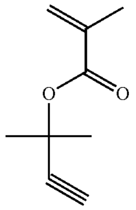
ALG Monomer 4
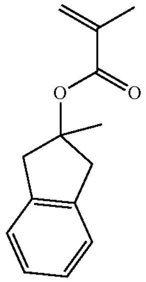
Comparative Monomer 1
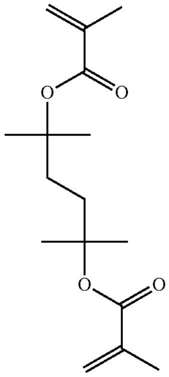
ALG Monomer 5
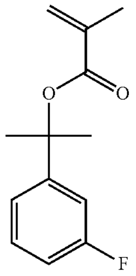
ALG Monomer 6
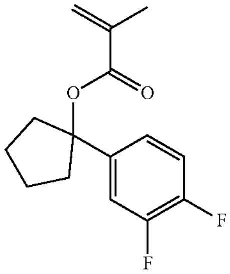

-continued

F Monomer 1

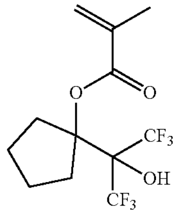

[Synthesis Example 2-1] Synthesis of Polymer 1

A 2-L flask was charged with 1.7 g of Monomer 1, 8.2 g of 1-methyl-1-cyclopentyl methacrylate, 5.9 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 1 was obtained. The composition of Polymer 1 was identified by $^{13}$C-NMR and $^{1}$H-NMR, and the Mw and Mw/Mn were identified by GPC.

Polymer 1

Mw=8,500
Mw/Mn=1.95

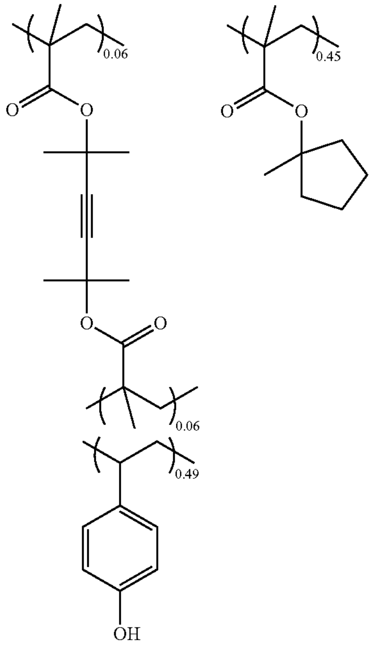

[Synthesis Example 2-2] Synthesis of Polymer 2

A 2-L flask was charged with 1.9 g of Monomer 1, 7.3 g of 1-methyl-1-cyclohexyl methacrylate, 6.4 g of 3-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 2 was obtained. The composition of Polymer 2 was identified by $^{13}$C-NMR and $^{1}$H-NMR, and the Mw and Mw/Mn were identified by GPC.

Polymer 2

Mw = 9,300
Mw/Mn = 1.99

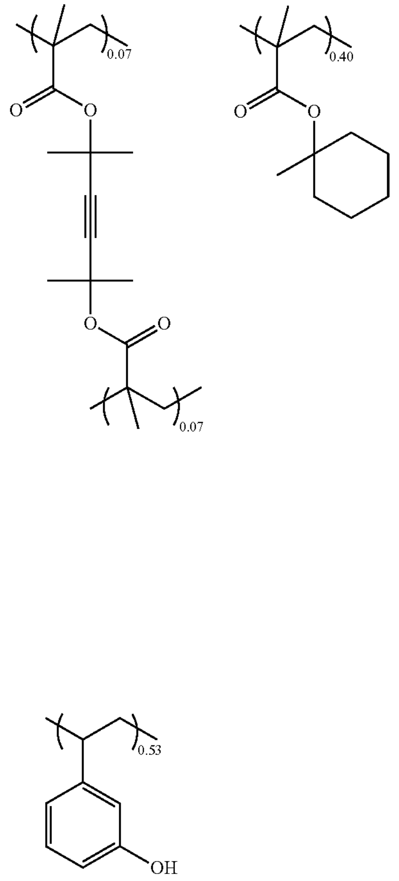

[Synthesis Example 2-3] Synthesis of Polymer 3

A 2-L flask was charged with 1.4 g of Monomer 1, 3.9 g of 1-(cyclopentyl-1-yl)-1-methylethyl methacrylate, 5.9 g of 3-fluoro-4-(methylcyclohexyloxy)styrene, 6.0 g of 3-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 3 was obtained. The composition of Polymer 3 was identified by $^{13}$C-NMR and $^{1}$H-NMR, and the Mw and Mw/Mn were identified by GPC.

Polymer 3

Mw = 10,1100
Mw/Mn = 2.01

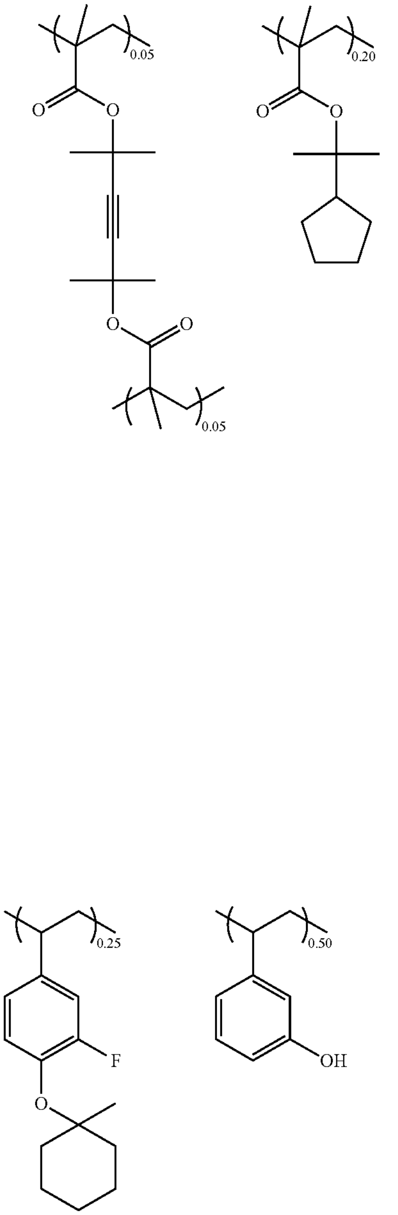

[Synthesis Example 2-4] Synthesis of Polymer 4

A 2-L flask was charged with 2.1 g of Monomer 2, 7.9 g of 1-methyl-1-cyclopentyl methacrylate, 5.5 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 4 was obtained. The composition of Polymer 4 was identified by $^{13}$C-NMR and $^{1}$H-NMR, and the Mw and Mw/Mn were identified by GPC.

Polymer 4

Mw = 9,300
Mw/Mn = 2.02

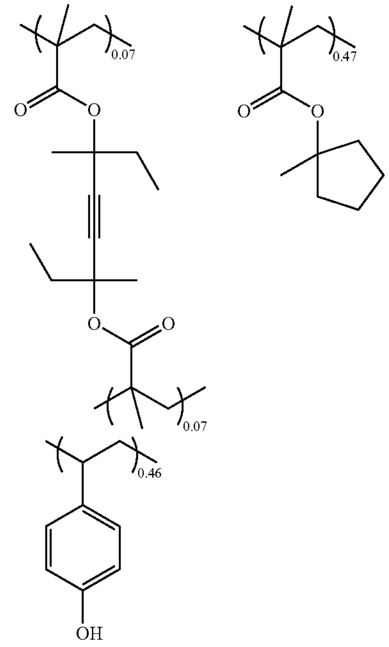

[Synthesis Example 2-5] Synthesis of Polymer 5

A 2-L flask was charged with 1.7 g of Monomer 3, 7.9 g of 1-vinyl-1-cyclopentyl methacrylate, 6.0 g of 3-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 5 was obtained. The composition of Polymer 5 was identified by $^{13}$C-NMR and $^{1}$H-NMR, and the Mw and Mw/Mn were identified by GPC.

Polymer 5

Mw = 8,500
Mw/Mn = 1.93

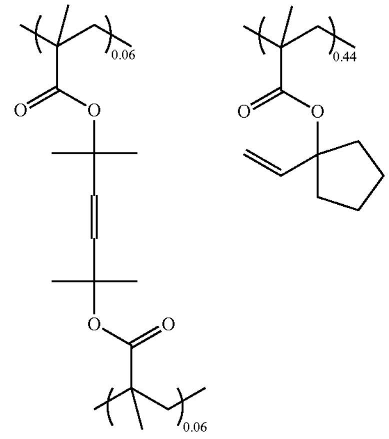

-continued

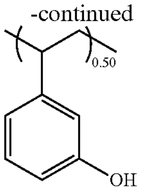

[Synthesis Example 2-6] Synthesis of Polymer 6

A 2-L flask was charged with 1.4 g of Monomer 1, 8.9 g of ALG Monomer 1, 6.6 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 6 was obtained. The composition of Polymer 6 was identified by $^{13}$C-NMR and $^{1}$H-NMR, and the Mw and Mw/Mn were identified by GPC.

Polymer 6

Mw = 9,600
Mw/Mn = 1.95

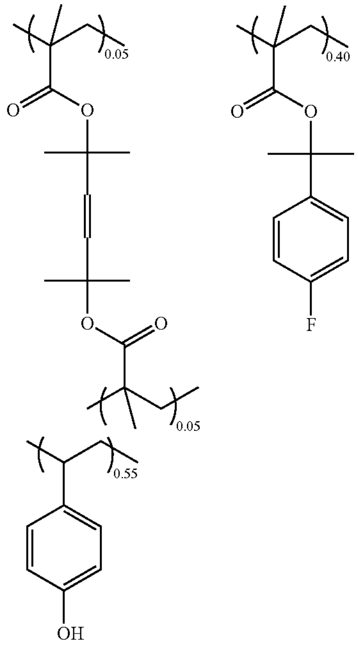

[Synthesis Example 2-7] Synthesis of Polymer 7

A 2-L flask was charged with 2.0 g of Monomer 4, 7.9 g of 1-methyl-1-cyclopentyl methacrylate, 6.0 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 7 was obtained. The composition of Polymer 7 was identified by $^{13}$C-NMR and $^{1}$H-NMR, and the Mw and Mw/Mn were identified by GPC.

Polymer 7

Mw=9,400
Mw/Mn=1.89

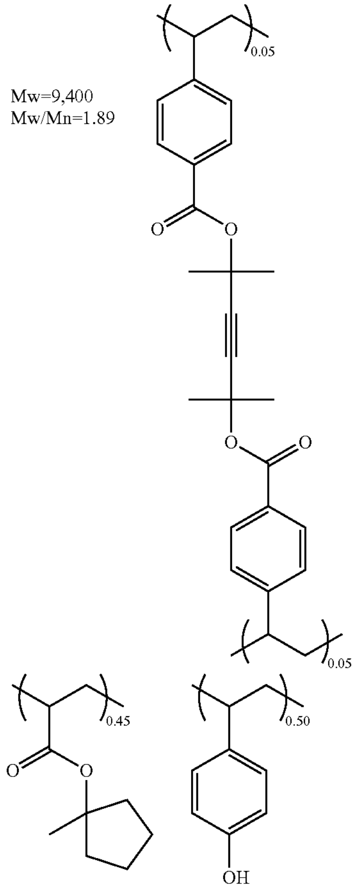

[Synthesis Example 2-8] Synthesis of Polymer 8

A 2-L flask was charged with 1.4 g of Monomer 1, 8.2 g of ALG Monomer 2, 6.6 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 8 was obtained. The composition of Polymer 8 was identified by $^{13}$C-NMR and $^{1}$H-NMR, and the Mw and Mw/Mn were identified by GPC.

Polymer 8

Mw=9,500
Mw/Mn=1.98

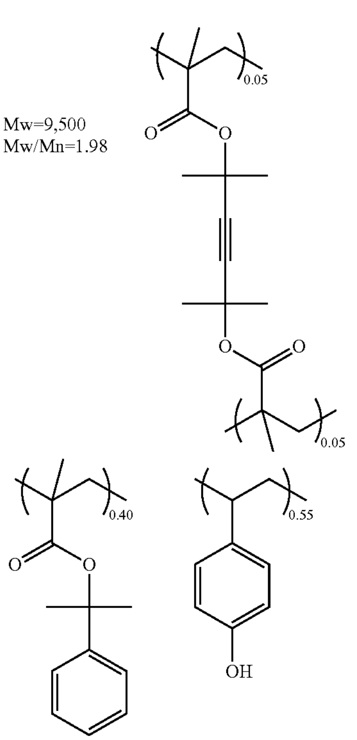

[Synthesis Example 2-9] Synthesis of Polymer 9

A 2-L flask was charged with 1.4 g of Monomer 1, 7.8 g of tert-butyl methacrylate, 4.8 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 9 was obtained. The composition of Polymer 9 was identified by $^{13}$C-NMR and $^{1}$H-NMR, and the Mw and Mw/Mn were identified by GPC.

Polymer 9

Mw=9,300
Mw/Mn=1.99

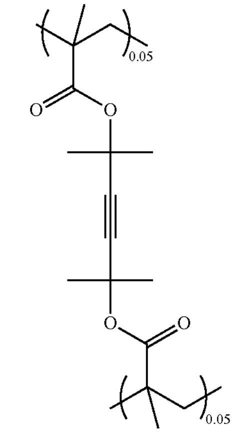

-continued

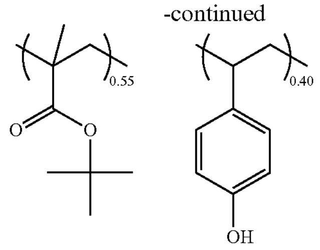

[Synthesis Example 2-10] Synthesis of Polymer 10

A 2-L flask was charged with 2.2 g of Monomer 1, 7.9 g of ALG Monomer 3, 4.8 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 10 was obtained. The composition of Polymer 10 was identified by $^{13}$C-NMR and $^{1}$H-NMR, and the Mw and Mw/Mn were identified by GPC.

Polymer 10

Mw=9,200
Mw/Mn=2.14

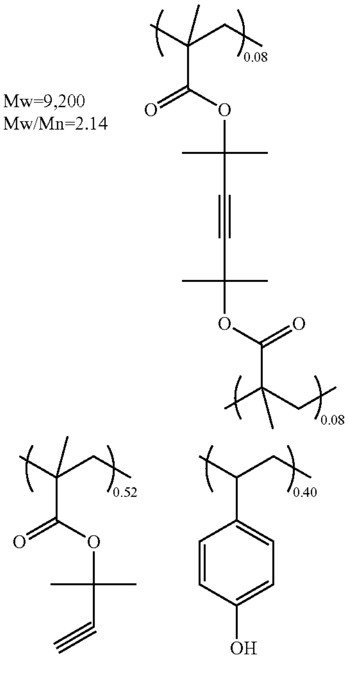

[Synthesis Example 2-11] Synthesis of Polymer 11

A 2-L flask was charged with 2.2 g of Monomer 1, 9.1 g of ALG Monomer 4, 6.0 g of 4-hydroxystyrene, and 40 g of THE as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 11 was obtained. The composition of Polymer 11 was identified by $^{13}$C-NMR and $^{1}$H-NMR, and the Mw and Mw/Mn were identified by GPC.

Polymer 11

Mw=9,600
Mw/Mn=2.05

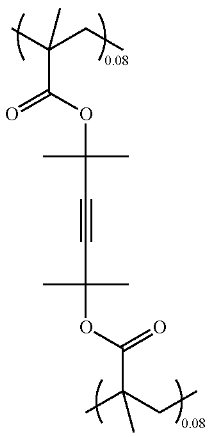

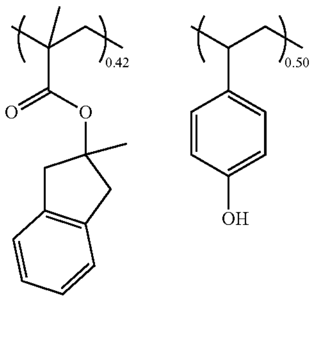

[Synthesis Example 2-12] Synthesis of Polymer 12

A 2-L flask was charged with 1.4 g of Monomer 1, 8.9 g of ALG Monomer 5, 6.6 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 12 was obtained. The composition of Polymer 12 was identified by $^{13}$C-NMR and $^{1}$H-NMR, and the Mw and Mw/Mn were identified by GPC.

Polymer 12

Mw=5,600
Mw/Mn=1.57

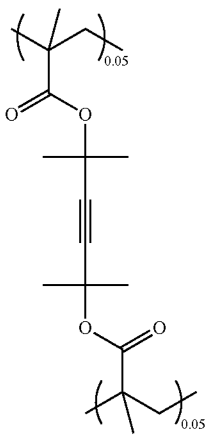

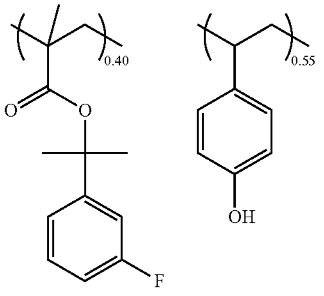

[Synthesis Example 2-13] Synthesis of Polymer 13

A 2-L flask was charged with 1.4 g of Monomer 1, 10.6 g of ALG Monomer 6, 3.2 g of F Monomer 1, 5.4 g of 4-hydroxystyrene, and 40 g of THF as a solvent. This reaction container was cooled to −70° C. under nitrogen atmosphere. Vacuum degassing and nitrogen blowing were repeated three times. After the temperature was raised to room temperature, 1.2 g of AIBN was added as a polymerization initiator, the temperature was raised to 60° C., and the reaction was allowed to take place for 15 hours. The reaction solution was poured into 1 L of isopropyl alcohol. A deposited white solid was separated by filtration. The obtained white solid was dried at 60° C. under reduced pressure. Thus, Polymer 13 was obtained. The composition of Polymer 13 was identified by $^{13}$C-NMR and $^{1}$H-NMR, and the Mw and Mw/Mn were identified by GPC.

Polymer 13

Mw=6,400
Mw/Mn=1.51

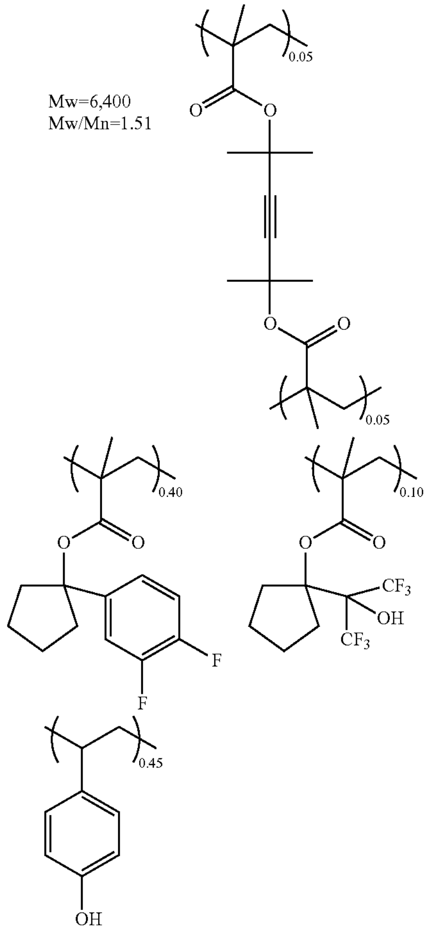

[Comparative Synthesis Example 1] Synthesis of Comparative Polymer 1

Comparative Polymer 1 was obtained by the same procedure as in Synthesis Example 2-4, except that Monomer 2 was not used. The composition of Comparative Polymer 1 was identified by $^{13}$C-NMR and $^{1}$H-NMR, and the Mw and Mw/Mn were identified by GPC.

Comparative Polymer 1

Mw=7,900
Mw/Mn=1.71

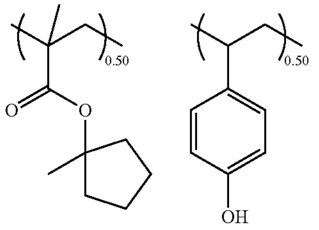

[Comparative Synthesis Example 2] Synthesis of Comparative Polymer 2

Comparative Polymer 2 was obtained by the same procedure as in Synthesis Example 2-4, except that Comparative Monomer 1 was used instead of Monomer 2. The composition of Comparative Polymer 2 was identified by $^{13}$C-NMR and $^{1}$H-NMR, and the Mw and Mw/Mn were identified by GPC.

Comparative Polymer 2

Mw=9,600
Mw/Mn=1.99

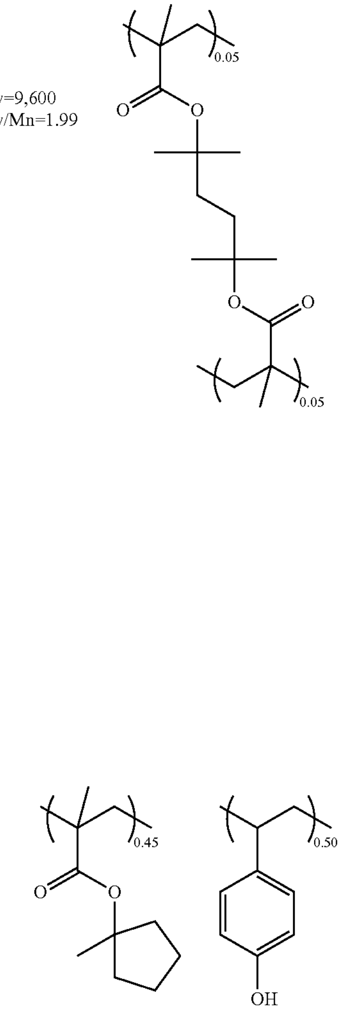

[3] Preparation and Evaluation of Positive Resist Materials

Examples 1 to 21, Comparative Examples 1, 2

(1) Preparation of Positive Resist Materials

According to the composition shown in Table 1, components were dissolved in an organic solvent in which 50 ppm of a surfactant Polyfox 636 (manufactured by OMNOVA Solutions Inc.) had been dissolved. The resulting solution was filtered through a filter having a pore size of 0.2 μm. In this manner, positive resist materials were prepared.

The components in Table 1 are as follows.

Organic solvents:

PGMEA (propylene glycol monomethyl ether acetate)

DAA (diacetone alcohol)

Acid generators: PAG-1 to PAG-12
Quenchers: Q-1 to Q-8
PAG-1
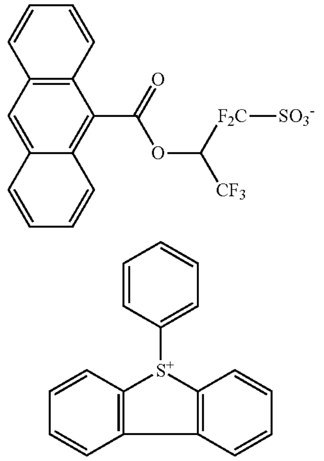
PAG-2
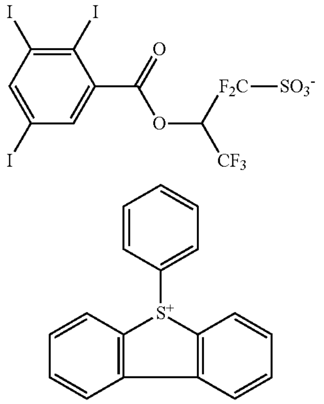
PAG-3
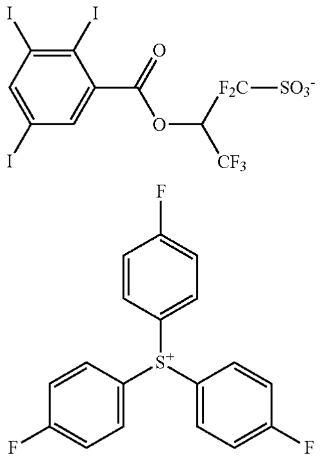
-continued
PAG-4
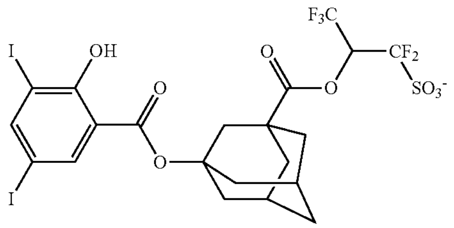
PAG-5
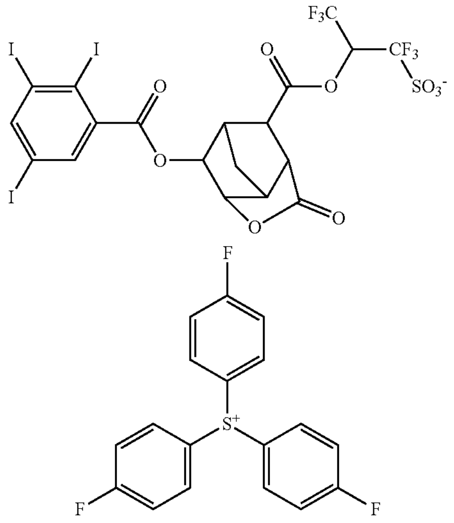
PAG-6
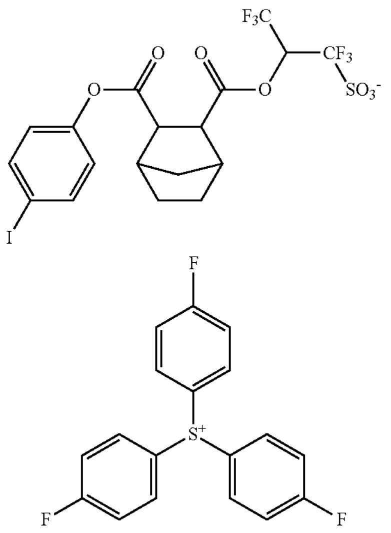

-continued
PAG-7
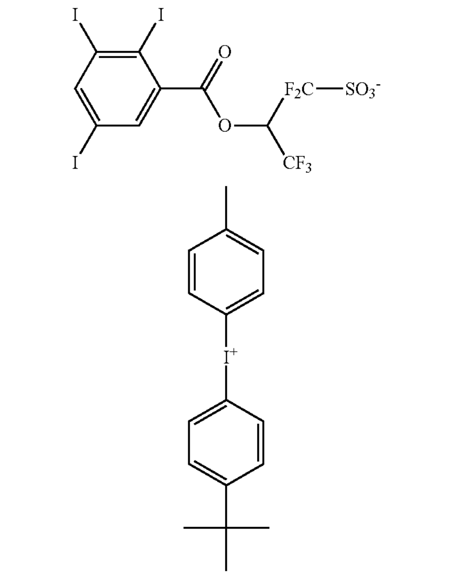
PAG-8
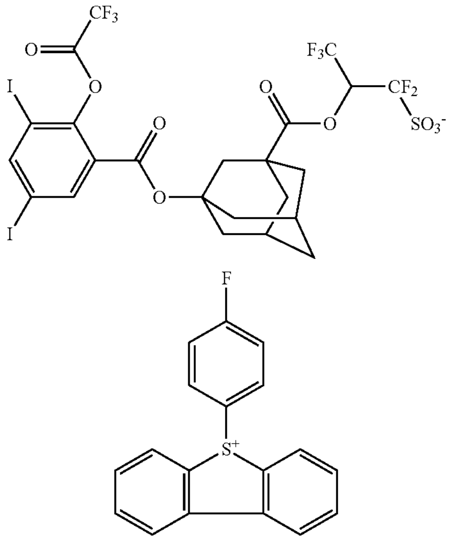
PAG-9
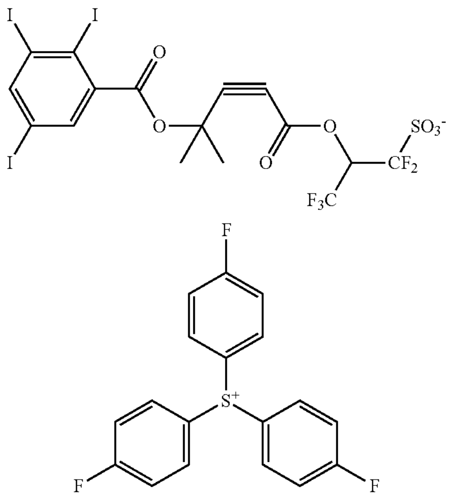
-continued
PAG-10
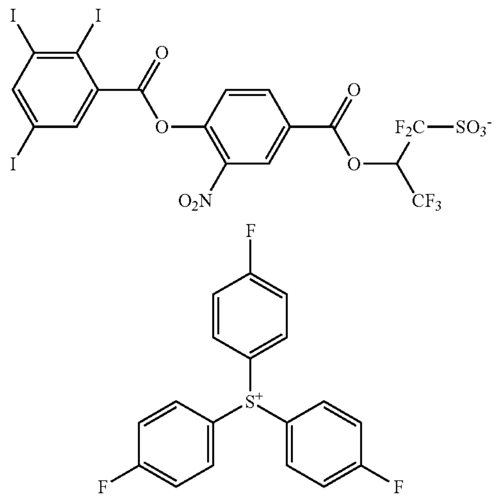
PAG-11
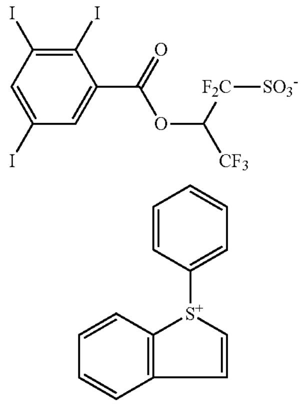
PAG-12
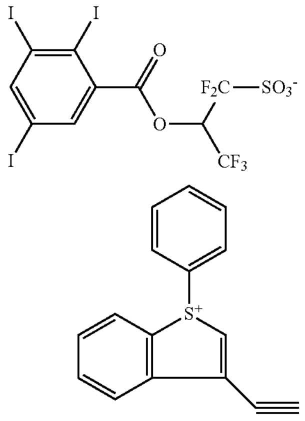

-continued
Q-1
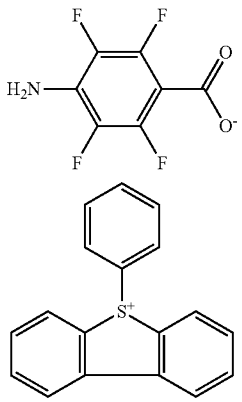
Q-2
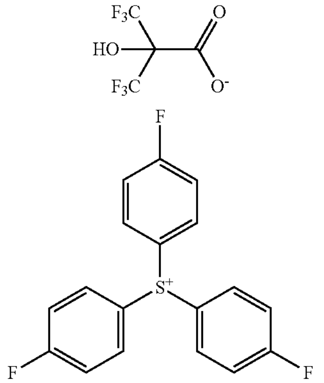
Q-3
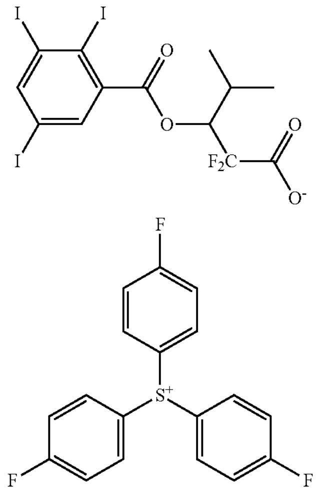
-continued
Q-4
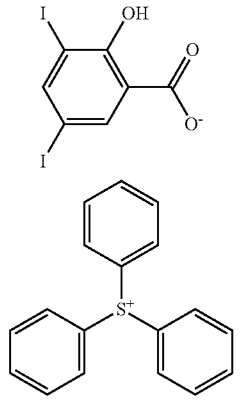
Q-5
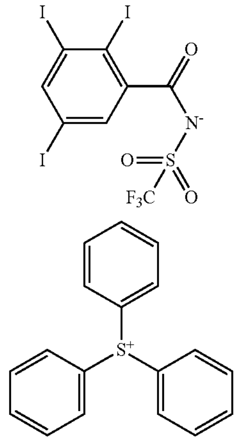
Q-6
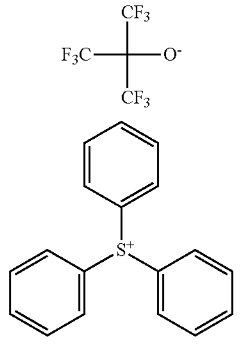
Q-7
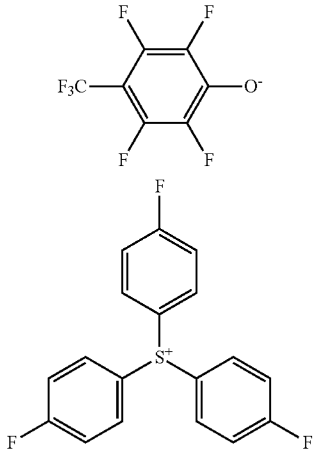

-continued

Q-8

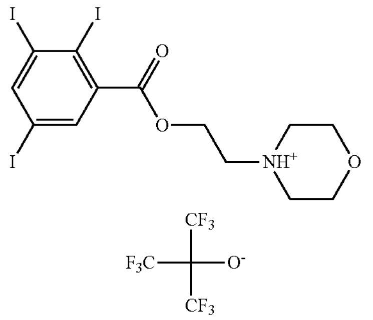

(2) EUV Lithography Evaluation

A Si substrate with a silicon-containing spin-on hard mask SHB-A940 (manufactured by Shin-Etsu Chemical CO., Ltd., silicon content: 43 mass %) formed to have a film thickness of 20 nm was spin-coated with one of the resist materials shown in Table 1. The resultant was prebaked using a hot plate at 100° C. for 60 seconds to prepare a resist film having a film thickness of 50 nm. The resist film was exposed using an EUV scanner NXE3400 (manufactured by ASML, NA: 0.33, σ: 0.9/0.6, quadrupole illumination, with a mask having a hole pattern with a pitch of 46 nm and +20% bias (on-wafer size)), followed by PEB on the hot plate at a temperature shown in Table 1 for 60 seconds, and development with a 2.38 mass % TMAH aqueous solution for 30 seconds to obtain a hole pattern with a dimension of 23 nm.

An exposure dose at which the hole dimension of 23 nm was formed was determined as sensitivity. Moreover, the dimensions of 50 holes were measured using a CD-SEM (CG6300) manufactured by Hitachi High-Technologies Corporation. Based on this result, the triple value (3σ) of the standard deviation (σ) was calculated and determined as dimensional variation (critical dimension uniformity: CDU).

The results are also shown in Table 1.

TABLE 1

| | Polymer (parts by mass) | Acid generator (parts by mass) | Quencher (parts by mass) | Organic solvent (parts by mass) | PEB temperature (° C.) | Sensitivity ($mJ/cm^2$) | CDU (nm) |
|---|---|---|---|---|---|---|---|
| Example 1 | Polymer 1 (100) | PAG-1 (20.8) | Q-1 (4.69) | PGMEA(2,000) DAA(500) | 85 | 35 | 2.8 |
| Example 2 | Polymer 2 (100) | PAG-2 (29.2) | Q-2 (5.28) | PGMEA(2,000) DAA(500) | 85 | 27 | 2.6 |
| Example 3 | Polymer 3 (100) | PAG-2 (29.2) | Q-3 (9.66) | PGMEA(2,000) DAA(500) | 85 | 27 | 2.6 |
| Example 4 | Polymer 4 (100) | PAG-2 (29.2) | Q-4 (6.52) | PGMEA(2,000) DAA(500) | 85 | 27 | 2.6 |
| Example 5 | Polymer 5 (100) | PAG-2 (29.2) | Q-5 (8.93) | PGMEA(2,000) DAA(500) | 85 | 28 | 2.6 |
| Example 6 | Polymer 6 (100) | PAG-2 (29.2) | Q-6 (4.98) | PGMEA(2,000) DAA(500) | 85 | 29 | 2.5 |
| Example 7 | Polymer 7 (100) | PAG-2 (29.2) | Q-2 (2.64) Q-8 (4.24) | PGMEA(2,000) DAA(500) | 85 | 31 | 2.6 |
| Example 8 | Polymer 8 (100) | PAG-2 (29.2) | Q-2 (5.28) | PGMEA(2,000) DAA(500) | 85 | 29 | 2.5 |
| Example 9 | Polymer 9 (100) | PAG-2 (29.2) | Q-2 (5.28) | PGMEA(2,000) DAA(500) | 90 | 28 | 2.5 |
| Example 10 | Polymer 10 (100) | PAG-2 (29.2) | Q-2 (5.28) | PGMEA(2,000) DAA(500) | 85 | 26 | 2.7 |
| Example 11 | Polymer 11 (100) | PAG-2 (29.2) | Q-2 (5.28) | PGMEA(2,000) DAA(500) | 85 | 27 | 2.8 |
| Example 12 | Polymer 1 (100) | PAG-3 (30.8) | Q-2 (5.28) | PGMEA(2,000) DAA(500) | 85 | 28 | 2.6 |
| Example 13 | Polymer 1 (100) | PAG-4 (32.3) | Q-2 (5.28) | PGMEA(2,000) DAA(500) | 85 | 29 | 2.6 |
| Example 14 | Polymer 1 (100) | PAG-5 (36.8) | Q-2 (5.28) | PGMEA(2,000) DAA(500) | 85 | 27 | 2.7 |
| Example 15 | Polymer 1 (100) | PAG-6 (25.9) | Q-2 (5.28) | PGMEA(2,000) DAA(500) | 85 | 27 | 2.6 |
| Example 16 | Polymer 1 (100) | PAG-7 (32.0) | Q-2 (5.28) | PGMEA(2,000) DAA(500) | 85 | 29 | 2.7 |
| Example 17 | Polymer 1 (100) | PAG-8 (35.2) | Q-2 (5.28) | PGMEA(2,000) DAA(500) | 85 | 28 | 2.8 |
| Example 18 | Polymer 1 (100) | PAG-9 (33.6) | Q-7 (5.50) | PGMEA(2,000) DAA(500) | 85 | 26 | 2.7 |
| Example 19 | Polymer 1 (100) | PAG-10 (35.8) | Q-7 (5.50) | PGMEA(2,000) DAA(500) | 85 | 28 | 2.5 |
| Example 20 | Polymer 12 (100) | PAG-11 (23.1) | Q-2 (5.28) | PGMEA(2,000) DAA(500) | 85 | 25 | 2.8 |

TABLE 1-continued

| | Polymer (parts by mass) | Acid generator (parts by mass) | Quencher (parts by mass) | Organic solvent (parts by mass) | PEB temperature (° C.) | Sensitivity (mJ/cm$^2$) | CDU (nm) |
|---|---|---|---|---|---|---|---|
| Example 21 | Polymer 13 (100) | PAG-12 (23.7) | Q-2 (5.28) | PGMEA(2,000) DAA(500) | 85 | 27 | 2.7 |
| Comparative Example 1 | Comparative Polymer 1 (100) | PAG-1 (20.8) | Q-2 (5.28) | PGMEA(2,000) DAA(500) | 85 | 38 | 3.1 |
| Comparative Example 2 | Comparative Polymer 2 (100) | PAG-1 (20.8) | Q-2 (5.28) | PGMEA(2,000) DAA(500) | 85 | 41 | 3.2 |

From the results shown in Table 1, high sensitivity and favorable CDU were achieved by using the inventive positive resist materials each containing: an acid generator; and a base polymer containing a repeating unit having two carboxyl groups whose hydrogen atoms are substituted with two tertiary carbon atoms each bonded to a double bond or triple bond.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A positive resist material comprising:

an acid generator; and a base polymer comprising a repeating unit comprising two carboxyl groups whose hydrogen atoms are substituted with two tertiary carbon atoms each bonded to a double bond or triple bond, wherein the repeating unit comprising two carboxyl groups whose hydrogen atoms are substituted with two tertiary carbon atoms each bonded to a double bond or triple bond is a repeating unit-a in the following formula (1), (1)

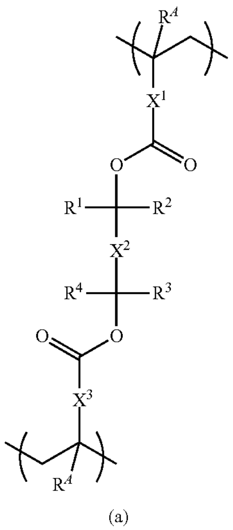

(a)

wherein $R^A$'s are identical to or different from each other and each represent a hydrogen atom or a methyl group; $X^1$ and $X^3$ each represent a single bond, a phenylene group, or a linking group having 1 to 12 carbon atoms containing at least one selected from the group consisting of an ester bond, an ether bond, and a lactone ring, provided that the linking group excludes the following formula (1'); $R^1$ to $R^4$ each represent a linear, branched, or cyclic alkyl group having 1 to 8 carbon atoms; and $X^2$ represents a vinylene group or an ethynylene group, (1')

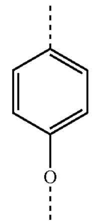

wherein an oxygen atom in the formula (1') is bonded to a carbon atom of a carboxyl group in the formula (1); and each broken line represents a bonding arm.

2. The positive resist material according to claim 1, wherein the acid generator is a sulfonium salt or iodonium salt of a sulfonic acid containing an iodine atom-substituted aromatic ring.

3. The positive resist material according to claim 2, wherein the sulfonium salt or iodonium salt of a sulfonic acid containing an iodine atom-substituted aromatic ring is shown by the following formula (2-1) or (2-2), (2-1)

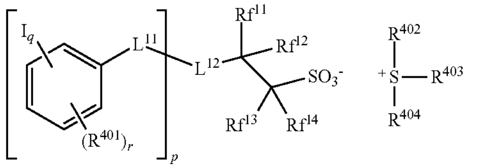

(2-2)

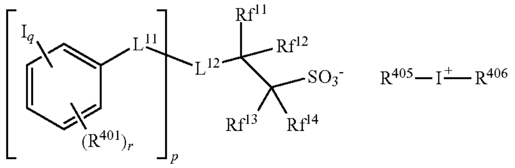

wherein "p" represents an integer satisfying $1 \leq p \leq 3$;

"q" and "r" represent integers satisfying $1 \leq q \leq 5$, $0 \leq r \leq 3$, and $1 \leq q+r \leq 5$;

$L^{11}$ represents a single bond, or a linear, branched, or cyclic saturated hydrocarbylene group having 1 to 6 carbon atoms and optionally containing an ether bond or an ester bond;

$L^{12}$ represents a single bond or a divalent linking group having 1 to 20 carbon atoms when "p" is 1, or represents a trivalent or tetravalent linking group having 1 to 20 carbon atoms when "p" is 2 or 3, the linking groups optionally containing an oxygen atom, a sulfur atom, a nitrogen atom, a chlorine atom, a bromine atom, or an iodine atom;

$R^{401}$ represents a hydroxy group, a carboxyl group, a fluorine atom, a chlorine atom, a bromine atom, an amino group, $—NR^{401A}—C(=O)—R^{401B}$, or $—NR^{401A}—C(=O)—O—R^{401B}$, or a saturated hydrocarbyl group having 1 to 20 carbon atoms, a saturated hydrocarbyloxy group having 1 to 20 carbon atoms, a saturated hydrocarbyloxycarbonyl group having 2 to 10 carbon atoms, a saturated hydrocarbylcarbonyloxy group having 2 to 20 carbon atoms, a saturated hydrocarbylsulfonyloxy group having 1 to 20 carbon atoms, or an aromatic hydrocarbon group having 6 to 20 carbon atoms each of which optionally contains an ether bond;

$R^{401A}$ represents a hydrogen atom or a saturated hydrocarbyl group having 1 to 6 carbon atoms, and optionally contains a halogen atom, a hydroxy group, an alkoxy group having 1 to 6 carbon atoms, a saturated hydrocarbylcarbonyl group having 2 to 6 carbon atoms, or a saturated hydrocarbylcarbonyloxy group having 2 to 6 carbon atoms;

$R^{401B}$ represents an aliphatic hydrocarbyl group having 1 to 16 carbon atoms or an aryl group having 6 to 12 carbon atoms, and optionally contains a halogen atom, a hydroxy group, a saturated hydrocarbyloxy group having 1 to 6 carbon atoms, a saturated hydrocarbylcarbonyl group having 2 to 6 carbon atoms, or a saturated hydrocarbylcarbonyloxy group having 2 to 6 carbon atoms, the aliphatic hydrocarbyl group is saturated or unsaturated, and linear, branched, or cyclic, and the saturated hydrocarbyl group, saturated hydrocarbyloxy group, saturated hydrocarbyloxycarbonyl group, saturated hydrocarbylcarbonyl groups, saturated hydrocarbylcarbonyloxy groups, and saturated hydrocarbylsulfonyloxy group are linear, branched, or cyclic;

when "p" and/or "r" are 2 or more, $R^{401}$'s are identical to or different from one another;

$Rf^{11}$ to $Rf^{14}$ each independently represent a hydrogen atom, a fluorine atom, or a trifluoromethyl group, at least one of $Rf^{11}$ to $Rf^{14}$ is a fluorine atom or a trifluoromethyl group, and $Rf^{11}$ and $Rf^{12}$ optionally bond with each other to form a carbonyl group;

$R^{402}$, $R^{403}$, $R^{404}$, $R^{405}$, and $R^{406}$ each independently represent a hydrocarbyl group having 1 to 20 carbon atoms optionally containing a fluorine atom, a chlorine atom, a bromine atom, an iodine atom, or a heteroatom, the hydrocarbyl group is saturated or unsaturated, and linear, branched, or cyclic, and the groups as $R^{402}$, $R^{403}$, $R^{404}$, $R^{405}$, and $R^{406}$ have some or all of hydrogen atoms optionally substituted with a hydroxy group, a carboxyl group, a halogen atom, a cyano group, a nitro group, a mercapto group, a sultone group, a sulfone group, or a sulfonium salt-containing group, and have some of carbon atoms optionally substituted with an ether bond, an ester bond, a carbonyl group, an amide bond, a carbonate group, or a sulfonic acid ester bond, and $R^{402}$ and $R^{403}$ are optionally bonded to each other to form a ring together with a sulfur atom bonded thereto.

4. The positive resist material according to claim 1, wherein the base polymer further comprises at least one selected from the group consisting of a repeating unit containing a carboxyl group whose hydrogen atom is substituted with a first acid labile group different from the two tertiary carbon atoms each bonded to a double bond or triple bond, and a repeating unit containing a phenolic hydroxy group whose hydrogen atom is substituted with a second acid labile group.

5. The positive resist material according to claim 2, wherein the base polymer further comprises at least one selected from the group consisting of a repeating unit containing a carboxyl group whose hydrogen atom is substituted with a first acid labile group different from the two tertiary carbon atoms each bonded to a double bond or triple bond, and a repeating unit containing a phenolic hydroxy group whose hydrogen atom is substituted with a second acid labile group.

6. The positive resist material according to claim 3, wherein the base polymer further comprises at least one selected from the group consisting of a repeating unit containing a carboxyl group whose hydrogen atom is substituted with a first acid labile group different from the two tertiary carbon atoms each bonded to a double bond or triple bond, and a repeating unit containing a phenolic hydroxy group whose hydrogen atom is substituted with a second acid labile group.

7. The positive resist material according to claim 4, wherein the repeating unit having the substituted first acid labile group is a repeating unit shown by the following formula (b1), and the repeating unit having the substituted second acid labile group is a repeating unit shown by the following formula (b2), (b1)

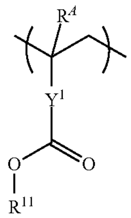

(b2)

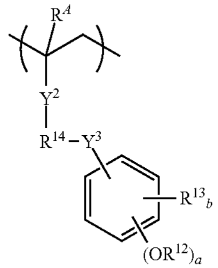

wherein each $R^A$ independently represents a hydrogen atom or a methyl group; $Y^1$ represents a single bond, a phenylene group, a naphthylene group, or a linking group having 1 to 14 carbon atoms containing at least one selected from the group consisting of an ester bond, an ether bond, and a lactone ring; $Y^2$ represents a single bond, an ester bond, or an amide bond; $Y^3$ represents a single bond, an ether bond, or an ester bond; $R^{11}$ represents the first acid labile group that is different from the two tertiary carbon atoms each bonded to a double bond or triple bond; $R^{12}$ represents the second acid labile group; $R^{13}$ represents a fluorine atom, a trifluoromethyl group, a cyano group, or a saturated hydrocarbyl group having 1 to 6 carbon atoms; $R^{14}$ represents a single bond or an alkanediyl group having 1 to 6 carbon atoms, and some of the carbon atoms are optionally substituted with an ether bond or an ester bond; and "a" represents 1 or 2, and "b" represents an integer of 0 to 4, with $1 \leq a+b \leq 5$.

8. The positive resist material according to claim 5, wherein the repeating unit having the substituted first acid labile group is a repeating unit shown by the following formula (b1), and the repeating unit having the substituted second acid labile group is a repeating unit shown by the following formula (b2), (b1)

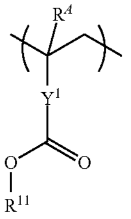

(b2)

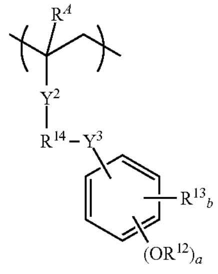

wherein each $R^A$ independently represents a hydrogen atom or a methyl group; $Y^1$ represents a single bond, a phenylene group, a naphthylene group, or a linking group having 1 to 14 carbon atoms containing at least one selected from the group consisting of an ester bond, an ether bond, and a lactone ring; $Y^2$ represents a single bond, an ester bond, or an amide bond; $Y^3$ represents a single bond, an ether bond, or an ester bond; $R^{11}$ represents the first acid labile group that is different from the two tertiary carbon atoms each bonded to a double bond or triple bond; $R^{12}$ represents the second acid labile group; $R^{13}$ represents a fluorine atom, a trifluoromethyl group, a cyano group, or a saturated hydrocarbyl group having 1 to 6 carbon atoms; $R^{14}$ represents a single bond or an alkanediyl group having 1 to 6 carbon atoms, and some of the carbon atoms are optionally substituted with an ether bond or an ester bond; and "a" represents 1 or 2, and "b" represents an integer of 0 to 4, with $1 \leq a+b \leq 5$.

9. The positive resist material according to claim 6, wherein the repeating unit having the substituted first acid labile group is a repeating unit shown by the following formula (b1), and the repeating unit having the substituted second acid labile group is a repeating unit shown by the following formula (b2), (b1)

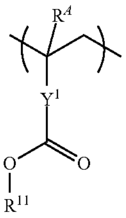

(b2)

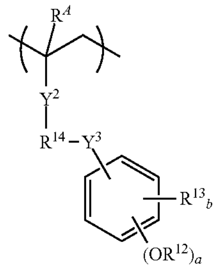

wherein each $R^A$ independently represents a hydrogen atom or a methyl group; $Y^1$ represents a single bond, a phenylene group, a naphthylene group, or a linking group having 1 to 14 carbon atoms containing at least one selected from the group consisting of an ester bond, an ether bond, and a lactone ring; $Y^2$ represents a single bond, an ester bond, or an amide bond; $Y^3$ represents a single bond, an ether bond, or an ester bond; $R^{11}$ represents the first acid labile group that is different from the two tertiary carbon atoms each bonded to a double bond or triple bond; $R^{12}$ represents the second acid labile group; $R^{13}$ represents a fluorine atom, a trifluoromethyl group, a cyano group, or a saturated hydrocarbyl group having 1 to 6 carbon atoms; $R^{14}$ represents a single bond or an alkanediyl group having 1 to 6 carbon atoms, and some of the carbon atoms are optionally substituted with an ether bond or an ester bond; and "a" represents 1 or 2, and "b" represents an integer of 0 to 4, with $1 \leq a+b \leq 5$.

10. The positive resist material according to claim 1, wherein the base polymer further comprises a repeating unit comprising an adhesive group selected from the group consisting of a hydroxy group, a carboxyl group, a lactone ring, a carbonate group, a thiocarbonate group, a carbonyl group, a cyclic acetal group, an ether bond, an ester bond, a sulfonic acid ester bond, a cyano group, an amide bond, $—O—C(=O)—S—$, and $—O—C(=O)—NH—$.

11. The positive resist material according to claim 1, further comprising one or more selected from the group consisting of an organic solvent, a quencher, and a surfactant.

12. A patterning process comprising steps of:

forming a resist film on a substrate by using the positive resist material according to claim 1;

exposing the resist film to a high-energy beam; and developing the exposed resist film by using a developer.

13. The patterning process according to claim 12, wherein the high-energy beam is an i-line beam, a KrF excimer laser beam, an ArF excimer laser beam, an electron beam, or an extreme ultraviolet ray having a wavelength of 3 to 15 nm.

* * * * *